US008444899B2

(12) United States Patent
DeSimone et al.

(10) Patent No.: US 8,444,899 B2
(45) Date of Patent: May 21, 2013

(54) METHODS AND MATERIALS FOR FABRICATING MICROFLUIDIC DEVICES

(75) Inventors: Joseph M. DeSimone, Chapel Hill, NC (US); Jason P. Rolland, Belmont, MA (US); Ginger M. Denison Rothrock, Durham, NC (US); Paul Resnick, Cary, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 0 days.

(21) Appl. No.: 13/438,431

(22) Filed: Apr. 3, 2012

(65) Prior Publication Data

US 2012/0256354 A1    Oct. 11, 2012

Related U.S. Application Data

(60) Division of application No. 12/063,284, filed as application No. PCT/US2006/031067 on Aug. 9, 2006, now Pat. No. 8,158,728, and a continuation-in-part of application No. PCT/US2005/004421, filed on Feb. 14, 2005.

(60) Provisional application No. 60/706,786, filed on Aug. 9, 2005, provisional application No. 60/732,727, filed on Nov. 2, 2005, provisional application No. 60/799,317, filed on May 10, 2006, provisional application No. 60/544,905, filed on Feb. 13, 2004.

(51) Int. Cl.
*B29C 33/40* (2006.01)

(52) U.S. Cl.
USPC ........... 264/226; 264/220; 264/225; 525/403; 525/474; 528/401; 528/402

(58) Field of Classification Search
USPC ... 264/220, 225, 226; 525/474, 403; 528/401, 528/402
See application file for complete search history.

(56) References Cited

U.S. PATENT DOCUMENTS

| | | |
|---|---|---|
| 3,810,874 A | 5/1974 | Mitsch et al. |
| 4,352,874 A | 10/1982 | Land et al. |
| 4,353,977 A | 10/1982 | Gerber et al. |
| 4,356,257 A | 10/1982 | Gerber |
| 4,359,526 A | 11/1982 | Walworth |
| 4,512,848 A | 4/1985 | Deckman et al. |
| 4,614,667 A | 9/1986 | Larson et al. |
| 4,663,274 A | 5/1987 | Slafer et al. |
| 4,681,925 A | 7/1987 | Strepparola et al. |
| 4,818,801 A | 4/1989 | Rice et al. |
| 4,830,910 A | 5/1989 | Larson |
| 5,041,359 A | 8/1991 | Kooi |
| 5,175,030 A | 12/1992 | Lu et al. |
| 5,189,135 A | 2/1993 | Cozzi et al. |
| 5,259,926 A | 11/1993 | Kuwabara et al. |
| 5,268,405 A | 12/1993 | Ojakaar et al. |
| 5,279,689 A | 1/1994 | Shvartsman |
| 5,368,789 A | 11/1994 | Kamitakahara et al. |
| 5,425,848 A | 6/1995 | Haisma et al. |
| 5,512,131 A | 4/1996 | Kumar et al. |
| 5,630,902 A | 5/1997 | Galarneau et al. |
| 5,753,150 A | 5/1998 | Martin et al. |
| 5,772,905 A | 6/1998 | Chou |
| 5,817,242 A | 10/1998 | Biebuyck et al. |
| 5,965,631 A | 10/1999 | Nicolson et al. |
| 5,994,133 A | 11/1999 | Meijs et al. |
| 6,027,595 A | 2/2000 | Suleski |
| 6,027,630 A | 2/2000 | Cohen |
| 6,054,537 A | 4/2000 | Shimizu et al. |
| 6,083,971 A | 7/2000 | Diederich et al. |
| 6,121,404 A | 9/2000 | Liles |
| 6,204,296 B1 | 3/2001 | Weers et al. |
| 6,207,758 B1 | 3/2001 | Brinati et al. |
| 6,228,318 B1 | 5/2001 | Nakamae et al. |
| 6,247,986 B1 | 6/2001 | Chiu et al. |
| 6,284,072 B1 | 9/2001 | Ryan et al. |
| 6,294,450 B1 | 9/2001 | Chen et al. |
| 6,300,042 B1 | 10/2001 | Mancini et al. |
| 6,306,563 B1 | 10/2001 | Xu et al. |
| 6,334,960 B1 | 1/2002 | Willson et al. |
| 6,335,224 B1 | 1/2002 | Peterson et al. |
| 6,355,198 B1 | 3/2002 | Kim et al. |
| 6,375,870 B1 | 4/2002 | Visovsky et al. |
| 6,422,528 B1 | 7/2002 | Domeier et al. |
| 6,517,995 B1 | 2/2003 | Jacobson et al. |
| 6,518,189 B1 | 2/2003 | Chou |
| 6,555,221 B1 | 4/2003 | Komiyama et al. |

(Continued)

FOREIGN PATENT DOCUMENTS

| | | |
|---|---|---|
| CH | 569 029 A5 | 11/1975 |
| DE | 20 44 888 A1 | 3/1971 |

(Continued)

OTHER PUBLICATIONS

Rolland, J., et al; Polymer Preprints, proceedings from 228th ACS National Meeting, Aug. 25, 2004.*
Rolland, J., et al.; Journal of the American Chemical Society, Feb. 6, 2004, p. 2322-2323.*
Rolland, J., et al.; Angewante Chem. Int. Ed., 2004, p. 5796-5799.*
Ng, H.T., et al.; Nano Letters, 2002, p. 961-964.*
Ameduri, B. and B. Boutevin, "Update on Fluoroelastomers: From Perfluoroelastomers to Fluorosilicones and Fluorophosphazenes," *Journal of Fluorine Chemistry*, 2005, pp. 221-229, vol. 126, Elsevier.
Becker, H. and C. Gartner, "Polymer Microfabrication Methods for Microfluidic Analytical Applications," *Electrophoresis*, 2000, pp. 12-26, vol. 21.
Bongiovanni, R., et al., "Fluorinated Networks Through Photopolymerisation Processes: Synthesis, Characterization and Properties," *J. Fluor. Chem.*, 2004, pp. 345-351, vol. 125, Elsevier.
Bongiovanni, R., et al., "Perfluoropolyether Structures as Surface Modifying Agents of UV-Curable Systems," *Macromol. Chem. Phys.*, 1998, pp. 1099-1105, vol. 199.
Choi, W.M. and O.O. Park, "A Soft-Imprint Technique for Direct Fabrication of Submicron Scale Patterns Using a Surface-Modified PDMS Mold," *Microelect. Eng.*, 2003, pp. 131-136, vol. 70, Elsevier.
Chou, S.Y., et al., "Imprint of Sub-25 nm Vias and Trenches in Polymers," *Appl. Phys. Lett.*, 1995, pp. 3114-3116, vol. 67(21).

(Continued)

Primary Examiner — Robert Jones, Jr.
(74) Attorney, Agent, or Firm — Alston & Bird LLP

(57) ABSTRACT

Materials and Methods are provided for fabricating microfluidic devices. The materials include low surface energy fluoropolymer compositions having multiple cure functional groups. The materials can include multiple photocurable and/or thermal-curable functional groups such that laminate devices can be fabricated. The materials also substantially do not swell in the presence of hydrocarbon solvents.

20 Claims, 19 Drawing Sheets

U.S. PATENT DOCUMENTS

| | | | |
|---|---|---|---|
| 6,607,683 B1 | 8/2003 | Harrington | |
| 6,620,196 B1 | 9/2003 | Trieu | |
| 6,645,432 B1 * | 11/2003 | Anderson et al. | 422/502 |
| 6,649,715 B1 | 11/2003 | Smith et al. | |
| 6,653,030 B2 | 11/2003 | Mei et al. | |
| 6,656,308 B2 | 12/2003 | Hougham et al. | |
| 6,656,398 B2 | 12/2003 | Birch et al. | |
| 6,660,192 B1 | 12/2003 | Kim et al. | |
| 6,663,820 B2 | 12/2003 | Arias et al. | |
| 6,673,397 B2 | 1/2004 | Malik | |
| 6,686,184 B1 | 2/2004 | Anderson et al. | |
| 6,689,900 B2 | 2/2004 | Wang et al. | |
| 6,696,220 B2 | 2/2004 | Bailey et al. | |
| 6,699,347 B2 | 3/2004 | Lehrter et al. | |
| 6,719,868 B1 | 4/2004 | Schueller et al. | |
| 6,752,942 B2 | 6/2004 | Kim et al. | |
| 6,753,131 B1 | 6/2004 | Rogers et al. | |
| 6,755,984 B2 | 6/2004 | Lee et al. | |
| 6,759,182 B2 | 7/2004 | Ikeda et al. | |
| 6,770,721 B1 | 8/2004 | Kim | |
| 6,783,717 B2 | 8/2004 | Hougham et al. | |
| 6,808,646 B1 | 10/2004 | Jeans | |
| 6,809,356 B2 | 10/2004 | Chou | |
| 6,828,244 B2 | 12/2004 | Chou | |
| 6,829,050 B2 | 12/2004 | Ikeda et al. | |
| 6,844,623 B1 | 1/2005 | Peterson et al. | |
| 6,849,558 B2 | 2/2005 | Schaper | |
| 6,860,956 B2 | 3/2005 | Bao et al. | |
| 6,869,557 B1 | 3/2005 | Wago et al. | |
| 6,900,881 B2 | 5/2005 | Sreenivasan et al. | |
| 6,923,930 B2 | 8/2005 | Ling et al. | |
| 6,929,899 B2 | 8/2005 | Pottebaum et al. | |
| 6,932,934 B2 | 8/2005 | Choi et al. | |
| 6,936,181 B2 | 8/2005 | Bulthaup et al. | |
| 6,936,194 B2 | 8/2005 | Watts | |
| 6,953,653 B2 | 10/2005 | Smith et al. | |
| 6,964,793 B2 | 11/2005 | Willson et al. | |
| 6,976,424 B2 | 12/2005 | Bruno et al. | |
| 7,070,406 B2 | 7/2006 | Jeans | |
| 7,117,790 B2 | 10/2006 | Kendale et al. | |
| 7,254,278 B2 | 8/2007 | Jung | |
| 7,294,294 B1 | 11/2007 | Wago et al. | |
| 7,588,710 B2 * | 9/2009 | Lee et al. | 264/220 |
| 2002/0156531 A1 | 10/2002 | Felt et al. | |
| 2003/0006527 A1 | 1/2003 | Rabolt et al. | |
| 2003/0062334 A1 | 4/2003 | Lee et al. | |
| 2003/0071016 A1 | 4/2003 | Shih et al. | |
| 2003/0139521 A1 | 7/2003 | Linert et al. | |
| 2003/0205552 A1 | 11/2003 | Hansford et al. | |
| 2004/0028804 A1 | 2/2004 | Anderson et al. | |
| 2004/0046271 A1 | 3/2004 | Watts | |
| 2004/0053009 A1 | 3/2004 | Ozin et al. | |
| 2004/0065252 A1 | 4/2004 | Sreenivasan et al. | |
| 2004/0110856 A1 | 6/2004 | Young et al. | |
| 2004/0123658 A1 | 7/2004 | Kirby et al. | |
| 2004/0137734 A1 | 7/2004 | Chou et al. | |
| 2004/0182711 A1 | 9/2004 | Liang et al. | |
| 2004/0202865 A1 | 10/2004 | Homola et al. | |
| 2004/0217085 A1 | 11/2004 | Jeans | |
| 2004/0219246 A1 | 11/2004 | Jeans | |
| 2005/0038180 A1 | 2/2005 | Jeans | |
| 2005/0061773 A1 | 3/2005 | Choi et al. | |
| 2005/0120902 A1 | 6/2005 | Adams et al. | |
| 2005/0142315 A1 | 6/2005 | DeSimone et al. | |
| 2006/0188598 A1 | 8/2006 | Jeans | |
| 2008/0038398 A1 | 2/2008 | Wago et al. | |

FOREIGN PATENT DOCUMENTS

| | | |
|---|---|---|
| EP | 0 393 263 A1 | 10/1990 |
| EP | 0 525 392 A1 | 2/1993 |
| EP | 0 754 691 A2 | 1/1997 |
| EP | 1 201 672 A2 | 5/2002 |
| EP | 1 551 066 A1 | 7/2005 |
| WO | WO 96/17266 | 6/1996 |
| WO | WO 96/31548 | 10/1996 |
| WO | WO 96/31791 | 10/1996 |
| WO | WO 02/14078 A2 | 2/2002 |
| WO | WO 03/005124 A1 | 1/2003 |
| WO | WO 03/031096 A2 | 4/2003 |
| WO | WO 03/072625 A1 | 9/2003 |
| WO | WO 2005/030822 | 4/2005 |
| WO | WO 2005/080465 | 9/2005 |
| WO | WO 2005/084191 | 9/2005 |
| WO | WO 2005/101466 A2 | 10/2005 |
| WO | WO 2006/083311 A2 | 8/2006 |

OTHER PUBLICATIONS

Colburn, M., "Capillary Fill Time & Meniscus Shape: An Asymmetric, Nonequal Contact Angle, Coplanar Cavity Study," *ChE 385 Project Report*, Available Online at Willson.cm.utexas.edu-...-Surface_Phenomena-Spring1999 Asymetric_Noon_equal_contact_angle_capillary_study, Dec. 3, 1998.

Haatainen, T and J. Ahopelto, "Step & Stamp Imprint Lithography: A Versatile Method For Nanoimprinting," presented at the NNT Conference, Dec. 11-13, 2002 at San-Francisco, CA.

Haatainen, T., and J. Ahopelto, "Pattern Transfer Using Step & Stamp Imprint Lithography," *Physica. Scripta.*, 2003, pp. 357-360, vol. 67.

Haatainen, T., et. al., "Step & Stamp Imprint Lithography Using a Commercial Flip Chip Bonder," *Proceeding of SPIE's 25th Annual International Symposium of Microlithography, Emerging Lithographic Technologies IV* at Santa Clara, CA, 2000, pp. 1-10.

Haisma, J., et al., "Mold-Assisted Nanolithography: A Process for Reliable Pattern Replication," *J. Vac. Sci. Technol.*, 1996, pp. 4124-4128, vol. B14(6).

Hulteen, J.C. and C.R. Martin, "A General Template-Based Method for the Preparation of Nanomaterials," *J. Mater. Chem.*, 1997, pp. 1075-1087, vol. 7(7).

Jackman, R., et al., "Fabricating Large Arrays of Microwells with Arbitrary Dimensions and Filling Them Using Discontinuous Dewetting," *Analytical Chemistry*, 1998, pp. 2280-2287, vol. 70(11).

Krauss, P., et al., Fabrication of Nanodevices Using Sub-25 nm Imprint Lithography, *Presented at NanoStructure Laboratory, Department of Electrical Engineering, University of Minnesota*, Minneapolis, MN, pp. 194-195, Date of Conference: Jun. 24-26, 1996.

Marzolin, C., et al., "Fabrication of Glass Microstructures by Micro-Molding of Sol-Gel Precursors," *Adv.Mater.*, 1998, pp. 571-574, vol. 10(8).

Suh, K.Y. et al., "Capillary Force Lithography," *Adv. Mater.*, 2001, pp. 1386-1389, vol. 13(18).

Suh, K.Y., and H.H. Lee, "Capillary Force Lithography: Large-Area Patterning, Self-Organization, and Anisotropic Dewetting," *Adv. Funct. Mater.*, 2002, pp. 405-413, vol. 12(6+7).

Tan, H., et al., "Roller Nanoimprint Lithography," *J Vac. Sci. Technol.*, 1998, pp. 3926-3928, vol. B16(6).

Themistou, E., and C.S. Patrickios, "Synthesis and Characterization of Star Polymers and Cross-Linked Star Polymer Model Networks Containing a Novel, Silicon-Based, Hydrolyzable Cross-Linker," *Macromolecules*, 2004, pp. 6734-6743, vol. 37(18).

Trombetta, T., et al., "Novel Branched Fluorinated Oligourethane Cationomers for Low Surface Tension Treatments," *Progr. Colloid. Polym. Sci.*, 2004, pp. 47-53, vol. 124.

Turri, S., et al., "Novel Glass Fiber-Reinforced Composites Having a UV and Peroxy Curable Fluoropolymer Matrix," *Macromol. Mater. Eng.*, 2003, pp. 708-716, vol. 288(9).

Wood, C.D., et al., "New Fluoropolymer Materials," *J. Fluor. Chem.*, 2004, pp. 1671-1676, vol. 125, Elsevier.

Xia, Y., et al., "Complex Optical Surfaces by Replica Molding Against Elastomeric Masters," *Sci. New Series*, 1996, pp. 347-349, vol. 274(5273).

Yin, Y. and Y. Xia, "Self-Assembly of Monodispersed Spherical Colloids into Complex Aggregates with Well-Defined Sizes, Shapes, and Structures," *Adv. Mater.*, 2001, pp. 267-271, vol. 13(4).

"Silicon Compounds," 2004, Gelest, XP002533455, pg. 215-386.

Solvay Solexis, Fomblin® Z Derivatives Product Data Sheet, 2002, p. 1-3.

Database Accession No. 002498839, Mar. 13, 1987.

Database Accession No. 002571416, Jun. 24, 2003.

Database Accession No. 002571417, May 10, 1998.

* cited by examiner

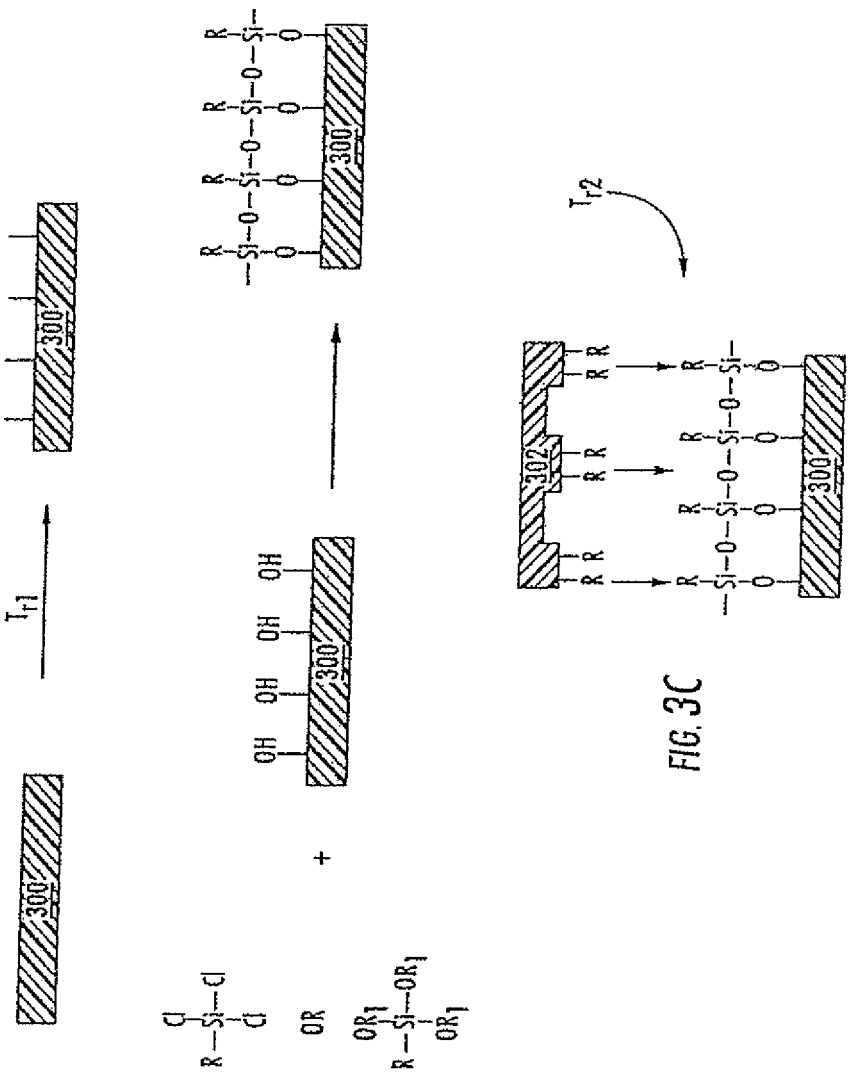

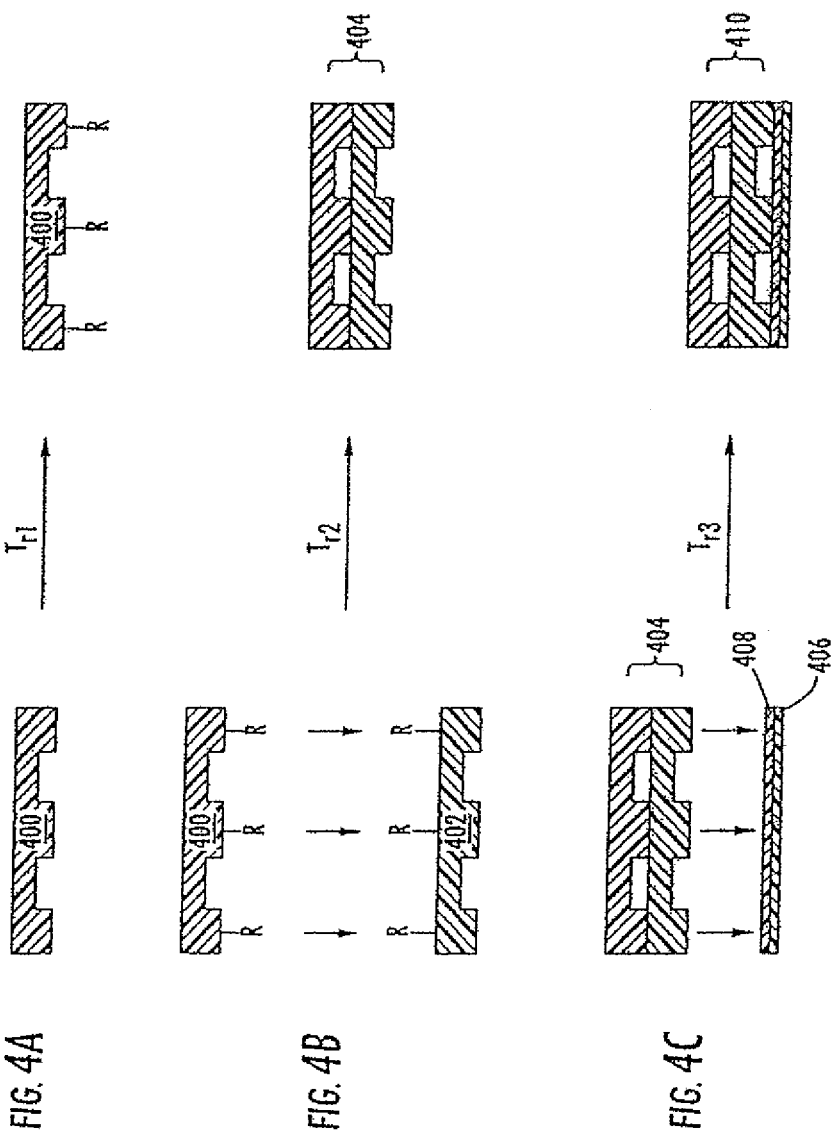

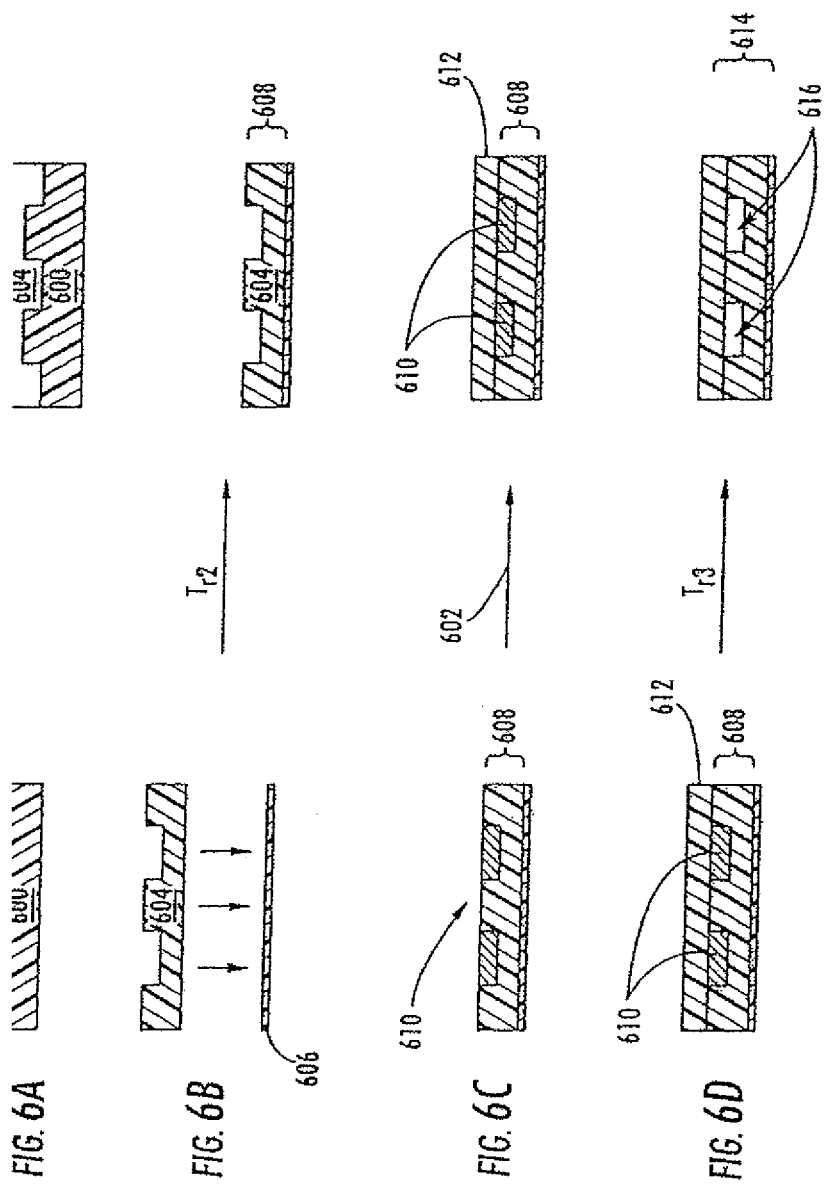

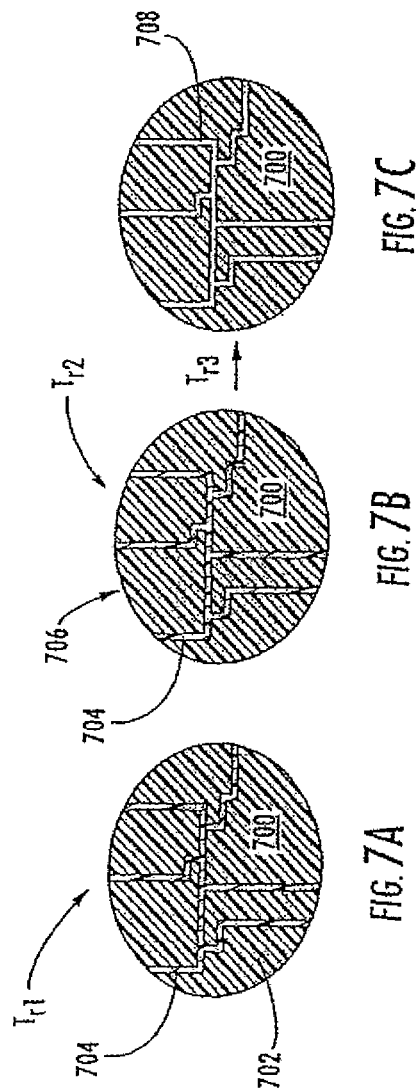

METHODS AND MATERIALS FOR FABRICATING MICROFLUIDIC DEVICES

CROSS REFERENCE TO RELATED APPLICATIONS

This application is a divisional of U.S. application Ser. No. 12/063,284, filed May 29, 2009 now U.S. Pat. No. 8,158,728, which is a U.S. national stage application of PCT/US06/031607, filed Aug. 9, 2006, which claims the benefit of U.S. Provisional Patent Application Ser. No. 60/706,786, filed Aug. 9, 2005; U.S. Provisional Patent Application Ser. No. 60/732,727, filed Nov. 2, 2005; and U.S. Provisional Patent Application Ser. No. 60/799,317 filed May 10, 2006; each of which is incorporated herein by reference in its entirety.

This application is also based on a Continuation in part of PCT International Patent Application Serial No. PCT/US05/04421, filed Feb. 14, 2005, which is based on and claims priority to U.S. Provisional Patent Application Ser. No. 60/544,905, filed Feb. 13, 2004, each of which is incorporated herein by reference in its entirety.

FEDERALLY SPONSORED RESEARCH OR DEVELOPMENT

This invention was made with U.S. Government support from Office of Naval Research No. N000140210185 and STC program of the National Science Foundation under Agreement No. CHE-9876674. The U.S. Government has certain rights in the invention.

TECHNICAL FIELD

Generally, the present invention relates to materials and methods for fabricating polymeric devices. More particularly the polymeric devices can be multi-layered devices such as microfluidic devices.

ABBREVIATIONS

AC=alternating current
Ar=Argon
° C.=degrees Celsius
cm=centimeter
8-CNVE=perfluoro(8-cyano-5-methyl-3,6-dioxa-1-octene
CSM=cure site monomer
CTFE=chlorotrifluoroethylene
g=grams
h=hours
1-HPFP=1,2,3,3,3-pentafluoropropene
2-HPFP=1,1,3,3,3-pentafluoropropene
HFP=hexafluoropropylene
HMDS=hexamethyldisilazane
IL=imprint lithography
IPDI=isophorone diisocyanate
MCP=microcontact printing
Me=methyl
MEA=membrane electrode assembly
MEMS=micro-electro-mechanical system
MeOH=methanol
MIMIC=micro-molding in capillaries
mL=milliliters
mm=millimeters
mmol=millimoles
$M_n$=number-average molar mass
m.p.=melting point
mW=milliwatts
NCM=nano-contact molding
NIL=nanoimprint lithography
nm=nanometers
Pd=palladium
PAVE=perfluoro(alkyl vinyl)ether
PDMS=poly(dimethylsiloxane)
PEM=proton exchange membrane
PFPE=perfluoropolyether
PMVE=perfluoro(methyl vinyl)ether
PPVE=perfluoro(propyl vinyl)ether
PSEPVE=perfluoro-2-(2-fluorosulfonylethoxy)propyl vinyl ether
PTFE=polytetrafluoroethylene
SAMIM=solvent-assisted micro-molding
SEM=scanning electron microscopy
Si=silicon
TFE=tetrafluoroethylene
μm=micrometers
UV=ultraviolet
W=watts
ZDOL=poly(tetrafluoroethylene oxide-co-difluoromethylene oxide)α,ω diol

BACKGROUND OF THE INVENTION

Microfluidic devices developed in the early 1990s were fabricated from hard materials, such as silicon and glass, using photolithography and etching techniques. See Ouellette, J., *The Industrial Physicist* 2003, August/September, 14-17; Scherer, A., et al., *Science* 2000, 290, 1536-1539. Photolithography and etching techniques, however, are costly and labor intensive, require clean-room conditions, and pose several disadvantages from a materials standpoint. For these reasons, soft materials have emerged as alternative materials for microfluidic device fabrication. The use of soft materials has made possible the manufacture and actuation of devices containing valves, pumps, and mixers. See e.g., Ouellette, J., *The Industrial Physicist* 2003, August/September, 14-17; Scherer, A., et al., *Science* 2000, 290, 1536-1539; Unger, M. A., et al., *Science* 2000, 288, 113-116; McDonald, J. C., et al., *Acc. Chem. Res.* 2002, 35, 491-499; and Thorsen, T., et al., *Science* 2002, 298, 580-584. For example, one such microfluidic device allows for control over flow direction without the use of mechanical valves. See Zhao, B., et al., *Science* 2001, 291, 1023-1026.

The increasing complexity of microfluidic devices has created a demand to use such devices in a rapidly growing number of applications. To this end, the use of soft materials has allowed microfluidics to develop into a useful technology that has found application in genome mapping, rapid separations, sensors, nanoscale reactions, ink jet printing, drug delivery, Lab-on-a-Chip, in vitro diagnostics, injection nozzles, biological studies, and drug screening. See, e.g., Ouellette, J., *The Industrial Physicist* 2003, August/September, 14-17; Scherer, A., et al., *Science* 2000, 290, 1536-1539; Unger, M. A. et al., *Science* 2000, 288, 113-116; McDonald, J. C., et al., *Acc. Chem. Res.* 2002, 35, 491-499; Thorsen, T., et al., *Science* 2002, 298, 580-584; and Liu, J., et al., *Anal. Chem.* 2003, 75, 4718-4723.

Poly(dimethylsiloxane) (PDMS) is the soft material of choice for many microfluidic device applications. See Scherer, A., et al., *Science* 2000, 290, 1536-1539; Unger, M. A., et al., *Science* 2000, 288, 113-116; McDonald, J. C., et al., *Acc. Chem. Res.* 2002, 35, 491-499; Thorsen, T., et al., *Science* 2002, 298, 580-584; and Liu, J., et al., *Anal. Chem.* 2003, 75, 4718-4723. A PDMS material offers numerous attractive properties in microfluidic applications. Upon cross-linking, PDMS becomes an elastomeric material with a low Young's modulus, e.g., approximately 750 kPa. See Unger, M. A., et al., *Science* 2000, 288, 113-116. This property allows PDMS to conform to surfaces and to form reversible seals. Further, PDMS has a low surface energy, e.g., approximately 20 erg/cm$^2$, which can facilitate its release from molds after patterning. See Scherer, A., et al., *Science* 2000, 290, 1536-1539; McDonald, J. C., et al., *Acc. Chem. Res.* 2002, 35, 491-499.

Another important feature of PDMS is its outstanding gas permeability. This property allows gas bubbles within the channels of a microfluidic device to permeate out of the device. This property also is useful in sustaining cells and microorganisms inside the features of the microfluidic device. The nontoxic nature of silicones, such as PDMS, also is beneficial in this respect and allows for opportunities in the realm of medical implants. McDonald, J. C., et al., *Acc. Chem. Res.* 2002, 35, 491-499.

Many current PDMS microfluidic devices are based on SYLGARD® 184 (Dow Corning, Midland, Mich., United States of America). SYLGARD® 184 is cured thermally through a platinum-catalyzed hydrosilation reaction. Complete curing of SYLGARD® 184 can take as long as five hours. The synthesis of a photocurable PDMS material, however, with mechanical properties similar to that of SYLGARD® 184 for use in soft lithography recently has been reported. See Choi, K. M., et al., *J. Am. Chem. Soc.* 2003, 125, 4060-4061.

Despite the aforementioned advantages, PDMS suffers from multiple drawbacks in microfluidic applications. First, PDMS swells in most organic solvents. Thus, PDMS-based microfluidic devices have a limited compatibility with various organic solvents. See Lee, J. N., et al., *Anal. Chem.* 2003, 75, 6544-6554. Among those organic solvents that swell PDMS are hexanes, ethyl ether, toluene, dichloromethane, acetone, and acetonitrile. See Lee, J. N., et al., *Anal. Chem.* 2003, 75, 6544-6554. The swelling of a PDMS microfluidic device by organic solvents can disrupt its micron-scale features, e.g., a channel or plurality of channels, and can restrict or completely shut off the flow of organic solvents through the channels. Thus, microfluidic applications with a PDMS-based device are limited to the use of fluids, such as water, that do not swell PDMS. As a result, those applications that require the use of organic solvents likely will need to use microfluidic systems fabricated from hard materials, such as glass and silicon. See Lee J. N., et al., *Anal. Chem.* 2003, 75, 6544-6554. This approach, however, is limited by the disadvantages of fabricating microfluidic devices from hard materials.

Second, PDMS-based devices and materials are notorious for not being adequately inert to be used even in aqueous-based chemistries. For example, PDMS is susceptible to reaction with weak and strong acids and bases. PDMS-based devices also are notorious for containing extractables, such as extractable oligomers and cyclic siloxanes, especially after exposure to acids and bases. Because PDMS is easily swollen by organics, hydrophobic materials, even those hydrophobic materials that are slightly soluble in water, can partition during use into PDMS-based materials used to construct PDMS-based microfluidic devices.

Thus, an elastomeric material that exhibits the attractive mechanical properties of PDMS combined with a resistance to swelling in common organic solvents would extend the use of microfluidic devices to a variety of new chemical applications that are inaccessible by current PDMS-based devices. Accordingly, the approach demonstrated by the presently disclosed subject matter uses an elastomeric material, more particularly a functional perfluoropolyether (PFPE) material, which is resistant to swelling in common organic solvents to fabricate a microfluidic device.

Functional PFPE materials are liquids at room temperature, exhibit low surface energy, low modulus, high gas permeability, and low toxicity with the added feature of being extremely chemically resistant. See Scheirs, J., *Modern Fluoropolymers*; John Wiley & Sons, Ltd.: New York, 1997; pp 435-485. Further, PFPE materials exhibit hydrophobic and lyophobic properties. For this reason, PFPE materials are often used as lubricants on high-performance machinery operating in harsh conditions. The synthesis and solubility of PFPE materials in supercritical carbon dioxide has been reported. See Bunyard, W., et al., *Macromolecules* 1999, 32, 8224-8226. Beyond PFPEs, fluoroelastomers also can include fluoroolefin-based materials, including, but not limited to, copolymers of tetrafluoroethylene, hexafluoropropylene, vinylidene fluoride and alkyl vinyl ethers, often with additional cure site monomers added for crosslinking.

A PFPE microfluidic device has been previously reported by Rolland, J. et al. *JACS* 2004, 126, 2322-2323. The device was fabricated from a functionalized PFPE material (e.g., a PFPE dimethacrylate (MW=4,000 g/mol)) having a viscosity of the functionalized material of approximately 800 cSt. This material was end-functionalized with a free radically polymerizable methacrylate group and UV photocured free radically with a photoinitiator. In Rolland, J. et al., supra, multilayer PFPE devices were generated using a specific partial UV curing technique, however, the adhesion was weak and generally not strong enough for a wide range of microfluidic applications. Further, the adhesion technique described by Rolland, J. et al. did not provide for adhesion to other substrates such as glass.

The presently disclosed subject matter describes the use of fluoroelastomers, especially a functional perfluoropolyether as a material for fabricating a solvent-resistant micro- and nano-scale structures, such as a microfluidic device. The use of fluoroelastomers and functional perfluoropolyethers in particular as materials for fabricating a microfluidic device addresses the problems associated with swelling in organic solvents exhibited by microfluidic devices made from other polymeric materials, such as PDMS. Accordingly, PFPE-based microfluidic devices can be used in conjunction with chemical reactions that are not amenable to other polymeric microfluidic devices.

Further, adequate adhesion between the layers of a multilayer microfluidic device can impact performance in most if not all applications. For example, adhesion can impact performance in microfluidic devices, such as those described by Unger et al., *Science*, 288, 113-6 (2000), which contain multiple layers allowing for the formation of pneumatic valves. Thus, there is a need in the art for improved methods for adhering the layers of a microfluidic device together or to other surfaces.

Furthermore, many devices, such as surgical instruments, medical devices, prosthetic implants, contact lenses, and the like, are formed from polymeric materials. Polymeric materials commonly used in the medical device industry include, but are not limited to polyurethanes, polyolefins (e.g., polyethylene and polypropylene), poly(meth)acrylates, polyesters (e.g., polyethyleneterephthalate), polyamides, polyvinyl resins, silicone resins (e.g., silicone rubbers and polysiloxanes), polycarbonates, polyfluorocarbon resins, synthetic resins, polystyrene, various bioerodible materials, and the like. Although these and other materials commonly used as implant materials have proven to be useful there are many drawbacks with the materials. One drawback is that with any implant there is always the chance of bio-fouling on the surface of the implant. Bio-fouling can occur due to the tissue/implant interface gap and the surface characteristics of the implant material. Accordingly, a need exists for improving the polymeric materials and/or functionalizing the materials or the surface of the medical device materials to generate a better tissue/device interface and reduce bio-fouling.

BRIEF SUMMARY OF THE INVENTION

According to an embodiment of the present invention, a polymer composition includes a first component including a fluoropolymer having a first curable functional group and a second component including a fluoropolymer having a second curable functional group. In some embodiments, the composition further includes a third component including a fluoropolymer having a third curable functional group. According to some embodiments, at least one of the fluoropolymer having a first curable functional group or the fluoropolymer having a second curable functional group comprises a perfluoropolyether. In alternative embodiments, at least one of the fluoropolymer having a first curable functional group, the fluoropolymer having a second curable functional group, or the fluoropolymer having a third curable functional group comprises a low surface energy polymeric material.

In some embodiments, the first curable functional group includes a first photocurable functional group. In some embodiments, the first photocurable functional group includes a photocurable diurethane methacrylate. In some embodiments, the second curable functional group includes a second photocurable functional group, which can include a photocurable diepoxy.

According to some embodiments, the second curable functional group includes a first thermal-curable functional group. In some embodiments, the first thermal-curable functional group includes a diisocyanate, a diepoxy, or a diamine. In some embodiments, the third curable functional group includes a second thermal-curable functional group that includes a triol, or a tetrol. The composition can include the combination wherein the first curable functional group includes a photocurable diurethane methacrylate, the second curable functional group includes a diisocyanate, and the third curable functional group includes a triol. According to other embodiments, the composition can include the combination wherein the first curable functional group includes a photocurable diurethane methacrylate, the second curable functional group includes a diisocyanate, and the third curable functional group includes a tetrol. In other embodiments, the composition can include the combination wherein the first curable functional group includes a photocurable diurethane methacrylate, the second curable functional group includes a diepoxy, and the third curable functional group includes a diamine. In still further embodiments, the composition can include the combination wherein the first curable functional group includes a photocurable diurethane methacrylate and the second curable functional group includes a photocurable diepoxy. In further embodiments, composition can include the combination wherein the first curable functional group includes a photocurable diurethane methacrylate and the second curable functional group includes a diisocyanate. According to some embodiments, the material of the present invention can include a fluoropolymer fabricated from a fluoroalkyliodide precursor.

According to some embodiments, the first photocurable functional group reacts at a first wavelength and the second photocurable functional group react at a second wavelength. In other embodiments, the first thermal-curable functional group reacts at a first time period and the second thermal-curable functional group reacts at a second time period. According to other embodiments, the first thermal-curable functional group reacts at a first temperature and the second thermal-curable functional group reacts at a second temperature. According to some embodiments, the second curable functional group remains viable after the first curable functional group is activated such that the second curable functional group can bind with a group consisting of another polymer, a hydroxyl group, another functional group, and combinations thereof.

In some embodiments, the perfluoropolyether is encapped with cycloaliphatic epoxides moieties. In some embodiments, the perfluoropolyether has a molecular weight of about 16000 and a modulus of about 800 kPa. In other embodiments, the perfluoropolyether has a molecular weight of less than about 16000. In further embodiments, the perfluoropolyether has a modulus of greater than about 500 kPa. In other embodiments, the perfluoropolyether has a molecular weight of about 16000 and a percent elongation at break of about 200 percent. According to some embodiments, the perfluoropolyether has a percent elongation at break of less than about 200 percent. In other embodiments, one of the first component or the second component includes a fluoropolymer having an elongation at break of about 300 percent. In yet other embodiments, one of the first component or the second component includes a fluoropolymer having an elongation at break of about 200 percent. In other embodiments, one of the first component or the second component includes a fluoropolymer having an elongation at break of between about 100 percent and about 300 percent. According to some embodiments, one of the first component or the second component includes a perfluoropolyether having an elongation at break of between about 200 percent and about 300 percent.

According to some embodiments, a polymer composition includes a fluoropolymer having at least two functional groups, wherein after a first functional group is activated to polymerize the fluoropolymer, a second functional group remains activatable to adhere the fluoropolymer to another chemical group. In some embodiments, the another chemical group is selected from the group of another polymer, a hydroxyl group, another functional group, and combinations thereof.

According to some embodiments of the present invention, a microfluidic device includes a first fluoropolymer component, wherein the first fluoropolymer component includes a perfluoropolyether. In some embodiments, the first fluoropolymer component includes a first curable functional group and can also include a second fluoropolymer component having a second curable functional group. In some embodiments, the first curable functional group includes a first photocurable functional group and the second curable functional group includes a first thermal-curable functional group. According to other embodiments, the second curable functional group includes a second photocurable functional group.

In some embodiments, the first photocurable functional group includes a photocurable diurethane methacrylate, or a photocurable diepoxy. In some embodiments, the first thermal-curable functional group includes a diisocyanate, a diepoxy, or a diamine. In further embodiments, the microfluidic device further includes a third fluoropolymer component, wherein the third fluoropolymer component includes a third curable functional group. In some embodiments, the third curable functional group includes a second thermal-curable functional group such as a triol or a tetrol.

According to some embodiments, the microfluidic device includes a composition wherein the first curable functional group includes a photocurable diurethane methacrylate, the second curable functional group includes a diisocyanate, and the third curable functional group includes a triol. According to some embodiments, the microfluidic device includes a composition wherein the first curable functional group includes a photocurable diurethane methacrylate, the second curable functional group includes a diisocyanate, and the third curable functional group includes a tetrol. According to some embodiments, the microfluidic device includes a composition wherein the first curable functional group includes a photocurable diurethane methacrylate, the second curable functional group includes a diepoxy, and the third curable functional group includes a diamine. According to some embodiments, the microfluidic device includes a composition wherein the first curable functional group includes a photocurable diurethane methacrylate and the second curable functional group includes a photocurable diepoxy. According to some embodiments, the microfluidic device includes a composition wherein the first curable functional group includes a photocurable diurethane methacrylate and the second curable functional group includes a diisocyanate. According to some embodiments, the microfluidic device includes a composition wherein the first curable functional group comprises a first photocurable functional group, and wherein the first photocurable functional group and the second photocurable functional group react to different wavelengths. According to some embodiments, the microfluidic device includes a composition wherein at least one of the first fluoropolymer component, the second fluoropolymer component, and the third fluoropolymer component comprises a perfluoropolyether. According to some embodiments, the microfluidic device includes a composition wherein the first fluoropolymer component, the second fluoropolymer component, and the third fluoropolymer component comprises a perfluoropolyether.

In other embodiments, the microfluidic device includes a siloxane component coupled with a first fluoropolymer component. In some embodiments, the microfluidic device has a first fluoropolymer component coupled with a siloxane component forming an adhesion that can withstand up to about 120 pounds per square inch (psi). In some embodiments, the first fluoropolymer component of the microfluidic device has an elongation at break of about 300 percent. In other embodiments, the first fluoropolymer component has an elongation at break of about 200 percent. In further embodiments, the first fluoropolymer component has an elongation at break of between about 100 percent and about 300 percent. In yet further embodiments, the first fluoropolymer component has an elongation at break of between about 200 percent and about 300 percent. In other embodiments, the fluoropolymer includes a low surface energy fluoropolymer. In some embodiments, the low surface energy fluoropolymer includes a surface energy of less than about 20 dynes/cm. In other embodiments, the low surface energy fluoropolymer includes a surface energy of less than about 18 dynes/cm, less than about 15 dynes/cm, or less than about 12 dynes/cm.

According to some embodiments, the microfluidic device includes a component selected from the group of: diurethane methacrylate; chain-extended diurethane methacrylate; diisocyanate; chain extended diisocyanate; blocked diisocyanate; PFPE three-armed triol; PFPE distyrene; diepoxy; diamine; thermally cured PU-tetrol; thermally cured PU-triol; thermally cured epoxy; photocured epoxy, and combinations thereof.

In some embodiments, the microfluidic device includes a first fluoropolymer component that is substantially free of trace metals. In other embodiments, the first fluoropolymer component is substantially solvent resistant. In some embodiments, the first fluoropolymer component swells less than about 10% by weight when in communication with an organic solvent. In other embodiments, the fluoropolymer component swells less than about 5% by weight when in communication with an organic solvent.

In some embodiments, the fluoropolymer component has a carbon to fluorine ratio of about 1:2, while in other embodiments, the fluoropolymer component has a carbon to fluorine ratio of about 1:1. According to some embodiments, the fluoropolymer component has a carbon to fluorine ratio of about 2:1. In further embodiments, the fluoropolymer component has a carbon to fluorine ratio of between about 1:1 and about 2:1. According to yet further embodiments, the fluoropolymer component has a carbon to fluorine ratio of between about 1:1 and about 1:2.

According to some embodiments, the microfluidic device further includes lamination between a first part and a second part wherein the laminate includes a chemical bond between the first part and the second part and wherein the first part does not delaminate from the second part under a pressure of about 120 pounds per square inch. In some embodiments, the microfluidic device includes a first part defining a channel therein and a valve positioned within the channel, wherein the valve can be actuated at a pressure between about 40 psi and about 60 psi without damaging the microfluidic device. In some embodiments, the microfluidic device includes a first fluoropolymer component including a coating on a channel of the microfluidic device.

In some embodiments, the microfluidic device includes a first fluoropolymer component having a molecular weight of about 16000 and a modulus of about 800 kPa. In other embodiments, the first fluoropolymer component has a molecular weight of less than about 16000. In some embodiments, the first fluoropolymer component has a modulus of greater than about 500 kPa. In further embodiments, the first fluoropolymer component has a molecular weight of about 16000 and a percent elongation at break of about 200 percent. In some embodiments, the first fluoropolymer component has a percent elongation at break of less than about 200 percent.

According to some embodiments, a microfluidic device includes a perfluoropolyether epoxy-containing a PAG; wherein the combination is blended with about 1 to about 5 mole % of a free radical photoinitiator selected from the group consisting of 2,2-dimethoxyacetophenone, 1-hydroxy cyclohexyl phenyl ketone, or diethoxyacetophenone. In other embodiments, the microfluidic device includes a perfluoropolyether epoxy-containing a PAG is photocurable at two or more wavelengths. In some embodiments, a microfluidic device includes a first part configured from a perfluoropolyether and a second part configured from a silicone. According to an embodiment of the present invention a micro device is prepared by a process including treating the device with a solution comprising 0.5% Fluorine gas in Nitrogen such that the Fluorine reacts free radically with hydrogen atoms in the device and thereby passivates a surface of the device.

According to some embodiments, a microfluidic device is prepared by the process including adding a fluorinated fluid to a polymer precursor of the microfluidic device, wherein the polymer precursor includes a photocurable or a thermalcurable precursor, curing the polymer by treating the polymer with photo radiation or thermal energy, respectively, and removing the fluorinated fluid from the cured polymer. In some embodiments the removing is an evaporation process, or a dissolving process. According to alternative embodiments, a concentration of the fluorinated fluid is less than about 15%, less than about 10%, or less than about 5%.

In some embodiments, a micro device of the present invention includes a surface passivated with an end-capped precursor. In some embodiments, the end-capped precursor includes a styrene end-capped liquid precursor. In alternative embodiments, the surface includes a surface of a valve, a channel, a reservoir, a membrane, or a wall.

According to alternative embodiments of the present invention, component part of a microfluidic device include valves, membranes, channels, reservoirs, wells, lids, and the like. In some embodiments, the component parts are fabricated from a first polymer component, wherein the first polymer component includes a fluoropolymer having a first curable functional group and a second polymer component, wherein the second polymer component includes a fluoropolymer having a second curable functional group. In some embodiments, the component part includes a third polymer component, wherein the third polymer component includes a fluoropolymer having a third curable functional group. According to some embodiments, the component part includes a composition wherein at least one of the fluoropolymer having a first curable functional group, the fluoropolymer having a second curable functional group, or the fluoropolymer having a third curable functional group comprises a perfluoropolyether. In other embodiments, the component part includes a composition wherein at least one of the fluoropolymer having a first curable functional group, the fluoropolymer having a second curable functional group, or the fluoropolymer having a third curable functional group comprises a low surface energy polymeric material. In some embodiments, the fluoropolymer has a first curable functional group includes a photocurable functional group. In some embodiments, the component part includes a fluoropolymer having a second curable functional group includes a thermal-curable functional group. In other embodiments, the component part includes a photocurable functional group selected from the group of photocurable diurethane methacrylate, photocurable diepoxy, and combinations thereof. In some embodiments, the thermal-curable functional group can be triol, diisocyanate, tetrol, diepoxy, diamine, or combinations thereof. In other embodiments, the first curable functional group and the second curable functional group is selected from the group consisting of diurethane methacrylate; chain-extended diurethane methacrylate; diisocyanate; chain extended diisocyanate; blocked diisocyanate; PFPE three-armed triol; PFPE distyrene; diepoxy; diamine; thermally cured PU-tetrol; thermally cured PU-triol; thermally cured epoxy; and photo-cured epoxy, and combinations thereof. In some embodiments, the component part includes a membrane or valve having at least two layer, wherein the layers include a perfluoropolyether laminate having a distyrene material laminated to a perfluoropolyether diurethane methacrylate material.

In some embodiments the component part includes a fluoropolymer having pores defined therein. In alternative embodiments, the pores are less than about 15 percent, less than about 10 percent, or less than about 5 percent.

According to some embodiments of the present invention, a method of making a micro device includes fabricating a microfluidic device from a fluoropolymer. In some embodiments, the fluoropolymer includes perfluoropolyether. In other embodiments, the fluoropolymer includes a first fluoropolymer component having a first curable functional group and a second fluoropolymer component having a second curable functional group. According to some embodiments, the first curable functional group includes a photocurable functional group and the second curable functional group includes a thermal-curable functional group.

According to some embodiments, a method of making a microfluidic device includes removing trace metals from a polymer and using the polymer to fabricate a microfluidic device, wherein the microfluidic device is substantially free from trace metals. In some embodiments, the polymer includes a fluoropolymer and in some embodiments, the fluoropolymer includes perfluoropolyether.

According to some embodiments of the present invention, a method for conducting reactions includes providing a microfluidic device having a polymer substantially free from trace metals and conducting reactions involving F— in the microfluidic device such that the F— is substantially not quenched by trace metals in the polymer of the microfluidic device.

In some embodiments of the present invention, a method for fabricating a microfluidic device includes casting a fluoropolymer onto a master template, wherein the master template includes a dimensional pattern, curing the fluoropolymer such that the fluoropolymer retains a substantial mirror image of the dimensional pattern, casting a poly(dimethylsiloxane) onto the cured fluoropolymer, curing the poly(dimethylsiloxane) such that the poly(dimethylsiloxane) retains a substantial mirror image of the pattern of the cured fluoropolymer, and using the cured poly(dimethylsiloxane) as a mold for molding further fluoropolymer components.

According to other embodiments of the present invention, a method for fabrication of a microfluidic device includes spin coating a thin layer of uncured polymer onto a first portion of a microfluidic device, positioning the first portion on a second portion of the microfluidic device such that the spin coated thin layer is in communication with the second portion of the microfluidic device, and curing the combination such that the spin coated thin layer is cured.

According to some embodiments, a method of increasing chemical compatibility of a polymeric device includes treating a polymeric device comprising a latent methacrylate, acrylate, and/or styrene group with a solution comprising a styrene end-capped precursor solution, evaporating or dissolving the solution such that a film of the styrene end-capped precursor remains on a surface of the polymeric device, and curing the styrene end-capped precursor film such that the film adheres to the surface of the polymeric device through reaction with latent methacrylate, acrylate, and/or styrene groups of the polymeric device.

In some embodiments of the present invention, a method of using a micro device includes fabricating a microfluidic device from a fluoropolymer, wherein the microfluidic device includes a channel and flowing a liquid at least partially through the channel. In some embodiments, the liquid includes an organic solvent, such as a hydrocarbon solvent. In alternative embodiments, the hydrocarbon solvent is selected from the group of tetrahydrofuran, toluene, dichloromethane, hexanes, chloroform, isopropyl alcohol, cyclohexane, methyl ethyl ketone, acetone, and combinations thereof. According to other methods of using a microfluidic device, a method is provided where the microfluidic device is fabricated from a fluoropolymer that is substantially free of trace metals and wherein the liquid includes F—. In alternative embodiments, a method of using a microfluidic device includes providing a microfluidic device having a channel, wherein the channel is partially coated with a fluoropolymer and introducing a substance into the channel of the microfluidic device, wherein the substance includes an organic solvent such as a hydrocarbon solvent.

In some embodiments, a fluoropolymer component is combined with a polymer component. In some embodiments the fluoropolymer and the polymer are not miscible. In some embodiments, the fluoropolymer and the polymer are miscible.

According to other embodiments, a microfluidic device includes a first component including a polymer having a first curable functional group and a second component including a polymer having a second curable functional group. In some embodiments, the first curable functional group includes a photocurable functional group and the second curable functional group includes a thermalcurable functional group. In some embodiments, the first curable functional includes a first photocurable functional group and the second curable functional group includes a second photocurable functional group and the first photocurable functional group is curable at a first wavelength and the second photocurable functional group is curable at a second wavelength. In some embodiments, the first curable functional group includes a first thermalcurable functional group and the second curable functional group includes a second thermalcurable functional group and the first thermalcurable functional group is curable at a first temperature and the second thermalcurable functional group is curable at a second temperature. According to some embodiments, the first curable functional group includes a first thermalcurable functional group and the second curable functional group includes a second thermalcurable functional group and the first thermalcurable functional group is curable at a first elapsed time and the second thermalcurable functional group is curable at a second elapsed time.

In some embodiments, the photocurable functional group includes a photocurable diurethane methacrylate and the thermalcurable functional group includes a diisocyanate. In other embodiments, the photocurable functional group includes a photocurable diurethane methacrylate and the thermalcurable functional group includes a diepoxy. In some embodiments, the photocurable functional group includes a photocurable diurethane methacrylate and the thermalcurable functional group includes a diamine. In some embodiments, the first photocurable functional group includes a photocurable diurethane methacrylate and the second photocurable functional group includes a photocurable diepoxy.

According to some embodiments, the composition further includes a polymer having a third curable functional group. In some embodiments, the first curable functional group includes a photocurable diurethane methacrylate, the second curable functional group includes a thermalcurable diisocyanate, and the third curable functional group includes a thermalcurable triol. In some embodiments, the first curable functional group includes a photocurable diurethane methacrylate, the second curable functional group includes a thermalcurable diisocyanate, and the third curable functional group includes a thermalcurable tetrol. In some embodiments, the first curable functional group includes a photocurable diurethane methacrylate, the second curable functional group includes a thermalcurable diepoxy, and the third curable functional group includes a thermalcurable diamine.

According to some embodiments of the present invention, a microfluidic device includes a membrane. The membrane comprises a first component including a polymer having a first curable functional group and a second component including a polymer having a second curable functional group. In some embodiments, the first curable functional group includes a photocurable functional group and the second curable functional group includes a thermalcurable functional group. In some embodiments, the first curable functional group includes a first photocurable functional group and the second curable functional group includes a second photocurable functional group and the first photocurable functional group is curable at a first wavelength and the second photocurable functional group is curable at a second wavelength. In other embodiments, the first curable functional group includes a first thermalcurable functional group and the second curable functional group includes a second thermalcurable functional group and the first thermalcurable functional group is curable at a first temperature and the second thermalcurable functional group is curable at a second temperature. In yet other embodiments, the first curable functional group includes a first thermalcurable functional group and the second curable functional group includes a second thermalcurable functional group and the first thermalcurable functional group is curable at a first elapsed time and the second thermalcurable functional group is curable at a second elapsed time.

According to some embodiments, a microfluidic device includes expanded polytetrafluoroethylene having perfluoropolyether cured in a pore of the expanded polytetrafluoroethylene. In some embodiments, the perfluoropolyether includes a curable functional group. According to some embodiments, the curable functional group includes a photocurable functional group, such as a photocurable diurethane methacrylate or a photocurable diepoxy. In other embodiments, the curable function group includes a thermalcurable functional group, such as a thermalcurable diisocyanate, diepoxy, diamine, triol, tetrol, or combinations thereof. In other embodiments, the perfluoropolyether includes a perfluoropolyether distyrene.

According to some embodiments, a method of making a microfluidic device includes providing a surface composed at least partially of expanded polytetrafluoroethylene, wetting the expanded polytetrafluoroethylene with a curable perfluoropolyether such that the perfluoropolyether enters pores of the expanded polytetrafluoroethylene and curing the perfluoropolyether. In some embodiments, the curable perfluoropolyether includes a curable functional group and a second curable functional group. According to some embodiments, the curable functional group includes a photocurable functional group or a thermalcurable functional group. In other embodiments, the curable perfluoropolyether includes a photocurable functional group and a thermalcurable functional group.

BRIEF DESCRIPTION OF THE DRAWINGS

FIGS. 3A-3C are schematic representations of an embodiment of the presently disclosed method for adhering a functional device to a treated substrate.

FIGS. 4A-4C are schematic representations of an embodiment of the presently disclosed method for fabricating a multilayer device.

FIG. 5A is a schematic representation of an embodiment of the presently disclosed method for functionalizing the interior surface of a channel.

FIG. 5B is a schematic representation of an embodiment of the presently disclosed method for functionalizing a surface of a device.

FIGS. 6A-6D are schematic representations of an embodiment of the presently disclosed method for fabricating a microstructure using a degradable and/or selectively soluble material.

FIGS. 7A-7C are schematic representations of an embodiment of the presently disclosed method for fabricating complex structures in a device using degradable and/or selectively soluble materials.

FIG. 12A is a photomicrograph of an open valve and FIG. 12B is a photomicrograph of a valve closed at about 45 psi.

DETAILED DESCRIPTION OF THE INVENTION

Figure 1A:
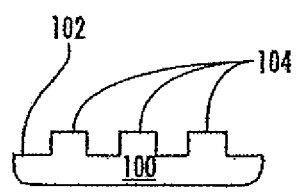
FIGS. 1A-1C are a series of schematic end views depicting the formation of a patterned layer of polymeric material in accordance with the presently disclosed subject matter.

The presently disclosed subject matter will now be described more fully hereinafter with reference to the accompanying Drawings and Examples, in which representative embodiments are shown. The presently disclosed subject matter can, however, be embodied in different forms and should not be construed as limited to the embodiments set forth herein. Rather, these embodiments are provided so that this disclosure will be thorough and complete, and will fully convey the scope of the embodiments to those skilled in the art.

Unless otherwise defined, all technical and scientific terms used herein have the same meaning as commonly understood by one of ordinary skill in the art to which this presently described subject matter belongs. All publications, patent applications, patents, and other references mentioned herein are incorporated by reference in their entirety.

Throughout the specification and claims, a given chemical formula or name shall encompass all optical and stereoisomers, as well as racemic mixtures where such isomers and mixtures exist.

I. Definitions

As used herein, the term "microfluidic device" generally refers to a device through which materials, particularly fluid borne materials, such as liquids, can be transported, in some embodiments on a micro-scale, and in some embodiments on a nano-scale. Thus, the microfluidic devices described by the presently disclosed subject matter can include microscale features, nanoscale features, and/or combinations thereof.

Accordingly, a microfluidic device typically includes structural or functional features dimensioned on the order of a millimeter-scale or less, which are capable of manipulating a fluid at a flow rate on the order of a microliter/min or less. Typically, such features include, but are not limited to channels, fluid reservoirs, reaction chambers, mixing chambers, and separation regions. In some examples, the channels include at least one cross-sectional dimension that is in a range of from about 0.1 μm to about 500 μm. The use of dimensions on this order allows the incorporation of a greater number of channels in a smaller area, and utilizes smaller volumes of fluids.

A microfluidic device can exist alone or can be a part of a microfluidic system which, for example and without limitation, can include: pumps for introducing fluids, e.g., samples, reagents, buffers and the like, into the system and/or through the system; detection equipment or systems; reagent, product or data storage systems; and control systems for controlling fluid transport and/or direction within the device, monitoring and controlling environmental conditions to which fluids in the device are subjected, e.g., temperature, current, and the like.

As used herein, the term "device" includes, but is not limited to, a microfluidic device, a microtiter plate, tubing, hose, medical implant devices, surgical devices, patches, orthopedic implants, medical device components, tools, and the like.

As used herein, the terms "channel," "microscale channel," and "microfluidic channel" are used interchangeably and can mean a recess or cavity formed in a material by imparting a pattern from a patterned substrate into a material or by any suitable material removing technique, or can mean a recess or cavity in combination with any suitable fluid-conducting structure mounted in the recess or cavity, such as a tube, capillary, or the like.

As used herein, the terms "flow channel" and "control channel" are used interchangeably and can mean a channel in a microfluidic device in which a material, such as a fluid, e.g., a gas or a liquid, can flow through. More particularly, the term "flow channel" refers to a channel in which a material of interest, e.g., a solvent or a chemical reagent, can flow through. Further, the term "control channel" refers to a flow channel in which a material, such as a fluid, e.g., a gas or a liquid, can flow through in such a way to actuate a valve or pump. More particularly, such a channel is filled with a gas or fluid that does not permeate the material of the microfluidic device, medical device, or medical implant. An example of such a gas includes sulfur hexafluoride. Examples of such liquids include mineral oil, silicon oil, propylene glycol, and ethylene glycol. Said another way, in some embodiments, the presently disclosed "flow channels" and/or "control channels" are impermeable to the fluid, e.g., a gas or a liquid as described immediately hereinabove, disposed and/or flowing therein.

As used herein, the term "valve" unless otherwise indicated refers to a configuration in which two channels are separated by an elastomeric segment, e.g., a PFPE segment that can be deflected into or retracted from one of the channels, e.g., a flow channel, in response to an actuation force applied to the other channel, e.g., a control channel. The term "valve" also includes one-way valves, which include channels separated by a bead. "Valve" can also mean a synthetic or natural biologic valve such as, for example, a vascular valve, heart valve, or the like.

As used herein, the term "pattern" can mean a channel or a microfluidic channel or an integrated network of microfluidic channels, which, in some embodiments, can intersect at predetermined points. A pattern also can include one or more of a micro- or nano-scale fluid reservoir, a micro- or nano-scale reaction chamber, a micro- or nano-scale mixing chamber, a micro- or nano-scale separation region, a surface texture, a pattern on a surface that can include micro and/or nano recesses and/or projections. The surface pattern can be regular or irregular.

As used herein, the term "intersect" can mean to meet at a point, to meet at a point and cut through or across, or to meet at a point and overlap. More particularly, as used herein, the term "intersect" describes an embodiment wherein two channels meet at a point, meet at a point and cut through or across one another, or meet at a point and overlap one another. Accordingly, in some embodiments, two channels can intersect, i.e., meet at a point or meet at a point and cut through one another, and be in fluid communication with one another. In some embodiments, two channels can intersect, i.e., meet at a point and overlap one another, and not be in fluid communication with one another, as is the case when a flow channel and a control channel intersect.

As used herein, the term "communicate" (e.g., a first component "communicates with" or "is in communication with" a second component) and grammatical variations thereof are used to indicate a structural, functional, mechanical, electrical, optical, or fluidic relationship, or any combination thereof, between two or more components or elements. As such, the fact that one component is said to communicate with a second component is not intended to exclude the possibility that additional components can be present between, and/or operatively associated or engaged with, the first and second components.

In referring to the use of a microfluidic device for handling the containment or movement of fluid, the terms "in", "on", "into", "onto", "through", and "across" the device generally have equivalent meanings.

As used herein, the term "monolithic" refers to a structure having or acting as a single, uniform structure.

As used herein, the term "non-biological organic materials" refers to organic materials, i.e., those compounds having covalent carbon-carbon bonds, other than biological materials. As used herein, the term "biological materials" includes nucleic acid polymers (e.g., DNA, RNA) amino acid polymers (e.g., enzymes, proteins, and the like) and small organic compounds (e.g., steroids, hormones) wherein the small organic compounds have biological activity, especially biological activity for humans or commercially significant animals, such as pets and livestock, and where the small organic compounds are used primarily for therapeutic or diagnostic purposes. While biological materials are of interest with respect to pharmaceutical and biotechnological applications, a large number of applications involve chemical processes that are enhanced by other than biological materials, i.e., non-biological organic materials.

As used herein, the term "partial cure" refers to a process wherein less than about 100% of the polymerizable groups are reacted. Thus, the term "partially-cured material" refers to a material which has undergone a partial cure process.

As used herein, the term "full cure" refers to a process wherein about 100% of the polymerizable groups are reacted.

Thus, the term "fully-cured material" refers to a material which has undergone a full cure process.

As used herein, the term "photocured" refers to the reaction of polymerizable groups whereby the reaction can be triggered by actinic radiation, such as UV light. In this application UV-cured can be a synonym for photocured.

As used herein, the term "thermal cure" or "thermally cured" refers to the reaction of polymerizable groups, whereby the reaction can be triggered by heating the material beyond a threshold.

Following long-standing patent law convention, the terms "a", "an", and "the" refer to "one or more" when used in this application, including the claims. Thus, for example, reference to "a microfluidic channel" includes a plurality of such microfluidic channels, and so forth.

II. Materials

In certain embodiments, the presently disclosed subject matter broadly describes and employs solvent resistant, low surface energy polymeric materials. According to some embodiments the low surface energy polymeric materials include, but are not limited to perfluoropolyether (PFPE), poly(dimethylsiloxane) (PDMS), poly(tetramethylene oxide), poly(ethylene oxide), poly(oxetanes), polyisoprene, polybutadiene, fluoroolefin-based fluoroelastomers, and the like. An example of casting a device with such materials includes casting liquid PFPE precursor materials onto a patterned substrate and then curing the liquid PFPE precursor materials to generate a patterned layer of functional PFPE material, which can be used to form a device, such as a medical device or a microfluidic device. For simplification purposes, most of the description will focus on PFPE materials, however, it should be appreciated that other such polymers, such as those recited above, can be equally applied to the methods, materials, and devices of the present invention.

Representative solvent resistant elastomer-based materials include but are not limited to fluorinated elastomer-based materials. As used herein, the term "solvent resistant" refers to a material, such as an elastomeric material that neither swells nor dissolves in common hydrocarbon-based organic solvents or acidic or basic aqueous solutions. Representative fluorinated elastomer-based materials include but are not limited to perfluoropolyether (PFPE)-based materials.

In certain embodiments, functional liquid PFPE materials exhibit desirable properties for use in a microfluidic and/or medical device. For example, functional PFPE materials typically have a low surface energy, are non-toxic, UV and visible light transparent, highly gas permeable; cure into a tough, durable, highly fluorinated elastomeric or glassy materials with excellent release properties, resistant to swelling, solvent resistant, biocompatible, combinations thereof, and the like. The properties of these materials can be tuned over a wide range through the judicious choice of additives, fillers, reactive co-monomers, and functionalization agents, examples of which are described further herein.

Such properties that are desirable to modify, include, but are not limited to, modulus, tear strength, surface energy, permeability, functionality, mode of cure, solubility, toughness, hardness, elasticity, swelling characteristics, combinations thereof, and the like. Some examples of methods of adjusting mechanical and or chemical properties of the finished material includes, but are not limited to, shortening the molecular weight between cross-links to increase the modulus of the material, adding monomers that form polymers of high Tg to increase the modulus of the material, adding charged monomer or species to the material to increase the surface energy or wetability of the material, combinations thereof, and the like. In some embodiments, the materials of the present invention have a low surface energy, wherein low is defined as about 30 dynes/cm. According to one embodiment, the surface energy is below about 30 dynes/cm. According to another embodiment the surface energy is less than about 20 dynes/cm. According to a more preferred embodiment, the surface energy is less than about 18 dynes/cm. According to yet another embodiment the surface energy is less than about 15 dynes/cm. According to still a further embodiment the surface energy is less than about 12 dynes/cm. According to further embodiments the surface energy is less than about 10 dynes/cm.

In some embodiments, the fluoronated polymers of the present invention, such as but not limited to PFPE, swell less than about a 15 percent volume change when subjected to a hydrocarbon solvent. In alternative embodiments, the hydrocarbon solvent can be tetrahydrofuran, toluene, dichloromethane, hexanes, chloroform, isopropyl alcohol, cyclohexane, methyl ethyl ketone, acetone, combinations thereof, and the like. In alternative embodiments, the fluoropolymer of the present invention can be altered, according to embodiments and methods herein, to decrease the swelling of the fluoropolymer to such solvents to less than about 10 percent by weight. In further embodiments, the swelling of the fluoropolymer in response to the solvents listed herein is less than about an 8 percent weight change. In yet further embodiments, the composition and organization of the fluoropolymer can be arranged, by methods disclosed herein such that the swelling of the fluoropolymer in response to the solvents listed herein is less than about a 5 percent weight change. Further solvents that can be applied to the materials disclosed herein can be found in Lee J. N. et al., *Solvent Compatibility of Poly(dimethylsiloxane) Based Microfluidic Devices*, Anal. Chem. 75, 6544-6554 (2003), which is incorporated herein by reference in its entirety including all references cited therein. The non-swelling nature and easy release properties of the presently disclosed PFPE materials allow for the fabrication of microfluidic devices.

According to some embodiments, the fluoropolymer of the present invention has a carbon to fluorine ratio of about 1:2. In some embodiments, the carbon to fluorine ratio is about 1:1. In alternative embodiments, the carbon to fluorine ratio is about 2:1. According to yet other embodiments the carbon to fluorine ratio is between about 1:1 to about 2:1. According to still further embodiments, the carbon to fluorine ratio is between about 1:1 to about 1:2.

According to an aspect of the present invention, the materials described herein the molecular weight of the polymer can be selected or modified, for example by chain extension, mixing with other components, increasing or decreasing functional groups, and the like, to yield a resulting material with predetermined mechanical properties, such as modulus, percent elongation at break, toughness, shear, combinations thereof, and the like. In some embodiments, the modulus of the fluoropolymer materials described herein can be decreased by increasing the molecular weight of the fluoropolymer. In one embodiment, the molecular weight of the fluoropolymer is about 16000 and the modulus is about 800 kPa. According to other embodiments, the modulus of the material can be about 500 kPa. According to other embodiments, the modulus of the material can be about 400 kPa. According to other embodiments, the modulus of the material can be about 200 kPa. According to other embodiments, the modulus of the material can be about 100 kPa. According to other embodiments, the modulus of the material can be between about 100 kPa and about 5 megaPa.

In some embodiments, the percent elongation at break of the material increases as the molecular weight of the material increases. According to some embodiments, the percent elongation at break of the fluoropolymers of the present invention is about 200 percent and the molecular weight is about 16000. According to an embodiment, the percent elongation at break of the fluoropolymer is about 300 percent. According to an embodiment, the percent elongation at break of the fluoropolymer is about 250 percent. According to an embodiment, the percent elongation at break of the fluoropolymer is about 200 percent. According to an embodiment, the percent elongation at break of the fluoropolymer is about 100 percent. According to some embodiments, the percent elongation at break of the fluoropolymer is between about 300 percent and about 100 percent.

A. Perfluoropolyether Materials Prepared from a Liquid PFPE Precursor Material Having a Viscosity Less than about 100 Centistokes As would be recognized by one of ordinary skill in the art, perfluoropolyethers (PFPEs) have been in use for over 25 years for many applications. Commercial PFPE materials are made by polymerization of perfluorinated monomers. The first member of this class was made by the cesium fluoride catalyzed polymerization of hexafluoropropene oxide (HFPO) yielding a series of branched polymers designated as KRYTOX® (DuPont, Wilmington, Del., United States of America). A similar polymer is produced by the UV catalyzed photo-oxidation of hexafluoropropene (FOMBLIN® Y) (Solvay Solexis, Brussels, Belgium). Further, a linear polymer (FOMBLIN® Z) (Solvay) is prepared by a similar process, but utilizing tetrafluoroethylene. Finally, a fourth polymer (DEMNUM®) (Daikin Industries, Ltd., Osaka, Japan) is produced by polymerization of tetrafluorooxetane followed by direct fluorination. Structures for these fluids are presented in Table I. Table II contains property data for some members of the PFPE class of lubricants. Likewise, the physical properties of functional PFPEs are provided in Table III. In addition to these commercially available PFPE fluids, a new series of structures are being prepared by direct fluorination technology. Representative structures of these new PFPE materials appear in Table IV. Of the abovementioned PFPE fluids, only KRYTOX® and FOMBLIN® Z have been extensively used in applications. See Jones, W. R., Jr., The Properties of Perfluoropolyethers Used for Space Applications, NASA Technical Memorandum 106275 (July 1993), which is incorporated herein by reference in its entirety. Accordingly, the use of such PFPE materials is provided in the presently disclosed subject matter.

TABLE I

NAMES AND CHEMICAL STRUCTURES OF COMMERCIAL PFPE FLUIDS

| NAME | Structure |
| --- | --- |
| DEMNUM ® | $C_3F_7O(CF_2CF_2CF_2O)_xC_2F_5$ |
| KRYTOX ® | $C_3F_7O[CF(CF_3)CF_2O]_xC_2F_5$ |
| FOMBLIN ® Y | $C_3F_7O[CF(CF_3)CF_2O]_x(CF_2O)_yC_2F_5$ |
| FOMBLIN ® Z | $CF_3O(CF_2CF_2O)_x(CF_2O)_yCF_3$ |

TABLE II

PFPE PHYSICAL PROPERTIES

| Lubricant | Average Molecular Weight | Viscosity at 20° C., (cSt) | Viscosity Index | Pour Point, ° C. | Vapor Pressure, Torr 20° C. | Vapor Pressure, Torr 100° C. |
|---|---|---|---|---|---|---|
| FOMBLIN ® Z-25 | 9500 | 255 | 355 | −66 | $2.9 \times 10^{-12}$ | $1 \times 10^{-8}$ |
| KRYTOX ® 143AB | 3700 | 230 | 113 | −40 | $1.5 \times 10^{-6}$ | $3 \times 10^{-4}$ |
| KRYTOX ® 143AC | 6250 | 800 | 134 | −35 | $2 \times 10^{-8}$ | $8 \times 10^{-6}$ |
| DEMNUM ® S-200 | 8400 | 500 | 210 | −53 | $1 \times 10^{-10}$ | $1 \times 10^{-7}$ |

TABLE III

PFPE PHYSICAL PROPERTIES OF FUNCTIONAL PFPEs

| Lubricant | Average Molecular Weight | Viscosity at 20° C., (cSt) | Vapor Pressure, Torr 20° C. | Vapor Pressure, Torr 100° C. |
|---|---|---|---|---|
| FOMBLIN ® Z-DOL 2000 | 2000 | 85 | $2.0 \times 10^{-5}$ | $2.0 \times 10^{-5}$ |
| FOMBLIN ® Z-DOL 2500 | 2500 | 76 | $1.0 \times 10^{-7}$ | $1.0 \times 10^{-4}$ |
| FOMBLIN ® Z-DOL 4000 | 4000 | 100 | $1.0 \times 10^{-8}$ | $1.0 \times 10^{-4}$ |
| FOMBLIN ® Z-TETROL | 500 | 2000 | $5.0 \times 10^{-7}$ | $2.0 \times 10^{-4}$ |

TABLE IV

Names and Chemical Structures of Representative PFPE Fluids

| Name | Structure[a] |
|---|---|
| Perfluoropoly(methylene oxide) (PMO) | $CF_3O(CF_2O)_xCF_3$ |
| Perfluoropoly(ethylene oxide) (PEO) | $CF_3O(CF_2CF_2O)_xCF_3$ |
| Perfluoropoly(dioxolane) (DIOX) | $CF_3O(CF_2CF_2OCF_2O)_xCF_3$ |
| Perfluoropoly(trioxocane) (TRIOX) | $CF_3O[(CF_2CF_2O)_2CF_2O]_xCF_3$ |

[a] wherein x is any integer.

In some embodiments, the perfluoropolyether precursor includes poly(tetrafluoroethylene oxide-co-difluoromethylene oxide)α,ω diol, which in some embodiments can be photocured to form one of a perfluoropolyether dimethacrylate and a perfluoropolyether distyrenic compound. A representative scheme for the synthesis and photocuring of a functionalized perfluoropolyether is provided in Scheme 1.

Scheme 1. Synthesis and Photocuring of Functionalized Perfluoropolyethers.

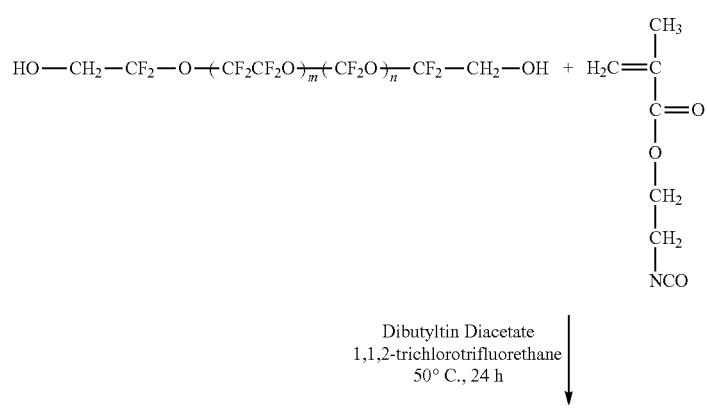

-continued

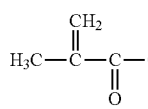 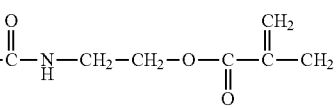

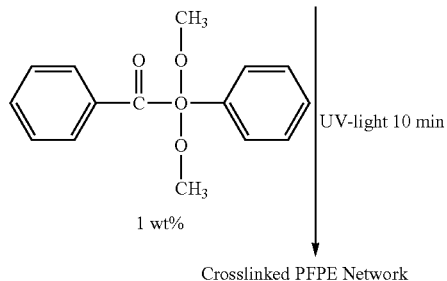

B. Perfluoropolyether Materials Prepared from a Liquid PFPE Precursor Material Having a Viscosity Greater than about 100 Centistokes The methods provided herein below for promoting and/or increasing adhesion between a layer of a PFPE material and another material and/or a substrate and for adding a chemical functionality to a surface include a PFPE material having a characteristic selected from the group consisting of a viscosity greater than about 100 centistokes (cSt) and a viscosity less than about 100 cSt, provided that the liquid PFPE precursor material having a viscosity less than 100 cSt is not a free-radically photocurable PFPE material. As provided herein, the viscosity of a liquid PFPE precursor material refers to the viscosity of that material prior to functionalization, e.g., functionalization with a methacrylate or a styrenic group.

Thus, in some embodiments, PFPE material is prepared from a liquid PFPE precursor material having a viscosity greater than about 100 centistokes (cSt). In some embodiments, the liquid PFPE precursor is end-capped with a polymerizable group. In some embodiments, the polymerizable group is selected from the group consisting of an acrylate, a methacrylate, an epoxy, an amino, a carboxylic, an anhydride, a maleimide, an isocyanato, an olefinic, and a styrenic group.

In some embodiments, the perfluoropolyether material includes a backbone structure selected from the group consisting of:

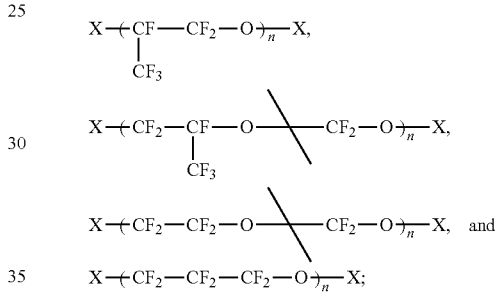

wherein X is present or absent, and when present includes an endcapping group, and n is an integer from 1 to 100.

In some embodiments, the PFPE liquid precursor is synthesized from hexafluoropropylene oxide or tetrafluoro ethylene oxide as shown in Scheme 2.

Scheme 2. Synthesis of a liquid PFPE precursor material from hexafluoropropylene oxide or tetrafluoro ethylene oxide.

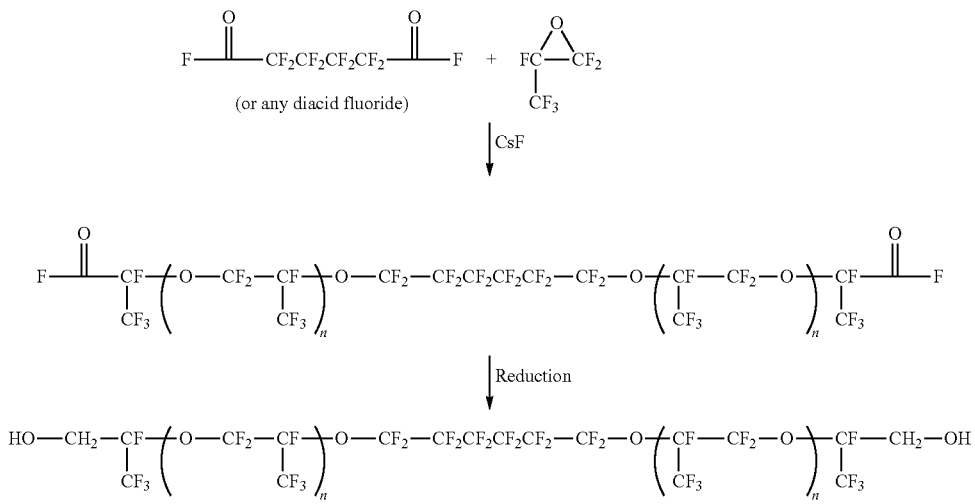

In some embodiments, the liquid PFPE precursor is synthesized from hexafluoropropylene oxide or tetrafluoro ethylene oxide as shown in Scheme 3.

Scheme 3. Synthesis of a liquid PFPE precursor material from hexafluoropropylene oxide or tetrafluoro ethylene oxide.

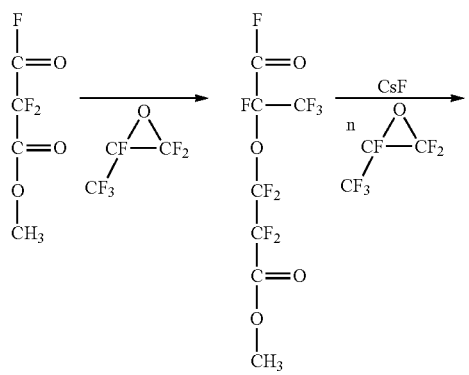

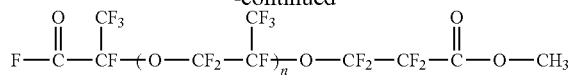

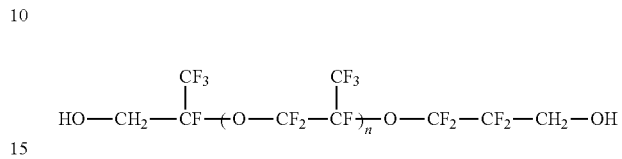

In some embodiments the liquid PFPE precursor includes a chain extended material such that two or more chains are linked together before adding polymerizablable groups. Accordingly, in some embodiments, a "linker group" joins two chains to one molecule. In some embodiments, as shown in Scheme 4, the linker group joins three or more chains.

Scheme 4. Linker group joining three PFPE chains.

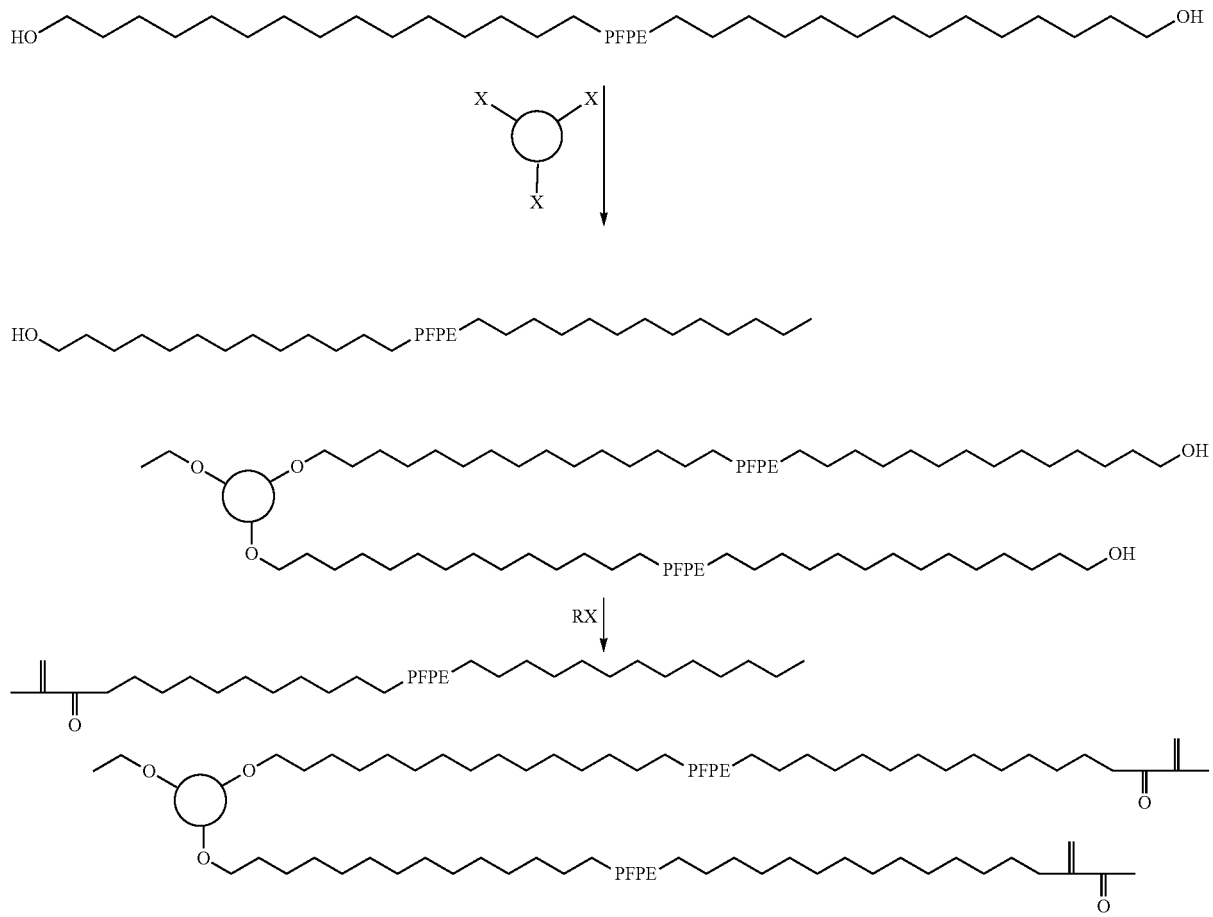

In some embodiments, X is selected from the group consisting of an isocyanate, an acid chloride, an epoxy, and a halogen. In some embodiments, R is selected from the group consisting of an acrylate, a methacrylate, a styrene, an epoxy, a carboxylic, an anhydride, a maleimide, an isocyanate, an olefinic, and an amine. In some embodiments, the circle represents any multifunctional molecule. In some embodiments, the multifunctional molecule includes a cyclic molecule. PFPE refers to any PFPE material provided hereinabove.

In some embodiments, the liquid PFPE precursor includes a hyperbranched polymer as provided in Scheme 5, wherein PFPE refers to any PFPE material provided hereinabove.
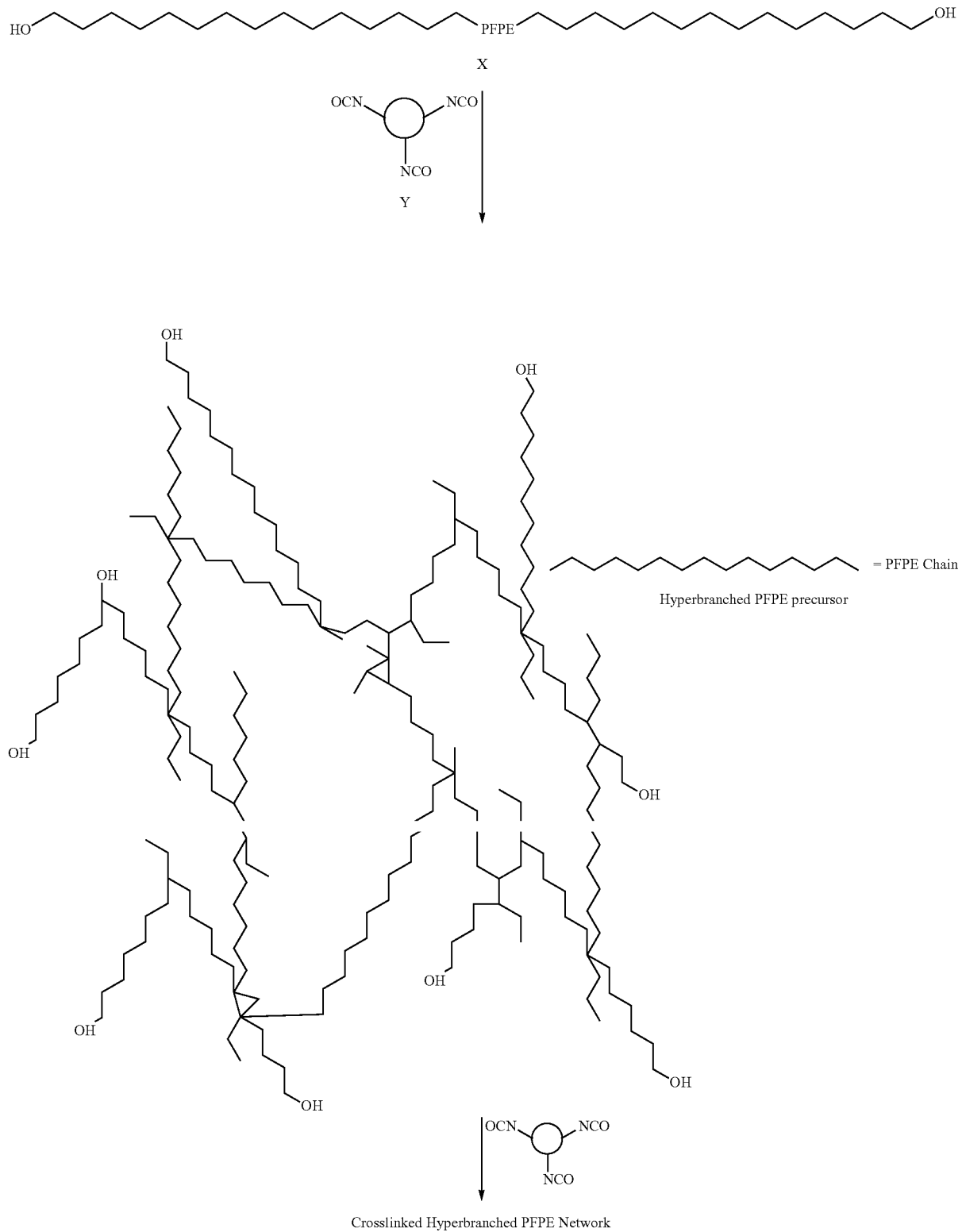
Scheme 5. Hyperbranched PFPE liquid precursor material.

In some embodiments, the liquid PFPE material includes an end-functionalized material selected from the group consisting of:

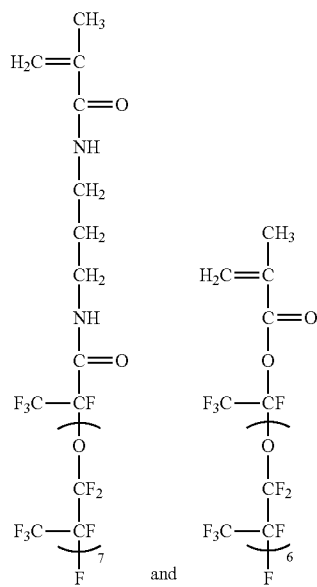

In some embodiments the PFPE liquid precursor is encapped with an epoxy moiety that can be photocured using a photoacid generator. Photoacid generators suitable for use in the presently disclosed subject matter include, but are not limited to: bis(4-tert-butylphenyl)iodonium p-toluenesulfonate, bis(4-tert-butylphenyl)iodonium triflate, (4-bromo-phenyl)diphenylsulfonium triflate, (tert-butoxycarbonylmethoxynaphthyl)-diphenylsulfonium triflate, (tert-butoxycarbonylmethoxyphenyl)diphenyl-sulfonium triflate, (4-tert-butylphenyl)diphenylsulfonium triflate, (4-chlorophenyl)diphenylsulfonium triflate, diphenyliodonium-9,10-dimethoxy-anthracene-2-sulfonate, diphenyliodonium hexafluorophosphate, diphenyliodonium nitrate, diphenyliodonium perfluoro-1-butanesulfonate, diphenyliodonium p-toluene-sulfonate, diphenyliodonium triflate, (4-fluorophenyl)diphenylsulfonium triflate, N-hydroxynaphthalimide triflate, N-hydroxy-5-norbornene-2,3-dicarboximide perfluoro-1-butanesulfonate, N-hydroxyphthalimide triflate, [4-[(2-hydroxytetradecyl)oxy]phenyl]-phenyliodonium hexafluoroantimonate, (4-iodophenyl)diphenylsulfonium triflate, (4-methoxyphenyl)diphenylsulfonium triflate, 2-(4-methoxystyryl)-4,6-bis(trichloromethyl)-1,3,5-triazine, (4-methylphenyl)di-phenylsulfonium triflate, (4-methylthiophenyl)methyl phenyl sulfonium triflate, 2-naphthyl diphenylsulfonium triflate, (4-phenoxy-phenyl)diphenylsulfonium triflate, (4-phenylthiophenyl)diphenylsulfonium triflate, thiobis(triphenyl sulfonium hexafluorophosphate), triarylsulfonium hexafluoroantimonate salts, triarylsulfonium hexafluorophosphate salts, triphenylsulfonium perfluoro-1-butanesulfonate, triphenylsulfonium triflate, tris(4-tert-butylphenyl)sulfonium perfluoro-1-butanesulfonate, and tris(4-tert-butylphenyl)sulfonium triflate.

In some embodiments the liquid PFPE precursor cures into a highly UV and/or highly visible light transparent elastomer. In some embodiments the liquid PFPE precursor cures into an elastomer that is highly permeable to oxygen, carbon dioxide, and nitrogen, a property that can facilitate maintaining the viability of biological fluids/cells disposed therein. In some embodiments, additives are added or layers are created to enhance the barrier properties of the device to molecules, such as oxygen, carbon dioxide, nitrogen, dyes, reagents, and the like.

In some embodiments, the material suitable for use with the presently disclosed subject matter includes a silicone material having a fluoroalkyl functionalized polydimethylsiloxane (PDMS) having the following structure:

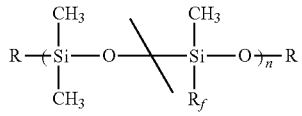

wherein:
R is selected from the group consisting of an acrylate, a methacrylate, and a vinyl group;
$R_f$ includes a fluoroalkyl chain; and
n is an integer from 1 to 100,000.

In some embodiments, the material suitable for use with the presently disclosed subject matter includes a styrenic material having a fluorinated styrene monomer selected from the group consisting of:

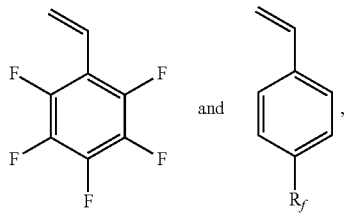

wherein $R_f$ includes a fluoroalkyl chain.

In some embodiments, the material suitable for use with the presently disclosed subject matter includes an acrylate material having a fluorinated acrylate or a fluorinated methacrylate having the following structure:

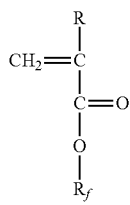

wherein:
R is selected from the group consisting of H, alkyl, substituted alkyl, aryl, and substituted aryl; and
$R_f$ includes a fluoroalkyl chain with a —$CH_2$— or a —$CH_2$—$CH_2$— spacer between a perfluoroalkyl chain and the ester linkage. In some embodiments, the perfluoroalkyl group has hydrogen substituents.

In some embodiments, the material suitable for use with the presently disclosed subject matter includes a triazine fluoropolymer having a fluorinated monomer.

In some embodiments, the fluorinated monomer or fluorinated oligomer that can be polymerized or crosslinked by a metathesis polymerization reaction includes a functionalized olefin. In some embodiments, the functionalized olefin includes a functionalized cyclic olefin. According to an alternative embodiment, the PFPE material includes a urethane block as described and shown in the following structures provided in Scheme 6:

Scheme 6. PFPE Urethane Tetrafunctional Methacrylate

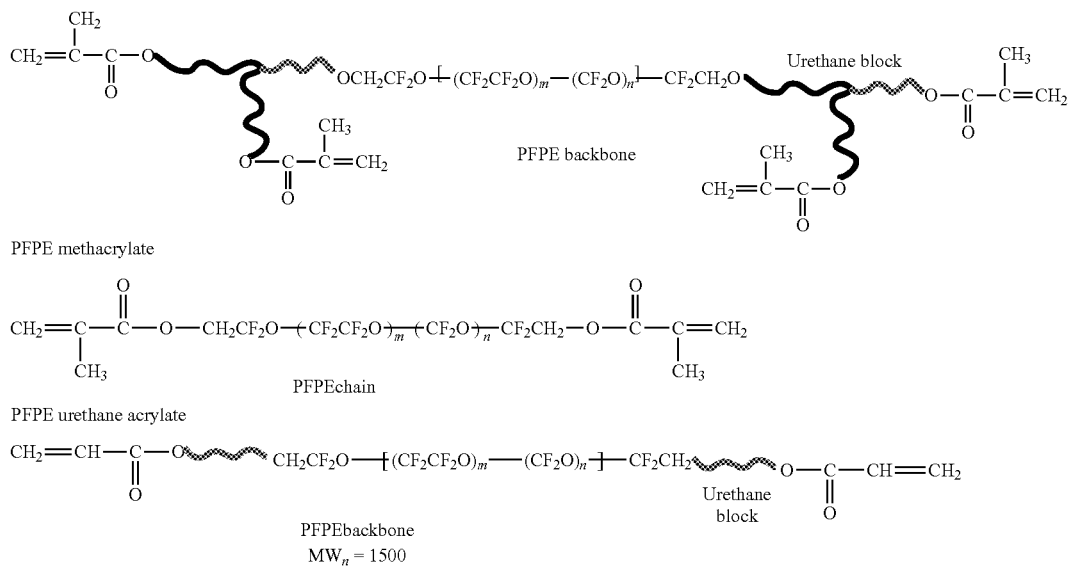

According to an embodiment of the present invention, PFPE urethane tetrafunctional methacrylate materials such as the above described can be used as the materials and methods of the present invention or can be used in combination with other materials and methods described herein, as will be appreciated by one of ordinary skill in the art.

According to some embodiments, urethane systems include materials with the following structures:

Scheme 7. PFPE Urethane System for Microfluidies.

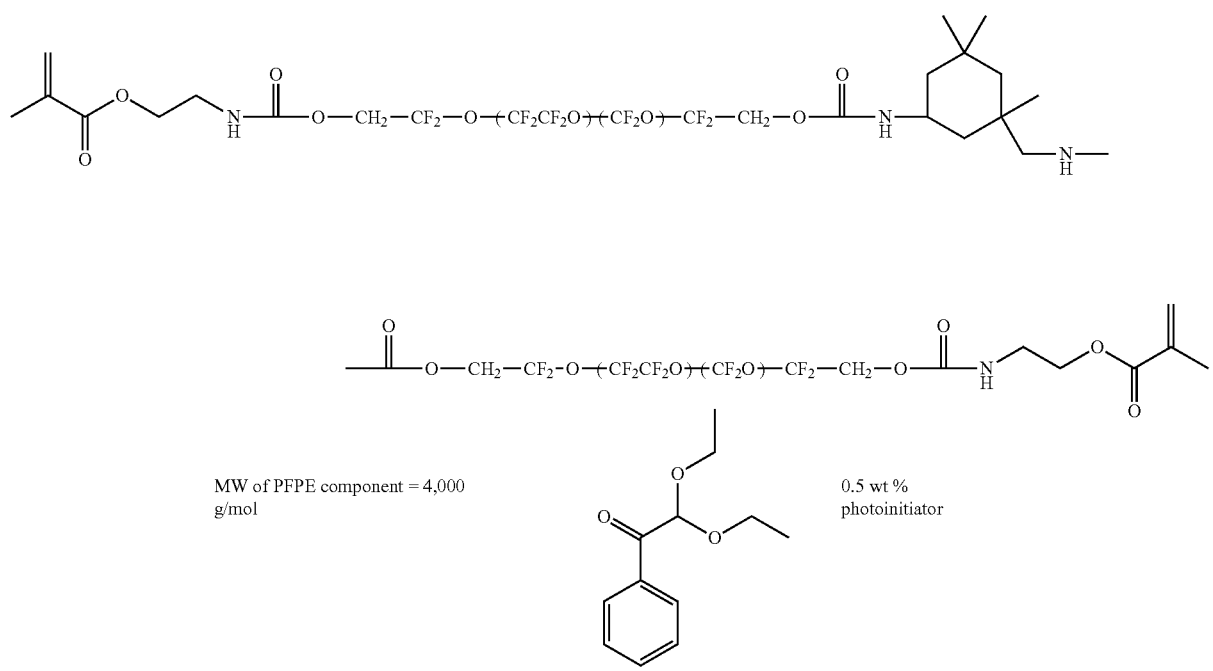

-continued

Part B

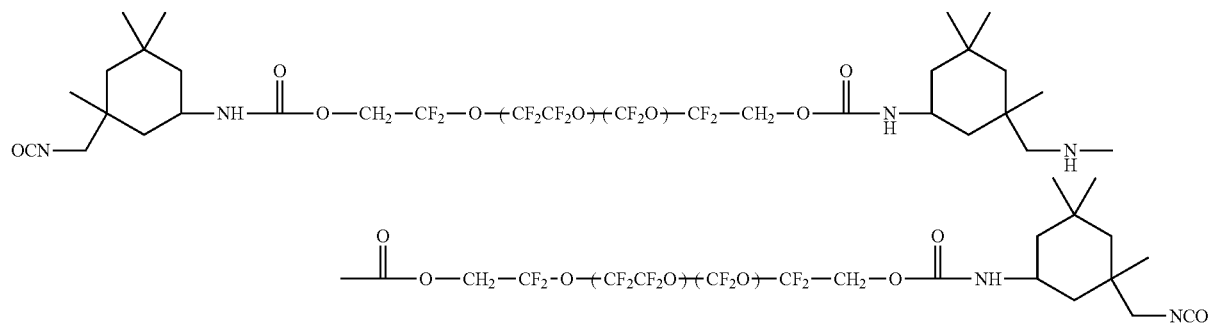

MW of PFPE component = 4,000 g/mol

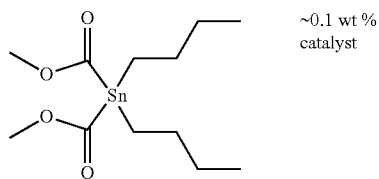

~0.1 wt % catalyst

Part C

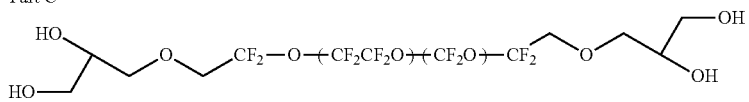

MW of PFPE component = 2,000 g/mol

Part D

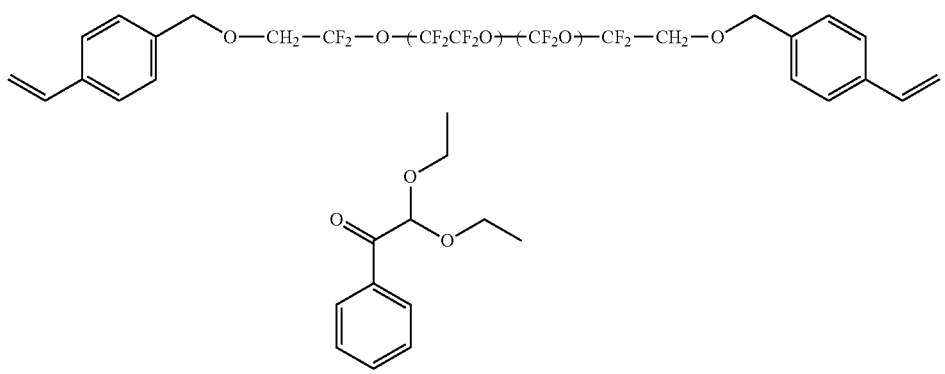

According to this scheme (Scheme 7), part A is a UV curable precursor and parts B and C make up a thermally curable component of the urethane system. The fourth precursor component, part D, is an end-capped precursor, (e.g., styrene end-capped liquid precursor). According to some embodiments, part D reacts with latent methacrylate, acrylate, or styrene groups contained in a base material, thereby adding chemical compatibility or a surface passivation to the base material and increasing the functionality of the base material.

C. Fluoroolefin-Based Materials

Further, in some embodiments, the materials used herein are selected from highly fluorinated fluoroelastomers, e.g., fluoroelastomers having at least fifty-eight weight percent fluorine, as described in U.S. Pat. No. 6,512,063 to Tang, which is incorporated herein by reference in its entirety. Such fluoroelastomers can be partially fluorinated or perfluorinated and can contain between 25 to 70 weight percent, based on the weight of the fluoroelastomer, of copolymerized units of a first monomer, e.g., vinylidene fluoride ($VF_2$) or tetrafluoroethylene (TFE). The remaining units of the fluoroelastomers include one or more additional copolymerized monomers, which are different from the first monomer, and are selected from the group consisting of fluorine-containing olefins, fluorine containing vinyl ethers, hydrocarbon olefins, and combinations thereof.

These fluoroelastomers include VITON® (DuPont Dow Elastomers, Wilmington, Del., United States of America) and Kel-F type polymers, as described for microfluidic applications in U.S. Pat. No. 6,408,878 to Unger et al. These commercially available polymers, however, have Mooney viscosities ranging from about 40 to 65 (ML 1+10 at 121° C.) giving them a tacky, gum-like viscosity. When cured, they become a stiff, opaque solid. As currently available, VITON® and Kel-F have limited utility for micro-scale molding. Curable species of similar compositions, but having lower viscosity and greater optical clarity, is needed in the art for the applications described herein. A lower viscosity (e.g., 2 to 32 (ML 1+10 at 121° C.)) or more preferably as low as 80 to 2000 cSt at 20° C., composition yields a pourable liquid with a more efficient cure.

More particularly, the fluorine-containing olefins include, but are not limited to, vinylidine fluoride, hexafluoropropylene (HFP), tetrafluoroethylene (TFE), 1,2,3,3,3-pentafluoropropene (1-HPFP), chlorotrifluoroethylene (CTFE) and vinyl fluoride.

The fluorine-containing vinyl ethers include, but are not limited to perfluoro(alkyl vinyl)ethers (PAVEs). More particularly, perfluoro(alkyl vinyl)ethers for use as monomers include perfluoro(alkyl vinyl)ethers of the following formula:

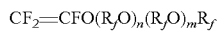
$CF_2=CFO(R_fO)_n(R_fO)_mR_f$ wherein each $R_f$ is independently a linear or branched $C_1$-$C_6$ perfluoroalkylene group, and m and n are each independently an integer from 0 to 10.

In some embodiments, the perfluoro(alkyl vinyl)ether includes a monomer of the following formula:

$CF_2=CFO(CF_2CFXO)_nR_f$ wherein X is F or $CF_3$, n is an integer from 0 to 5, and $R_f$ is a linear or branched $C_1$-$C_6$ perfluoroalkylene group. In some embodiments, n is 0 or 1 and $R_f$ includes 1 to 3 carbon atoms. Representative examples of such perfluoro(alkyl vinyl)ethers include perfluoro(methyl vinyl)ether (PMVE) and perfluoro (propyl vinyl)ether (PPVE).

In some embodiments, the perfluoro(alkyl vinyl)ether includes a monomer of the following formula:

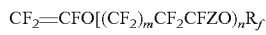
$CF_2=CFO[(CF_2)_mCF_2CFZO]_nR_f$ wherein $R_f$ is a perfluoroalkyl group having 1-6 carbon atoms, m is an integer from 0 or 1, n is an integer from 0 to 5, and Z is F or $CF_3$. In some embodiments, $R_f$ is $C_3F_7$, M is 0, and n is 1.

In some embodiments, the perfluoro(alkyl vinyl)ether monomers include compounds of the formula:

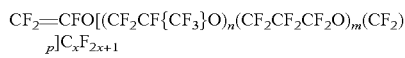
$CF_2=CFO[(CF_2CF\{CF_3\}O)_n(CF_2CF_2CF_2O)_m(CF_2)_p]C_xF_{2x+1}$ wherein m and n each integers independently from 0 to 10, p is an integer from 0 to 3, and x is an integer from 1 to 5. In some embodiments, n is 0 or 1, m is 0 or 1, and x is 1.

Other examples of useful perfluoro(alkyl vinyl ethers) include:

$CF_2=CFOCF_2CF(CF_3)O(CF_2O)_mC_nF_{2n+1}$ wherein n is an integer from 1 to 5, m is an integer from 1 to 3. In some embodiments, n is 1.

In embodiments wherein copolymerized units of a perfluoro(alkyl vinyl)ether (PAVE) are present in the presently described fluoroelastomers, the PAVE content generally ranges from 25 to 75 weight percent, based on the total weight of the fluoroelastomer. If the PAVE is perfluoro(methyl vinyl) ether (PMVE), then the fluoroelastomer contains between 30 and 55 wt. % copolymerized PMVE units.

Hydrocarbon olefins useful in the presently described fluoroelastomers include, but are not limited to ethylene (E) and propylene (P). In embodiments wherein copolymerized units of a hydrocarbon olefin are present in the presently described fluoroelastomers, the hydrocarbon olefin content is generally 4 to 30 weight percent.

Further, the presently described fluoroelastomers can, in some embodiments, include units of one or more cure site monomers. Examples of suitable cure site monomers include: i) bromine-containing olefins; ii) iodine-containing olefins; iii) bromine-containing vinyl ethers; iv) iodine-containing vinyl ethers; v) fluorine-containing olefins having a nitrile group; vi) fluorine-containing vinyl ethers having a nitrile group; vii) 1,1,3,3,3-pentafluoropropene (2-HPFP); viii) perfluoro(2-phenoxypropyl vinyl)ether; and ix) non-conjugated dienes.

The brominated cure site monomers can contain other halogens, preferably fluorine. Examples of brominated olefin cure site monomers are $CF_2=CFOCF_2CF_2CF_2OCF_2CF_2Br$; bromotrifluoroethylene; 4-bromo-3,3,4,4-tetrafluorobutene-1 (BTFB); and others such as vinyl bromide, 1-bromo-2,2-difluoroethylene; perfluoroallyl bromide; 4-bromo-1,1,2-trifluorobutene-1; 4-bromo-1,1,3,3,4,4,-hexafluorobutene; 4-bromo-3-chloro-1,1,3,4,4-penta-fluorobutene; 6-bromo-5,5,6,6-tetrafluorohexene; 4-bromoperfluorobutene-1 and 3,3-difluoroallyl bromide. Brominated vinyl ether cure site monomers include 2-bromo-perfluoroethyl perfluorovinyl ether and fluorinated compounds of the class $CF_2Br-R_f-O-CF=CF_2$ (wherein $R_f$ is a perfluoroalkylene group), such as $CF_2BrCF_2O-CF=CF_2$, and fluorovinyl ethers of the class $ROCF=CFBr$ or $ROCBr=CF_2$ (wherein R is a lower alkyl group or fluoroalkyl group), such as $CH_3OCF=CFBr$ or $CF_3CH_2OCF=CFBr$.

Suitable iodinated cure site monomers include iodinated olefins of the formula: $CHR=CH-Z-CH_2CHR-I$, wherein R is $-H$ or $-CH_3$; Z is a $C_1$ to $C_{18}$ (per)fluoroalkylene radical, linear or branched, optionally containing one or more ether oxygen atoms, or a (per)fluoropolyoxyalkylene radical as disclosed in U.S. Pat. No. 5,674,959. Other examples of useful iodinated cure site monomers are unsaturated ethers of the formula: $I(CH_2CF_2CF_2)_nOCF=CF_2$ and $ICH_2CF_2O[CF(CF_3)CF_2O]_nCF=CF_2$, and the like, wherein n is an integer from 1 to 3, such as disclosed in U.S. Pat. No. 5,717,036. In addition, suitable iodinated cure site monomers including iodoethylene, 4-iodo-3,3,4,4-tetrafluorobutene-1 (ITFB); 3-chloro-4-iodo-3,4,4-trifluorobutene; 2-iodo-1,1,2,2-tetrafluoro-1-(vinyloxy)ethane; 2-iodo-1-(perfluorovinyloxy)-1,1,-2,2-tetrafluoroethylene; 1,1,2,3,3,3-hexafluoro-2-iodo-1-(perfluorovinyloxy)-propane; 2-iodoethyl vinyl ether; 3,3,4,5,5,5-hexafluoro-4-iodopentene; and iodotrifluoroethylene are disclosed in U.S. Pat. No. 4,694,045. Allyl iodide and 2-iodo-perfluoroethyl perfluorovinyl ether also are useful cure site monomers. Useful nitrile-containing cure site monomers include those of the formulas shown below:

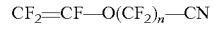
$CF_2=CF-O(CF_2)_n-CN$ wherein n is an integer from 2 to 12. In some embodiments, n is an integer from 2 to 6.

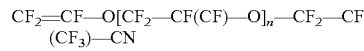
$CF_2=CF-O[CF_2-CF(CF)-O]_n-CF_2-CF(CF_3)-CN$ wherein n is an integer from 0 to 4. In some embodiments, n is an integer from 0 to 2.

$CF_2=CF-[OCF_2CF(CF_3)]_x-O-(CF_2)_n-CN$ wherein x is 1 or 2, and n is an integer from 1 to 4; and

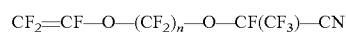
$CF_2=CF-O-(CF_2)_n-O-CF(CF_3)-CN$ wherein n is an integer from 2 to 4. In some embodiments, the cure site monomers are perfluorinated polyethers having a nitrile group and a trifluorovinyl ether group.

In some embodiments, the cure site monomer is:

$CF_2=CFOCF_2CF(CF_3)OCF_2CF_2CN$ i.e., perfluoro(8-cyano-5-methyl-3,6-dioxa-1-octene) or 8-CNVE.

Examples of non-conjugated diene cure site monomers include, but are not limited to 1,4-pentadiene; 1,5-hexadiene; 1,7-octadiene; 3,3,4,4-tetrafluoro-1,5-hexadiene; and others, such as those disclosed in Canadian Patent No. 2,067,891 and European Patent No. 0784064A1. A suitable triene is 8-methyl-4-ethylidene-1,7-octadiene.

In embodiments wherein the fluoroelastomer will be cured with peroxide, the cure site monomer is preferably selected from the group consisting of 4-bromo-3,3,4,4-tetrafluorobutene-1 (BTFB); 4-iodo-3,3,4,4-tetrafluorobutene-1 (ITFB); allyl iodide; bromotrifluoroethylene and 8-CNVE. In embodiments wherein the fluoroelastomer will be cured with a polyol, 2-HPFP or perfluoro(2-phenoxypropyl vinyl)ether is the preferred cure site monomer. In embodiments wherein the fluoroelastomer will be cured with a tetraamine, bis(aminophenol) or bis(thioaminophenol), 8-CNVE is the preferred cure site monomer.

Units of cure site monomer, when present in the presently disclosed fluoroelastomers, are typically present at a level of 0.05-10 wt. % (based on the total weight of fluoroelastomer), preferably 0.05-5 wt. % and most preferably between 0.05 and 3 wt. %.

Fluoroelastomers which can be used in the presently disclosed subject matter include, but are not limited to, those having at least 58 wt. % fluorine and having copolymerized units of i) vinylidene fluoride and hexafluoropropylene; ii) vinylidene fluoride, hexafluoropropylene and tetrafluoroethylene; iii) vinylidene fluoride, hexafluoropropylene, tetrafluoroethylene and 4-bromo-3,3,4,4-tetrafluorobutene-1; iv) vinylidene fluoride, hexafluoropropylene, tetrafluoroethylene and 4-iodo-3,3,4,4-tetrafluorobutene-1; v) vinylidene fluoride, perfluoro(methyl vinyl)ether, tetrafluoroethylene and 4-bromo-3,3,4,4-tetrafluorobutene-1; vi) vinylidene fluoride, perfluoro(methyl vinyl)ether, tetrafluoroethylene and 4-iodo-3,3,4,4-tetrafluorobutene-1; vii) vinylidene fluoride, perfluoro(methyl vinyl)ether, tetrafluoroethylene and 1,1,3,3,3-pentafluoropropene; viii) tetrafluoroethylene, perfluoro(methyl vinyl)ether and ethylene; ix) tetrafluoroethylene, perfluoro(methyl vinyl)ether, ethylene and 4-bromo-3,3,4,4-tetrafluorobutene-1; x) tetrafluoroethylene, perfluoro(methyl vinyl)ether, ethylene and 4-iodo-3,3,4,4-tetrafluorobutene-1; xi) tetrafluoroethylene, propylene and vinylidene fluoride; xii) tetrafluoroethylene and perfluoro(methyl vinyl)ether; xiii) tetrafluoroethylene, perfluoro(methyl vinyl)ether and perfluoro(8-cyano-5-methyl-3,6-dioxa-1-octene); xiv) tetrafluoroethylene, perfluoro(methyl vinyl) ether and 4-bromo-3,3,4,4-tetrafluorobutene-1; xv) tetrafluoroethylene, perfluoro(methyl vinyl)ether and 4-iodo-3,3,4,4-tetrafluorobutene-1; and xvi) tetrafluoroethylene, perfluoro(methyl vinyl) ether and perfluoro(2-phenoxypropyl vinyl) ether.

Additionally, iodine-containing endgroups, bromine-containing endgroups or combinations thereof can optionally be present at one or both of the fluoroelastomer polymer chain ends as a result of the use of chain transfer or molecular weight regulating agents during preparation of the fluoroelastomers. The amount of chain transfer agent, when employed, is calculated to result in an iodine or bromine level in the fluoroelastomer in the range of 0.005-5 wt. %, preferably 0.05-3 wt. %.

Examples of chain transfer agents include iodine-containing compounds that result in incorporation of bound iodine at one or both ends of the polymer molecules. Methylene iodide; 1,4-diiodoperfluoro-n-butane; and 1,6-diiodo-3,3,4,4-tetrafluorohexane are representative of such agents. Other iodinated chain transfer agents include 1,3-diiodoperfluoropropane; 1,6-diiodoperfluorohexane; 1,3-diiodo-2-chloroperfluoropropane; 1,2-di(iododifluoromethyl)perfluorocyclobutane; monoiodoperfluoroethane; monoiodoperfluorobutane; 2-iodo-1-hydroperfluoroethane, and the like. Also included are the cyano-iodine chain transfer agents disclosed European Patent No. 0868447A1. Particularly preferred are diiodinated chain transfer agents.

Examples of brominated chain transfer agents include 1-bromo-2-iodoperfluoroethane; 1-bromo-3-iodoperfluoropropane; 1-iodo-2-bromo-1,1-difluoroethane and others such as disclosed in U.S. Pat. No. 5,151,492.

Other chain transfer agents suitable for use include those disclosed in U.S. Pat. No. 3,707,529. Examples of such agents include isopropanol, diethylmalonate, ethyl acetate, carbon tetrachloride, acetone and dodecyl mercaptan.

D. Dual Photo-Curable and Thermal-Curable Materials

According to another embodiment, a material according to the invention includes one or more of a photo-curable constituent and a thermal-curable constituent. In one embodiment, the photo-curable constituent is independent from the thermal-curable constituent such that the material can undergo multiple cures. A material having the ability to undergo multiple cures is useful, for example, in forming layered devices or in connecting or attaching devices to other devices or portions or components of devices to other portions or components of devices. For example, a liquid material having photocurable and thermal-curable constituents can undergo a first cure to form a first device through, for example, a photocuring process or a thermal curing process. Then the photocured or thermal cured first device can be adhered to a second device of the same material or any material similar thereto that will thermally cure or photocure and bind to the material of the first device. By positioning the first device and second device adjacent one another and subjecting the first and second devices to a thermal curing or photocuring, whichever component that was not activated on the first curing. Thereafter, either the thermal cure constituents of the first device that were left un-activated by the photocuring process or the photocure constituents of the first device that were left un-activated by the first thermal curing, will be activated and bind the second device. In one embodiment, using this method and materials, the first and second devices become adhered together. It will be appreciated by one of ordinary skill in the art that the order of curing processes is independently determined and a thermal-curing could occur first followed by a photocuring or a photocuring could occur first followed by a thermal curing.

According to yet another embodiment, multiple thermocurable constituents can be included in the material such that the material can be subjected to multiple and independent thermal curing processes. For example, the multiple thermal-curable constituents can have different activation temperature ranges such that the material can undergo a first thermal-cure at a first temperature range, a second thermal-cure at a second temperature range, etc. Accordingly, in one embodiment, the material can be adhered to multiple other materials through different thermal-cures, thereby, forming a multiple laminate layer device. In alternative embodiments, the material can include different thermal-cure constituents that react or are activated at different rates, thereby, presenting the user with the option to first cure the material at a first rate, then subject the material to a second cure at a different rate to adhere the first cured material to a second material for example.

In another embodiment, the material of the present invention can include a dual photo-cure material which can include different constituents that can be cured at different wavelengths. For example, a first photo-cure constituent can be a dimethacrylate that cures at a wavelength of about 365 nm.

The material can also include a second photo-cure constituent, such as, for example, a diepoxy material that is activated at another wavelength, such as for example 254 nm. In this manner, multiple layers of a device can be bonded and adhered to other substrates such as glass, silicon, other polymeric materials, laminates, combinations thereof, and the like at different stages of fabrication of an overall device.

Examples of chemical groups which would be suitable end-capping agents for a UV curable component include: methacrylates, acrylates, styrenics, epoxides, cyclobutanes and other 2+2 cycloadditions, combinations thereof, and the like. Examples of chemical group pairs which are suitable to endcap a thermally curable component include: epoxy/amine, epoxy/hydroxyl, triol/diisocyanate, tetrol/diisocyanate, carboxylic acid/amine, carboxylic acid/hydroxyl, ester/amine, ester/hydroxyl, amine/anhydride, acid halide/hydroxyl, acid halide/amine, amine/halide, hydroxyl/halide, hydroxyl/chlorosilane, azide/acetylene and other so-called "click chemistry" reactions, and metathesis reactions involving the use of Grubb's-type catalysts, combinations thereof, and the like. Examples of UV and thermal end-cap combinations, according to some embodiments, include: UV diurethane methacrylate with thermal triol and diisocyanate components, UV diurethane methacrylate with thermal tetrol and diisocyanate components, UV diurethane methacrylate with UV diepoxy, UV diurethane methacrylate with thermal diepoxy and diamine components, UV diurethane methacrylate with thermal diisocyanate, combinations thereof, and the like.

The presently disclosed methods for the adhesion of multiple layers of a device to one another or to a separate surface can be applied to PFPE-based materials, as well as a variety of other materials, including PDMS and other liquid-like polymers. Examples of liquid-like polymeric materials that are suitable for use in the presently disclosed adhesion methods include, but are not limited to, PDMS, poly(tetramethylene oxide), poly(ethylene oxide), poly(oxetanes), polyisoprene, polybutadiene, and fluoroolefin-based fluoroelastomers, such as those available under the registered trademarks VITON® AND KALREZ®.

Accordingly, in one embodiment, the presently disclosed methods can be used to adhere layers of different polymeric materials together to form devices, such as microfluidic devices, medical device, surgical devices, tools, components of medical devices, implant materials, laminates, and the like. For example, multiple PFPE and PDMS layers can be adhered together in a given microfluidic and/or medical device. In some embodiments, the different polymeric materials include a fluoropolymer mixed with a polymer in the same device. According to some embodiments, the polymer is miscible with the fluoropolymer. According to other embodiments, the polymer is immiscible with the fluoropolymer.

According to some embodiments, a device can be formed from a composition of a fluoropolymer mixed with a polymer, wherein the fluoropolymer includes a first functional group and the polymer includes a second functional group. According to such embodiments, the functional groups can be photocurable and/or thermalcurable functional groups as disclosed herein. In other embodiments, a device can be formed from a composition having a first polymer and a second polymer, wherein the first polymer includes a first functional group and the second polymer includes a second functional group. According to such embodiments, the first and second functional groups can include functional groups disclosed herein, such as photocurable and/or thermalcurable functional groups. In yet other embodiments, a device can be formed from a composition that includes a first fluoropolymer and a second fluoropolymer, wherein the first fluoropolymer includes a first functional group and the second fluoropolymer includes a second functional group. According to such embodiments, the first and second functional groups can include functional groups disclosed herein, such as photocurable and/or thermalcurable functional groups. The compositions just described can undergo a first cure by activating the first curable functional group of one of the components of the composition (i.e., the photocurable functional group), then, after multiple components of a device are formed (through photocuring of the materials), the components can be positioned with respect to each other and treated to a second cure to thereby activate the second function group (i.e., thermalcurable functional group) and cure or laminate the multiple components together.

According to other embodiments, different components of a device can be formed from different materials, such as for example, a first component of a device can be formed from a polymer material and a second component of the device can be formed from a fluoropolymer material. According to such embodiments, both the polymer and the fluoropolymer can include dual cure functional groups, such as for example, photocurable and thermalcurable functional groups. Accordingly, the individual components of a device can be fabricated by subjecting the materials to a first cure (i.e., a photocure) to fabricate the component, then the individual components can be positioned with respect to each other to form the desired device and subjected to a second cure (i.e., thermal cure) to bind the individual components and form the device.

E. Silicone Based Materials

According to alternate embodiments, novel silicone based materials include one or more photocurable and thermalcurable components. In such alternate embodiments, silicone based materials can include one or more photo-curable and one or more thermal-curable components such that the silicone based material has a dual curing capability as described herein. Silicone based materials compatible with the present invention are described herein and throughout the reference materials incorporated by reference into this application.

F. Phosphazene-Containing Polymers

According to some embodiments, devices and methods disclosed herein can be formed with materials that include phosphazene-containing polymers having the following structure. According to these embodiments, R, in the structure below, can be a fluorine-containing alkyl chain. Examples of such fluorine-containing alkyl chains can be found in *Langmuir,* 2005, 21, 11604, the disclosure of which is incorporated herein by reference in its entirety. The devices disclosed in this application can be formed from phosphazene-containing polymers or from PFPE in combination with phosphazene-containing polymers.

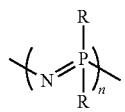

G. Materials End-Capped with an Aryl Trifluorovinyl Ether (TVE)

In some embodiments, devices and methods disclosed herein can be formed with materials that include materials end-capped with one or more aryl trifluorovinyl ether (TVE) group, as shown in the structure below. Examples of materials end-capped with a TVE group can be found in *Macromolecules,* 2003, 36, 9000, which is incorporated herein by reference in its entirety. These structures react in a 2+2 addition at about 150° C. to form perfluorocyclobutyl moieties. In some embodiments, $R_f$ can be a fluoropolymer, for example a PFPE chain. In some embodiments three or more TVE groups are present on a 3-armed PFPE polymer such that the material crosslinks into a network.

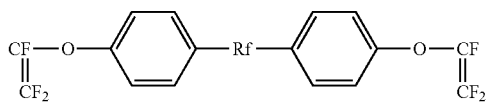

H. Sodium Naphthalene Etchant

In some embodiments a sodium naphthalene etchant, such as commercially available Tetraetch™, is contacted with a layer of a device, such as a fluoropolymer device disclosed herein. In other embodiments, a sodium naphthalene etchant is contacted with a layer of a PFPE-based device, such as a microfluidic device disclosed herein. According to such embodiments, the etch reacts with C—F bonds in the polymer of the device forming functional groups along a surface of the device. In some embodiments, these functional groups can then be reacted with modalities on other layers, on a silicon surface, on a glass surface, combinations thereof, or the like, thereby forming an adhesive bond. In some embodiments, such adhesive bonds available on the surface of devices disclosed herein, such as microfluidic devices, can increase adhesion between two devices, layers of a device, combinations thereof, or the like. Increasing the bonding strength between layers of a microfluidic device can increase the functionality of the device, for example, by increasing the pressure range that channels of the device can be operated within, increasing valve pressures, and the like.

I. Trifunctional PFPE Precursor

According to some embodiments, a trifunctional PFPE precursor can be used to fabricate devices disclosed herein, such as microfluidic devices. In one embodiment, the trifunctional PFPE precursor disclosed herein can increase the functionality of an overall device by increasing the number of functional groups that can be added to the material. Moreover, the trifunctional PFPE precursor can provide for increased cross-linking capabilities of the material. According to such embodiments, devices can be synthesized

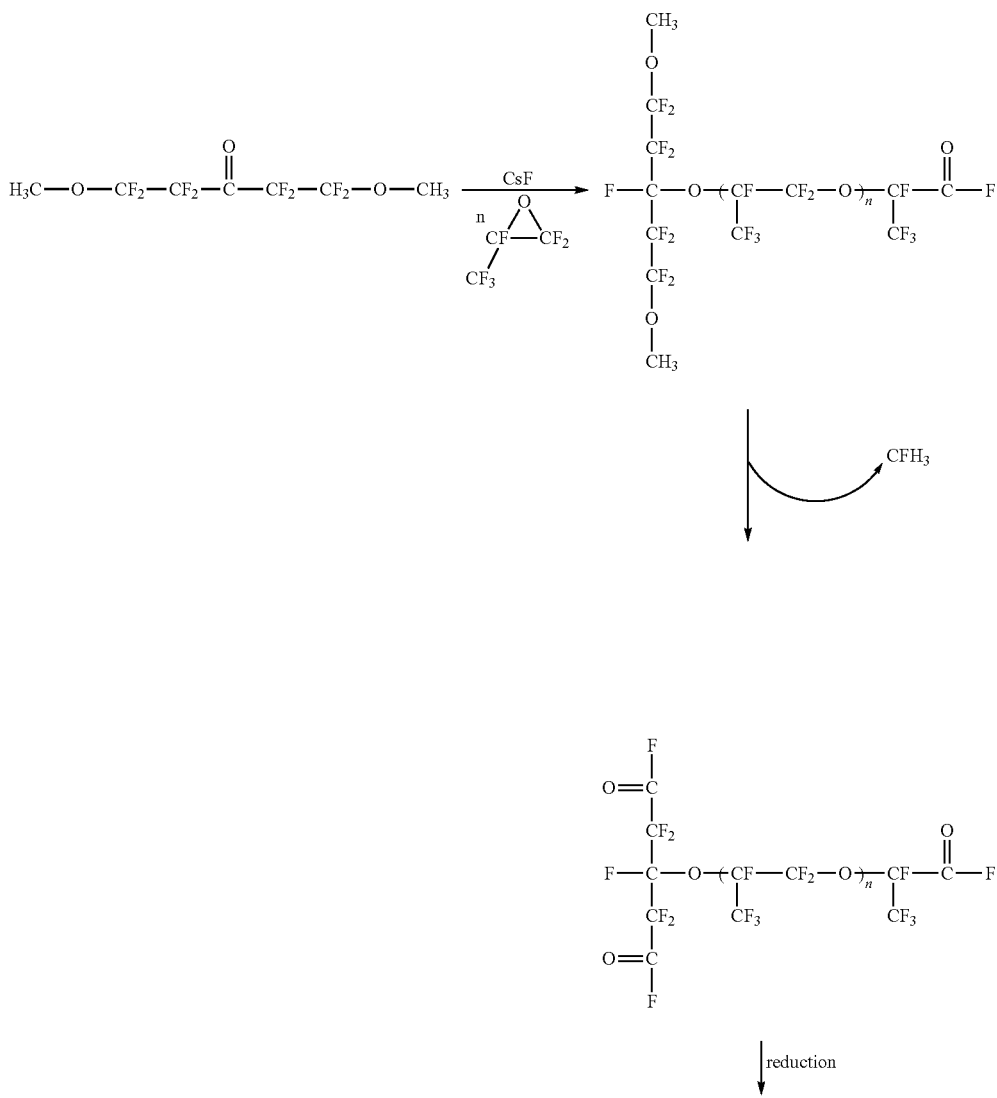

-continued

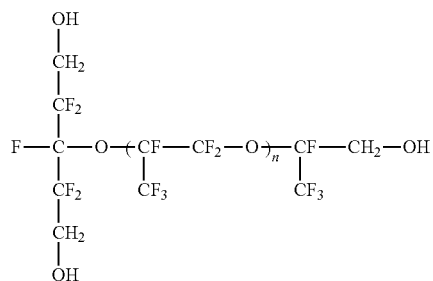

by the following reaction scheme. In further embodiments, a trifunctional PFPE precursor for the fabrication of devices, such as for example microfluidic devices disclosed herein, is synthesized by the following reaction scheme.

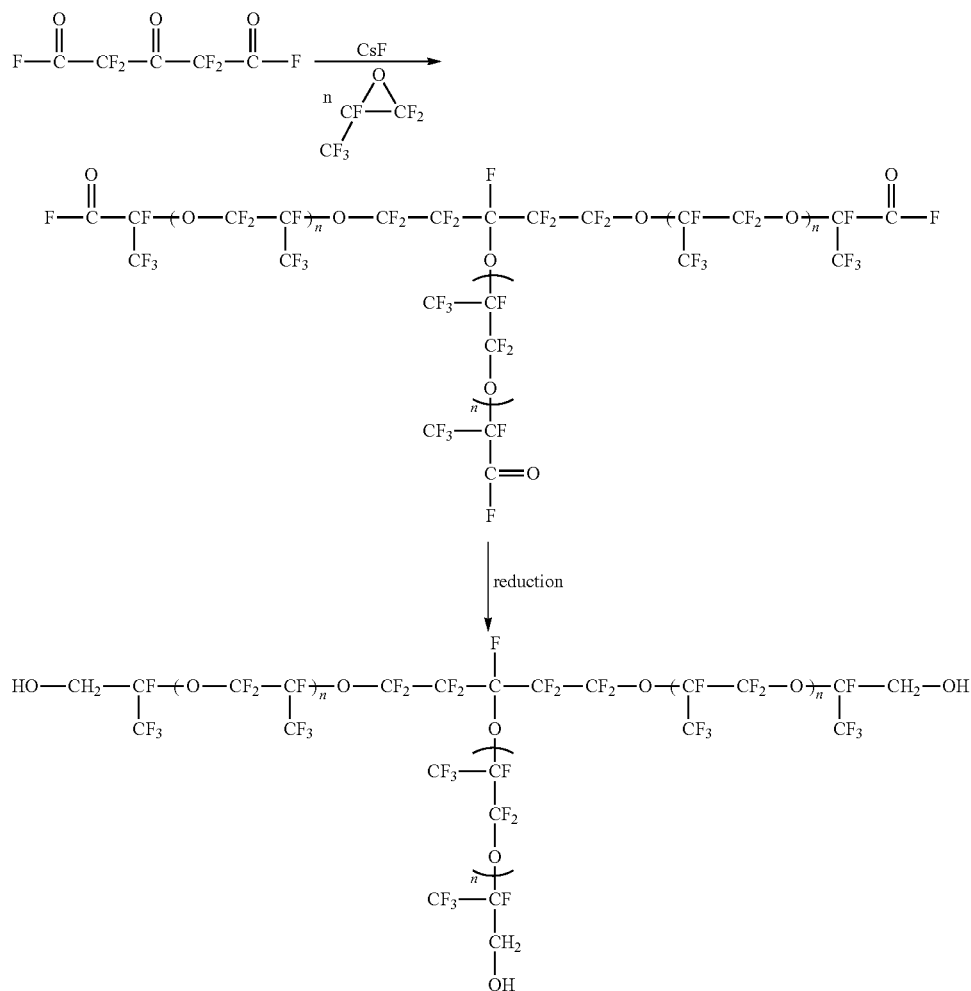

J. Fluoroalkyliodide Precursors for Generating Fluoropolymers and/or PFPE's

In some embodiments, functional PFPEs or other fluoropolymers can be generated using fluoroalkyliodide precursors. According to such embodiments, such materials can be modified by insertion of ethylene and then transformed into a host of common functionalities including but not limited to: silanes, Grignard reagents, alcohols, cyano, thiol, epoxides, amines, and carboxylic acids.

$$Rf-I+=\rightarrow Rf-CH_2CH_2-I$$

K. Diepoxy Materials

According to some embodiments, one or more of the PFPE precursors useful for fabricating devices disclose herein, such as microfluidic devices for example, contains diepoxy materials. The diepoxy materials can be synthesized by reaction of PFPE diols with epichlorohydrin according to the reaction scheme below.

HO—CH₂—CF₂—O—(CF₂CF₂O)—(CF₂O)—CF₂—CH₂—OH     + 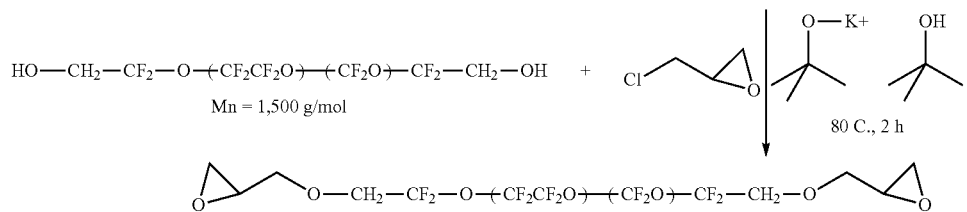

Mn = 1,500 g/mol

L. Encapped PFPE Chains with Cycloaliphatic Epoxides

In some embodiments, PFPE chains can be encapped with cycloaliphatic epoxides moieties such as cyclohexane epoxides, cyclopentane epoxides, combinations thereof, or the like. In some embodiments, the PFPE diepoxy includes a chain-extending material having the structure below synthesized by varying the ratio of diol to epichlorohydrin during the synthesis. Examples of some synthesis procedures are described by Tonelli et al. in *Journal of Polymer Science: Part A: Polymer Chemistry* 1996, Vol 34, 3263, which is incorporated herein by reference in its entirety. Utilizing this method, physical and chemical properties, such as mechanical, optical, thermal, and the like, including elasticity, solvent resistance, translucency, toughness, adhesion, and the like, of the cured material can be tuned to predetermined requirements.

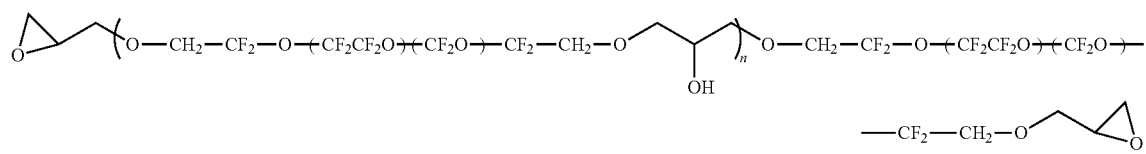

In further embodiments, the secondary alcohol formed in this reaction can be used to attach further functional groups. An example of this is shown below whereby the secondary alcohol is reacted with 2-isocyanatoethyl methacrylate to yield a material with species reactive towards both free radical and cationic curing. In some embodiments, functional groups such as in this example can be utilized to bond surfaces together, such as for example, layers of fluoropolymer, such as PFPE, material in a microfluidic device. In still further embodiments, moieties along the wall of a microfluidic chip such as biomolecules, proteins, charged species, catalysts, etc. can be attached through such secondary alcohol species.

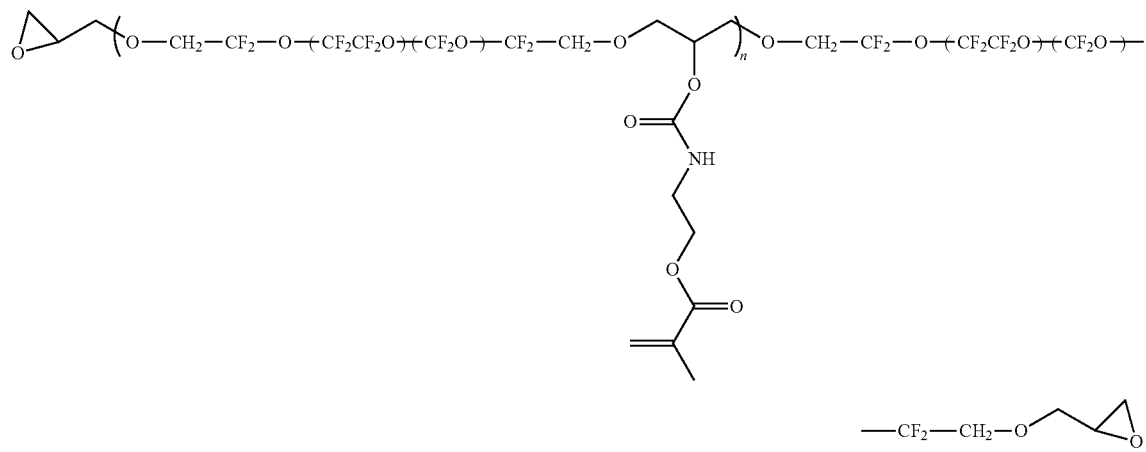

M. PFPE Diepoxy Cured with Diamines

In some embodiments, PFPE diepoxy can be cured with traditional diamines, including but not limited to, 1,6 hexanediamine; isophorone diamine; 1,2 ethanediamine; combinations thereof; and the like. According to some embodiments the diepoxy can be cured with imidazole compounds including those with the following or related structures where R1, R2, and R3 can be a hydrogen atom or other alkyl substituents such as methyl, ethyl, propyl, butyl, fluoroalkyl compounds, combinations thereof, and the like. According to some embodiments, the imidazole agent is added to the PFPE diepoxy in concentrations on the order of between about 1-25 mol % in relation to the epoxy content. In some embodiments the PFPE diepoxy containing an imidazole catalyst is the thermal part of a two cure system, such as described elsewhere herein.

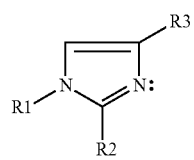

N. PFPE Cured with Photoacid Generators

In some embodiments, a PFPE diepoxy can be cured through the use of photoacid generators (PAGs). In some embodiments, the PAGs are dissolved in the PFPE material in concentrations ranging from between about 1 to about 5 mol % relative to epoxy groups and cured by exposure to UV light. Specifically, for example, these photoacid generators can posses the following structure (Rhodorsil™ 2074 (Rhodia, Inc):

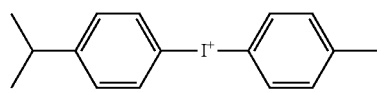

-continued

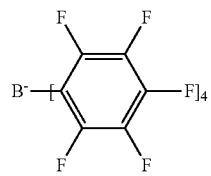

In other embodiments, the photoacid generator can be, for example, Cyracure™ (Dow Corning) possessing the following structure:

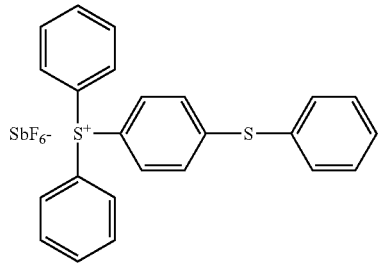

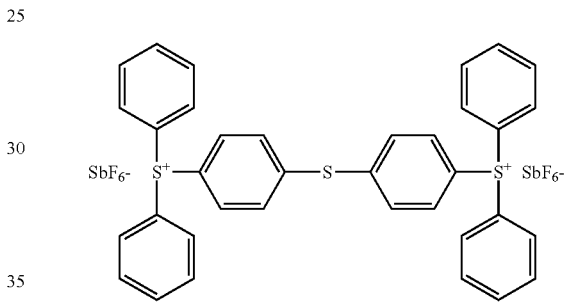

O. PFPE Diol Containing a Poly(Ethylene Glycol)

In some embodiments, a commercially available PFPE diol containing a the number of poly(ethylene glycol) units, such as those commercially sold as ZDOL TX™ (Solvay Solexis) can be used as the material for fabrication of a device, such as a microfluidic device. In other embodiments, the commercially available PFPE diol containing a given number of poly (ethylene glycol) units is used in combination with other materials disclosed herein. Such materials can be useful for dissolving the above described photoinitiators into the PFPE diepoxy and can also be helpful in tuning mechanical properties of the material as the PFPE diol containing a poly (ethylene glycol) unit can react with propagating epoxy units and can be incorporated into the final network.

P. PFPE Diols and/or Polyols Mixed with a PFPE Diepoxy

In further embodiments, commercially available PFPE diols and/or polyols, shown below and commercially sold as ZDOL™ and Z-Tetrol™ (Solvay Solexis) can be mixed with a PFPE diepoxy compound to tune mechanical properties by incorporating into the propagating epoxy network during curing.

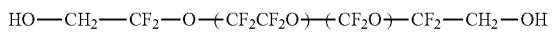

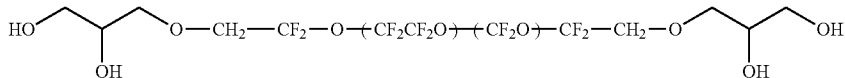

Q. PFPE Epoxy-Containing a PAG Blended with a Photoinitiator

In some embodiments, a PFPE epoxy-containing a PAG can be blended with between about 1 and about 5 mole % of a free radical photoinitiator such as, for example, 2,2-dimethoxyacetophenone, 1-hydroxy cyclohexyl phenyl ketone, diethoxyacetophenone, combinations thereof, or the like. These materials, when blended with a PAG, form reactive cationic species which are the product of oxidation by the PAG when the free-radical initiators are activated with UV light, as partially described by Crivello et al. *Macromolecules* 2005, 38, 3584, which is incorporated herein by reference in its entirety. In some embodiments, such cationic species can be capable of initiating epoxy polymerization and/or curing. The use of this method allows the PFPE diepoxy to be cured at a variety of different wavelengths.

R. PFPE Diepoxy Containing a Photoacid Generator and Blended with a PFPE Diepoxy In some embodiments, a PFPE diepoxy material containing a photoacid generator can be blended with a PFPE dimethacrylate material containing a free radical photoinitiator and possessing the following structure:

curing of the second diepoxy material at another wavelength, such as for example 254 nm. In this manner, multiple layers of patterned PFPE materials can be bonded and adhered to substrates such as glass, silicon, other polymeric materials, combinations thereof, and the like at different stages of fabrication of an overall device.

S. Other Materials

According to alternative embodiments, the following materials can be utilized alone, in connection with other materials disclosed herein, or modified by other materials disclosed herein and applied to the methods disclosed herein to fabricate, in some embodiments devices disclosed herein. Moreover, end-groups disclosed herein and disclosed in U.S. Pat. Nos. 3,810,874; and 4,818,801, each of which is incorporated herein by reference including all references cited therein.

i. Diurethane Methacrylate

In some embodiments, the material is or includes diurethane methacrylate fabricated from the following reaction and having a modulus of about 4.0 MPa and is UV curable with the following structure:

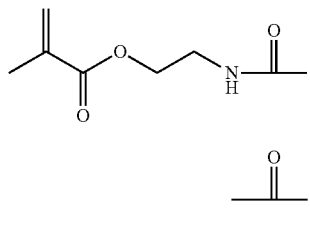

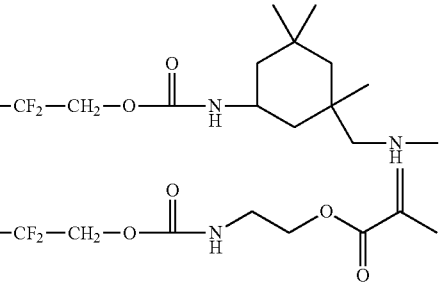

In one embodiment, the blended material includes a dual cure material which can be cured at one wavelength, for example, curing the dimethacrylate at 365 nm, and then bonded to other layers of material through activating the

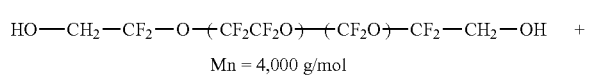

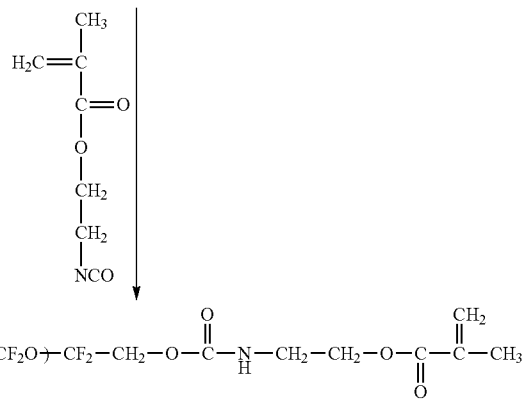

ii. Chain-Extended Diurethane Methacrylate

In some embodiments, the material is or includes a chain extended diurethane methacrylate fabricated from the following reaction and having nomenclature: 2M-240, 2M-340, 2M-440; chain extension before end-capping which increases molecular weight between crosslinks; modulus of approximately 2.0 MPa; and is UV curable, having the following structure:

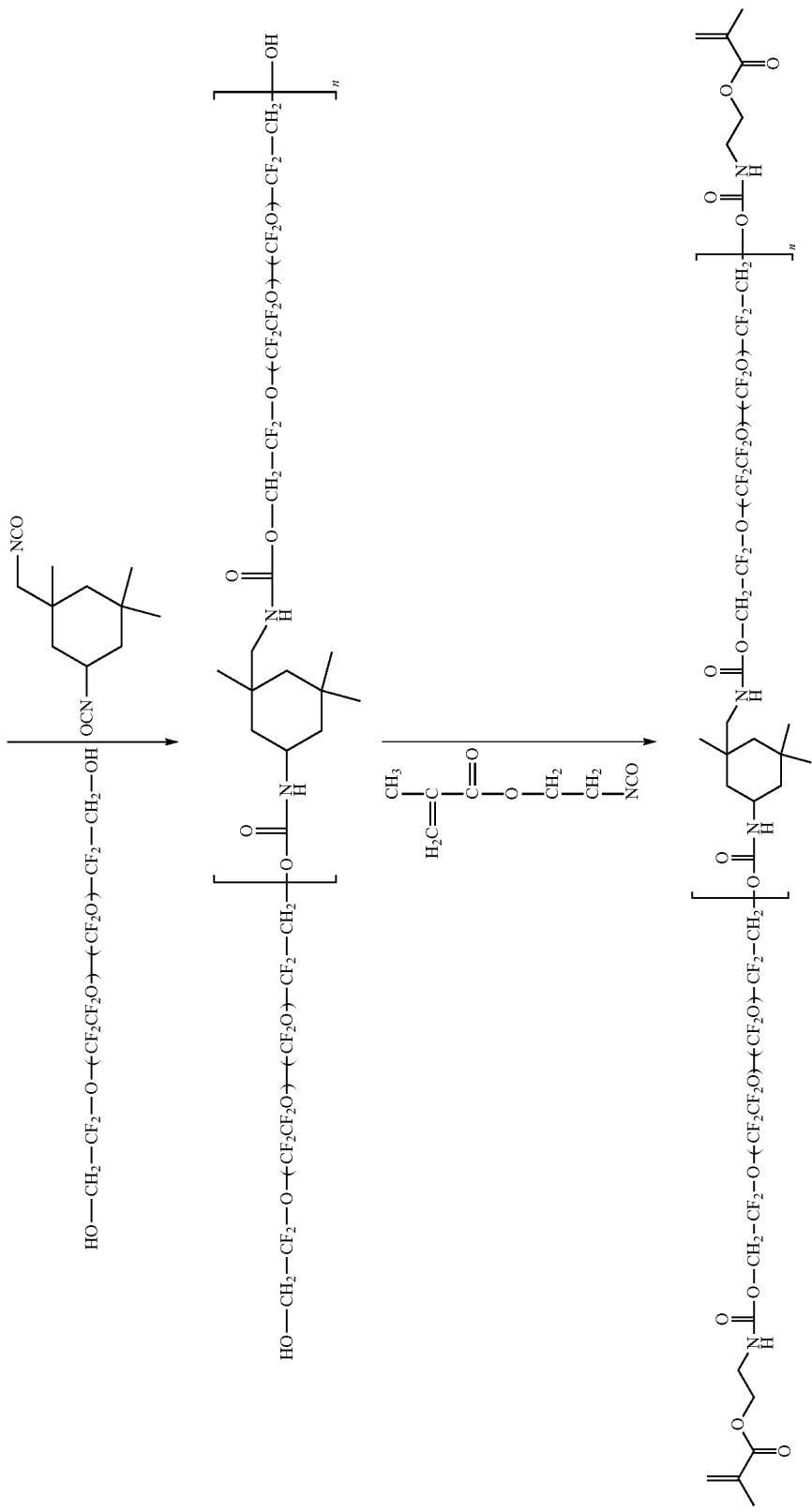

In some alternative embodiments, the chain extended diurethane methacrylate has the following structure:

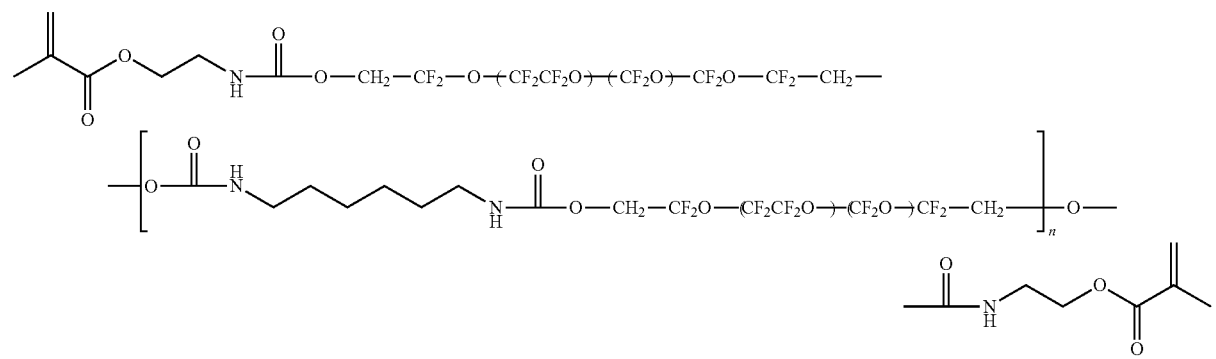

iii. Diisocyanate

In some embodiments, the material is or includes nomenclature: 2I-140; the material is typically one component of a two-component thermally curable system; may be cured by itself through a moisture cure technique (disclosed herein); can be fabricated from the following reaction and has the following structure:

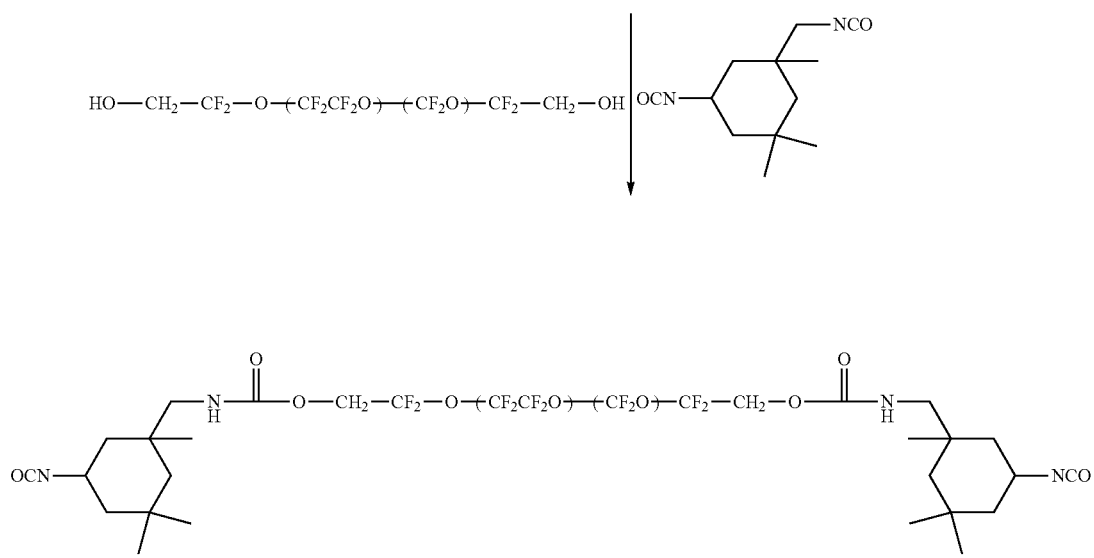

In some alternative embodiments, the diisocyanate functionalized perfluoropolyether has the following structure:

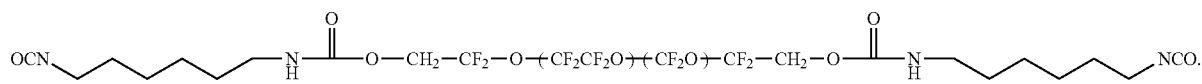

iv. Chain Extended Diisocyanate

In some embodiments, the material is or includes, nomenclature: 2I-240, 2I-340, 2I-440 (depending on the degree of chain extension); where the material is one component of a two component thermally curable system; chain extended by linking several PFPE chains together; may be cured by itself through a moisture cure; can be fabricated from the following reaction and includes the following structure:

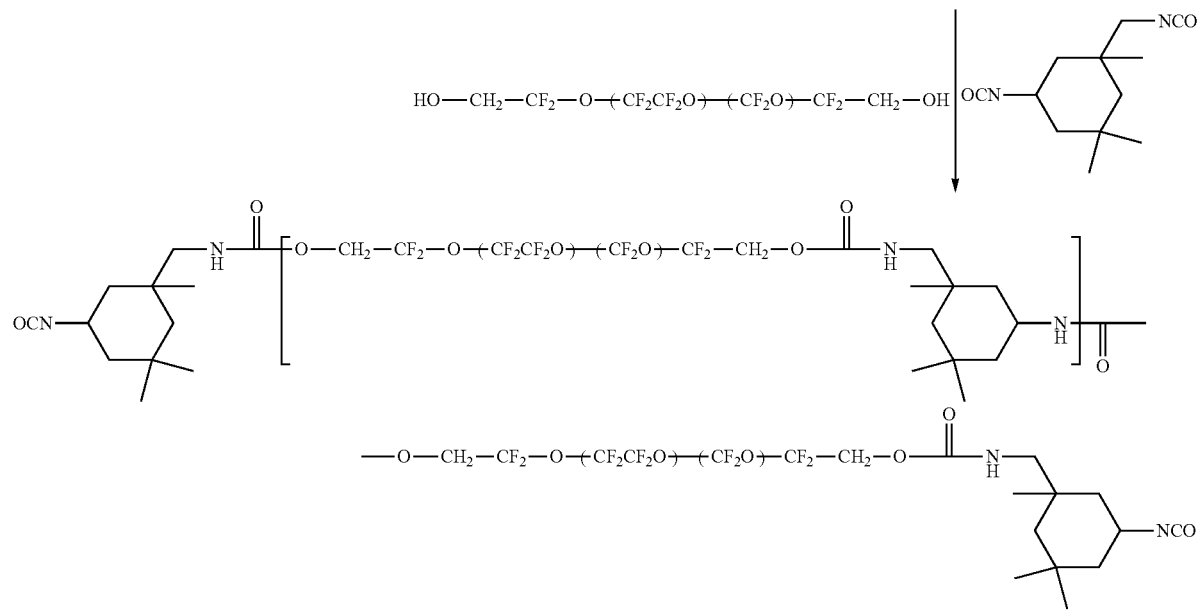

v. Blocked Diisocyanate

In some embodiments, the material is or includes: nomenclature: 2I-140B; includes similar function to 2I-140 but not moisture sensitive (blocking group cleaves at high temp and reforms isocyanate); material can be one component of a two component thermally curable system; can be fabricated from the following reaction and includes the following structure:

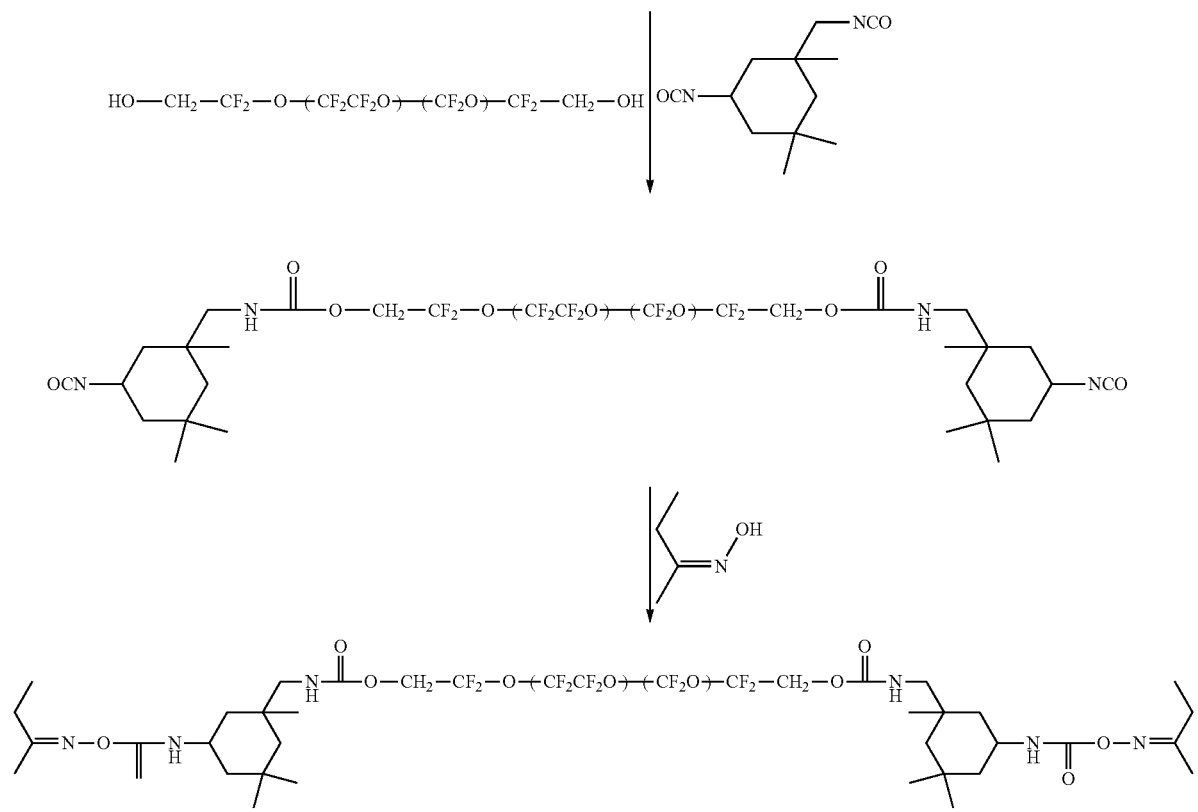

vi. PFPE Three-Armed Triol

In some embodiments, the material is or includes: nomenclature: 3A-115; is one component of a two-component thermally curable urethane system; includes the benefits of being highly miscible with other PFPE compositions; can be fabricated from the following reaction and includes the following structure:

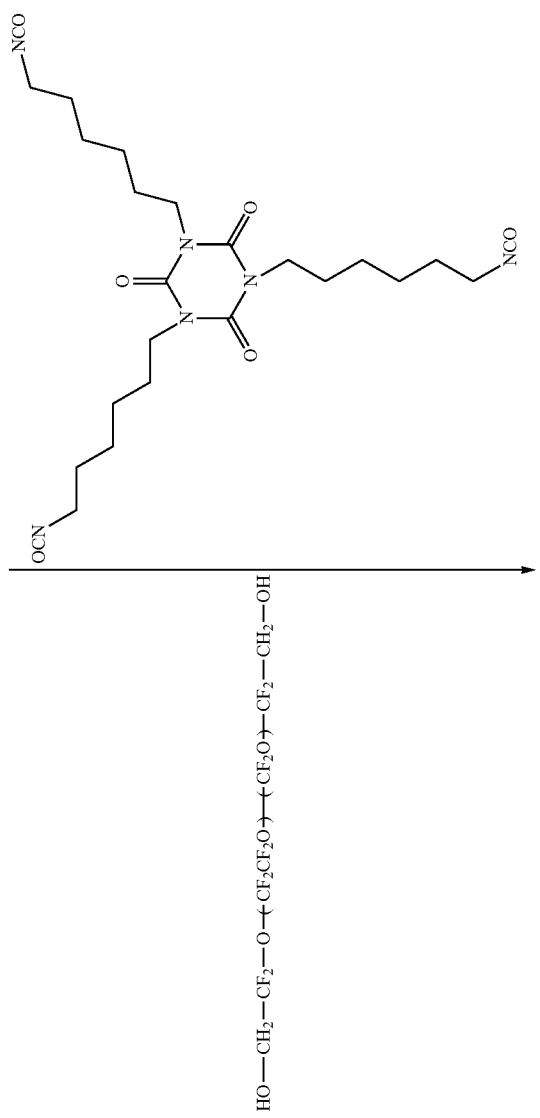

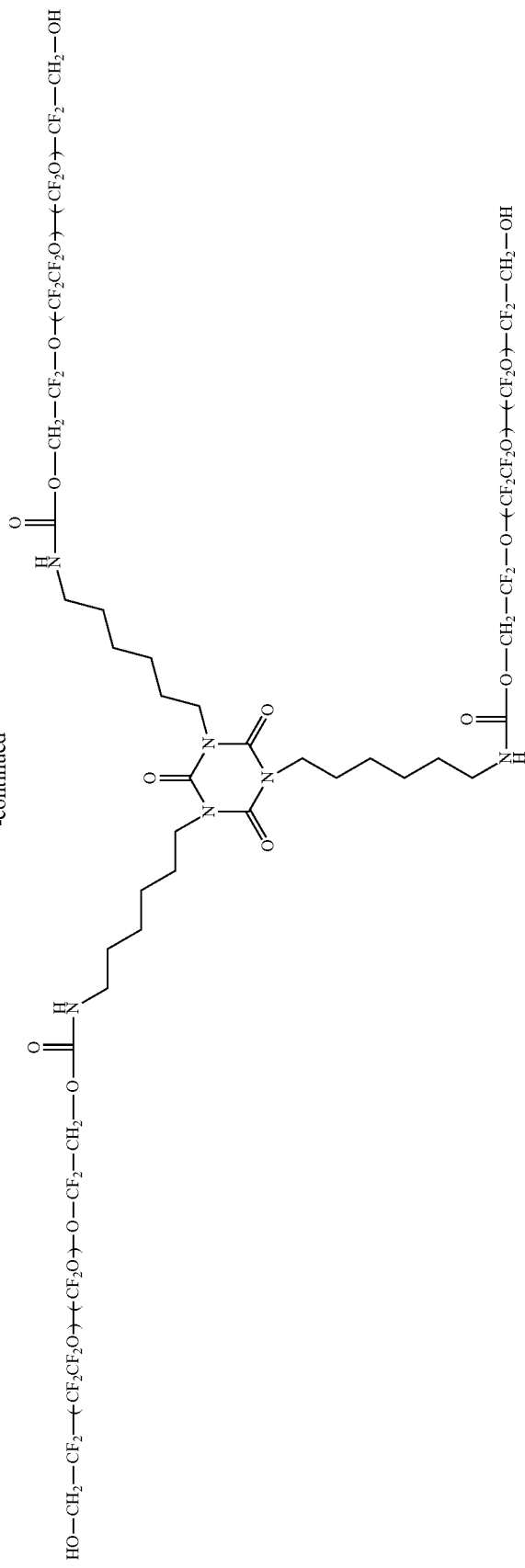

vii. PFPE DiStyrene

In some embodiments, the material is or includes: nomenclature: 2S-140; is UV curable; highly chemically stable; is useful in making laminate coatings with other compositions; can be fabricated from the following reaction and includes the following structure:

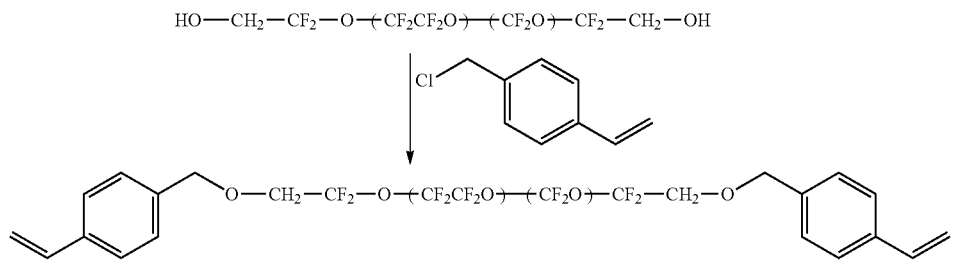

viii. Diepoxy

In some embodiments, the material is or includes: nomenclature: 2E-115, 2E-140 (depending on MW of the chain); can be UV cured; can be thermally cured by itself using imidazoles; can also be thermally cured in a two-component diamine system; is highly chemically stable; can be fabricated from the following reaction and includes the following structure:

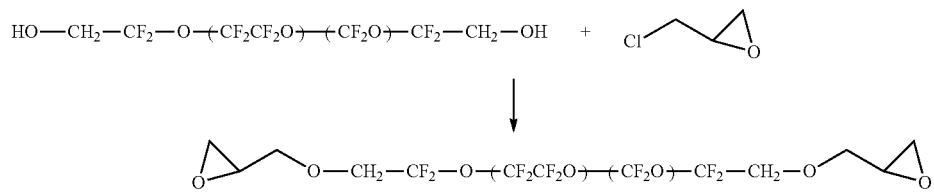

ix. Diamine

In some embodiments, the material is or includes: nomenclature: 2A-115, 2A-140 (depending on MW of the chain); can be thermally cured in a two-component diamine system; has functionality of 6 (3 amines available on each end); is highly chemically stable; can be fabricated from the following reaction and includes the following structure:

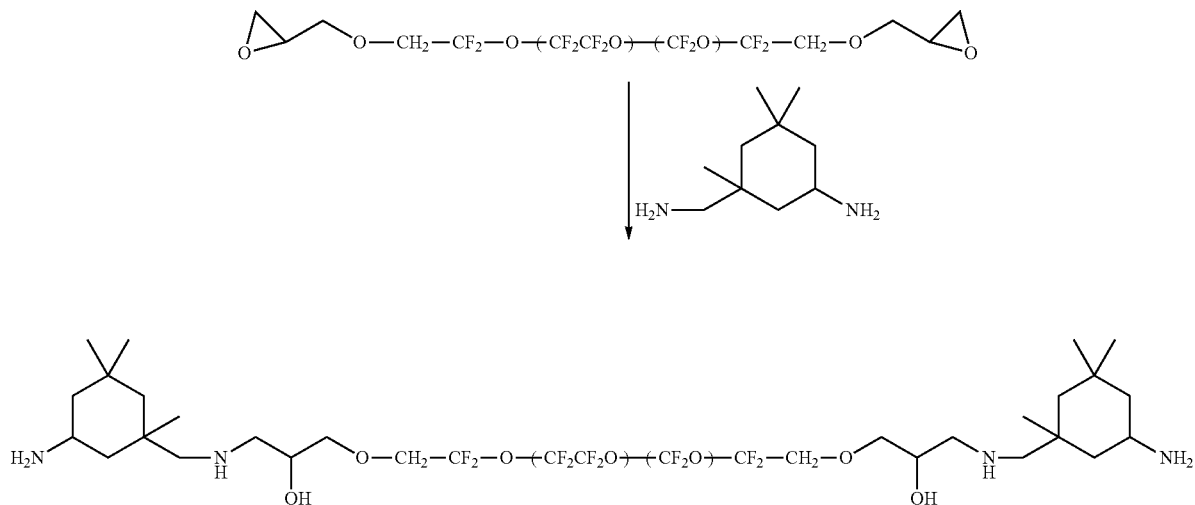

x. Thermally Cured PU-Tetrol

In some embodiments, the material is or includes: nomenclature: 2I-140+Z-tetrol; can be thermally cured in a two-component system, such as for example mixed in a 2:1 molar ratio at about 100-about 130 degrees C.; forms tough, mechanically stable network; the cured network is slightly cloudy due to immiscibility of tetrol; and includes the following:

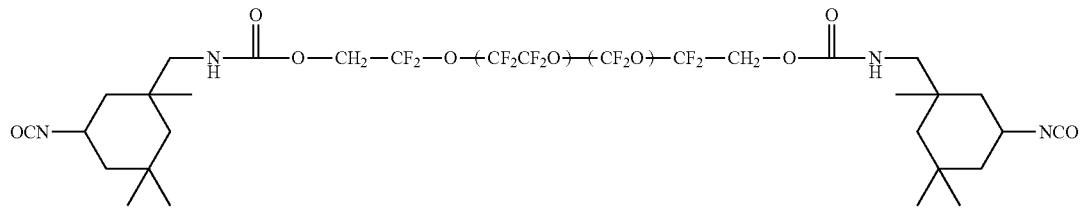

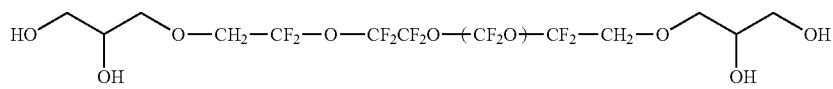

Z-Tetrol xi. Thermally Cured PU-Triol

In some embodiments, the material is or includes: nomenclature: 2I-140+3A-115; can be thermally cured in a two-component system, such as for example mixed in a 3:2 molar ratio, at about 100-about 130 degrees C.; forms tough, mechanically stable network; where the cured network is clear and colorless; and includes the following:

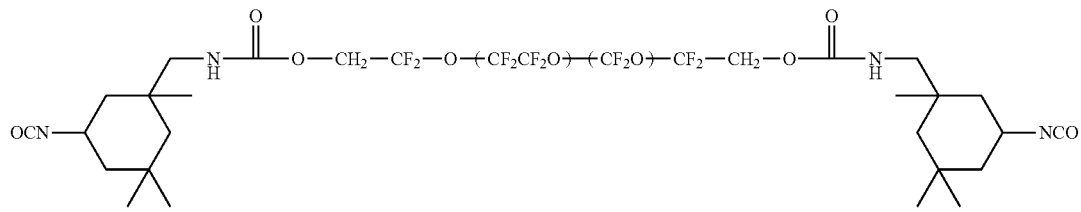

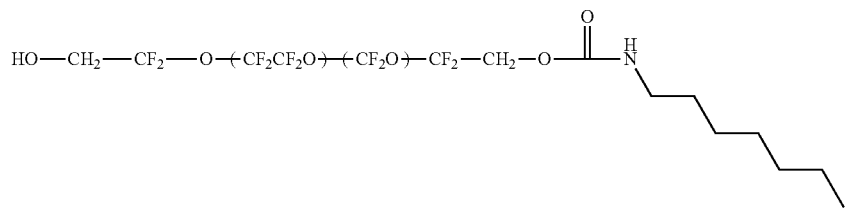

-continued

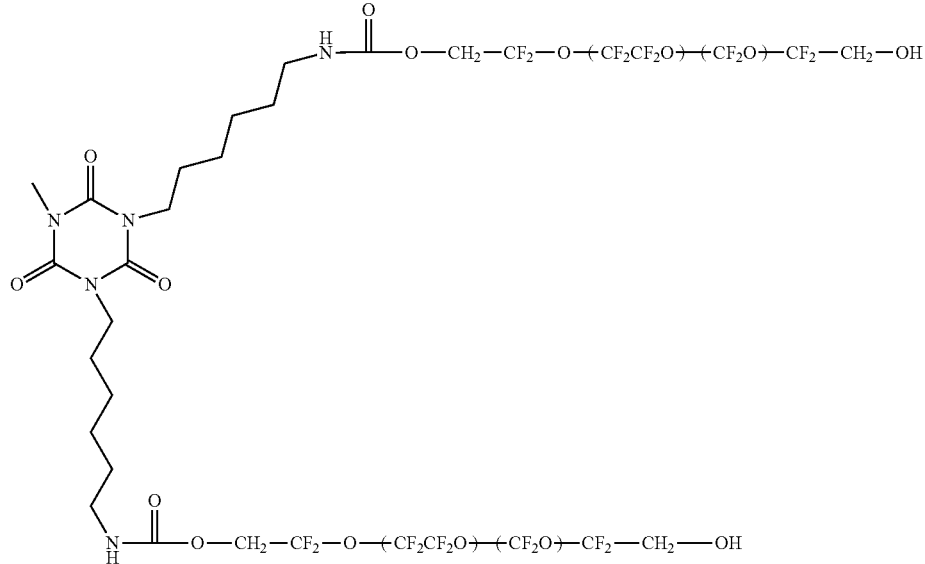

xii. Thermally Cured Epoxy

In some embodiments, the material is or includes: nomenclature: 2E-115+2A-115; can be thermally cured in a two-component system, such as for example mixed in a 3:1 molar ratio, at about 100-about 130 degrees C.; forms mechanically stable network; where the cured network is clear and colorless; has high chemical stability; and includes the following:

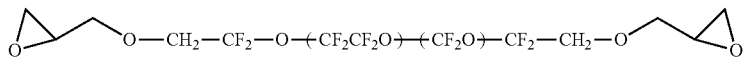

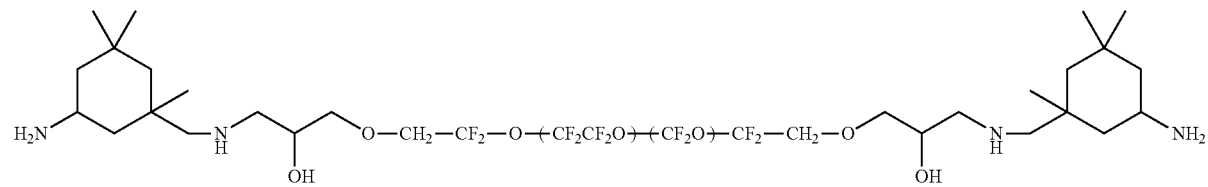

xiii. UV-Cured Epoxy

In some embodiments, the material is or includes: nomenclature: 2E-115+ZDOL TX; is a UV curable composition; includes ZDOL TX used to solubilize PAG; where the cured network is clear and yellow; has high chemical stability; and includes the following:

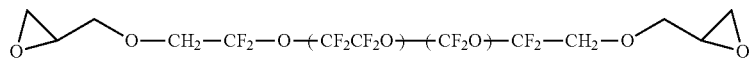

-continued
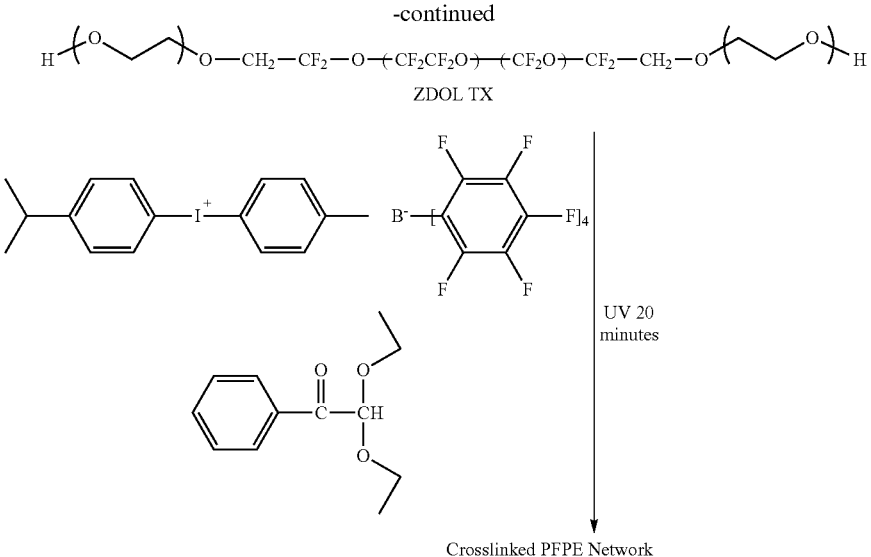
ZDOL TX
Crosslinked PFPE Network
xiv. UV-Thermal Dual Cure
In some embodiments, the material is or includes: nomenclature: 2M-240, 2I-140, Z-Tetrol; can be mixed in a 2:1 ratio (UV to thermal); forms cloudy network (tetrol); has a high viscosity; forms a very strong adhesion; has very good mechanical properties; and includes the following:
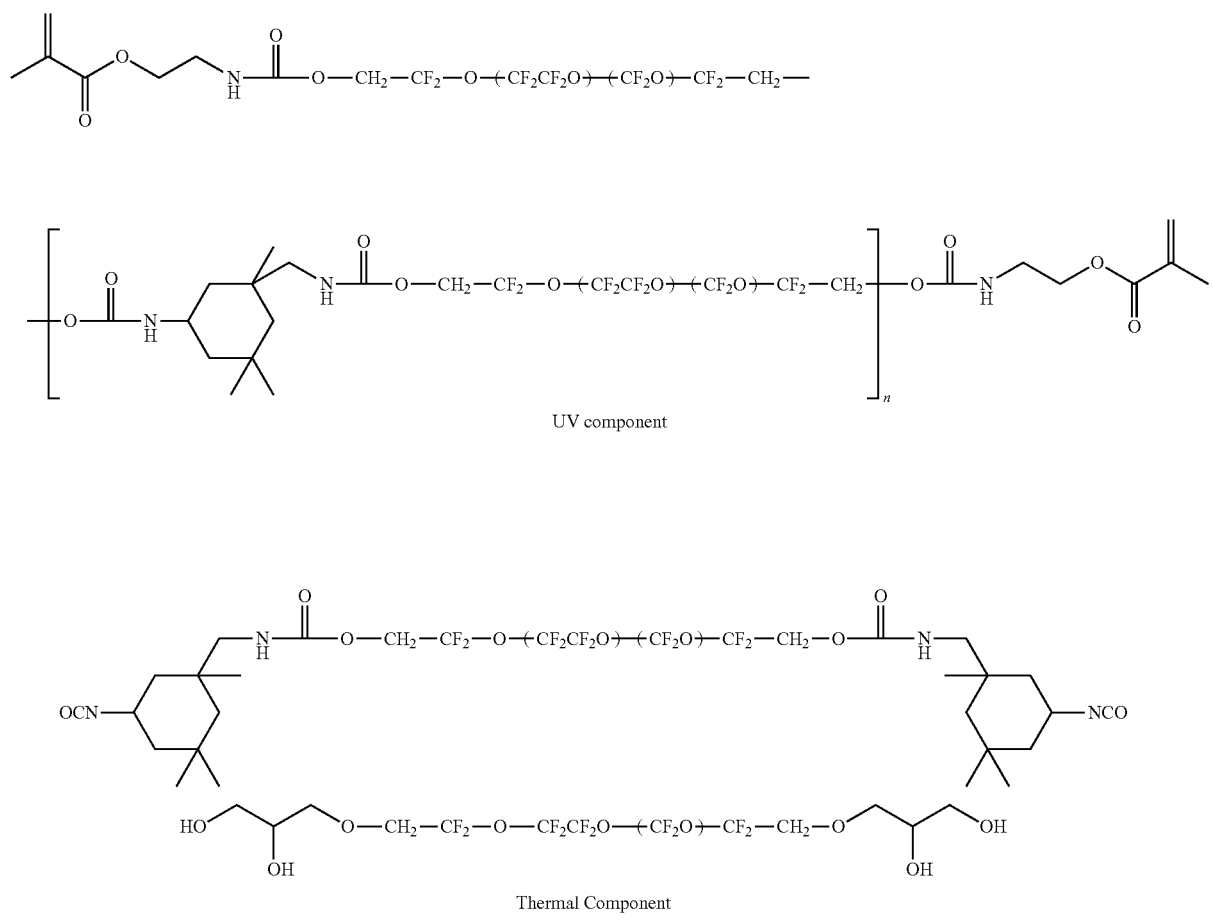
UV component
Thermal Component xv. Orthogonal Cure with Triol

In some embodiments, the material is or includes: nomenclature: 2M-240, 2I-140, 3A-115; can be mixed in a 2:1 ratio (UV to thermal); forms clear and colorless network; has a high viscosity; forms very strong adhesion; includes very good mechanical properties; and includes the following:

xvi. UV Orthogonal System

In some embodiments, the material is or includes: nomenclature: 2M-240, 2E-115, ZDOL-TX; can be mixed in a 1:1 ratio (epoxy to methacrylate); forms clear and yellow network; has strong adhesion properties; has good mechanical properties; and includes the following:

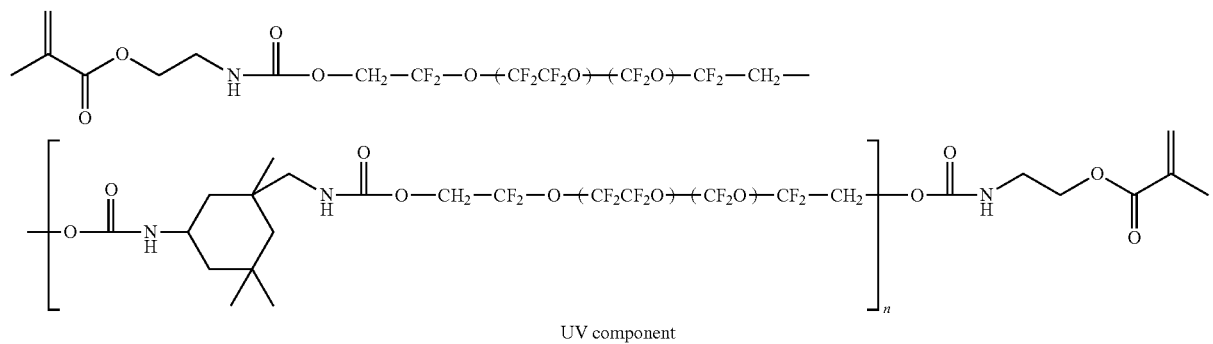

UV component

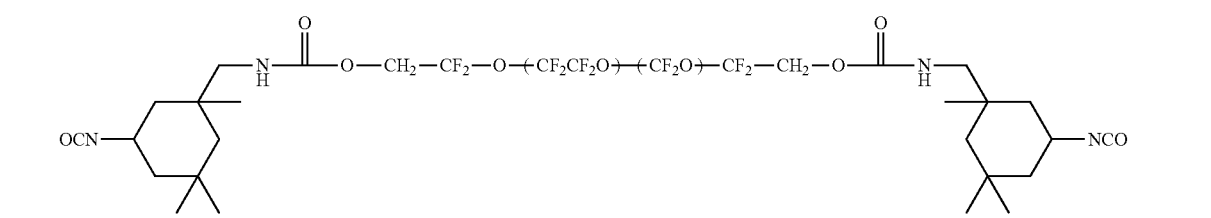

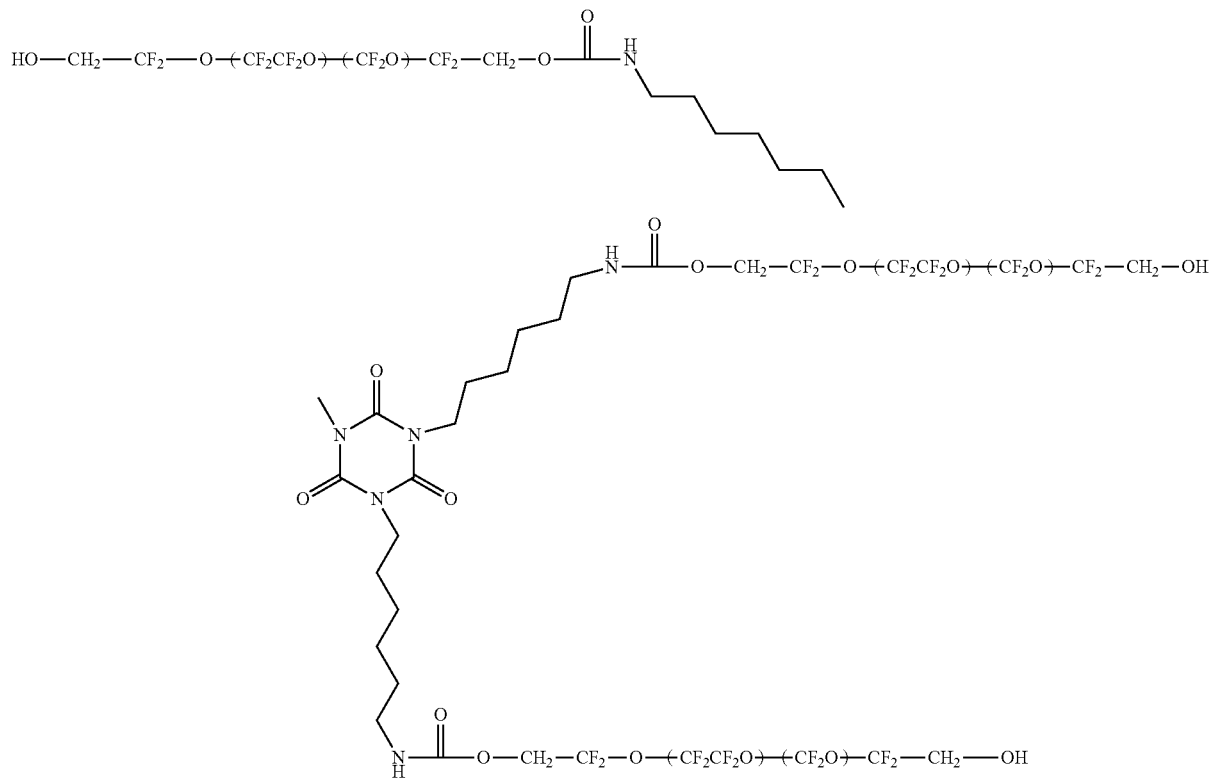

Thermal Component

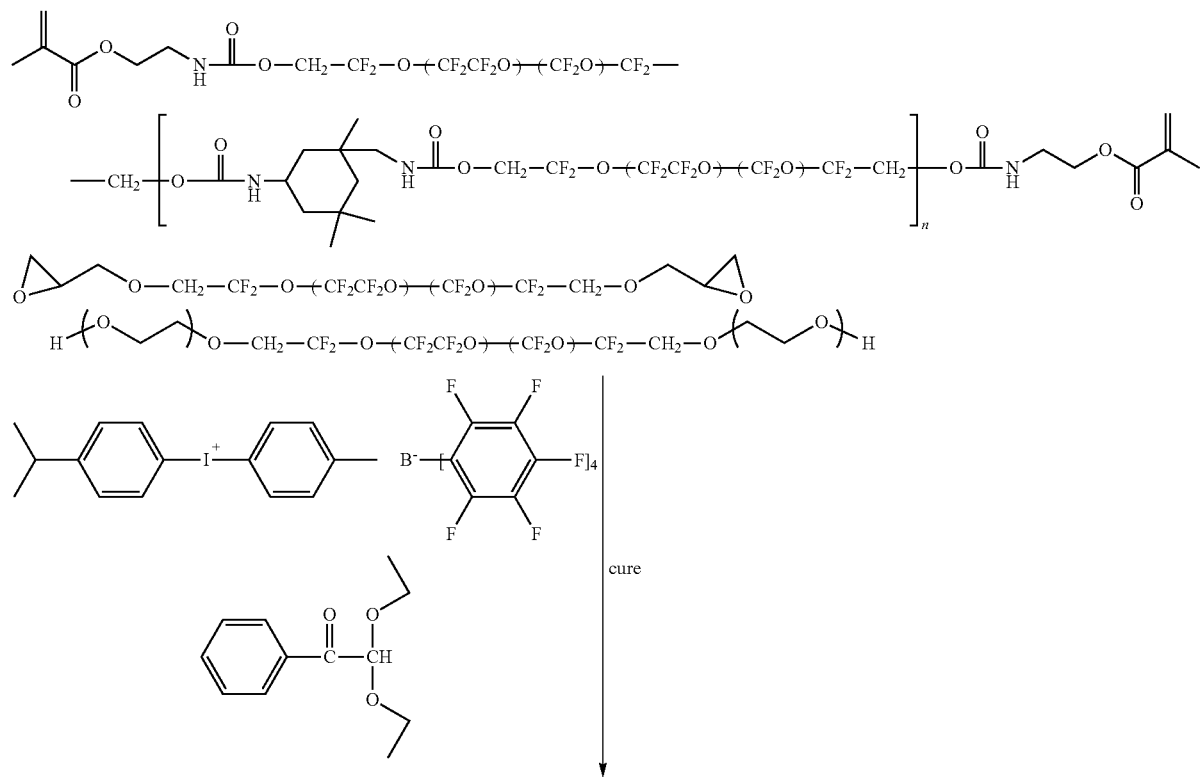
xvii. UV with Epoxy Dual Cure
In some embodiments, the material is or includes: nomenclature: 2M-240, 2E-115, DA-115; the material forms slightly yellow network; includes a ratio (2:1 UV to thermal); has good mechanical properties; good adhesion; is highly chemical stability; and includes the following:
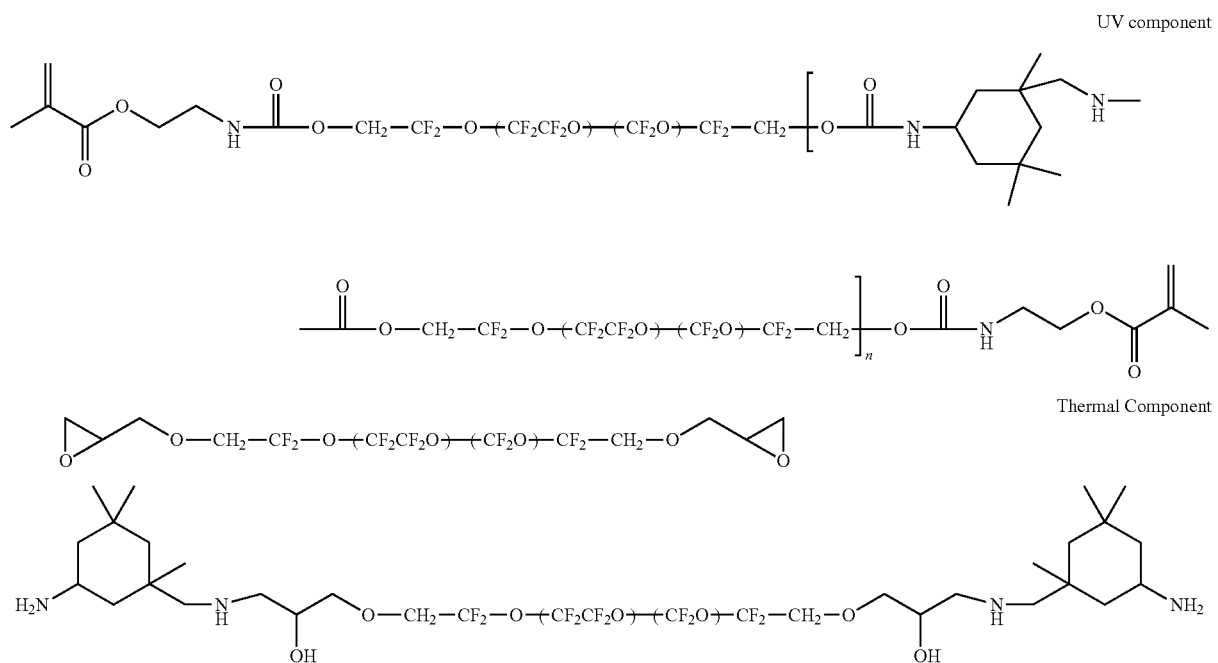

xviii. Orthogonal with Diisocyanate

In some embodiments, the material is or includes: nomenclature: 2M-240, 2I-140; is one component of a thermal cure system (isocyanate reacts with urethane linkage on urethane dimethacrylate); has good mechanical properties; forms a strong adhesion; cures to clear, slightly yellow network; and includes the following:

In some embodiments, the liquid PFPE precursor material is partially cured to form a partially cured PFPE network. In some embodiments, the partially cured network is contacted with a second partially cured layer of PFPE material and the curing reaction is taken to completion, thereby forming a permanent bond between the PFPE layers.

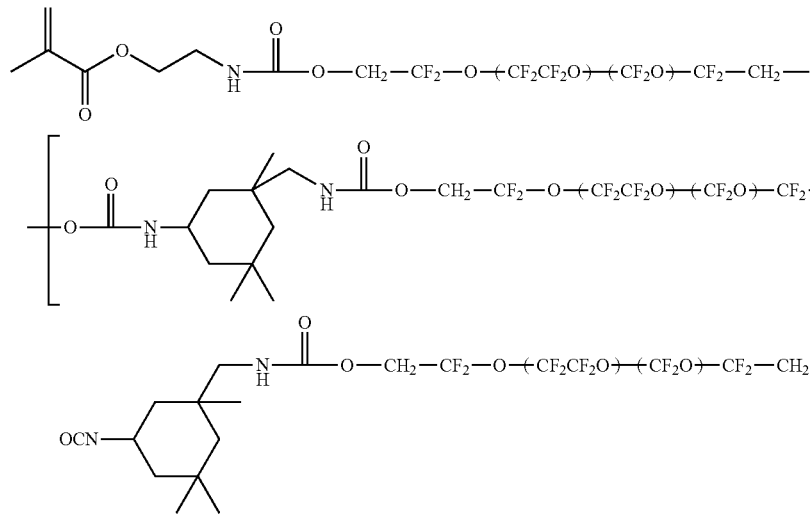

xix. ePTFE Combined with PFPE

In some embodiments, expanded poly (tetrafluoroethylene) (ePTFE) is combined with PFPE. ePTFE is a microporous poly (tetrafluoroethylene) (PTFE) membrane formed by expanding PTFE at high temperatures. Because of the incredibly low surface energy of perfluoropolyether (PFPE) materials, as disclosed herein, the PFPE can be cast onto ePTFE membranes and effectively wet the pores of the ePTFE, thereby forming an interpenetrating polymer network.

The PFPE can include functional groups, such as functional groups disclosed herein. In some embodiments, the PFPE can include photocurable functional groups and/or thermalcurable functional groups. In some embodiments, where the PFPE includes a photocurable functional group, the PFPE can be cured by exposure to UV light after it has been wetted onto the ePTFE. The resulting membrane of ePTFE and PFPE includes, for example, desirable flexibility, chemically resistance, and gas permeability to solvent vapors and to air. The ePTFE portion of the membrane provides a continuous structure which serves to greatly toughen materials compared to just an elastomer itself. Some membranes are generally described by Zumbrum et al. in U.S. Pat. No. 6,673,455, which is incorporated by reference herein in its entirety including all reference cited therein.

III. Method for Forming a Microfluidic Device Through a Thermal Free Radical Curing Process In some embodiments, the presently disclosed subject matter provides a method for forming a microfluidic device by which a functional liquid perfluoropolyether (PFPE) precursor material is contacted with a patterned substrate, i.e., a master, and is thermally cured using a free radical initiator. As provided in more detail herein below, in some embodiments, the liquid PFPE precursor material is fully cured to form a fully cured PFPE network, which can then be removed from the patterned substrate and contacted with a second substrate to form a reversible, hermetic seal.

Further, the partially cured PFPE network can be contacted with a layer or substrate including another polymeric material, such as poly(dimethylsiloxane) or another polymer, and then thermally cured so that the PFPE network adheres to the other polymeric material. Additionally, the partially cured PFPE network can be contacted with a solid substrate, such as glass, quartz, or silicon, and then bonded to the substrate through the use of a silane coupling agent.

A. Method of Forming a Patterned Layer of an Elastomeric Material

Figure 1B:
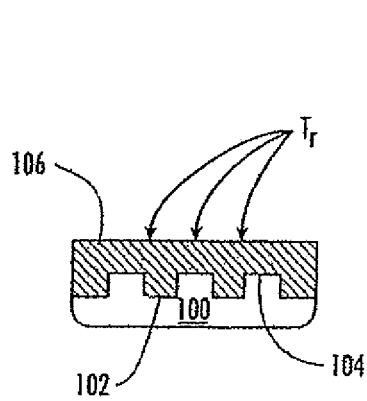
Figure 1C:
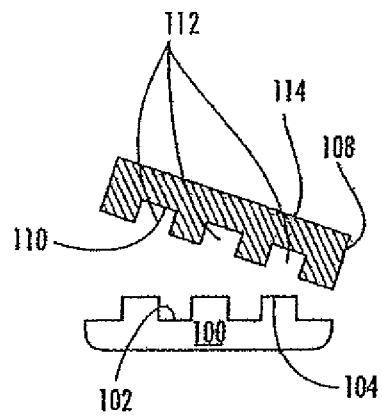

In some embodiments, the presently disclosed subject matter provides a method of forming a patterned layer of an elastomeric material. The presently disclosed method is suitable for use with the perfluoropolyether material described in Sections II.A. and II.B., and the fluoroolefin-based materials described in Section II.C. An advantage of using a higher viscosity PFPE material allows, among other things, for a higher molecular weight between cross links. A higher molecular weight between cross links can improve the elastomeric properties of the material, which can prevent among other things, cracks from forming. Referring now to FIGS. 1A-1C, a schematic representation of an embodiment of the presently disclosed subject matter is shown. A substrate 100 having a patterned surface 102 with a raised protrusion 104 is depicted. Accordingly, the patterned surface 102 of the substrate 100 includes at least one raised protrusion 104, which forms the shape of a pattern. In some embodiments, patterned surface 102 of substrate 100 includes a plurality of raised protrusions 104 which form a complex pattern.

As best seen in FIG. 1B, a liquid precursor material 106 is disposed on patterned surface 102 of substrate 100. As shown in FIG. 1B, the liquid precursor material 102 is treated with a treating process $T_r$. Upon the treating of liquid precursor material 106, a patterned layer 108 of an elastomeric material (as shown in FIG. 1C) is formed.

As shown in FIG. 1C, the patterned layer 108 of the elastomeric material includes a recess 110 that is formed in the bottom surface of the patterned layer 108. The dimensions of recess 110 correspond to the dimensions of the raised protrusion 104 of patterned surface 102 of substrate 100. In some embodiments, recess 110 includes at least one channel 112, which in some embodiments of the presently disclosed subject matter includes a microscale channel. Patterned layer 108 is removed from patterned surface 102 of substrate 100 to yield microfluidic device 114. In some embodiments, removal of microfluidic device 114 is performed using a "lift-off" solvent which slowly wets underneath the device and releases it from the patterned substrate. Examples of such solvents include, but are not limited to, any solvent that will not adversely interact with the microfluidic device or functional components of the microfluidic device. Examples of such solvents include, but are not limited to: water, isopropyl alcohol, acetone, N-methylpyrollidinone, and dimethyl formamide.

In some embodiments, the patterned substrate includes an etched silicon wafer. In some embodiments, the patterned substrate includes a photoresist patterned substrate. In some embodiments, the patterned substrate is treated with a coating that can aid in the release of the device from the patterned substrate or prevent reaction with latent groups on a photoresist which constitutes the patterned substrate. An example of the coating can include, but is not limited to, a silane or thin film of metal deposited from a plasma, such as, a Gold/Palladium coating. For the purposes of the presently disclosed subject matter, the patterned substrate can be fabricated by any of the processing methods known in the art, including, but not limited to, photolithography, electron beam lithography, and ion milling.

In some embodiments, the patterned layer of perfluoropolyether is between about 0.1 micrometers and about 100 micrometers thick. In some embodiments, the patterned layer of perfluoropolyether is between about 0.1 millimeters and about 10 millimeters thick. In some embodiments, the patterned layer of perfluoropolyether is between about one micrometer and about 50 micrometers thick. In some embodiments, the patterned layer of perfluoropolyether is about 20 micrometers thick. In some embodiments, the patterned layer of perfluoropolyether is about 5 millimeters thick.

In some embodiments, the patterned layer of perfluoropolyether includes a plurality of microscale channels. In some embodiments, the channels have a width ranging from about 0.01 µm to about 1000 µm; a width ranging from about 0.05 µm to about 1000 µm; and/or a width ranging from about 1 µm to about 1000 µm. In some embodiments, the channels have a width ranging from about 1 µm to about 500 µm; a width ranging from about 1 µm to about 250 µm; and/or a width ranging from about 10 µm to about 200 µm. Exemplary channel widths include, but are not limited to, 0.1 µm, 1 µm, 2 µm, 5 µm, 10 µm, 20 µm, 30 µm, 40 µm, 50 µm, 60 µm, 70 µm, 80 µm, 90 µm, 100 µm, 110 µm, 120 µm, 130 µm, 140 µm, 150 µm, 160 µm, 170 µm, 180 µm, 190 µm, 200 µm, 210 µm, 220 µm, 230 µm, 240 µm, and 250 µm.

In some embodiments, the channels have a depth ranging from about 1 µm to about 1000 µm; and/or a depth ranging from about 1 µm to 100 µm. In some embodiments, the channels have a depth ranging from about 0.01 µm to about 1000 µm; a depth ranging from about 0.05 µm to about 500 µm; a depth ranging from about 0.2 µm to about 250 µm; a depth ranging from about 1 µm to about 100 µm; a depth ranging from about 2 µm to about 20 µm; and/or a depth ranging from about 5 µm to about 10 µm. Exemplary channel depths include, but are not limited to, 0.01 µm, 0.02 µm, 0.05 µm, 0.1 µm, 0.2 µm, 0.5 µm, 1 µm, 2 µm, 3 µm, 4 µm, 5 µm, 7.5 µm, 10 µm, 12.5 µm, 15 µm, 17.5 µm, 20 µm, 22.5 µm, 25 µm, 30 µm, 40 µm, 50 µm, 75 µm, 100 µm, 150 µm, 200 µm, and 250 µm.

In some embodiments, the channels have a width-to-depth ratio ranging from about 0.1:1 to about 100:1. In some embodiments, the channels have a width-to-depth ratio ranging from about 1:1 to about 50:1. In some embodiments, the channels have a width-to-depth ratio ranging from about 2:1 to about 20:1. In some embodiments, the channels have a width-to-depth ratio ranging from about 3:1 to about 15:1. In some embodiments, the channels have a width-to-depth ratio of about 10:1.

One of ordinary skill in the art would recognize that the dimensions of the channels of the presently disclosed subject matter are not limited to the exemplary ranges described hereinabove and can vary in width and depth to affect the magnitude of force required to flow a material through the channel and/or to actuate a valve to control the flow of the material therein. Further, as will be described in more detail herein below, channels of greater width are contemplated for use as a fluid reservoir, a reaction chamber, a mixing channel, a separation region, and the like.

B. Method for Forming a Multilayer Patterned Material

In some embodiments, the presently disclosed subject matter describes a method for forming a multilayer patterned material, e.g., a multilayer patterned PFPE material. In some embodiments, the multilayer patterned perfluoropolyether material is used to fabricate a monolithic PFPE-based microfluidic device.

Referring now to FIGS. 2A-2D, a schematic representation of the preparation of an embodiment of the presently disclosed subject matter is shown. Patterned layers 200 and 202 are provided, each of which, in some embodiments, include a perfluoropolyether material prepared from a liquid PFPE precursor material having a viscosity greater than about 100 cSt. In this example, each of the patterned layers 200 and 202 include a plurality of channels 204. In this embodiment of the presently disclosed subject matter, the plurality of channels 204 include microscale channels. In patterned layer 200, the channels are represented by a dashed line, i.e., in shadow, in FIGS. 2A-2C. Patterned layer 202 is overlaid on patterned layer 200 in a predetermined alignment. In this example, the predetermined alignment is such that channels 204 in patterned layer 200 and 202 are substantially perpendicular to each other. In some embodiments, as depicted in FIGS. 2A-2D, patterned layer 200 is overlaid on nonpatterned layer 206. Nonpatterned layer 206 can include a perfluoropolyether.

Figures 2A, 2B, 2C:
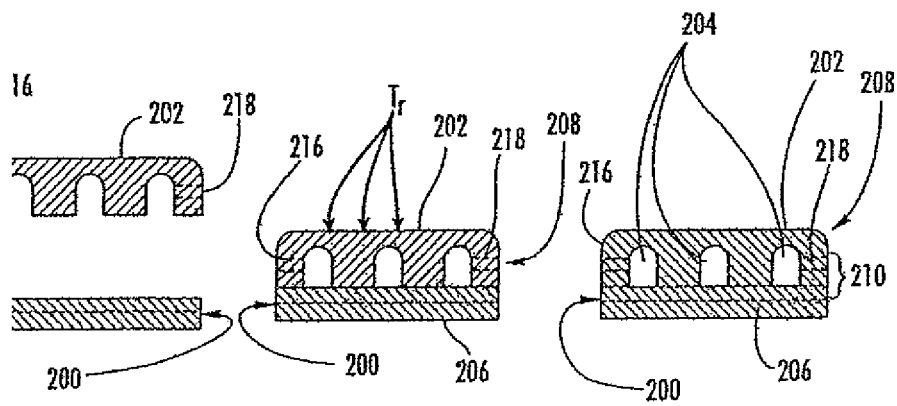
FIGS. 2A-2D are a series of schematic end views depicting the formation of a device comprising two patterned layers of a polymeric material in accordance with the presently disclosed subject matter.
Figure 2D:
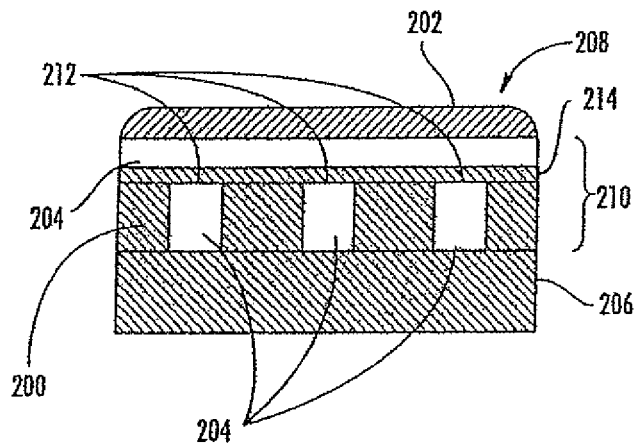

Continuing with reference to FIGS. 2A-2D, patterned layers 200 and 202, and in some embodiments nonpatterned layer 206, are treated by a treating process $T_r$. As described in more detail herein below, layers 200, 202, and, in some embodiments nonpatterned layer 206, are treated by treating $T_r$, to promote the adhesion of patterned layers 200 and 202 to each other, and in some embodiments, patterned layer 200 to nonpatterned layer 206, as shown in FIGS. 2C and 2D. The resulting microfluidic device 208 includes an integrated network 210 of microscale channels 204 which intersect predetermined intersecting points 212, as best seen in the cross-section provided in FIG. 2D. Also shown in FIG. 2D is membrane 214 comprising the top surface of channels 204 of patterned layer 200 which separates channel 204 of patterned layer 202 from channels 204 of patterned layer 200.

Continuing with reference to FIGS. 2A-2C, in some embodiments, patterned layer 202 includes a plurality of apertures, and the apertures are designated input aperture 216 and output aperture 218. In some embodiments, the holes, e.g., input aperture 216 and output aperture 218 are in fluid communication with channels 204. In some embodiments, the apertures include a side-actuated valve structure constructed of, for example, a thin membrane of PFPE material which can be actuated to restrict the flow in an abutting channel. It will be appreciated, however, that the side-actuated valve structure can be constructed from other materials disclosed herein.

In some embodiments, the first patterned layer of photocured PFPE material is cast at such a thickness to impart a degree of mechanical stability to the PFPE structure. Accordingly, in some embodiments, the first patterned layer of the photocured PFPE material is about 50 µm to several centimeters thick. In some embodiments, the first patterned layer of the photocured PFPE material is between 50 µm and about 10 millimeters thick. In some embodiments, the first patterned layer of the photocured PFPE material is 5 mm thick. In some embodiments, the first patterned layer of PFPE material is about 4 mm thick. Further, in some embodiments, the thickness of the first patterned layer of PFPE material ranges from about 0.1 µm to about 10 cm; from about 1 µm to about 5 cm; from about 10 µm to about 2 cm; and from about 100 µm to about 10 mm.

In some embodiments, the second patterned layer of the photocured PFPE material is between about 1 micrometer and about 100 micrometers thick. In some embodiments, the second patterned layer of the photocured PFPE material is between about 1 micrometer and about 50 micrometers thick. In some embodiments, the second patterned layer of the photocured material is about 20 micrometers thick.

Although FIGS. 2A-2C disclose the formation of a microfluidic device wherein two patterned layers of PFPE material are combined, in some embodiments of the presently disclosed subject matter it is possible to form a microfluidic device having one patterned layer and one non-patterned layer of PFPE material. Thus, the first patterned layer can include a microscale channel or an integrated network of microscale channels and then the first patterned layer can be overlaid on top of the non-patterned layer and adhered to the non-patterned layer using a photocuring step, such as application of ultraviolet light as disclosed herein, to form a monolithic structure including enclosed channels therein.

Accordingly, in some embodiments, a first and a second patterned layer of photocured perfluoropolyether material, or alternatively a first patterned layer of photocured perfluoropolyether material and a nonpatterned layer of photocured perfluoropolyether material, adhere to one another, thereby forming a monolithic PFPE-based microfluidic device.

C. Method of Forming a Patterned PFPE Layer Through a Thermal Free Radical Curing Process In some embodiments, a thermal free radical initiator, including, but not limited to, a peroxide and/or an azo compound, is blended with a liquid perfluoropolyether (PFPE) precursor, which is functionalized with a polymerizable group, including, but not limited to, an acrylate, a methacrylate, and a styrenic unit to form a blend. As shown in FIGS. 1A-1C, the blend is then contacted with a patterned substrate, i.e., a "master," and heated to cure the PFPE precursor into a network.

In some embodiments, the PFPE precursor is fully cured to form a fully cured PFPE precursor. In some embodiments, the free radical curing reaction is allowed to proceed only partially to form a partially-cured network.

D. Method of Adhering a Layer of a PFPE Material to a Substrate Through a Thermal Free Radical Curing Process In some embodiments the fully cured PFPE precursor is removed, e.g., peeled, from the patterned substrate, i.e., the master, and contacted with a second substrate to form a reversible, hermetic seal.

In some embodiments, the partially cured network is contacted with a second partially cured layer of PFPE material and the curing reaction is taken to completion, thereby forming a permanent bond between the PFPE layers.

In some embodiments, the partial free-radical curing method is used to bond at least one layer of a partially-cured PFPE material to a substrate. In some embodiments, the partial free-radical curing method is used to bond a plurality of layers of a partially-cured PFPE material to a substrate. In some embodiments, the substrate is selected from the group consisting of a glass material, a quartz material, a silicon material, a fused silica material, and a plastic material. In some embodiments, the substrate is treated with a silane coupling agent.

An embodiment of the presently disclosed method for adhering a layer of PFPE material to a substrate is illustrated in FIGS. 3A-3C. Referring now to FIG. 3A, a substrate 300 is provided, wherein, in some embodiments, substrate 300 is selected from the group consisting of a glass material, a quartz material, a silicon material, a fused silica material, and a plastic material. Substrate 300 is treated by treating process $T_{r1}$. In some embodiments, treating process $T_{r1}$ includes treating the substrate with a base/alcohol mixture, e.g., KOH/isopropanol, to impart a hydroxyl functionality to substrate 300.

Referring now to FIG. 3B, functionalized substrate 300 is reacted with a silane coupling agent, e.g., R—$SiCl_3$ or R—$Si(OR_1)_3$, wherein R and $R_1$ represent a functional group as described herein to form a silanized substrate 300. In some embodiments, the silane coupling agent is selected from the group consisting of a monohalosilane, a dihalosilane, a trihalosilane, a monoalkoxysilane, a dialkoxysilane, and a trialkoxysilane; and wherein the monohalosilane, dihalosilane, trihalosilane, monoalkoxysilane, dialkoxysilane, and trialkoxysilane are functionalized with a moieties selected from the group consisting of an amine, a methacrylate, an acrylate, a styrenic, an epoxy, an isocyanate, a halogen, an alcohol, a benzophenone derivative, a maleimide, a carboxylic acid, an ester, an acid chloride, and an olefin.

Referring now to FIG. 3C, silanized substrate 300 is contacted with a patterned layer of partially cured PFPE material 302 and treated by treating process $Tr_2$ to form a permanent bond between patterned layer of PFPE material 302 and substrate 300.

In some embodiments, a partial free radical cure is used to adhere a PFPE layer to a second polymeric material, such as a poly(dimethyl siloxane) (PDMS) material, a polyurethane material, a silicone-containing polyurethane material, and a PFPE-PDMS block copolymer material. In some embodiments, the second polymeric material includes a functionalized polymeric material. In some embodiments, the second polymeric material is encapped with a polymerizable group. In some embodiments, the polymerizable group is selected from the group consisting of an acrylate, a styrene, and a methacrylate. Further, in some embodiments, the second polymeric material is treated with a plasma and a silane coupling agent to introduce the desired functionality to the second polymeric material.

An embodiment of the presently disclosed method for adhering a patterned layer of PFPE material to another patterned layer of polymeric material is illustrated in FIGS. 4A-4C. Referring now to FIG. 4A, a patterned layer of a first polymeric material 400 is provided. In some embodiments, first polymeric material includes a PFPE material. In some embodiments, first polymeric material includes a polymeric material selected from the group consisting of a poly(dimethylsiloxane) material, a polyurethane material, a silicone-containing polyurethane material, and a PFPE-PDMS block copolymer material. Patterned layer of first polymeric material 400 is treated by treating process $T_{r1}$. In some embodiments, treating process $T_{r1}$ includes exposing the patterned layer of first polymeric material 400 to UV light in the presence of $O_3$ and an R functional group, to add an R functional group to the patterned layer of polymeric material 400.

Referring now to FIG. 4B, the functionalized patterned layer of first polymeric material 400 is contacted with the top surface of a functionalized patterned layer of PFPE material 402 and then treated by treating process $T_{r2}$ to form a two layer hybrid assembly 404. Thus, functionalized patterned layer of first polymeric material 400 is thereby bonded to functionalized patterned layer of PFPE material 402.

Referring now to FIG. 4C, two-layer hybrid assembly 404, in some embodiments, is contacted with substrate 406 to form a multilayer hybrid structure 410. In some embodiments, substrate 406 is coated with a layer of liquid PFPE precursor material 408. Multilayer hybrid structure 410 is treated by treating process $T_{r3}$ to bond two-layer assembly 404 to substrate 406.

IV. Methods for Forming a Device Through a Two-Component Curing Process

The presently disclosed subject matter provides a method for forming a device by which a polymer, such as, functional perfluoropolyether (PFPE) precursors, are contacted with a patterned surface and then cured through the reaction of two components, such as epoxy/amine, epoxy/hydroxyl, triol/diisocyanate, carboxylic acid/amine, carboxylic acid/hydroxyl, ester/amine, ester/hydroxyl, amine/anhydride, acid halide/hydroxyl, acid halide/amine, amine/halide, hydroxyl/halide, hydroxyl/chlorosilane, azide/acetylene and other so-called "click chemistry" reactions, and metathesis reactions involving the use of Grubb's-type catalysts to form a fully-cured or a partially-cured PFPE network. Examples of UV and thermal end-cap combinations, according to some embodiments, include: UV diurethane methacrylate with thermal triol and diisocyanate components, UV diurethane methacrylate with thermal tetrol and diisocyanate components, UV diurethane methacrylate with UV diepoxy, UV diurethane methacrylate with thermal diepoxy and diamine components, UV diurethane methacrylate with thermal diisocyanate, combinations thereof, and the like.

As used herein the term "click chemistry" refers to a term used in the art to describe the synthesis of compounds using any of a number of carbon-heteroatom bond forming reactions. "Click chemistry" reactions typically are relatively insensitive to oxygen and water, have high stereoselectivity and yield, and thermodynamic driving forces of about 20 kcal/mol or greater. In some embodiments, useful "click chemistry" reactions include cycloaddition reactions of unsaturated compounds, including 1,3-dipolar additions and Diels-Alder reactions; nucleophilic substitution reactions, especially those involving ring opening of small, strained rings like epoxides and aziridines; addition reactions to carbon-carbon multiple bonds; and reactions involving non-aldol carbonyl chemistry, such as the formation of ureas and amides.

Further, the term "metathesis reactions" refers to reactions in which two compounds react to form two new compounds with no change in oxidation numbers in the final products. For example, olefin metathesis involves the 2+2 cycloaddition of an olefin and a transition metal alkylidene complex to form a new olefin and a new alkylidene. In ring-opening metathesis polymerization (ROMP), the olefin is a strained cyclic olefin, and 2+2 cycloaddition to the transition metal catalyst involves opening of the strained ring. The growing polymer remains part of the transition metal complex until capped, for example, by 2+2 cycloaddition to an aldehyde. Grubbs catalysts for metathesis reactions were first described in 1996 (see Schwab, P., et al., *J. Am. Chem. Soc.,* 118, 100-110 (1996)). Grubbs catalysts are transition metal alkylidenes containing ruthenium supported by phosphine ligands and are unique in that that they are tolerant of different functionalities in the alkene ligand.

Accordingly, in one embodiment, the photocurable component can include functional groups that can undergo photochemical 2+2 cycloadditions. Such groups include alkenes, aldehydes, ketones, and alkynes. Photochemical 2+2 cycloadditions can be used, for example, to form cyclobutanes and oxetanes.

Thus, in some embodiments, the partially-cured PFPE network is contacted with another substrate, and the curing is then taken to completion to adhere the PFPE network to the substrate. This method can be used to adhere multiple layers of a PFPE material to a substrate.

Further, in some embodiments, the substrate includes a second polymeric material, such as PDMS, or another polymer. In some embodiments, the second polymeric material includes an elastomer other than PDMS, such as Kratons™ (Shell Chemical Company), buna rubber, natural rubber, a fluoroelastomer, chloroprene, butyl rubber, nitrile rubber, polyurethane, or a thermoplastic elastomer. In some embodiments, the second polymeric material includes a rigid thermoplastic material, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

In some embodiments, the PFPE layer is adhered to a solid substrate, such as a glass material, a quartz material, a silicon material, and a fused silica material, through use of a silane coupling agent.

A. Method of Forming a Patterned PFPE Layer Through a Two-Component Curing Process In some embodiments, a PFPE network is formed through the reaction of a two-component functional liquid precursor system. Using the general method for forming a patterned layer of polymeric material as shown in FIGS. 1A-1C, a liquid precursor material that includes a two-component system is contacted with a patterned substrate and a patterned layer of PFPE material is formed. In some embodiments, the two-component liquid precursor system is selected from the group consisting of an epoxy/amine, epoxy/hydroxyl, triol/diisocyanate, carboxylic acid/amine, carboxylic acid/hydroxyl, ester/amine, ester/hydroxyl, amine/anhydride, acid halide/hydroxyl, acid halide/amine, amine/halide, hydroxyl/halide, hydroxyl/chlorosilane, azide/acetylene and other so-called "click chemistry" reactions, and metathesis reactions involving the use of Grubb's-type catalysts. The functional liquid precursors are blended in the appropriate ratios and then contacted with a patterned surface or master. The curing reaction is allowed to take place by using heat, catalysts, and the like, until the network is formed.

In some embodiments, a fully cured PFPE precursor is formed. In some embodiments, the two-component reaction is allowed to proceed only partially, thereby forming a partially cured PFPE network.

B. Method of Adhering a PFPE Layer to a Substrate Through a Two-Component Curing Process

1. Full Cure with a Two-Component Curing Process

In some embodiments, the fully cured PFPE two-component precursor is removed, e.g., peeled, from the master and contacted with a substrate to form a reversible, hermetic seal. In some embodiments, the partially cured network is contacted with another partially cured layer of PFPE and the reaction is taken to completion, thereby forming a permanent bond between the layers. In some embodiments, the cure component can be a photo-cure component that is activated upon exposure to photo or UV radiation. In alternative embodiments, the cure component can be a thermal-cure component that is activated upon the application of thermal energy. In yet alternative embodiments, the cure component can be activated by a moisture cure mechanism. Moisture cure mechanisms are disclosed in S. Turri, et al. *Surf. Interface Anal.* 29, 873-886, which is incorporated herein by reference in its entirety including all references cited therein.

2. Partial Cure with a Two-Component System

As shown in FIGS. 3A-3C, in some embodiments, the partial two-component curing method is used to bond at least one layer of a partially-cured PFPE material to a substrate. In some embodiments, the partial two-component curing method is used to bond a plurality of layers of a partially-cured PFPE material to a substrate. In some embodiments, the substrate is selected from the group consisting of a glass material, a quartz material, a silicon material, a fused silica material, and a plastic material. In some embodiments, the substrate is treated with a silane coupling agent.

As shown in FIGS. 4A-4C, in some embodiments, a partial two-component cure is used to adhere the PFPE layer to a second polymeric material, such as a poly(dimethylsiloxane) (PDMS) material. In some embodiments, the PDMS material includes a functionalized PDMS material. In some embodiments, the PDMS is treated with a plasma and a silane coupling agent to introduce the desired functionality to the PDMS material. In some embodiments, the PDMS material is encapped with a polymerizable group. In some embodiments, the polymerizable group includes an epoxide. In some embodiments, the polymerizable group includes an amine.

In some embodiments, the second polymeric material includes an elastomer other than PDMS, such as Kratons™, buna rubber, natural rubber, a fluoroelastomer, chloroprene, butyl rubber, nitrile rubber, polyurethane, or a thermoplastic elastomer. In some embodiments, the second polymeric material includes a rigid thermoplastic, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

3. Excess Cure with a Two-Component System

The presently disclosed subject matter provides a method for forming a microfluidic device by which a functional perfluoropolyether (PFPE) precursor is contacted with a patterned substrate and cured through the reaction of two components, such as epoxy/amine, epoxy/hydroxyl, triol/diisocyanate, carboxylic acid/amine, carboxylic acid/hydroxyl, ester/amine, ester/hydroxyl, amine/anhydride, acid halide/hydroxyl, acid halide/amine, amine/halide, hydroxyl/halide, hydroxyl/chlorosilane, azide/acetylene and other so-called "click chemistry" reactions, and metathesis reactions involving the use of Grubb's-type catalysts, to form a layer of cured PFPE material. In this particular method, the layer of cured PFPE material can be adhered to a second substrate by fully curing the layer with an excess of one component and contacting the layer of cured PFPE material with a second substrate having an excess of a second component in such a way that the excess groups react to adhere the layers.

Thus, in some embodiments, a two-component system, such as an epoxy/amine, epoxy/hydroxyl, triol/diisocyanate, carboxylic acid/amine, carboxylic acid/hydroxyl, ester/amine, ester/hydroxyl, amine/anhydride, acid halide/hydroxyl, acid halide/amine, amine/halide, hydroxyl/halide, hydroxyl/chlorosilane, azide/acetylene and other so-called "click chemistry" reactions, and metathesis reactions involving the use of Grubb's-type catalysts, is blended. In some embodiments, at least one component of the two-component system is in excess of the other component. The reaction is then taken to completion by heating, using a catalyst, and the like, with the remaining cured network having a plurality of functional groups generated by the presence of the excess component.

In some embodiments, two layers of fully cured PFPE materials including complimentary excess groups are contacted with one another, wherein the excess groups are allowed to react, thereby forming a permanent bond between the layers.

As shown in FIGS. 3A-3C, in some embodiments, a fully cured PFPE network including excess functional groups is contacted with a substrate. In some embodiments, the substrate is selected from the group consisting of a glass material, a quartz material, a silicon material, a fused silica material, and a plastic material. In some embodiments, the substrate is treated with a silane coupling agent such that the functionality on the coupling agent is complimentary to the excess functionality on the fully cured network. Thus, a permanent bond is formed to the substrate.

As shown in FIGS. 4A-4C, in some embodiments, the two-component excess cure is used to bond a PFPE network to a second polymeric material, such as a poly(dimethylsiloxane) PDMS material. In some embodiments, the PDMS material includes a functionalized PDMS material. In some embodiments, the PDMS material is treated with a plasma and a silane coupling agent to introduce the desired functionality. In some embodiments, the PDMS material is encapped with a polymerizable group. In some embodiments, the polymerizable material includes an epoxide. In some embodiments, the polymerizable material includes an amine.

In some embodiments, the second polymeric material includes an elastomer other than PDMS, such as Kratons™, buna rubber, natural rubber, a-fluoroelastomer, chloroprene, butyl rubber, nitrile rubber, polyurethane, or a thermoplastic elastomer. In some embodiments, the second polymeric material includes a rigid thermoplastic, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

4. Blending a Thermalcurable Component with a Photocurable Material

According to yet another embodiment, microfluidic devices are formed from adhering multiple layers of materials together. In one embodiment, a two-component thermally curable material is blended with a photocurable material, thereby creating a multiple stage curing material. In certain embodiments, the two-component system can include functional groups, such as epoxy/amine, epoxy/hydroxyl, triol/diisocyanate, carboxylic acid/amine, carboxylic acid/hydroxyl, ester/amine, ester/hydroxyl, amine/anhydride, acid halide/hydroxyl, acid halide/amine, amine/halide, hydroxyl/halide, hydroxyl/chlorosilane, azide/acetylene and other so-called "click chemistry" reactions, and metathesis reactions involving the use of Grubb's-type catalysts. In one embodiment, the photocurable component can include such functional groups as: acrylates, styrenics, epoxides, cyclobutanes and other 2+2 cycloadditions.

In some embodiments, a two-component thermally curable material is blended in varying ratios with a photocurable material. In one embodiment, the material can then be deposited on a patterned substrate as described above. Such a system can be exposed to actinic radiation, e.g., UV light, and solidified into a network, while the thermally curable components are mechanically entangled in the network but remain unreacted. Layers of the material can then be prepared, for example, cut, trimmed, punched with inlet/outlet holes, and aligned in predetermined positions on a second, photocured layer. Once the photocured layers are aligned and sealed, the device can be heated to activate the thermally curable component within the layers. When the thermally curable components are activated by the heat, the layers are adhered together by reaction at the interface.

In some embodiments, the thermal reaction is taken to completion. In other embodiments, the thermal reaction is initially only done partially and after multiple layers are aligned, the thermal reaction is taken to completion thereby adhering the layers together. In other embodiments, a multi-layered device is formed and adhered to a final flat, non-patterned layer through the thermal cure.

In some embodiments, the thermal cure reaction is done first. The layer is then prepared, for example, cut, trimmed, punched with inlet/outlet holes, and aligned. Next, the photocurable component is activated by exposure to actinic radiation, e.g., UV light, and the layers are adhered by functional groups reacting at the interface between the layers.

In some embodiments, blended two-component thermally curable and photocurable materials are used to bond a PFPE network to a second polymeric material, such as a poly(dimethylsiloxane) PDMS material. In some embodiments, the PDMS material includes a functionalized PDMS material. As will be appreciated by one of ordinary skill in the art, the functionalized PDMS material is PDMS material that contains a reactive chemical group, as described elsewhere herein. In some embodiments, the PDMS material is treated with a plasma and a silane coupling agent to introduce the desired functionality. In some embodiments, the PDMS material is encapped with a polymerizable group. In some embodiments, the polymerizable material includes an epoxide. In some embodiments, the polymerizable material includes an amine.

In some embodiments, the second polymeric material includes an elastomer other than PDMS, such as Kratons™, buna rubber, natural rubber, a fluoroelastomer, chloroprene, butyl rubber, nitrile rubber, polyurethane, or a thermoplastic elastomer. In some embodiments, the second polymeric material includes a rigid thermoplastic, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

In some embodiments, a blend of a photocurable PFPE liquid precursor and a two-component thermally curable PFPE liquid precursor is made in such a way that one component of the two component thermally curable blend is in excess of the other. In this way, multiple layers can be adhered through residual complimentary functional groups present in multiple layers.

Figures 12A, 12B:
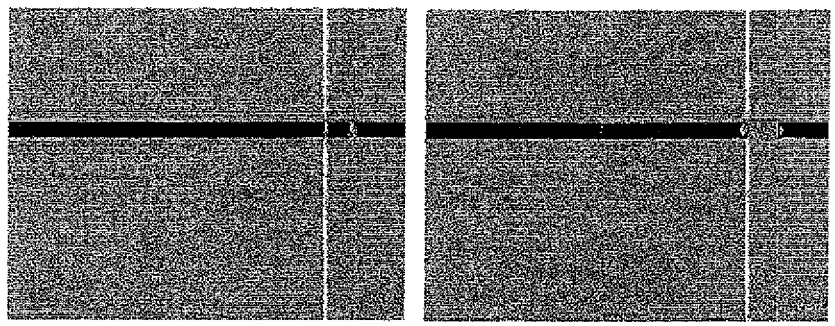
FIGS. 12A-12B are photomicrographs of an air-actuated pneumatic valve in a presently disclosed PFPE microfluidic device actuated at a pressure of about 45 psi.

According to a preferred embodiment, the amount of thermal cure and photocure substance added to the material is selected to produce adhesion between layers of the completed device that can withstand a pressure up to a desired pressure per square inch. According to some embodiments, the amount of thermal cure and photocure substance added to the material is selected to produce adhesion between layers of the device that can withstand pressures up to about 120 psi. According to other embodiments, the laminated device can withstand pressure up to about 110 psi. According to other embodiments, the laminated device can withstand pressure up to about 100 psi. According to other embodiments, the laminated device can withstand pressure up to about 90 psi. According to other embodiments, the laminated device can withstand pressure up to about 80 psi. According to other embodiments, the laminated device can withstand pressure up to about 70 psi. In alternative embodiment the adhesion between layers is structured such that a device can withstand pressures between about 5 psi and about 120 psi in different ranges of the device without delamination. According to yet a further embodiment, the amount of thermal cure and photocure substance added to the material is selected to produce adhesion between layers of the device that can withstand pressures between about 10 psi and about 60 psi without delaminating. An example of a valve in a PFPE device actuated at about 45 psi is shown in FIG. 12. No delamination is observed after cycling the valve repeatedly for extended periods of time.

Figures 11A, 11B, 11C, 11D, 11E:
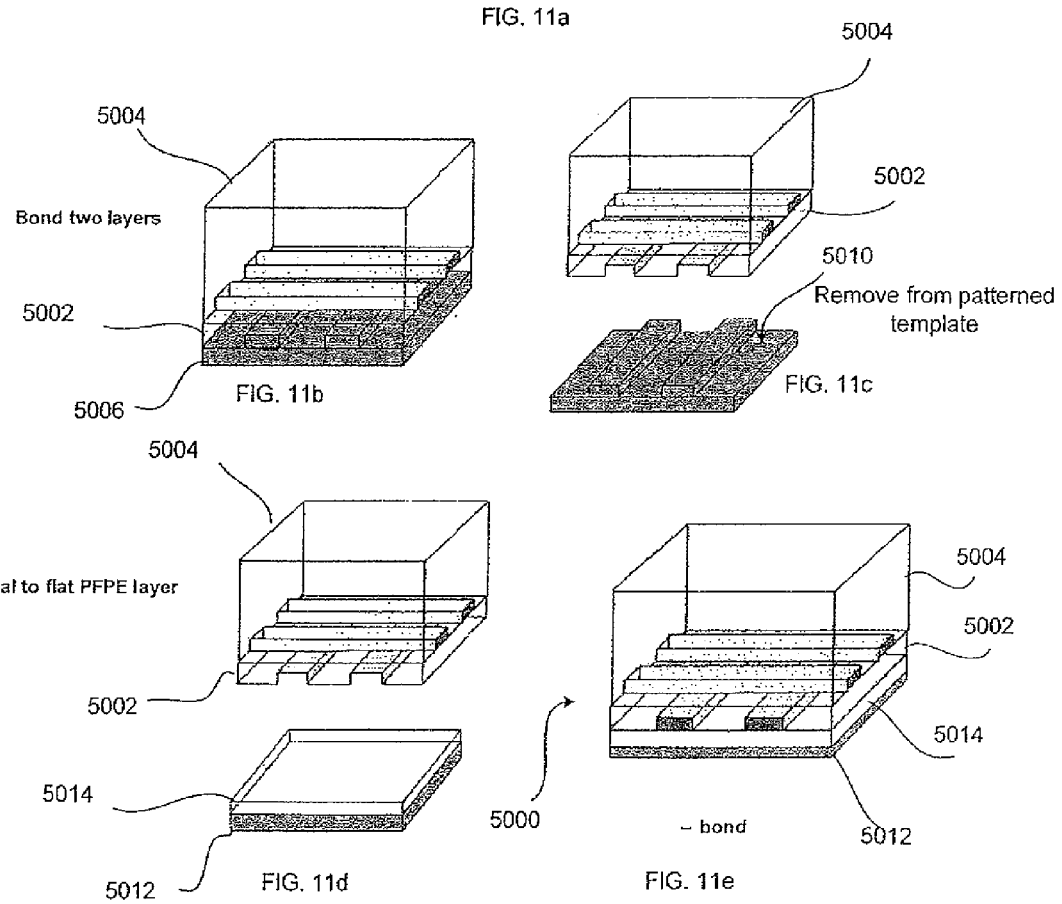
FIGS. 11a-11e illustrate a process for fabricating a device according to an embodiment of the present invention.

An illustrative example of a method for making a multi-layered microfluidic device will now be described with respect to FIGS. 11*a*-11*e*. A two-component thermally curable material blended with a photocurable material is disposed on patterned templates 5006, 5008 (sometimes referred to as a master template or template), as shown in FIG. 11*a*. According to alternative embodiments of the present invention, the blended material can be spin coated onto the patterned template or cast onto the patterned template by pooling the material inside a gasket. In some embodiments, spin coating is used to form thin layers such as first layer 5002 and a cast technique is used to form thick layers such as second layer 5004, as will be appreciated by one of ordinary skill in the art. Next, the blended material positioned on templates 5006 and 5008 is treated with an initial cure, such as a photocure, to form first layer 5002 and second layer 5004, respectively. The photocure partially cures the material but does not initiate the thermal cure components of the material. Patterned template 5008 is then removed from second layer 5004. Removal of patterned templates from the layers is described in more detail herein. Next, second layer 5004 is positioned with respect to first layer 5002 and the combination is treated with a second cure, as shown in FIG. 11*b*, which results in the bonding, or adhesion, between first layer 5002 and second layer 5004, collectively referred to hereinafter as the "two adhered layers 5002 and 5004." In some embodiments, the second cure is an initial heat curing that initiates the two-component thermal cure of the material. Next, the two adhered layers 5002 and 5004 are removed from patterned template 5006, as shown in FIG. 11*c*. In FIG. 11*d*, the two adhered layers 5002 and 5004 are positioned on flat layer 5014, flat layer 5014 previously being coated onto flat template 5012 and treated with an initial cure. The combination of layers 5002, 5004, and 5014 is then treated to a final cure to fully adhere all three layers together, as shown in FIG. 11*e*.

According to alternative embodiments, patterned template 5006 can be coated with release layer 5010 to facilitate removal of the cured or partially cured layers (see FIG. 11*c*). Further, coating of the templates, e.g., patterned template 5006 and/or patterned template 5008, can reduce reaction of the thermal components with latent groups present on the template. For example, release layer 5010 can be a Gold/Palladium coating.

According to alternative embodiments, removal of the partially cured and cured layers can be realized by peeling, suction, pneumatic pressure, through the application of solvents to the partially cured or cured layers, or through a combination of these teachings.

V. Method for Functionalizing a Surface of a Micro- and/or Nano-Scale Device

In some embodiments, the presently disclosed subject matter provides materials and methods for functionalizing the channels in a microfluidic device and/or a microtiter well. In some embodiments, such functionalization includes, but is not limited to, the synthesis and/or attachment of peptides and other natural polymers to the interior surface of a channel in a microfluidic device. Accordingly, the presently disclosed subject matter can be applied to microfluidic devices, such as those described by Rolland, J., et al., *JACS* 2004, 126, 2322-2323, the disclosure of which is incorporated herein by reference in its entirety.

In some embodiments, the method includes binding a small molecule to the interior surface of a microfluidic channel or the surface of a microtiter well. In such embodiments, once bound, the small molecule can serve a variety of functions. In some embodiments, the small molecule functions as a cleavable group, which when activated, can change the polarity of the channel and hence the wettability of the channel. In some embodiments, the small molecule functions as a binding site. In some embodiments, the small molecule functions as a binding site for one of a catalyst, a drug, a substrate for a drug, an analyte, and a sensor. In some embodiments, the small molecule functions as a reactive functional group. In some embodiments, the reactive functional group is reacted to yield a zwitterion. In some embodiments, the zwitterion provides a polar, ionic channel.

Figure 5A:
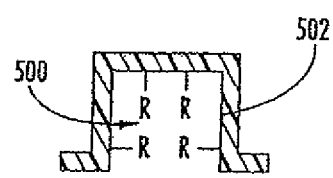
FIGS. 5A and 5B are schematic representations of an embodiment of the presently disclosed method for functionalizing the interior surface of a channel.
Figure 5B:
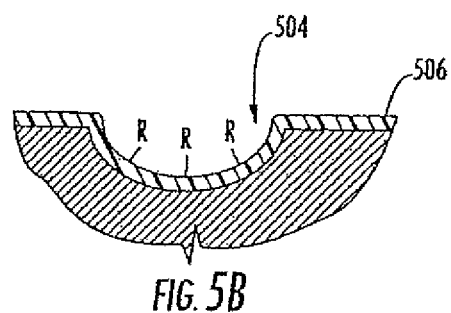

An embodiment of the presently disclosed method for functionalizing the interior surface of a microfluidic channel and/or a microtiter well is illustrated in FIGS. 5A and 5B. Referring now to FIG. 5A, a microfluidic channel 500 is provided. In some embodiments, microfluidic channel 500 is formed from a functional PFPE material having an R functional group, as described herein. In some embodiments, microchannel 500 includes a PFPE network which undergoes a post-curing treating process, whereby functional group R is introduced into the interior surface 502 of microfluidic channel 500.

Referring now to FIG. 5B, a microtiter well 504 is provided. In some embodiments, microtiter well 504 is coated with a layer of functionalized PFPE material 506, which includes an R functional group, to impart functionality into microtiter well 504.

A. Method of Attaching a Functional Group to a PFPE Network

In some embodiments, PFPE networks including excess functionality are used to functionalize the interior surface of a microfluidic channel or the surface of a microtiter well. In some embodiments, the interior surface of a microfluidic channel or the surface of a microtiter well is functionalized by attaching a functional moiety selected from the group consisting of a protein, an oligonucleotide, a drug, a ligand, a catalyst, a dye, a sensor, an analyte, and a charged species capable of changing the wettability of the channel.

In some embodiments, latent functionalities are introduced into the fully cured PFPE network. In some embodiments, latent methacrylate groups are present at the surface of the PFPE network that has been free radically cured either photochemically or thermally. Multiple layers of fully cured PFPE are then contacted with the functionalized surface of the PFPE network, forming a seal, and reacted, by heat, for example, to allow the latent functionalities to react and form a permanent bond between the layers.

In some embodiments, the latent functional groups react photochemically with one another at a wavelength different from that used to cure the PFPE precursors. In some embodiments, this method is used to adhere fully cured layers to a substrate. In some embodiments, the substrate is selected from the group consisting of a glass material, a quartz material, a silicon material, a fused silica material, and a plastic material. In some embodiments, the substrate is treated with a silane coupling agent complimentary to the latent functional groups.

In some embodiments, such latent functionalities are used to adhere a fully cured PFPE network to a second polymeric material, such as a poly(dimethylsiloxane) PDMS material. In some embodiments, the PDMS material includes a functionalized PDMS material. In some embodiments, the PDMS material is treated with a plasma and a silane coupling agent to introduce the desired functionality. In some embodiments, the PDMS material is encapped with a polymerizable group. In some embodiments, the polymerizable group is selected from the group consisting of an acrylate, a styrene, and a methacrylate.

In some embodiments, the second polymeric material includes an elastomer other than PDMS, such as Kratons™, buna rubber, natural rubber, a fluoroelastomer, chloroprene, butyl rubber, nitrile rubber, polyurethane, or a thermoplastic elastomer. In some embodiments, the second polymeric material includes a rigid thermoplastic, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

B. Method of Introducing Functionality in the Generation of a Liquid PFPE Precursor The presently disclosed subject matter provides a method of forming a microfluidic device by which a photochemically cured PFPE layer is placed in conformal contact with a second substrate thereby forming a seal. The PFPE layer is then heated at elevated temperatures to adhere the layer to the substrate through latent functional groups. In some embodiments, the second substrate also includes a cured PFPE layer. In some embodiments, the second substrate includes a second polymeric material, such as a poly(dimethylsiloxane) (PDMS) material.

In some embodiments, the second polymeric material includes an elastomer other than PDMS, such as Kratons™, buna rubber, natural rubber, a fluoroelastomer, chloroprene, butyl rubber, nitrile rubber, polyurethane, or a thermoplastic elastomer. In some embodiments, the second polymeric material includes a rigid thermoplastic, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

In some embodiments, the latent groups include methacrylate units that are not reacted during the photocuring process. Further, in some embodiments, the latent groups are introduced in the generation of the liquid PFPE precursor. For example, in some embodiments, methacrylate units are added to a PFPE diol through the use of glycidyl methacrylate, the reaction of the hydroxy and the epoxy group generates a secondary alcohol, which can be used as a handle to introduce chemical functionality. In some embodiments, multiple layers of fully cured PFPE are adhered to one another through these latent functional groups. In some embodiments, the latent functionalities are used to adhere a fully cured PFPE layer to a substrate. In some embodiments, the substrate is selected from the group consisting of a glass material, a quartz material, a silicon material, a fused silica material, and a plastic material. In some embodiments, the substrate is treated with a silane coupling agent.

Further, this method can be used to adhere a fully cured PFPE layer to a second polymeric material, such as a poly(dimethylsiloxane) (PDMS) material. In some embodiments, the PDMS material includes a functionalized PDMS material. In some embodiments, the PDMS material is treated with a plasma and a silane coupling agent to introduce the desired functionality. In some embodiments, the PDMS material is encapped with a polymerizable group. In some embodiments, the polymerizable material is selected from the group consisting of an acrylate, a styrene, and a methacrylate.

In some embodiments, the second polymeric material includes an elastomer other than PDMS, such as Kratons™, buna rubber, natural rubber, a fluoroelastomer, chloroprene, butyl rubber, nitrile rubber, polyurethane, or a thermoplastic elastomer. In some embodiments, the second polymeric material includes a rigid thermoplastic, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

In some embodiments, PFPE networks containing latent functionality are used to functionalize the interior surface of a microfluidic channel or a microtiter well. Examples include the attachment of proteins, oligonucleotides, drugs, ligands, catalysts, dyes, sensors, analytes, and charged species capable of changing the wettability of the channel.

C. Method of Linking Multiple Chains of a PFPE Material with a Functional Linker Group In some embodiments, the presently disclosed method adds functionality to a microfluidic channel or a microtiter well by adding a chemical "linker" moiety to the elastomer itself. In some embodiments, a functional group is added along the backbone of the precursor material. An example of this method is illustrated in Scheme 8.

In some embodiments, the precursor material includes a macromolecule containing hydroxyl functional groups. In some embodiments, as depicted in Scheme 8, the hydroxyl functional groups include diol functional groups. In some embodiments, two or more of the diol functional groups are connected through a trifunctional "linker" molecule. In some embodiments, the trifunctional linker molecule has two functional groups, R and R'. In some embodiments, the R' group reacts with the hydroxyl groups of the macromolecule. In Scheme 8, the circle can represent a linking molecule; and the wavy line can represent a PFPE chain.

In some embodiments, the R group provides the desired functionality to the interior surface of the microfluidic channel or surface of a microtiter well. In some embodiments, the R' group is selected from the group including, but not limited to, an acid chloride, an isocyanate, a halogen, and an ester moiety. In some embodiments, the R group is selected from one of, but not limited to, a protected amine and a protected alcohol. In some embodiments, the macromolecule diol is functionalized with polymerizable methacrylate groups. In some embodiments, the functionalized macromolecule diol is cured and/or molded by a photochemical process as described by Rolland, J. et al. *JACS* 2004, 126, 2322-2323, the disclosure of which is incorporated herein by reference in its entirety.

Thus, the presently disclosed subject matter provides a method of incorporating latent functional groups into a photocurable PFPE material through a functional linker group. Thus, in some embodiments, multiple chains of a PFPE material are linked together before encapping the chain with a polymerizable group. In some embodiments, the polymerizable group is selected from the group consisting of a methacrylate, an acrylate, and a styrenic. In some embodiments, latent functionalities are attached chemically to such "linker" molecules in such a way that they will be present in the fully cured network.

In some embodiments, latent functionalities introduced in this manner are used to bond multiple layers of PFPE, bond a fully cured PFPE layer to a substrate, such as a glass material or a silicon material that has been treated with a silane coupling agent, or bond a fully cured PFPE layer to a second polymeric material, such as a PDMS material. In some embodiments, the PDMS material is treated with a plasma and a silane coupling agent to introduce the desired functionality. In some embodiments, the PDMS material is encapped Scheme 8.

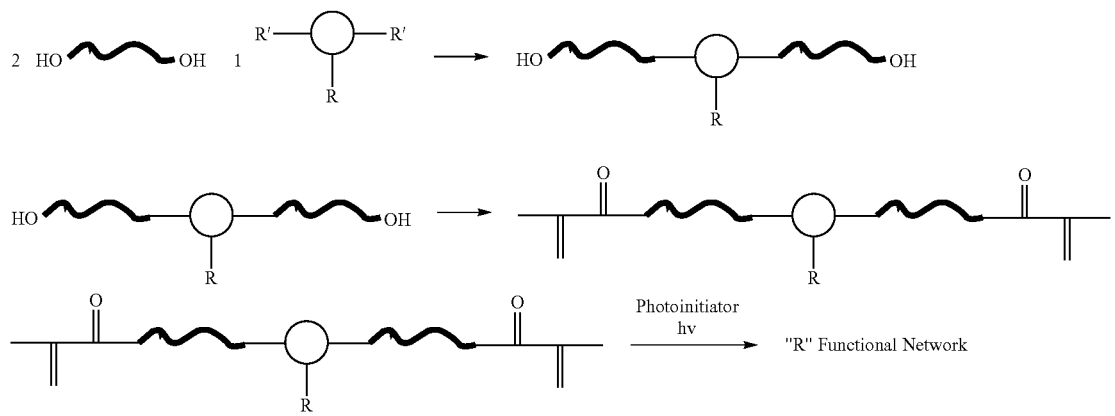

Representative method of adding a functional group along the backbone of a precursor material.

with a polymerizable group. In some embodiments, the polymerizable group is selected from the group consisting of an acrylate, a styrene, and a methacrylate.

In some embodiments, the second polymeric material includes an elastomer other than PDMS, such as Kratons™, buna rubber, natural rubber, a fluoroelastomer, chloroprene, butyl rubber, nitrile rubber, polyurethane, or a thermoplastic elastomer. In some embodiments, the second polymeric material includes a rigid thermoplastic, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

In some embodiments, PFPE networks including functionality attached to "linker" molecules are used to functionalize the interior surface of a microfluidic channel and/or the surface of a microtiter well. In some embodiments, the inside of a microfluidic channel is functionalized by attaching a functional moiety selected from the group consisting of a protein, an oligonucleotide, a drug, a catalyst, a dye, a sensor, an analyte, and a charged species capable of changing the wettability of the channel.

D. Methods for Improving Chemical Compatibility of a Surface

According to some embodiments of the present invention, the surface of devices fabricated from materials and methods described herein can be passivated to impart chemical compatibility to the devices. According to such materials and methods, surface passivation is achieved by treating the surface of a device fabricated from materials described herein with an end-capped UV and/or thermal curable liquid precursor (e.g., styrene end-capped precursor). Upon activation of the photo or thermally cure component of the styrene end-capped precursor, the precursor reacts with latent methacrylate, styrene, and/or acrylate groups of the material and binds thereto, thereby providing a surface passivation to the surface of the device.

According to another embodiment, a device fabricated from PFPE that contains latent methacrylate, acrylate, and/or styrene groups, as described throughout this application, is treated with a styrene end-capped UV curable PFPE liquid precursor. According to such embodiments, a solution of the styrene end-capped UV curable precursor, dissolved in a solvent including but not limited to pentafluorobutane, can be applied to a surface of a device fabricated from PFPE. The solvent is allowed to evaporate, thereby leaving a film of the styrene end-capped UV curable precursor coating the PFPE surface. In one embodiment the film is then cured, by exposure to UV light, and thereby adhered to latent methacrylate, acrylate, and/or styrene groups of the PFPE material. The surface coated with the styrene end-capped precursor does not contain acid-labile groups such as urethane and/or ester linkages, thus creating a surface passivation and improving the chemical compability of the base PFPE material.

According to another embodiment, the surface of a device fabricated from base materials described herein is passivated by a gas phase passivation. According to such embodiments, a device is exposed to a mixture of 0.5% Fluorine gas in Nitrogen. The Fluorine reacts free radically with hydrogen atoms in the base material, thus passivating the surface of device that is treated with the gas.

VI. Method of Adding Functional Monomers to the PFPE Precursor Material

In some embodiments, the method includes adding a functional monomer to an uncured precursor material. In some embodiments, the functional monomer is selected from the group consisting of functional styrenes, methacrylates, and acrylates. In some embodiments, the precursor material includes a fluoropolymer. In some embodiments, the functional monomer includes a highly fluorinated monomer. In some embodiments, the highly fluorinated monomer includes perfluoro ethyl vinyl ether (EVE). In some embodiments, the precursor material includes a poly(dimethyl siloxane) (PDMS) elastomer. In some embodiments, the precursor material includes a polyurethane elastomer. In some embodiments, the method further includes incorporating the functional monomer into the network by a curing step.

In some embodiments, functional monomers are added directly to the liquid PFPE precursor to be incorporated into the network upon crosslinking. For example, monomers can be introduced into the network that are capable of reacting post-crosslinking to adhere multiple layers of PFPE, bond a fully cured PFPE layer to a substrate, such as a glass material or a silicon material that has been treated with a silane coupling agent, or bond a fully cured PFPE layer to a second polymeric material, such as a PDMS material. In some embodiments, the PDMS material is treated with a plasma and a silane coupling agent to introduce the desired functionality. In some embodiment, the PDMS material is encapped with a polymerizable group. In some embodiments, the polymerizable material is selected from the group consisting of an acrylate, a styrene, and a methacrylate.

In some embodiments, the second polymeric material includes an elastomer other than PDMS, such as Kratons™, buna rubber, natural rubber, a fluoroelastomer, chloroprene, butyl rubber, nitrile rubber, polyurethane, or a thermoplastic elastomer. In some embodiments, the second polymeric material includes a rigid thermoplastic, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

In some embodiments, functional monomers are added directly to the liquid PFPE precursor and are used to attach a functional moiety selected from the group consisting of a protein, an oligonucleotide, a drug, a catalyst, a dye, a sensor, an analyte, and a charged species capable of changing the wettability of the channel.

Such monomers include, but are not limited to, tert-butyl methacrylate, tert butyl acrylate, dimethylaminopropyl methacrylate, glycidyl methacrylate, hydroxy ethyl methacrylate, aminopropyl methacrylate, allyl acrylate, cyano acrylates, cyano methacrylates, trimethoxysilane acrylates, trimethoxysilane methacrylates, isocyanato methacrylate, lactone-containing acrylates and methacrylates, sugar-containing acrylates and methacrylates, poly-ethylene glycol methacrylate, nornornane-containing methacrylates and acrylates, polyhedral oligomeric silsesquioxane methacrylate, 2-trimethylsiloxyethyl methacrylate, 1H,1H,2H,2H-fluoroctylmethacrylate, pentafluorostyrene, vinyl pyridine, bromostyrene, chlorostyrene, styrene sulfonic acid, fluorostyrene, styrene acetate, acrylamide, and acrylonitrile.

In some embodiments, monomers which already have the above agents attached are blended directly with the liquid PFPE precursor to be incorporated into the network upon crosslinking. In some embodiments, the monomer includes a group selected from the group consisting of a polymerizable group, the desired agent, and a fluorinated segment to allow for miscibility with the PFPE liquid precursor. In some embodiments, the monomer does not include a polymerizable group, the desired agent, and a fluorinated segment to allow for miscibility with the PFPE liquid precursor.

In some embodiments, monomers are added to adjust the mechanical properties of the fully cured elastomer. Such monomers include, but are not limited to: perfluoro(2,2-dimethyl-1,3-dioxole), hydrogen-bonding monomers which contain hydroxyl, urethane, urea, or other such moieties, monomers containing bulky side group, such as tert-butyl methacrylate.

In some embodiments, functional species such as the above mentioned monomers are introduced and are mechanically entangled, i.e., not covalently bonded, into the network upon curing. For example, in some embodiments, functionalities are introduced to a PFPE chain that does not contain a polymerizable monomer and such a monomer is blended with the curable PFPE species. In some embodiments, such entangled species can be used to adhere multiple layers of cured PFPE together if two species are reactive, such as: epoxy/amine, hydroxy/acid chloride, triol/diisocyanate, hydroxy/isocyanate, amine/isocyanate, amine/halide, hydroxy/halide, amine/ester, and amine/carboxylic acid. Upon heating, the functional groups will react and adhere the two layers together.

Additionally, such entangled species can be used to adhere a PFPE layer to a layer of another material, such as glass, silicon, quartz, PDMS, Kratons™, buna rubber, natural rubber, a fluoroelastomer, chloroprene, butyl rubber, nitrile rubber, polyurethane, or a thermoplastic elastomer. In some embodiments, the second polymeric material includes a rigid thermoplastic, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

In some embodiments, such an entangled species can be used to functionalize the interior of a microfluidic channel for the purposes described hereinabove.

VII. Other Methods of Introducing Functionality to a PFPE Surface

In some embodiments, an Argon plasma is used to introduce functionality along a fully cured PFPE surface using the method for functionalizing a poly(tetrafluoroethylene) surface as described by Chen, Y. and Momose, Y. *Surf. Interface. Anal.* 1999, 27, 1073-1083, which is incorporated herein by reference in it entirety. More particularly, without being bound to any one particular theory, exposure of a fully cured PFPE material to Argon plasma for a period of time adds functionality along the fluorinated backbone.

Such functionality can be used to adhere multiple layers of PFPE, bond a fully cured PFPE layer to a substrate, such as a glass material or a silicon material that has been treated with a silane coupling agent, or bond a fully cured PFPE layer to a second polymeric material, such as a PDMS material. In some embodiments, the PDMS material includes a functionalized material. In some embodiments, the PDMS material is treated with a plasma and a silane coupling agent to introduce the desired functionality. Such functionalities also can be used to attach proteins, oligonucleotides, drugs, catalysts, dyes, sensors, analytes, and charged species capable of changing the wettability of the channel.

In some embodiments, the second polymeric material includes an elastomer other than PDMS, such as Kratons™, buna rubber, natural rubber, a fluoroelastomer, chloroprene, butyl rubber, nitrile rubber, polyurethane, or a thermoplastic elastomer. In some embodiments, the second polymeric material includes a rigid thermoplastic, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone).

In some embodiments, a fully cured PFPE layer is brought into conformal contact with a solid substrate. In some embodiments, the solid substrate is selected from the group consisting of a glass material, a quartz material, a silicon material, a fused silica material, and a plastic material. In some embodiments, the PFPE material is irradiated with UV light, e.g., a 185-nm UV light, which can strip a fluorine atom off of the back bone and form a chemical bond to the substrate as described by Vurens, G., et al. *Langmuir* 1992, 8, 1165-1169. Thus, in some embodiments, the PFPE layer is covalently bonded to the solid substrate by radical coupling following abstraction of a fluorine atom.

VIII. Adhesion of a Microscale or a Nanoscale Device to a Substrate Through an Encasing Polymer In some embodiments, a microscale device, a nanoscale device, or combinations thereof is adhered to a substrate by placing the fully cured device in conformal contact on the substrate and pouring an "encasing polymer" over the entire device. In some embodiments, the encasing polymer is selected from the group consisting of a liquid epoxy precursor and a polyurethane. The encasing polymer is then solidified by curing or other methods. The encasement serves to bind the layers together mechanically and to bind the layers to the substrate.

In some embodiments, the microscale device, the nanoscale device, or combinations thereof includes one of a perfluoropolyether material as described in Section II.A and Section II.B., hereinabove, and a fluoroolefin-based material as described in Section II.C., hereinabove.

In some embodiments, the substrate is selected from the group consisting of a glass material, a quartz material, a silicon material, a fused silica material, and a plastic material. Further, in some embodiments, the substrate includes a second polymeric material, such as poly(dimethylsiloxane) (PDMS), or another polymer. In some embodiments, the second polymeric material includes an elastomer other than PDMS, such as Kratons™, buna rubber, natural rubber, a fluoroelastomer, chloroprene, butyl rubber, nitrile rubber, polyurethane, or a thermoplastic elastomer. In some embodiments, the second polymeric material includes a rigid thermoplastic material, including but not limited to: polystyrene, poly(methyl methacrylate), a polyester, such as poly(ethylene terephthalate), a polycarbonate, a polyimide, a polyamide, a polyvinylchloride, a polyolefin, a poly(ketone), a poly(ether ether ketone), and a poly(ether sulfone). In some embodiments, the surface of the substrate is functionalized with a silane coupling agent such that it will react with the encasing polymer to form an irreversible bond.

IX. Method for Forming a Microstructure Using Sacrificial Layers

The presently disclosed subject matter provides a method for forming microchannels or a microstructure for use as a microfluidic device by using sacrificial layers including a degradable or selectively soluble material. In some embodiments, the method includes contacting a liquid precursor material with a two-dimensional or a three-dimensional sacrificial structure, treating, e.g., curing, the precursor material, and removing the sacrificial structure to form a microfluidic channel.

Accordingly, in some embodiments, a PFPE liquid precursor is disposed on a multidimensional scaffold, wherein the multidimensional scaffold is fabricated from a material that can be degraded or washed away after curing of the PFPE network. These materials protect the channels from being filled in when another layer of elastomer is cast thereon. Examples of such degradable or selective soluble materials include, but are not limited to waxes, photoresists, polysulfones, polylactones, cellulose fibers, salts, or any solid organic or inorganic compounds. In some embodiments, the sacrificial layer is removed thermally, photochemically, or by washing with solvents. Importantly, the compatibility of the materials and devices disclosed herein with organic solvents provides the capability to use sacrificial polymer structures in microfluidic devices.

The PFPE materials of use in forming a microstructure by using sacrificial layers include those PFPE and fluoroolefin-based materials as described hereinabove in Section II of the presently disclosed subject matter.

FIGS. 6A-6D and FIGS. 7A-7C show embodiments of the presently disclosed methods for forming a microstructure by using a sacrificial layer of a degradable or selectively soluble material.

Referring now to FIG. 6A, a patterned substrate 600 is provided. Liquid PFPE precursor material 602 is disposed on patterned substrate 600. In some embodiments, liquid PFPE precursor material 602 is disposed on patterned substrate 600 via a spin-coating process. Liquid PFPE precursor material 602 is treated by treating process $T_{r1}$ to form a layer of treated liquid PFPE precursor material 604.

Referring now to FIG. 6B, the layer of treated liquid PFPE precursor material 604 is removed from patterned substrate 600. In some embodiments, the layer of treated liquid PFPE precursor material 604 is contacted with substrate 606. In some embodiments, substrate 606 includes a planar substrate or a substantially planar substrate. In some embodiments, the layer of treated liquid PFPE precursor material is treated by treating process $T_{r2}$, to form two-layer assembly 608.

Referring now to FIG. 6C, a predetermined volume of degradable or selectively soluble material 610 is disposed on two-layer assembly 608. In some embodiments, the predetermined volume of degradable or selectively soluble material 610 is disposed on two-layer assembly 608 via a spin-coating process. Referring once again to FIG. 6C, liquid precursor material 602 is disposed on two-layer assembly 608 and treated to form a layer of PFPE material 612, which covers the predetermined volume of degradable or selectively soluble material 610.

Referring now to FIG. 6D, the predetermined volume of degradable or selectively soluble material 610 is treated by treating process $T_{r3}$ to remove the predetermined volume of degradable or selectively soluble material 610, thereby forming microstructure 616. In some embodiments, microstructure 616 includes a microfluidic channel. In some embodiments, treating process $T_{r3}$ is selected from the group consisting of a thermal process, an irradiation process, and a dissolution process.

In some embodiments, patterned substrate 600 includes an etched silicon wafer. In some embodiments, the patterned substrate includes a photoresist patterned substrate. For the purposes of the presently disclosed subject matter, the patterned substrate can be fabricated by any of the processing methods known in the art, including, but not limited to, photolithography, electron beam lithography, and ion milling.

In some embodiments, degradable or selectively soluble material 610 is selected from the group consisting of a polyolefin sulfone, a cellulose fiber, a polylactone, and a polyelectrolyte. In some embodiments, the degradable or selectively soluble material 610 is selected from a material that can be degraded or dissolved away. In some embodiments, degradable or selectively soluble material 610 is selected from the group consisting of a salt, a water-soluble polymer, and a solvent-soluble polymer.

In addition to simple channels, the presently disclosed subject matter also provides for the fabrication of multiple complex structures that can be "injection molded" or fabricated ahead of time and embedded into the material and removed as described above.

FIGS. 7A-C illustrate an embodiment of the presently disclosed method for forming a microchannel or a microstructure through the use of a sacrificial layer. Referring now to FIG. 7A, a substrate 700 is provided. In some embodiments, substrate 700 is coated with a liquid PFPE precursor material 702. Sacrificial structure 704 is placed on substrate 700. In some embodiments, liquid PFPE precursor material 702 is treated by treating process $T_{r1}$.

Referring now to FIG. 7B, a second liquid PFPE precursor material 706 is disposed over sacrificial structure 704, in such a way to encase sacrificial structure 704 in second liquid precursor material 706. Second liquid precursor material 706 is then treated by treating process $T_{r2}$. Referring now to FIG. 7C, sacrificial structure 704 is treated by treating process $T_{r3}$, to degrade and/or remove sacrificial structure, thereby forming microstructure 708. In some embodiments, microstructure 708 includes a microfluidic channel.

In some embodiments, substrate 700 includes a silicon wafer. In some embodiments, sacrificial structure 704 includes a degradable or selectively soluble material. In some embodiments, sacrificial structure 704 is selected from the group consisting of a polyolefin sulfone, a cellulose fiber, a polylactone, and a polyelectrolyte. In some embodiments, the sacrificial structure 704 is selected from a material that can be degraded or dissolved away. In some embodiments, sacrificial structure 704 is selected from the group consisting of a salt, a water-soluble polymer, and a solvent-soluble polymer.

A. Method of Increasing the Modulus of a Microfluidic Device using PTFE Powder

In some embodiments, the modulus of a microfluidic device fabricated from PFPE materials or any of the fluoropolymer materials described hereinabove can be increased by blending polytetrafluoroethylene (PTFE) powder, also referred to herein as a "PTFE filler," into the liquid precursor prior to curing. Because PTFE itself has a very high modulus, addition of PTFE in its powder form, when evenly dispersed throughout the low modulus materials of the present invention, will raise the overall modulus of the material. The PTFE filler also can contribute additional chemical stability and solvent resistance to the PFPE materials.

B. Use of the Material in Combination with a Microfluidic Device

According to an embodiment of the present invention, micro or nano scale devices, portions of devices, components, parts, or the like made from the methods and materials described herein can be formed for incorporation into a microfluidic device. For example, micro or nano scale valves or plugs can be formed from the materials and methods of the present invention that can effectively close off channels in a microfluidic device. According to one embodiment, the valve or plug can be formed in a shape and/or size configuration to fit within a micro-chamber and remain in position or be configured to move in response to substances flowing in a particular direction or block particular channels from flow. According to another embodiment, a valve or plug can be formed in an micro-channel by introducing the materials of the present invention, in liquid form, into the micro-channel and curing the liquid material according to the methods disclosed in the present invention. Thereby, the valve or plug takes on the shape of the micro-channel forming a conformal fit because the channel acts as the mold for the valve. In alternative embodiments, a valve is formed by positioning a first channel adjacent a test channel such that when the first channel is pressurized the first channel exerts a pressure on the test channel and reduces a cross-section width of the test channel, thereby reducing or eliminating the flow path within the test channel.

X. Microfluidic Devices

A. Functionalizing Microfluidic Devices

According to embodiments of the present invention microfluidic devices can be functionalized to increase their chemical compatibility. According to such embodiments the surface of channels of the microfluidic devices can be passivated by methods and materials of the present invention. According to such embodiments, a PFPE based microfluidic device can be treated with a styrene end-capped UV curable liquid precursor. The styrene end-capped UV curable precursor is dissolved in a solvent, such as but not limited to, pentafluorobutane such that a solution is formed. This solution is then introduced into the channels of the microfluidic device and the solvent is evaporated. Following evaporation of the solvent, the precursor remains coated on the walls of the channels. In one embodiment, the microfluidic device with the precursor coated on the walls of the channels is treated with a UV treatment which adheres the precursor to the walls of the channels through reaction with latent methacrylate groups contained in the base material of the microfluidic device. The surface coated with the styrene end-capped precursor does not contain acid-labile groups such as urethane and/or ester linkages, thus creating a surface passivation and improving the chemical compability of the channels of the microfluidic device.

According to other embodiments, medical devices, surgical devices, medical implants, and the like, fabricated from materials and methods disclosed in the present application can be treated with the surface treatment methods herein described to create surface passivation on the device and increase chemical compatibility of the devices. Such surface passivation can increase the chemically inert nature of the base material, reduce adsorption of substances to the surface, increase resistance to acids and bases, combinations thereof, and the like.

According to another embodiment, the surface of a device fabricated from materials described herein is passivated by a gas phase passivation. According to such embodiments, a device is exposed to a mixture of 0.5% Fluorine gas in Nitrogen. The Fluorine reacts free radically with hydrogen atoms in the base material, thus passivating the surface of device that is treated with the gas.

B. Devices Having Torque Actuated Valves

In some embodiments, microfluidic devices are fabricated from the materials and methods described herein and contain "torque actuated valves" such as those described by Whitesides et al. in *Anal Chem* 2005, 77, 4726. Such valves, as well as the valves described in the references below are incorporated into fluoropolymer or PFPE-based microfluidic chips. References describing appropriate valves that can be fabricated, treated, utilized, or the like from the materials and methods disclosed herein include: (1) Lee, S.; Jeong, W.; Beebe, D. J. *Lab Chip* 2003, 3, 164-167; (2) Rich, C. A.; Wise, K. D. *J. Microelectromech. Syst.* 2003, 12, 201-208; (3) Studer, V.; Hang, G.; Pandolfi, A.; Ortiz, M.; Anderson, W. F.; Quake, S. R; *J. Appl. Phys.* 2004, 95, 393-398; (4) Sin, A.; Reardon, C. F.; Shuler, M. L. *Biotechnol. Bioeng.* 2004, 85, 359-363; (5) Gu, W.; Zhu, X.; Futai, N.; Cho, B. S.; Takayama, S. *Proc. Natl. Acad. Sci. U.S.A.* 2004, 101, 15861-15866; (6) Rohit, P.; Yang, M.; Johnson, B. N.; Burns, D. T.; Burns, M. A. *Anal. Chem.* 2004, 76, 3740-3748; (7) Liu, R. H.; Bonanno, J.; Yang, J.; Lenigk, R.; Grodzinski, P. *Sens. Actuators, B* 2004, B98, 328-336; (8) Selvaganaphthy, P.; Carlen, E. T.; Mastrangelo, C. H. *Sens. Actuators, A* 2003, A104, 275-282; (9) Sethu, P.; Mastrangelo, C. H. *Sens. Actuators, A* 2003, A104, 283-289; (10) Klintberg, L.; Svedberg, M.; Nikolajeff, F.; Thornell, G. *Sens. Actuators, A* 2003, A103, 307-316; (11) Suzuki, H.; Yoneyama, R. *Sens. Actuators, B* 2003, B96, 38-45; (12) Hua, S. Z.; Sachs, F.; Yang, D. X, Chopra, H. D. *Anal. Chem.* 2002, 74, 6392-6396; (13) Xie, J.; Miao, Y.; Shih, J.; He, Q.; Liu, J.; Tai, Y.-C.; Lee, T. D. *Anal. Chem.* 2004, 76, 3756-3763; (14) Tsai, J. H.; Lin, L. *J. Microelectromech. Syst.* 2002, 11, 665-671; (15) Munyan, J. W.; Fuentes, H. V.; Draper, M.; Kelly, R. T.; Woolley, A. T. *Lab Chip* 2003, 3, 217-220; (16) Hartshorne, H.; Backhouse, C. J.; Lee, W. E. *Sens. Actuators, B* 2004, B99, 592-600; (17) Hatch, A.; Kamholz, A. E.; Holman, G.; Yager, P.; Bohringer, K. F. *J. Microelectromech. Syst.* 2001, 10, 215-221; (18) Jackson, W. C.; Tran, H. D.; O'Brien, M. J.; Rabinovich, E.; Lopez, G. P. *J. Vac. Sci. Technol. B* 2001, 19, 596-599; (19) Luo, Q.; Mutlu, S.; Gianchandani, Y. B.; Svec, F.; Frechet, J. M. J. *Electrophoresis* 2003, 24, 3694-3702; (20) Yu, C.; Mutlu, S.; Selvaganaphthy, P.; Mastrangelo, C. H.; Svec, F.; Frechet, J. M. J. *Anal. Chem.* 2003, 75, 1958-1961; (21) Griss, P.; Andersson, H.; Stemme, G. *Lab Chip* 2002, 2, 117-120; (22) Beebe, D. J.; Moore, J. S.; Bauer, J. M.; Yu, Q.; Liu, R. H.; Devadoss, C.; Jo, B. *Nature* 2000, 404, 588-590; (23) Beebe, D. J.; Mensing, G. A.; Walker, G. M. *Annu. Rev. Biomed. Eng.* 2002 4, 261-286; (24) Jacobson, S. C.; Ermakov, S. V.; Ramsey, J. M. *Anal. Chem.* 1999, 71, 3273-3276; (25) Lazar, I. M.; Karger, B. L. *Anal. Chem.* 2002, 74, 6259-6268; (26) Gitlin, I.; Stroock, A. D.; Whitesides, G. M.; Ajdari, A. *Appl. Phys. Lett.* 2003, 83, 1486-1488; (27) Lastochkin, D.; Zhou, R.; Wang, P.; Ben, Y.; Chang, H.-C. *J. Appl. Phys.* 2004, 96, 1730-1733; (28) Liu, S.; Pu, Q.; Lu, J. J. *J. Chromatogr., A* 2003, 1013, 57-64; (29) Takamura, Y.; Onoda, H.; Inokuchi, H.; Adachi, S.; Oki, A.; Horiike, Y. *Electrophoresis* 2003, 24, 185-192; (30) McKnight, T. E.; Culbertson, C. T.; Jacobson, S. C.; Ramsey, J. M. *Anal Chem.* 2001, 73, 4045-4049; (31) Culbertson, C. T.; Ramsey, R. S.; Ramsey, M. J. *Anal. Chem.* 2000, 72, 2285-2291; (32) Salimi-Moosavi, H.; Tang, T.; Harrison, D. J. *J. Am. Chem. Soc.* 1997, 119, 8716-8717; (33) Johnston, I. D.; Davis, J. B.; Richter, R.; Herbert, G. I.; Tracey, M. C. *Analyst* 2004, 129, 829-834; (34) Terray, A.; Oakey, J.; Man, D. W. M. *Science* 2002, 296, 1841-1844; (35) Andersson, H.; van der Wijngaart, W.; Griss, P.; Niklaus, F.; Stemme, G. *Sens. Actuators, B* 2001, B75, 136-141; (36) Walker, G. M.; Beebe, D. J. *Lab Chip* 2002, 2, 131-134; (37) Shoji, S. *Top. Curr. Chem.* 1998, 194, 163-188; (38) Kovacs, G. T. A. *Micromachined Transducers Sourcebook*; McGraw-Hill: New York, 1998; each of which is incorporated herein by reference in its entirety.

C. Multiple Material Devices

In some embodiments, the materials described herein are used in only a part of a fabricated microfluidic device. In such devices, portions of the device are made from the materials disclosed herein and other portions of the device are made from other materials described herein such as glass or PDMS. Examples of such "parts" include but are not limited to: valves, channels, walls, discs, layers, backing, plugs, balls, switches, gears, and pillars. In some embodiments, these structures can be generated in situ by exposing UV light through a photomask of the desired shape such that the PFPE material is cured in the desired shape in select regions. Residual PFPE material that was not exposed to UV light due to the mask are left untreated and can then be washed away with a solvent such as 1,1,1-3,3-pentafluorobutane. This leaves a structure behind that mimics the mask opening. In further embodiments, this structure is adhered in place by activating a second curing step as described previously.

D. Master Template Patterns for Fabricating Devices

Figure 17:
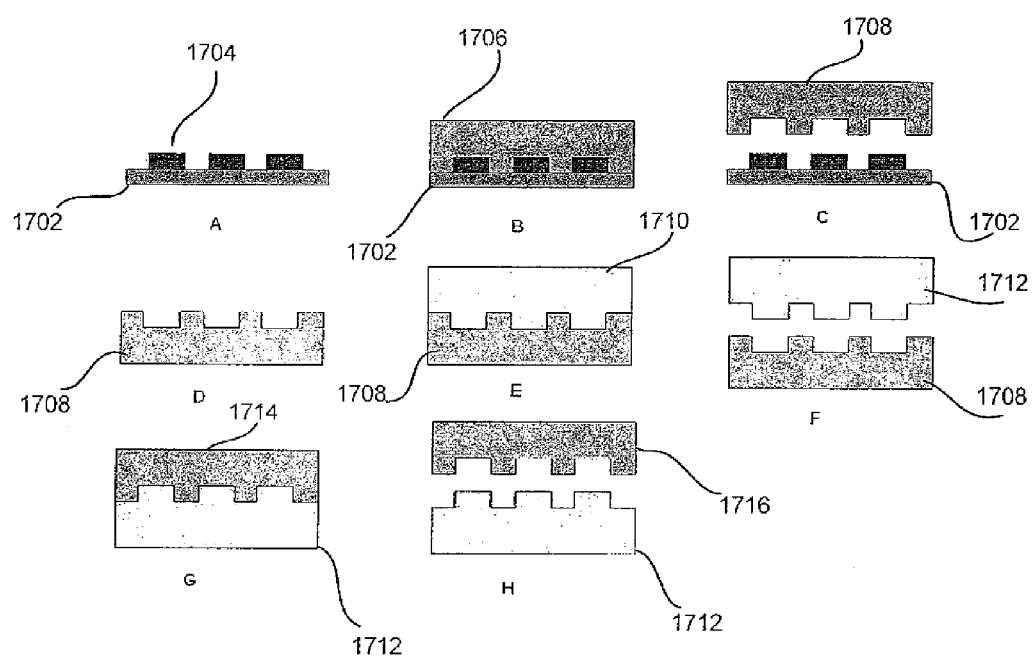
FIG. 17 shows a device being formed through a master template patterning sequence according to an embodiment of the present invention.

Referring to FIG. 17, in some embodiments, master template patterns used to fabricate devices, such as for example microfluidic devices, can be transferred to a PDMS slab which is then used to pattern devices. According to such embodiments, an initial master template 1702 is prepared with a pattern 1704 that is to be transferred to a final device. In some embodiments master template 1702 can be generated from a silicon substance, a photoresist substance, combinations thereof, or the like. Next, a liquid PFPE precursor 1706 is introduced to master template 1702 and/or its pattern 1704, as shown in steps B-C. In some embodiments, liquid PFPE 1706 can be introduced onto master template 1702 by casting, deposition, spin coating, pressing, pouring, combinations thereof, or the like. Liquid PFPE 1706 is then cured while in contact with master template 1702 to form solidified liquid PFPE 1708 that can retain pattern 1704 of master template 1702 when removed from master template 1702. In some embodiments, liquid PFPE 1704 is cured as described herein, such as for example by, photo-curing, thermal curing, evaporation curing, combinations thereof, and the like. Solidified liquid PFPE 1708 is then removed from master template 1702, as shown in step C. Solidified liquid PFPE 1708 can then be used as a template for patterning a PDMS layer 1710, as shown in steps D-F. Liquid PDMS 1710 is brought into contact with solidified liquid PFPE 1708 and cured, forming solidified liquid PDMS 1712, as shown in steps E-F. Liquid PDMS 1710 can include curing agents as described herein and can be cured by methods and techniques described herein, such as for example, photo activation of photo-curing agents, thermal activation of thermal curing agents, evaporation curing, combinations thereof, and the like. Solidified liquid PDMS 1712 is then removed from solidified liquid PFPE template 1708, as shown in step F. Finally, solidified liquid PDMS 1712 can be used as a template to mold subsequent PFPE devices by introducing a second quantity of liquid PFPE 1714 to solidified liquid PDMS template 1712 and curing liquid PFPE 1714, as shown in steps G-H. Liquid PFPE 1714 can include curing agents as described herein and can be cured by methods and techniques described herein to form PFPE device 1716. PFPE device 1716 can then be removed from solidified liquid PDMS template 1710. The use of liquid PDMS as a template for fabrication of PFPE device 1716 allows for easier release of PFPE device 1716 from the PDMS template 1710 than release from a silicon or photoresist template. Use of a PDMS template, such as described herein, if further advantageous over a silicon or photoresist template when the silicon or photoresist template contains latent functionalities which can react with the endgroups on the PFPE precursors, thereby causing adhesion of the PFPE device to the silicon or photoresist template.

E. Layering by Spin Coating

In some embodiments, layers of materials described herein can be adhered to other layers by spin coating a thin layer of uncured material onto another layer, positioning the layers with respect to each other, and curing the material, with for example UV light, photo-curing, or thermal energy, to activate curing agents within the layers and/or spin coated thin layer such that the layers are adhered together. In some embodiments this process is repeated multiple times to form a multilayer device. In some embodiments the spin coated thin layer can be between about 50 nm and about 2 microns. According to other embodiments, the thin layer is between about 100 nm and about 1 micron.

F. Low Permeability Layer Inside a Device

In some embodiments, a layer of a material with very low permeability to a liquid or gas such as oxygen, water vapor, water, combinations thereof, or the like is fabricated as an inner layer of a multiple layer device. Such device can be, for example, a microfluidic device as described herein. The low permeability material can be, for example, an acrylic polymer such as poly(methyl methacrylate), poly(ethylene), or a UV curable resin such as trimethylolpropane triacrylate, or a material made by metathesis polymerization such as poly (dicyclo pentadiene), combinations thereof, or the like.

G. Acid and/or Base Treatment

In some embodiments, a layer of materials described herein can be treated with an acid and/or base such that any latent functionalities associated with a surface of the material can be neutralized. Neutralizing such latent functionalities reduces interactions with substances that come into contact with the material during use. According to some embodiments, the surface of the material treated is the surface of a channel formed within the material, such as for example, a channel of a microfluidic device. According to some embodiments, F— is a preferable surface treatment, however other treatments can also be utilized and may be more appropriate for the compositions of the material to be treated.

H. Microfluidic Device with Minimum Quenching of Reactions Involving F—

According to some embodiments of the present invention, microfluidic devices contain from substantially zero to minimal amounts of trace metals. In some embodiments, the microfluidic devices are fabricated from PFPE materials that contain from substantially zero to minimal amounts of trace metals.

Many reactions involving F— as a nucleophile are quenched by trace amounts of metal catalysts, specifically, organo-tin catalysts such as dibutyltin diacetate, dibutyltin dilaurate, and stannous octoate. Further, it is generally known that metal catalysts or metal complexes will form strong complexes with F—. For example, metal complexes containing Ru, Rh, Pd, Pt, Cu, Co, Ni, Fe, Cr, Sn, Al, and Si are known to form strong associations with F—. An example of such a reaction is shown below for the synthesis of 2-deoxy-2-[$^{18}$F] fluoro-D-glucose (FDG), an imaging agent used in positron emission tomography (PET).

Many reactions using microfluidic devices involve the synthesis of PET agents. Moreover, many if not most of these agents involve reactions using F— as a nucleophile. Therefore, microfluidic device fabricated from the materials disclosed herein are preferable for PET reactions using F— as a nucleophile because.

I. Use of an Epoxy-Functional Polymer Containing a Photoacid Generator

In some embodiments, a layer of an epoxy-functional polymer containing a photoacid generator can be deposited onto a surface or in between multiple layers of a device. In some embodiments, the epoxy functional polymer has a Tg at or above room temperature and is spin-coated onto a surface such as glass, silicon, a flat or cured layer of PFPE material, combinations thereof, or the like. Layers of a device can then be sealed to the polymer layer and irradiated with UV light. The UV-light activates the PAG within the epoxy-functional polymer causing it to crosslink as well as react with latent groups on the surface of the PFPE layer, thus adhering the PFPE layer to the surface. In some embodiments, the epoxy-functional polymer consists of SU-8 photoresist, polymers containing the following structure, combinations thereof, or the like:

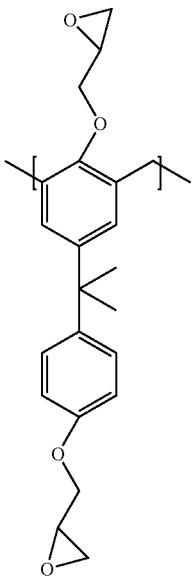

J. Epoxy-Functional Polymers

In some embodiments, the epoxy-functional polymer, as described herein can be a copolymer of glycidyl methacrylate and one or more comonomers such as Zonyl TM® fluoroalkyl methacrylate monomers or the like.

K. ePTFE Materials in Combination with PFPE

In some embodiments, a microfluidic device or a component of a microfluidic device (e.g., membrane, valve, channel, reservoir, or the like) is formed by using expanded poly (tetrafluoroethylene) (ePTFE). ePTFE is a microporous poly (tetrafluoroethylene) (PTFE) membrane formed by expanding PTFE at high temperatures. Because of the incredibly low surface energy of perfluoropolyether (PFPE) materials, as disclosed herein, the PFPE can be cast onto ePTFE membranes and effectively wet the pores included in the ePTFE, thereby forming an interpenetrating polymer network.

The PFPE can include functional groups, such as functional groups disclosed herein. In some embodiments, the PFPE can include photocurable functional groups and/or thermalcurable functional groups. In some embodiments, where the PFPE includes a photocurable functional group, the PFPE can be cured by exposure to UV light after it has been wetted onto the ePTFE. The resulting membrane of ePTFE and PFPE includes, for example, desirable flexibility, chemically resistance, and gas permeability to solvent vapors and to air. The ePTFE portion of the membrane provides a continuous structure which serves to greatly toughen materials compared to just an elastomer itself. Some membranes are generally described by Zumbrum et al. in U.S. Pat. No. 6,673, 455, which is incorporated by reference herein in its entirety including all reference cited therein.

In some embodiments, membranes of combined ePTFE and PFPE can be used in microfluidic platforms, especially where evaporation of solvents through a membrane is desired. According to some embodiments, these membranes are useful in microfluidic platforms involving the synthesis of radio-labelled biomarkers for Positron Emission Tomography (PET) imaging where chemical inertness of the membrane can be crucial. In some embodiments, the ePTFE membrane can be filled with a PFPE distyrene material that can be subsequently UV or thermally cured, yielding high chemical resistance.

In other embodiments, the "dual cure" PFPE materials described herein can be used to wet ePTFE membranes or microfluidic device components and activated in such ways to adhere the membrane to other membranes or other components of the device. In some embodiments, methods for fabricating a microfluidic device (or device in general) can include taking a mixture of UV curable and thermally curable PFPE materials and casting them onto an ePTFE membrane, UV curing the PFPE, sealing the combination of ePTFE/PFPE to another layer or component of a microfluidic device, and then heating the combination of ePTFE/PFPE and device component to activate the thermal component, thus generating adhesion of the device component to the PFPE layer that is adhered to the ePTFE.

XI. Microfluidics Unit Operations

Microfluidic control devices are necessary for the development of effective lab-on-a-chip operations. Valve structures and actuation, fluid control, mixing, separation, and detection at microscale levels must be designed to have a large-scale shift to miniaturization. To construct such devices, integration of the individual components on a common platform must be developed so that solvents and solutes can be completely controlled.

Microfluidic flow controllers are traditionally externally pump-based, including hydrodynamic, reciprocating, acoustic, and peristaltic pumps, and can be as simple as a syringe (see U.S. Pat. No. 6,444,106 to Mcbride et al., U.S. Pat. No. 6,811,385 to Blakley, U.S. Published Patent Application No. 20040028566 to Ko et al.). More recently, electroosmosis, a process that does not require moving parts, has experienced success as a fluid flow driver (see U.S. Pat. No. 6,406,605 to Moles, U.S. Pat. No. 6,568,910 to Parse). Other fluid flow devices that do not require moving parts use gravity (see U.S. Pat. No. 6,743,399 to Weigl et al.), centrifugal force (see U.S. Pat. No. 6,632,388 to Sanae et al.), capillary action (see U.S. Pat. No. 6,591,852 to McNeely et al.), or heat (see U.S. Published Patent Application No. 20040257668 to Ito) to drive liquids through the microchannels. Other inventions create liquid flow by the application of an external force, such as a blade (see U.S. Pat. No. 6,068,751 to Neukermans).

Valves also are used in fluid flow control. Valves can be actuated by applying an external force, such as a blade, cantilever, or plug to an elastomeric channel (see U.S. Pat. No. 6,068,751 to Neukermans). Elastic channels also can contain membranes that can be deflected by air pressure and/or liquid pressure, e.g., water pressure, electrostatically, or magnetically (see U.S. Pat. No. 6,408,878 to Unger et al.). Other 2-way valves are actuated by light (see U.S. Published Patent Application No. 20030156991 to Halas et al.), piezoelectric crystals (see Published PCT International Application No. WO 2003/089,138 to Davis et al.), particle deflection (see U.S. Pat. No. 6,802,489 to Man et al.), or bubbles formed within the channel electrochemically (see Published PCT International Application No. WO 2003/046,256 to Hua et al.). One-way or "check valves" also can be formed in microchannels with balls, flaps, or diaphragms (see U.S. Pat. No. 6,817,373 to Cox et al.; U.S. Pat. No. 6,554,591 to Dai et al.; Published PCT International Application No. WO 2002/053, 290 to Jeon et al.). Rotary-type switching valves are used for complex reactions (see Published PCT International Application No. WO 2002/055,188 to Powell et al.).

Microscale mixing and separation components are necessary to facilitate reactions and evaluate products. In microfluidic devices, mixing is most often done by diffusion, in channels of long length scales, curved, with variable widths, or having features that cause turbulence (see U.S. Pat. No. 6,729,352 to O'Conner et al., U.S. Published Patent Application No. 20030096310 to Hansen et al.). Mixing also can be accomplished electroosmotically (see U.S. Pat. No. 6,482,306 to Yager et al.) or ultrasonically (see U.S. Pat. No. 5,639,423 to Northrup et al.). Separations in micro-scale channels typically use three methods: electrophoresis, packed columns or gel within a channel, or functionalization of channel walls. Electrophoresis is commonly done with charged molecules, such as nucleic acids, peptides, proteins, enzymes, and antibodies and the like, and is the simplest technique (see U.S. Pat. No. 5,958,202 to Regnier et al., U.S. Pat. No. 6,274,089 to Chow et al.). Channel columns can be packed with porous or stationary-phase coated beads or a gel to facilitate separations (see Published PCT International Application No. WO 2003/068,402 to Koehler et al., U.S. Published Patent Application No. 20020164816 to Quake et al., U.S. Pat. No. 6,814,859 to Koehler et al.). Possible packing materials include silicates, talc, Fuller's earth, glass wool, charcoal, activated charcoal, celite, silica gel, alumina, paper, cellulose, starch, magnesium silicate, calcium sulfate, silicic acid, florisil, magnesium oxide, polystyrene, p-aminobenzyl cellulose, polytetrafluoroethylene resin, polystyrene resin, SEPHADEX™ (Amersham Biosciences, Corp., Piscataway, N.J., United States of America), SEPHAROSE™ (Amersham Biosciences, Corp., Piscataway, N.J., United States of America), controlled pore glass beads, agarose, other solid resins known to one skilled in the art and combinations of two or more of any of the foregoing. Magnetizable material, such as ferric oxide, nickel oxide, barium ferrite or ferrous oxide, also can be imbedded, encapsulated of otherwise incorporated into a solid-phase packing material.

The walls of microfluidic chambers also can be functionalized with a variety of ligands that can interact or bind to an analyte or to a contaminant in an analyte solution. Such ligands include: hydrophilic or hydrophobic small molecules, steroids, hormones, fatty acids, polymers, RNA, DNA, PNA, amino acids, peptides, proteins (including antibody binding proteins such as protein G), antibodies or antibody fragments (FABs, etc), antigens, enzymes, carbohydrates (including glycoproteins or glycolipids), lectins, cell surface receptors (or portions thereof), species containing a positive or a negative charge, and the like (see U.S. Published Patent Application No. 20040053237 to Liu et al., Published PCT International Application No. WO 2004/007,582 to Augustine et al., U.S. Published Patent Application No. 20030190608 to Blackburn).

Thus, in some embodiments, the presently disclosed subject matter describes a method of flowing a material and/or mixing two or more materials in a PFPE-based microfluidic device. In some embodiments, the presently disclosed subject matter describes a method of conducting a chemical reaction, including but not limited to synthesizing a biopolymer, such as DNA. In some embodiments, the presently disclosed subject matter describes a method of screening a sample for a characteristic. In some embodiments, the presently disclosed subject matter describes a method of dispensing a material. In some embodiments, the presently disclosed subject matter describes a method of separating a material.

A. Method of Flowing a Material and/or Mixing Two Materials in a PFPE-Based Microfluidic Device Referring now to FIG. 8, a schematic plan view of a microfluidic device of the presently disclosed subject matter is shown. The microfluidic device is referred to generally at 800. Microfluidic device 800 includes a patterned layer 802, and a plurality of holes 810A, 810B, 810C, and 810D. These holes can be further described as inlet aperture 810A, inlet aperture 810B, and inlet aperture 810C, and outlet aperture 810D. Each of apertures 810A, 810B, 810C, and 810D are covered by seals 820A, 820B, 820C, and 820D, which are preferably reversible seals. Seals 820A, 820B, 820C, and 820D are provided so that materials, including but not limited to, solvents, chemical reagents, components of a biochemical system, samples, inks, and reaction products and/or mixtures of solvents, chemical reagents, components of a biochemical system, samples, inks, reaction products and combinations thereof, can be stored, shipped, or otherwise maintained in microfluidic device 800 if desired. Seals 820A, 820B, 820C, and 820D can be reversible, that is, removable, so that microfluidic device 800 can be implemented in a chemical reaction or other use and then can be resealed if desired.

Figure 8:
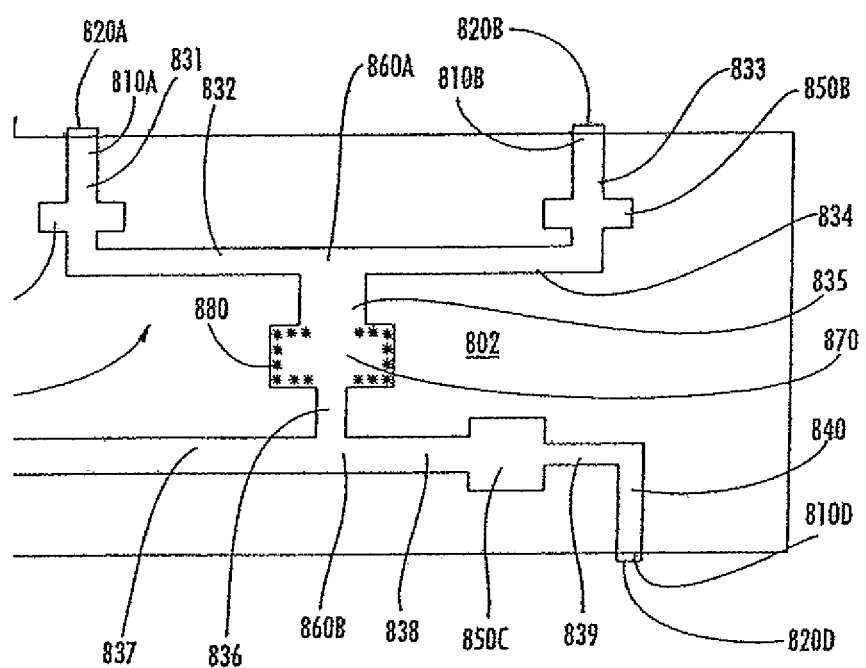
FIG. 8 is a schematic plan view of a device in accordance with the presently disclosed subject matter.

Continuing with reference to FIG. 8, in some embodiments, apertures 810A, 810B, and 810C, further include pressure-actuated valves (including intersecting, overlaid flow channels) which can be actuated to seal the microfluidic channel associated with the aperture.

Continuing with reference to FIG. 8, patterned layer 802 of microfluidic device 800 includes an integrated network 830 of microscale channels. Optionally, pattern layer 802 includes a functionalized surface, such as that shown in FIG. 5A. Integrated network 830 can include a series of fluidly connected microscale channels designated by the following reference characters: 831, 832, 833, 834, 835, 836, 837, 838, 839, and 840. Thus, inlet aperture 810A is in fluid communication with microscale channel 831 that extends away from aperture 810A and is in fluid communication with microscale channel 832 via a bend. In integrated network 830 depicted in FIG. 8, a series of 90° bends are shown for convenience. It is noted, however, that the paths and bends provided in the channels of integrated network 830, can encompass any desired configuration, angle, or other characteristic (such as but not limited to a serpentine section). Indeed, fluid reservoirs 850A and 850B can be provided along microscale channels 831, 832, 833, and 834, respectively, if desired. As shown in FIG. 8, fluid reservoirs 850A and 850B include at least one dimension that is greater than a dimension of the channels that are immediately adjacent to them.

Continuing, then, with reference to FIG. 8, microscale channels 832 and 834 intersect at intersecting point 860A and proceed into a single microscale channel 835. Microscale channel 835 proceeds to a chamber 870, which in the embodiment shown in FIG. 8, is dimensioned to be wider than microscale channel 835. In some embodiments, chamber 870 includes a reaction chamber. In some embodiments, chamber 870 includes a mixing region. In some embodiments, chamber 870 includes a separation region. In some embodiments, the separation region includes a given dimension, e.g., length, of a channel, wherein the material is separated by charge, or mass, or combinations thereof, or any other physical characteristic wherein a separation can occur over a given dimension. In some embodiments, the separation region includes an active material 880. As would be understood by one of ordinary skill in the art, the term "active material" is used herein for convenience and does not imply that the material must be activated to be used for its intended purpose. In some embodiments, the active material includes a chromatographic material. In some embodiments, the active material includes a target material.

Continuing with FIG. 8, it is noted that chamber 870 does not necessarily need to be of a wider dimension than an adjacent microscale channel. Indeed chamber 870 can simply include a given segment of a microscale channel wherein at least two materials are separated, mixed, and/or reacted.

Extending from chamber 870 substantially opposite from microscale channel 835 is microscale channel 836. Microscale channel 836 forms a T-junction with microscale channel 837, which extends away from and is in fluid communication with aperture 810C. Thus, the junction of microscale channels 836 and 837 form intersecting point 860B. Microscale channel 838 extends from intersecting point 860B in a direction substantially opposite microscale channel 837 and to fluid reservoir 850C. Fluid reservoir 850C is dimensioned to be wider than microscale channel 838 for a predetermined length. As noted above, however, a given section of a microscale channel can act as a fluid reservoir without the need to necessarily change a dimension of the section of microscale channel. Moreover, microscale channel 838 could act as a reaction chamber in that a reagent flowing from microscale channel 837 to intersection point 860B could react with a reagent moving from microscale channel 836 to intersection point 860B and into microscale channel 838.

Continuing with reference to FIG. 8, microscale channel 839 extends from fluid reservoir 850C substantially opposite microfluidic channel 838 and travels through a bend into microscale channel 840. Microscale channel 840 is fluidly connected to outlet aperture 810D. Outlet aperture 810D can optionally be reversibly sealed via seal 820D, as discussed above. Again, the reversible sealing of outlet aperture 810D can be desirable in the case of an embodiment where a reaction product is formed in microfluidic device 800 and is desired to be transported to another location in microfluidic device 800.

The flow of a material can be directed through the integrated network 830 of microscale channels, including channels, fluid reservoirs, and reaction chambers through the use of pressure-actuated valves and the like known in the art, for example those described in U.S. Pat. No. 6,408,878 to Unger et al., which is incorporated herein by reference in its entirety. The presently disclosed subject matter thus provides a method of flowing a material through a PFPE-based microfluidic device. In some embodiments, the method includes providing a microfluidic device including (i) a perfluoropolyether (PFPE) material having a characteristic selected from the group consisting of: a viscosity greater than about 100 centistokes (cSt); a viscosity less than about 100 cSt, provided that the liquid PFPE precursor material having a viscosity less than 100 cSt is not a free-radically photocurable PFPE material; (ii) a functionalized PFPE material; (iii) a fluoroolefin-based elastomer; and (iv) combinations thereof, and wherein the microfluidic device includes one or more microscale channels; and flowing a material in the microscale channel.

Also provided is a method of mixing two or more materials. In some embodiments, the method includes providing a microscale device including (i) a perfluoropolyether (PFPE) material having a characteristic selected from the group consisting of: a viscosity greater than about 100 centistokes (cSt); a viscosity less than about 100 cSt, provided that the liquid PFPE precursor material having a viscosity less than 100 cSt is not a free-radically photocurable PFPE material; (ii) a functionalized PFPE material; (iii) a fluoroolefin-based elastomer; and (iv) combinations thereof; and contacting a first material and a second material in the device to mix the first and second materials. Optionally, the microscale device is selected from the group consisting of a microfluidics device and a microtiter plate.

Figure 10:
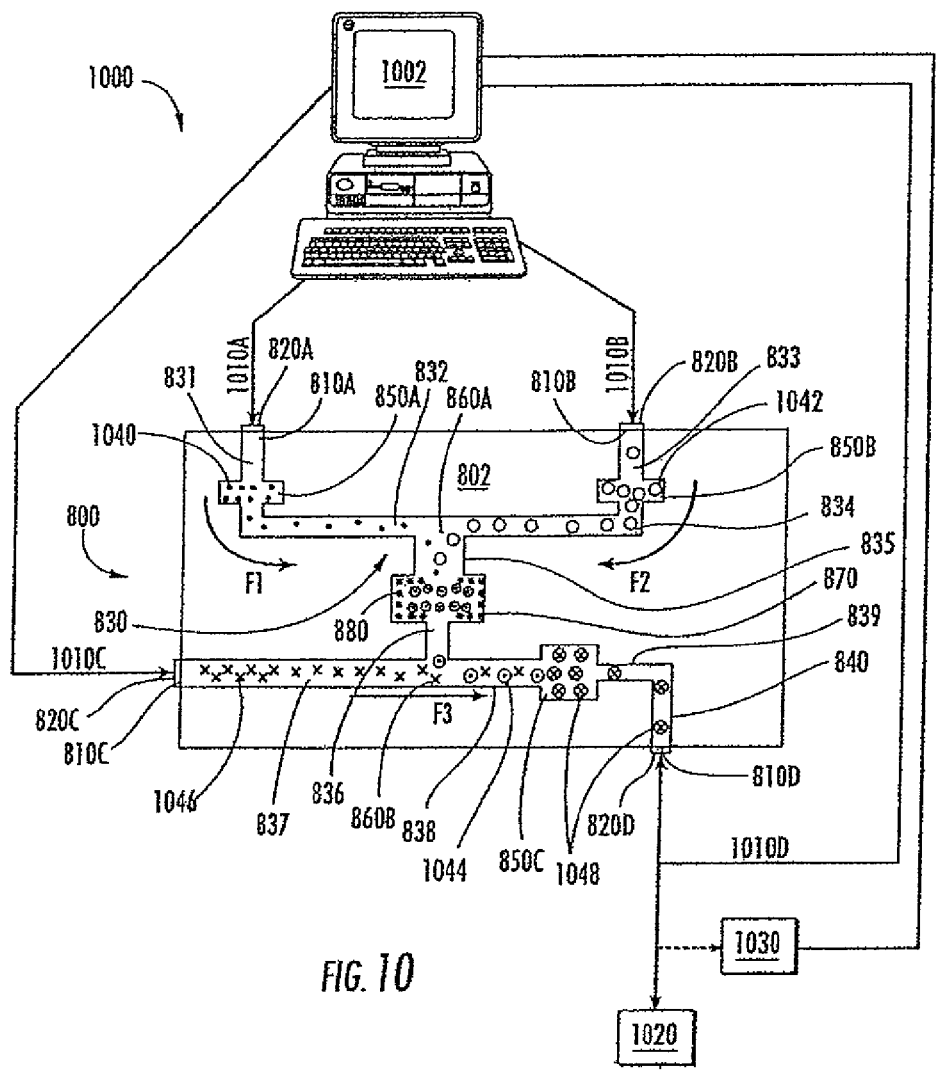
FIG. 10 is a schematic view of a system for flowing a solution or conducting a chemical reaction in a microfluidic device in accordance with the presently disclosed subject matter.

In some embodiments, the method includes disposing a material in the microfluidic device. In some embodiments, as is best shown in FIG. 10 and as discussed in more detail herein below, the method includes applying a driving force to move the material along the microscale channel.

In some embodiments, the layer of PFPE material covers a surface of at least one of the one or more microscale channels. Optionally, the layer of PFPE material includes a functionalized surface. In some embodiments, the microfluidic device includes one or more patterned layers of PFPE material, and wherein the one or more patterned layers of the PFPE material defines the one or more microscale channels. In this case the patterned layer of PFPE can include a functionalized surface. In some embodiments, the microfluidic device can further include a patterned layer of a second polymeric material, wherein the patterned layer of the second polymeric material is in operative communication with the at least one of the one or more patterned layers of PFPE material. See FIG. 2.

In some embodiments, the method includes at least one valve. In some embodiments the valve is a pressure-actuated valve, wherein the pressure-actuated valve is defined by one of: (a) a microscale channel; and (b) at least one of the plurality of holes. In some embodiments, the pressure-actuated valve is actuated by introducing a pressurized fluid or a gas that does not permeate the material including the microscale channel (e.g., Sulfur Hexafluoride) into one of: (a) a microscale channel; and (b) at least one of the plurality of holes.

In some embodiments, the pressurized fluid has a pressure between about 10 psi and about 60 psi. In some embodiments, the pressure is about 25 psi. In some embodiments, the material includes a fluid. In some embodiments, the fluid includes a solvent. In some embodiments, the solvent includes an organic solvent. In some embodiments, the material flows in a predetermined direction along the microscale channel.

In the case of mixing two materials, which in some embodiments can include mixing two reactants to provide a chemical reaction, the contacting of the first material and the second material is performed in a mixing region defined in the one or more microscale channels. The mixing region can include a geometry selected from the group consisting of a T-junction, a serpentine, an elongated channel, a microscale chamber, and a constriction. Optionally, the first material and the second material are disposed in separate channels of the microfluidic device. Also, the contacting of the first material and the second material can be performed in a mixing region defined by an intersection of the channels.

Continuing with a method of mixing, the method can include flowing the first material and the second material in a predetermined direction in the microfluidic device, and can include flowing the mixed materials in a predetermined direction in the microfluidic device. In some embodiments, the mixed material can be contacted with a third material to form a second mixed material. In some embodiments the mixed material includes a reaction product and the reaction product can be subsequently reacted with a third reagent. One of ordinary skill in the art upon review of the presently disclosed subject matter would recognize that the description of the method of mixing provided immediately hereinabove is for the purposes of illustration and not limitation. Accordingly, the presently disclosed method of mixing materials can be used to mix a plurality of materials and form a plurality of mixed materials and/or a plurality of reaction products. The mixed materials, including but not limited to reaction products, can be flowed to an outlet aperture of the microfluidic device. A driving force can be applied to move the materials through the microfluidic device. See FIG. 10. In some embodiments the mixed materials are recovered.

In an embodiment employing a microtiter plate, the microtiter plate can include one or more wells. In some embodiments, the layer of PFPE material covers a surface of at least one of the one or more wells. The layer of PFPE material can include a functionalized surface. See FIG. 5B.

B. Method of Synthesizing a Biopolymer in a PFPE-Based Microfluidic Device

In some embodiments, the presently disclosed PFPE-based microfluidic device can be used in biopolymer synthesis, for example, in synthesizing oligonucleotides, proteins, peptides, DNA, and the like. In some embodiments, such biopolymer synthesis systems include an integrated system including an array of reservoirs, fluidic logic for selecting flow from a particular reservoir, an array of channels, reservoirs, and reaction chambers in which synthesis is performed, and fluidic logic for determining into which channels the selected reagent flows.

Figure 9:
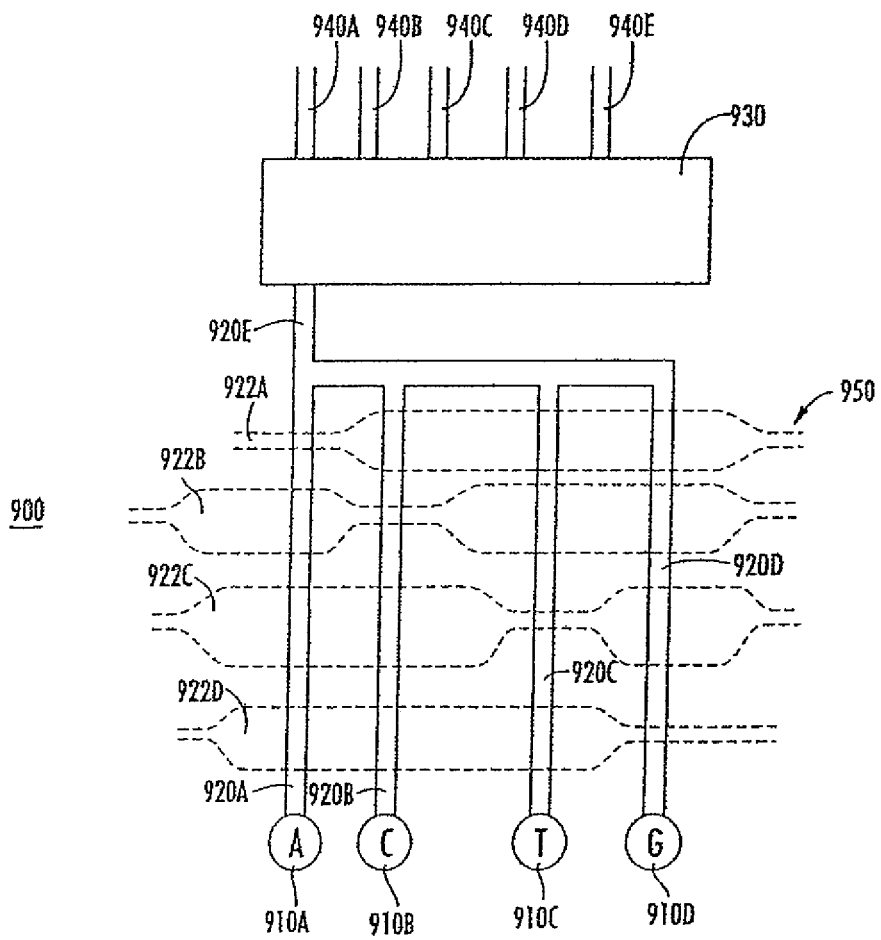
FIG. 9 is a schematic of an integrated microfluidic system for biopolymer synthesis.

Referring now to FIG. 9, a plurality of reservoirs, e.g., reservoirs 910A, 910B, 910C, and 910D, have bases A, C, T, and G respectively disposed therein, as shown. Four flow channels 920A, 920B, 920C, and 920D are connected to reservoirs 910A, 910B, 910C, and 910D. Four control channels 922A, 922B, 922C, and 922D (shown in phantom) are disposed thereacross with control channel 922A permitting flow only through flow channel 920A (i.e., sealing flow channels 920B, 920C, and 920D), when control channel 922A is pressurized. Similarly, control channel 922B permits flow only through flow channel 920B when pressurized. As such, the selective pressurization of control channels 922A, 922B, 922C, and 922D sequentially selects a desired base A, C, T, and G from a desired reservoir 910A, 910B, 910C, or 910D. The fluid then passes through flow channel 920E into a multiplexed channel flow controller 930, (including, for example, any system as shown in FIG. 8) which in turn directs fluid flow into one or more of a plurality of synthesis channels or reaction chambers 940A, 940B, 940C, 940D, or 940E in which solid phase synthesis can be carried out.

In some embodiments, instead of starting from the desired base A, C, T, and G, a reagent selected from one of a nucleotide and a polynucleotide is disposed in at least one of reservoir 910A, 910B, 910C, and 910D. In some embodiments, the reaction product includes a polynucleotide. In some embodiments, the polynucleotide is DNA.

Accordingly, after a review of the present disclosure, one of ordinary skill in the art would recognize that the presently disclosed PFPE-based microfluidic device can be used to synthesize biopolymers, as described in U.S. Pat. Nos. 6,408,878 to Unger et al. and 6,729,352 to O'Conner et al., and/or in a combinatorial synthesis system as described in U.S. Pat. No. 6,508,988 to van Dam et al., each of which is incorporated herein by reference in its entirety.

C. Method of Incorporating a PFPE-Based Microfluidic Device into an Integrated Fluid Flow System.

In some embodiments, the method of performing a chemical reaction or flowing a material within a PFPE-based microfluidic device includes incorporating the microfluidic device into an integrated fluid flow system. Referring now to FIG. 10, a system for carrying out a method of flowing a material in a microfluidic device and/or a method of performing a chemical reaction in accordance with the presently disclosed subject matter is schematically depicted. The system itself is generally referred to at 1000. System 1000 can include a central processing unit 1002, one or more driving force actuators 1010A, 1010B, 1010C, and 1010D, a collector 1020, and a detector 1030. In some embodiments, detector 1030 is in fluid communication with the microfluidic device (shown in shadow). System microfluidic device 1000 of FIG. 8, and these reference numerals of FIG. 8 are employed in FIG. 10. Central processing unit (CPU) 1002 can be, for example, a general purpose personal computer with a related monitor, keyboard or other desired user interface. Driving force actuators 1010A, 1010B, 1010C, and 1010D can be any suitable driving force actuator as would be apparent to one of ordinary skill in the art upon review of the presently disclosed subject matter. For example, driving force actuators 1010A, 1010B, 1010C, and 1010D can be pumps, electrodes, injectors, syringes, or other such devices that can be used to force a material through a microfluidic device. Representative driving forces themselves thus include capillary action, pump driven fluid flow, electrophoresis based fluid flow, pH gradient driven fluid flow, or other gradient driven fluid flow.

In the schematic of FIG. 10 driving force actuator 1010D is shown as connected at outlet aperture 810D, as will be described below, to demonstrate that at least a portion of the driving force can be provided at the end point of the desired flow of solution, reagent, and the like. Collector 1020 also is provided to show that a reaction product 1048, as discussed below, can be collected at the end point of system flow. In some embodiments, collector 1020 includes a fluid reservoir. In some embodiments, collector 1020 includes a substrate. In some embodiments, collector 1020 includes a detector. In some embodiments, collector 1020 includes a subject in need of therapeutic treatment. For convenience, system flow is generally represented in FIG. 10 by directional arrows F1, F2, and F3.

Continuing with reference to FIG. 10, in some embodiments a chemical reaction is performed in integrated flow system 1000. In some embodiments, material 1040, e.g., a chemical reagent, is introduced to microfluidic device 1000 through aperture 810A, while a second material 1042, e.g., a second chemical reagent, is introduced to microfluidic device 1000, via inlet aperture 810B. Optionally, microfluidics device 1000 includes a functionalized surface (see FIG. 5A). Driving force actuators 1010A and 1010B propel chemical reagents 1040 and 1042 to microfluidic channels 831 and 833, respectively. Flow of chemical reagents 1040 and 1042 continues to fluid reservoirs 850A and 850B, where a reserve of reagents 1040 and 1042 is collected. Flow of chemical reagents 1040 and 1042 continues into microfluidic channels 832 and 834 to intersection point 860A wherein initial contact between chemical reagents 1040 and 1042 occurs. Flow of chemical reagents 1040 and 1042 then continues to reaction chamber 870 where a chemical reaction between chemical reagents 1040 and 1042 proceeds.

Continuing with reference to FIG. 10, reaction product 1044 flows to microscale channel 836 and to intersection point 860B. Chemical reagent 1046 then reacts with reaction product 1044 beginning at intersection point 860B through reaction chamber 838 and to fluid reservoir 850C. A second reaction product 1048 is formed. Flow of the second reaction product 1048 continues through microscale channel 840 to aperture 810D and finally into collector 1020. Thus, it is noted that CPU 1002 actuates driving force actuator 1010C such that chemical reagent 1046 is released at an appropriate time to contact reaction product 1044 at intersection point 860B.

D. Representative Applications of a Microfluidic Device

In some embodiments, the presently disclosed subject matter discloses a method of screening a sample for a characteristic. In some embodiments, the presently disclosed subject matter discloses a method of dispensing a material. In some embodiments, the presently disclosed subject matter discloses a method of separating a material. Accordingly, one of ordinary skill in the art would recognize that a microfluidic device described herein can be applied to many applications, including, but not limited to, genome mapping, rapid separations, sensors, nanoscale reactions, ink jet printing, drug delivery, Lab-on-a-Chip, in vitro diagnostics, injection nozzles, biological studies, high-throughput screening technologies, such as for use in drug discovery and materials science, diagnostic and therapeutic tools, research tools, and the biochemical monitoring of food and natural resources, such as soil, water, and/or air samples collected with portable or stationary monitoring equipment. In some embodiments, the presently disclosed subject matter discloses screening a material through a microfluidic device. Some useful microfluidic devices suitable for ultraviolet detection are described in International Patent Publication Number WO 02/29397 A2, which is incorporated herein by reference in its entirety.

1. Method of Screening a Sample for a Characteristic

In some embodiments, the presently disclosed subject matter discloses a method of screening a sample for a characteristic. In some embodiments, the method includes:

(a) providing a microscale device comprising:
  (i) a perfluoropolyether (PFPE) material having a characteristic selected from the group consisting of: a viscosity greater than about 100 centistokes (cSt) and a viscosity less than about 100 cSt, provided that the liquid PFPE precursor material having a viscosity less than 100 cSt is not a free-radically photocurable PFPE material;
  (ii) a functionalized PFPE material;
  (iii) a fluoroolefin-based elastomer; and
  (iv) combinations thereof;
(b) providing a target material;
(c) disposing the sample in the microscale device;
(d) contacting the sample with the target material; and
(e) detecting an interaction between the sample and the target, wherein the presence or the absence of the interaction is indicative of the characteristic of the sample.

Referring once again to FIG. 10, at least one of materials 1040 and 1042 includes a sample. In some embodiments, at least one of materials 1040 and 1042 includes a target material. Thus, a "sample" generally refers to any material about which information relating to a characteristic is desired. Also, a "target material" can refer to any material that can be used to provide information relating to a characteristic of a sample based on an interaction between the target material and the sample. In some embodiments, for example, when sample 1040 contacts target material 1042 an interaction occurs. In some embodiments, the interaction produces a reaction product 1044. In some embodiments, the interaction includes a binding event. In some embodiments, the binding event includes the interaction between, for example, an antibody and an antigen, an enzyme and a substrate, or more particularly, a receptor and a ligand, or a catalyst and one or more chemical reagents. In some embodiments, the reaction product is detected by detector 1030.

In some embodiments, the method includes disposing the target material in at least one of the plurality of channels. Referring once again to FIG. 10, in some embodiments, the target material includes active material 880. In some embodiments, the target material, the sample, or both the target and the sample are bound to a functionalized surface. In some embodiments, the target material includes a substrate, for example a non-patterned layer. In some embodiments, the substrate includes a semiconductor material. In some embodiments, at least one of the plurality of channels of the microfluidic device is in fluid communication with the substrate, e.g., a non-patterned layer. In some embodiments, the target material is disposed on a substrate, e.g., a non-patterned layer. In some embodiments, at least one of the one or more channels of the microfluidic device is in fluid communication with the target material disposed on the substrate.

In some embodiments, the method includes disposing a plurality of samples in at least one of the plurality of channels. In some embodiments, the sample is selected from the group consisting of a therapeutic agent, a diagnostic agent, a research reagent, a catalyst, a metal ligand, a non-biological organic material, an inorganic material, a foodstuff, soil, water, and air. In some embodiments, the sample includes one or more members of one or more libraries of chemical or biological compounds or components. In some embodiments, the sample includes one or more of a nucleic acid template, a sequencing reagent, a primer, a primer extension product, a restriction enzyme, a PCR reagent, a PCR reaction product, or a combination thereof. In some embodiments, the sample includes one or more of an antibody, a cell receptor, an antigen, a receptor ligand, an enzyme, a substrate, an immunochemical, an immunoglobulin, a virus, a virus binding component, a protein, a cellular factor, a growth factor, an inhibitor, or a combination thereof.

In some embodiments, the target material includes one or more of an antigen, an antibody, an enzyme, a restriction enzyme, a dye, a fluorescent dye, a sequencing reagent, a PCR reagent, a primer, a receptor, a ligand, a chemical reagent, or a combination thereof.

In some embodiments, the interaction includes a binding event. In some embodiments, the detecting of the interaction is performed by at least one or more of a spectrophotometer, a fluorometer, a photodiode, a photomultiplier tube, a microscope, a scintillation counter, a camera, a CCD camera, film, an optical detection system, a temperature sensor, a conductivity meter, a potentiometer, an amperometric meter, a pH meter, or a combination thereof.

Accordingly, after a review of the present disclosure, one of ordinary skill in the art would recognize that the presently disclosed PFPE-based microfluidic device can be used in various screening techniques, such as those described in U.S. Pat. Nos. 6,749,814 to Bergh et al., 6,737,026 to Bergh et al., 6,630,353 to Parce et al., 6,620,625 to Wolk et al., 6,558,944 to Parce et al., 6,547,941 to Kopf-Sill et al., 6,529,835 to Wada et al., 6,495,369 to Kercso et al., and 6,150,180 to Parce et al., each of which is incorporated by reference in its entirety. Further, after a review of the present disclosure, one of ordinary skill in the art would recognize that the presently disclosed PFPE-based microfluidic device can be used, for example, to detect DNA, proteins, or other molecules associated with a particular biochemical system, as described in U.S. Pat. No. 6,767,706 to Quake et al., which is incorporated herein by reference in its entirety.

2. Method of Dispensing a Material

Additionally, the presently disclosed subject matter describes a method of dispensing a material. In some embodiments, the method includes:

(a) providing a microfluidic device comprising:
  (i) a perfluoropolyether (PFPE) material having a characteristic selected from the group consisting of: a viscosity greater than about 100 centistokes (cSt) and a viscosity less than about 100 cSt, provided that the liquid PFPE precursor material having a viscosity less than 100 cSt is not a free-radically photocurable PFPE material;
  (ii) a functionalized PFPE material;
  (iii) a fluoroolefin-based elastomer; and
  (iv) combinations thereof; and wherein the microfluidics device includes one or more microscale channels, and wherein at least one of the one or more microscale channels includes an outlet aperture;

(b) providing at least one material;
(c) disposing at least one material in at least one of the one or more microscale channels; and
(d) dispensing at least one material through the outlet aperture.

In some embodiments, the layer of PFPE material covers a surface of at least one of the one or more microscale channels.

Referring once again to FIG. 10, in some embodiments, a material, e.g., material 1040, second material 1042, chemical reagent 1046, reaction product 1044, and/or reaction product 1048 flow through outlet aperture 810D and are dispensed in or on collector 1020. In some embodiments, the target material, the sample, or both the target and the sample are bound to a functionalized surface.

In some embodiments, the material includes a drug. In some embodiments, the method includes metering a predetermined dosage of the drug. In some embodiments, the method includes dispensing the predetermined dosage of the drug.

In some embodiments, the material includes an ink composition. In some embodiments, the method includes dispensing the ink composition on a substrate. In some embodiments, the dispensing of the ink composition on a substrate forms a printed image.

Accordingly, after a review of the present disclosure, one of ordinary skill in the art would recognize that the presently disclosed PFPE-based microfluidic device can be used for microfluidic printing as described in U.S. Pat. Nos. 6,334,676 to Kaszczuk et al., 6,128,022 to DeBoer et al., and 6,091,433 to Wen, each of which is incorporated herein by reference in its entirety.

3. Method of Separating a Material

In some embodiments, the presently disclosed subject matter describes a method of separating a material, the method includes:
(a) providing a microfluidic device comprising:
(i) a perfluoropolyether (PFPE) material having a characteristic selected from the group consisting of: a viscosity greater than about 100 centistokes (cSt) and a viscosity less than about 100 cSt, provided that the liquid PFPE precursor material having a viscosity less than 100 cSt is not a free-radically photocurable PFPE material;
(ii) a functionalized PFPE material;
(iii) a fluoroolefin-based elastomer; and
(iv) combinations thereof; and wherein the microfluidics device includes one or more microscale channels, and wherein at least one of the one or more microscale channels includes a separation region;
(b) disposing a mixture comprising at least a first material and a second material in the microfluidic device;
(c) flowing the mixture through the separation region; and
(d) separating the first material from the second material in the separation region to form at least one separated material.

Referring once again to FIG. 10, in some embodiments, at least one of material 1040 and second material 1042 include a mixture. For example, material 1040, e.g., a mixture, flows through the microfluidic system to chamber 870, which in some embodiments includes a separation region. In some embodiments, the separation region includes active material 880, e.g., a chromatographic material. Material 1040, e.g., a mixture, is separated in chamber 870, e.g., a separation chamber, to form a third material 1044, e.g., a separated material. In some embodiments, separated material 1044 is detected by detector 1030.

In some embodiments, the separation region includes a chromatographic material. In some embodiments, the chromatographic material is selected from the group consisting of a size-separation matrix, an affinity-separation matrix, and a gel-exclusion matrix, or a combination thereof.

In some embodiments, the first or second material includes one or more members of one or more libraries of chemical or biological compounds or components. In some embodiments, the first or second material includes one or more of a nucleic acid template, a sequencing reagent, a primer, a primer extension product, a restriction enzyme, a PCR reagent, a PCR reaction product, or a combination thereof. In some embodiments, the first or second material includes one or more of an antibody, a cell receptor, an antigen, a receptor ligand, an enzyme, a substrate, an immunochemical, an immunoglobulin, a virus, a virus binding component, a protein, a cellular factor, a growth factor, an inhibitor, or a combination thereof.

In some embodiments, the method includes detecting the separated material. In some embodiments, the detecting of the separated material is performed by at least one or more of a spectrophotometer, a fluorometer, a photodiode, a photomultiplier tube, a microscope, a scintillation counter, a camera, a CCD camera, film, an optical detection system, a temperature sensor, a conductivity meter, a potentiometer, an amperometric meter, a pH meter, or a combination thereof.

Accordingly, after a review of the present disclosure, one of ordinary skill in the art would recognize that the presently disclosed PFPE-based microfluidic device can be used to separate materials, as described in U.S. Pat. Nos. 6,752,922 to Huang et al., 6,274,089 to Chow et al., and 6,444,461 to Knapp et al., each of which is incorporated herein by reference in its entirety.

XII. Applications for Functionalized Microfluidic Devices

Fluidic microchip technologies are increasingly being used as replacements for traditional chemical and biological laboratory functions. Microchips that perform complex chemical reactions, separations, and detection on a single device have been fabricated. These "lab-on-a-chip" applications facilitate fluid and analyte transport with the advantages of reduced time and chemical consumption and ease of automation.

A variety of biochemical analysis, reactions, and separations have been performed within microchannel systems. High throughput screening assays of synthesized molecules and natural products are of great interest. Microfluidic devices for screening a wide variety of molecules based on their ability to inhibit the interactions of enzymes and fluorescently labeled substrates have been described (U.S. Pat. No. 6,046,056, to Parse et al.). As described by Parse et al., such devices allow for screening natural or synthetic libraries of potential drugs through their antagonist or agonist properties. The types of molecules that can be screened include, but are not limited to, small organic or inorganic molecules, polysaccharides, peptides, proteins, nucleic acids or extracts of biological materials such as bacteria, fungi, yeast, plants and animal cells. The analyte compounds can be free in solution or attached to a solid support, such as agarose, cellulose, dextran, polystyrene, carboxymethyl cellulose, polyethylene glycol (PEG), filter paper, nitrocellulose, ion exchange resins, plastic films, glass beads, polyaminemethylvinylether maleic acid copolymer, amino acid copolymer, ethylene-maleic acid copolymer, nylon, silk, and the like. Compounds can be tested as pure compounds or in pools. For example, U.S. Pat. No. 6,007,690 to Nelson et al. relates to a microfluidic molecular diagnostic that purifies DNA from whole blood samples. The device uses an enrichment channel that cleans up or concentrates the analyte sample. For example, the enrichment channel could hold antibody coated beads to remove various cell parts via their antigenic components or could hold chromatographic components, such as ion exchange resin or a hydrophobic or hydrophilic membrane. The device also can include a reactor chamber, wherein various reactions can be performed on the analyte, such as a labeling reaction or in the case of a protein analyte, a digestion reaction. Further, U.S. Published Patent Application No. 20040256570 to Beebe et al. describes a device where antibody interaction with an antigenic analyte material coated on the outside of a liposome is detected when that interaction causes the lysis of the liposome and its release of a detectable molecule. U.S. Published Patent Application No. 20040132166 to Miller et al. provides a microfluidic device that can sense environmental factors, such as pH, humidity, and $O_2$ levels critical for the growth of cells. The reaction chambers in these devices can function as bioreactors capable of growing cells, allowing for their use to transfect cells with DNA and produce proteins, or to test for the possible bioavailability of drug substances by measuring their absorbance across CACO-2 cell layers.

In addition of growing cells, microfluidic devices also have been used to sort cells. U.S. Pat. No. 6,592,821 to Wada et al. describes hydrodynamic focusing to sort cells and subcellular components, including individual molecules, such as nucleic acids, polypeptides or other organic molecules, or larger cell components like organelles. The method can sort for cell viability or other cellular expression functions.

Amplification, separation, sequencing, and identification of nucleic acids and proteins are common microfluidic device applications. For example, U.S. Pat. No. 5,939,291 to Loewy et al. illustrate a microfluidic device that uses electrostatic techniques to perform isothermal nucleic acid amplification. The device can be used in conjunction with a number of common amplification reaction strategies, including PCR (polymerase chain reaction), LCR (ligase chain reaction), SDA (strand displacement amplification), NASBA (nucleic acid sequence-based amplification), and TMA (transcription-mediated amplification). U.S. Pat. No. 5,993,611 to Moroney et al. describes a device that uses capacitive charging to analyze, amplify or otherwise manipulate nucleic acids. Devices have been designed that sort DNA by size, analyzing restriction fragment length polymorphism (see U.S. Pat. No. 6,833,242 to Quake et al.). The devices also can have particular use in forensic applications, such as DNA fingerprinting. U.S. Pat. No. 6,447,724 to Jensen et al. describes microfluidics that identify components of a mixture based on the different fluorescent lifetimes of the labels attached to members of the mixture. Such a device could be used to analyze sequencing reactions of nucleic acids, proteins or oligosaccharides or to inspect or interrogate members of a combinatorial library of organic molecules.

Other microfluidic devices directed toward specific protein applications include a device that promotes protein crystal growth in microfluidic channels (see U.S. Pat. No. 6,409,832, to Weigl et al.). In the device, protein sample and solvent are directed to a channel with laminar flow characteristics that form diffusion zones, which provide well-defined crystallization. U.S. Published Patent Application No. 2004/0121449 to Pugia et al. illustrates a device that can separate red blood cells from plasma using minimal centrifugal force on sample sizes as small as 5 microliters. The device could be particularly useful in clinical diagnostics and also could be used to separate any particulate matter from a liquid.

As partly described hereinabove, microfluidic devices have been utilized as microreactors for a variety of chemical and biological applications. Chambers in these devices can be used for sequencing, restriction enzyme digests, restriction fragment length polymorphism (RFLP) analysis, nucleic acid amplification, or gel electrophoresis (see U.S. Pat. No. 6,130,098, to Handique et al.). A multitude of chemical titration reactions can be run in the devices (see U.S. Published Patent Application No. 20040258571, to Lee et al.), including acid-based titrations or titrations based on precipitation (for example, Ag(I) with $Cl^-$, $Br^-$, $I^-$, or $SCN$), complex formation (for example, Ag(I) with $CN^-$), or redox reactions (such as Fe(II)/Fe(III) with Ce(III)/Ce(IV)). Further, a sensor for potentiometry, amperometry, spectrophotometry, turbidometry, fluorimetry or calorimetry can be attached to the device. Fractionation of proteins (see U.S. Published Patent Application No. 20040245102, to Gilbert et al.) based physical or biological properties is of use in protein expression analysis (finding molecular markers, determining a molecular basis or profile for a disease state or interpreting protein structure/function relationships). A variety of electrophoresis techniques (including capillary isoelectric focusing, capillary zone electrophoresis, and capillary gel electrophoresis) have been employed in microfluidic devices for fractionating proteins (see U.S. Pat. No. 6,818,112, to Schneider et al.). The different electrophoretic techniques can be used in series, with or without a labeling step to help with quantitation, and in conjunction with a variety of elution techniques (such as hydrodynamic salt mobilization, pH mobilization, or electroosmotic flow) to further separate proteins. A variety of other materials have been used to aid in separation processes in microfluidic devices. Such materials can be attached to channel walls in a device or be present as a separate matrix inside a channel (see U.S. Pat. No. 6,581,441 to Paul; U.S. Pat. No. 6,613,581, to Wada et al.). Parallel separation channels can exist to separate many samples at the same time. The solid separation media can be present as a discrete particle or as a porous monolithic solid. Possible materials include silica gel, agarose-based gels, polyacrylamide gels, a colloidal solution, such as a gelatin, starches, non-ionic macroreticular and macroporous resins (such as AMBERCHROM™ (Rohm and Haas Co, Philadelphia, Pa., United States of America), AMBERLITE™ (Rohm and Haas Co, Philadelphia, Pa., United States of America), DOWEX™ (The Dow Chemical Company, Midland, Mich., United States of America), DUO-LITE® (Rohm and Haas Co, Philadelphia, Pa., United States of America), and the like), or material present as beads (glass, metal, silica, acrylic, SEPHAROSE™, cellulose, ceramic, polymer, and the like). These materials also can have present on their surfaces various biologically based molecules to aid in separation (for example, lectins bind to carbohydrates and antibodies can bind to antigenic groups on different proteins). Membranes within microchannels have been used for electroosmotic separation (see U.S. Pat. No. 6,406,605, to Moles). Suitable membranes can include materials, such as track etched polycarbonate or polyimide.

Temperature, concentration and flow gradients also have been employed to aid in separation in microfluidic devices. U.S. Published Patent Application No. 20040142411 to Kirk et al. discloses the use of chemotaxis (the movement of cells induced by a concentration gradient of a soluble chemotactic stimulus), hapatotaxis (the movement of cells in response to a concentration gradient of a substrate-bound stimulus) and chemoinvasion (the movement of cells into and/or through a barrier or gel matrix in response to a stimulus). Chemotatic stimuli include chemorepellants and chemoattractants. A chemoattractant is any substance that attracts cells. Examples include, but are not limited to, hormones such as epinephrine and vasopressin; immunological agents such as interleukein-2; growth factors, chemokines, cytokines, and various peptides, small molecules and cells. Chemorepellants include irritants such as benzalkonium chloride, propylene glycol, methanol, acetone, sodium dodecyl sulfate, hydrogen peroxide, 1-butanol, ethanol and dimethylsulfoxide; toxins, such as cyanide, carbonylcyanide chlorophenylhydrozone; endotoxins and bacterial lipopolysaccharides; viruses; pathogens; and pyrogens. Non-limiting examples of cells that can be manipulated by these techniques include lymphocytes, monocytes, leukocytes, macrophages, mast cells, T-cells, B-cells, neutrophils, basophils, fibroblasts, tumor cells and many others.

Microfluidic devices as sensors have garnered attention in the last few years. Such microfluidic sensors can include dye-based detection systems, affinity-based detections systems, microfabricated gravimetric analyzers, CCD cameras, optical detectors, optical microscopy systems, electrical systems, thermocouples, thermoresistors, and pressure sensors. Such devices have been used to detect biomolecules (see Published PCT International Application No. WO 2004/094,986 to Althaus et al.), including polynucleotides, proteins and viruses through their interaction with probe molecules capable of providing an electrochemical signal. For example, intercalation of a nucleic acid sample with a probe molecule, such as doxorubicin can reduce the amount of free doxorubicin in contact with an electrode; and a change in electrical signal results. Devices have been described that contain sensors for detecting and controlling environmental factors inside device reaction chambers such as humidity, pH, dissolved $O_2$ and dissolved $CO_2$ (see Published PCT International Application No. WO 2004/069,983 to Rodgers et al.). Such devices have particular use in growing and maintaining cells. The carbon content of samples can be measured in a device (see U.S. Pat. No. 6,444,474 to Thomas et al.) wherein UV irradiation oxidizes organics to $CO_2$, which is then quantitated by conductivity measurements or infrared methods. Capacitance sensors used in microfluidic devices (see Published PCT International Application No. WO 2004/085,063 to Xie et al.) can be used to measure pressure, flow, fluid levels, and ion concentrations.

Another application for microfluidic systems includes the high throughput injection of cells (see Published PCT International Application No. WO 00/20554 to Garman et al.) In such a device, cells are impelled to a needle where they can be injected with a wide variety of materials including molecules and macromolecules, genes, chromosomes, or organelles. The device also can be used to extract material from cells and would be of use in a variety of fields, such as gene therapy, pharmaceutical or agrochemical research, and diagnostics. Microfluidic devices also have been used as a means of delivering ink in ink jet printing (see U.S. Pat. No. 6,575,562 to Anderson et al.), and to direct sample solutions onto an electrospray ionization tip for mass spectrometry (see U.S. Pat. No. 6,803,568 to Bousse et al.). Systems for transdermal drug delivery also have been reported (see Published PCT International Application No. WO 2002/094,368 to Cormier et al.), as well as devices containing light altering elements for use in spectroscopy applications (see U.S. Pat. No. 6,498,353 to Nagle et al.).

XIII. Applications for Functionalized Microtiter Plates

The presently disclosed materials and methods also can be applied to the design and manufacture of devices to be used in the manner of microtiter plates. Microtiter plates have a variety of uses in the fields of high throughput screening for proteomics, genomics and drug discovery, environmental chemistry assays, parallel synthesis, cell culture, molecular biology and immunoassays. Common base materials used for microtiter plates include hydrophobic materials, such as polystyrene and polypropylene, and hydrophilic materials, such as glass. Silicon, metal, polyester, polyolefin and polytetrafluoroethylene surfaces also have been used for microtiter plates.

Surfaces can be selected for a particular application based on their solvent and temperature compatibilities and for their ability (or lack of ability) to interact with the molecules or biomolecules being assayed or otherwise manipulated. Chemical modification of the base material is often useful in tailoring the microtiter plate to its desired function either by modifying the surface characteristics or by providing a site for the covalent attachment of a molecule or biomolecule. The functionalizable nature of the presently disclosed materials is well suited for these purposes.

Some applications call for surfaces with low binding characteristics. Proteins and many other biomolecules (such as eukaryotic and microbial cells) can passively adsorb to polystyrene through hydrophobic or ionic interactions. Some surface-modified base materials have been developed to address this problem. CORNING® Ultra Low Attachment (Corning Incorporated-Life Sciences, Acton, Mass., United States of America) is a hydrogel-coated polystyrene. The hydrogel coating renders the surface neutral and hydrophilic, preventing the attachment of almost all cells. Vessels made from the surface have uses in preventing serum protein absorption, in preventing anchorage-dependent cells (MDCK, VERO, C6, and the like) from dividing, in selectively culturing tumor or virally transformed cells as unattached colonies, in preventing stem cells from attachment-mediated differentiation, and in studying the activation and inactivation mechanisms of macrophages. NUNC MINISORP™ (Nalgene Nunc International, Naperville, Ill., United States of America) is polyethylene-based product with low protein affinity and has uses for DNA probe and serum-based assays where non-specific binding is a problem.

For other applications base, materials have been modified to enhance their ability to adhere to cells and other biomolecules. NUNCLON Δ™ (Nalgene Nunc International) is a polystyrene surface treated by corona or plasma discharge to add surface carboxyl groups, rendering the material hydrophilic and negatively charged. The material has been used in the cell culture of a variety of cells. Polyolefin and polyester materials also have been treated to enhance their hydrophilicity and thereby become good surfaces for the adhesion and growth of cells (for example PERMANOX™ and THERMANOX™, also from Nalgene Nunc International). Base materials can be coated with poly-D-lysine, collagen or fibronectin to create a positively charged surface, which also can enhance cell attachment, growth and differentiation.

Further, other molecules can be absorbed to a microtiter-like plate. Nunc MAXISORP™ (Nalgene Nunc) is a modified polystyrene base that has a high affinity for polar molecules and is recommended for surfaces where antibodies need to be absorbed to the surface, as in the case of many ELISA assays. Surfaces also can be modified to interact with analytes in a more specific manner. Examples of such functional modifications include nickel-chelate modified surfaces for the quantification and detection of histidine-tagged fusion proteins and glutathione-modified surfaces for the capture of GST-tagged fusion proteins. Streptavidin-coated surfaces can be used when working with biotinylated proteins.

Some modified surfaces provide sites for the covalent attachment of various molecules or biomolecules. COVALINK™ NH Secondary Amine surface (Nalgene Nunc International) is a polystyrene surface covered with secondary amines which can bind proteins and peptides through their carboxyl groups via carbodimide chemistry or bind DNA through the formation of a 5' phosphoramidiate bond (again using carbodimide chemistry). Other molecules, carbohydrates, hormones, small molecules and the like, containing or modified to contain carboxylate groups also can be bound to the surface. Epoxide is another useful moiety for covalently linking groups to surfaces. Epoxide modified surfaces have been used to create DNA chips via the reaction of amino-modified oligonucleotides with surfaces. Surfaces with immobilized oligonucleotides can be of use in high throughput DNA and RNA detection systems and in automated DNA amplification applications.

Other uses for microtiter plates are directed toward modifying the surface to make it more hydrophobic, rendering it more compatible with organic solvents or to reduce the absorption of drugs, usually small organic molecules. For example, Total Drug Analysis assays generally rely on using acetonitrile to precipitate proteins and salts from a plasma or serum sample. The drug being assayed must remain in solution for subsequent quantification. Organic solvent-compatible microtiter plates also have uses as high performance liquid chromatography (HPLC) or liquid chromatography/mass spectrometry/mass spectrometry (LC/MS/MS) prep devices and as combinatorial chemistry or parallel synthesis reaction vessels (either for solution-based or solid phase chemistries). Examples of surfaces for these types of uses include MULTICHEM™ microplates (Whatman, Inc., Florham Park, N.J., United States of America) and MULTI-SCREEN® Solvinert (Millipore, Billerica, Mass., United States of America).

XIV. Method for Using a Functionalized Perfluoropolyether Network as a Gas Separation Membrane The presently disclosed subject matter provides for the use of a functionalized perfluoropolyether (PFPE) network as a gas separation membrane. In some embodiments, the functionalized PFPE network is used as a gas separation membrane to separate gases selected from the group consisting of $CO_2$, methane, hydrogen, CO, CFCs, CFC alternatives, organics, nitrogen, methane, $H_2S$, amines, fluorocarbons, fluoroolefins, and $O_2$. In some embodiments, the functionalized PFPE network is used to separate gases in a water purification process. In some embodiments, the gas separation membrane includes a stand-alone film. In some embodiments, the gas separation membrane includes a composite film.

In some embodiments, the gas separation membrane includes a co-monomer. In some embodiments, the co-monomer regulates the permeability properties of the gas separation membrane. Further, the mechanical strength and durability of such membranes can be finely tuned by adding composite fillers, such as silica particles and others, to the membrane. Accordingly, in some embodiments, the membrane further includes a composite filler. In some embodiments, the composite filler includes silica particles.

XV. Applications of Solvent Resistant Low Surface Energy Materials

According to alternative embodiments, the presently disclosed materials and methods can be combined with and/or substituted for, one or more of the following materials and applications.

According to one embodiment, the materials and methods of the present invention can be substituted for the silicone component in adhesive materials. In another embodiment, the materials and methods of the present invention can be combined with adhesive materials to provide stronger binding and alternative adhesion formats. An example of a material to which the present invention can be applied includes adhesives, such as a two part flowable adhesive that rapidly cures when heated to form a flexible and high tear elastomer. Adhesives such as this are suitable for bonding silicone coated fabrics to each other and to various substrates. An example of such an adhesive is, DOW CORNING® Q5-8401 ADHESIVE KIT (Dow Corning Corp., Midland, Mich., United States of America).

According to another embodiment, the materials and methods of the present invention can be substituted for the silicone component in color masterbatches. In another embodiment, the materials and methods of the present invention can be combined with the components of color masterbatches to provide stronger binding and alternative binding formats. Examples of a color masterbatch suitable for use with the present invention include, but are not limited to, a range of pigment masterbatches designed for use with liquid silicone rubbers (LSR's), for example, SILASTIC® LPX RED IRON OXIDE 5 (Dow Corning Corp., Midland, Mich., United States of America).

According to yet another embodiment, the materials and methods of the present invention can be substituted for liquid silicone rubber materials. In another embodiment, the materials and methods of the present invention can be combined with liquid silicone rubber materials to provide stronger binding and alternative binding techniques of the present invention to the liquid silicone rubber material. Examples of liquid silicone rubber suitable for use or substitution with the present invention include, but are not limited to, liquid silicone rubber coatings, such as a two part solventless liquid silicone rubber that is both hard and heat stable. Similar liquid silicone rubber coatings show particularly good adhesion to polyamide as well as glass and have a flexible low friction and non-blocking surface, such products are represented by, for example, DOW CORNING® 3625 A&B KIT. Other such liquid silicone rubber includes, for example, DOW CORNING® 3629 PART A; DOW CORNING® 3631 PART A&B (a two part, solvent free, heat-cured liquid silicone rubber); DOW CORNING® 3715 BASE (a two part solventless silicone top coat that cures to a very hard and very low friction surface that is anti-soiling and dirt repellent); DOW CORNING® 3730 A&B KIT (a two part solventless and colorless liquid silicone rubber with particularly good adhesion to polyamide as well as glass fabric); SILASTIC® 590 LSR PART A&B (a two part solventless liquid silicone rubber that has good thermal stability); SILASTIC® 9252/250P KIT PARTS A & B (a two part, solvent-free, heat cured liquid silicone rubber; general purpose coating material for glass and polyamide fabrics; three grades are commonly available including halogen free, low smoke toxicity, and food grade); SILASTIC® 9252/500P KIT PARTS A&B; SILASTIC® 9252/900P KIT PARTS A&B; SILASTIC® 9280/30 KIT PARTS A & B; SILASTIC® 9280/60E KIT PARTS A & B; SILASTIC® 9280/70E KIT PARTS A & B; SILASTIC® 9280/75E KIT PARTS A & B; SILASTIC® LSR 9151-200P PART A; SILASTIC® LSR 9451-1000P; RTV Elastomers (Dow Corning Corp., Midland, Mich., United States of America); DOW CORNING® 734 FLOWABLE SEALANT, CLEAR (a one part solventless silicone elastomer for general sealing and bonding applications, this silicone elastomer is a flowable liquid that is easy to use and cures on exposure to moisture in the air); DOW CORNING® Q3-3445 RED FLOWABLE ELASTOMER; (a red, flowable one part solventless silicone elastomer for high temperature release coatings, typically this product is used to coat fabric, release foodstuffs, and is stable up to 260° C.); and DOW CORNING® Q3-3559 SEMIFLOWABLE TEXTILE ELASTOMER (a semi-flowable one part solventless silicone elastomer).

According to yet another embodiment, the materials and methods of the present invention can be substituted for water based precured silicone elastomers. In another embodiment, the materials and methods of the present invention can be combined with water based silicone elastomers to provide the improved physical and chemical properties described herein to the materials. Examples of water based silicone elastomers suitable for use or substitution with the present invention include, but are not limited to, water based auxiliaries to which the present invention typically applies include DOW CORNING® 84 ADDITIVE (a water based precured silicone elastomer); DOW CORNING® 85 ADDITIVE (a water based precured silicone elastomer); DOW CORNING® ET-4327 EMULSION (methyl/phenyl functional silicone emulsion providing fiber lubrication, abrasion resistance, water repellency and flexibility to glass fabric, typically used as a glassfiber pre-treatment for PTFE coatings); and Dow Corning 7-9120 Dimethicone NF Fluid (a new grade of polydimethylsiloxane fluid introduced by Dow Corning for use in over-the-counter (OTC) topical and skin care products).

According to yet another embodiment, the materials and methods of the present invention can be substituted for other silicone based materials. In another embodiment, the materials and methods of the present invention can be combined with such other silicone based materials to impart improved physical and chemical properties to these other silicone based materials. Examples of other silicone based materials suitable for use or substitution with the present invention include, but are not limited to, for example, United Chemical Technologies RTV silicone (United Chemical Technologies, Inc., Bristol, Pa., United States of America) (flexible transparent elastomer suited for electrical/electronic potting and encapsulation); Sodium Methyl siliconate (this product renders siliceous surfaces water repellent and increases green strength and green storage life); Silicone Emulsion (useful as a non-toxic sprayable releasing agent and dries to clear silicone film); PDMS/a-Methylstyrene (useful where temporary silicone coating must be dissolved off substrate); GLASSCLAD® 6C (United Chemical Technologies, Inc., Bristol, Pa., United States of America) (a hydrophobic coating with glassware for fiberoptics, clinical analysis, electronics); GLASSCLAD® 18 (a hydrophobic coating for labware, porcelain ware, optical fibers, clinical analysis, and light bulbs); GLASSCLAD® HT (a protective hard thin film coating with >350° C. stability); GLASSCLAD® PSA (a high purity pressure sensitive adhesive which forms strong temporary bonds to glass, insulation components, metals and polymers); GLASSCLAD® SO (a protective hard coating for deposition of silicon dioxide on silicon); GLASSCLAD® EG (a flexible thermally stable resin, gives oxidative and mechanical barrier for resistors and circuit boards); GLASSCLAD® RC (methylsilicone with >250° C. stability, commonly used as coatings for electrical and circuit board components); GLASSCLAD® CR (silicone paint formulation curing to a flexible film, serviceable to 290° C.); GLASSCLAD® TF (a source of thick film (0.2-0.4 micron) coatings of silicon dioxide, converts to 36% silicon dioxide and is typically used for dielectric layers, abrasion resistant coatings, and translucent films); GLASSCLAD® FF (a moisture activated soft elastomer for biomedical equipment and optical devices); and UV SILICONE (UV curable silicone with refractive index (R.I.) matched to silica, cures in thin sections with conventional UV sources).

According to still further embodiments of the present invention, the materials and methods of the present invention can be substituted for and/or combined with further silicone containing materials. Some examples of further silicone containing materials include, but are not limited to, TUFSIL® (Specialty Silicone Products, Inc., Ballston Spa, N.Y., United States of America) (developed by Specialty Silicones primarily for the manufacture of components of respiratory masks, tubing, and other parts that come in contact with skin, or are used in health care and food processing industries); Baysilone Paint Additive TP 3738 (LANXESS Corp., Pittsburgh, Pa., United States of America) (a slip additive that is resistant to hydrolysis); Baysilone Paint Additive TP 3739 (compositions that reduce surface tension and improve substrate wetting, three acrylic thickeners for anionic, cationic, nonionic and amphoteric solutions, such as APK, APN and APA which are powdered polymethacrylates, and a liquid acrylic thickener); Tego Protect 5000 (Tego Chemie Service GmbH, Essen, Germany) (a modified polydimethylsiloxane resin typically for matte finishes, clear finishes and pigmented paint systems); Tego Protect 5001 (a silicone polyacrylate resin that contains a water repellent, typically used with clear varnish systems); Tego Protect 5002 (a silicone polyacrylate resin that can be repainted after mild surface preparation); Microsponge 5700 Dimethicone (a system based on the Microsponge dimethicone entrapment technology which is useful in the production of emulsion, powder, and stick products for facial treatments, foundations, lipsticks, moisturizers, and sun care products, dimethicone typically is packed into the empty spaces in a complex crosslinked matrix of polymethacrylate copolymer); 350 cST polydimethylsiloxane makes up 78% of the entrapped dimethicone component and 1000 cST polydimethylsiloxane constitutes the other 22%, the system typically facilitates the delivery of dimethicone's protective action to the skin); MB50 high molecular weight polydimethylsiloxane additive series (enables better processing with reduced surface friction and faster operating speeds, commonly available in formulations for PE, PS, PP, thermoplastic polyester elastomer, nylon 6 and 66, acetal and ABS, the silicone component is odorless and colorless and can be used for applications involving food contact, the product can be used as a substitute for silicone fluid and PTFE); Slytherm XLT (a new polydimethylsiloxane low temperature heat transfer fluid from Dow Corning, unlike traditional organic transfer fluids, it is non-toxic, odorless and does not react with other materials in the system, at high temperatures it has the additional advantage of being non-fouling and non-sludge forming); and 561® silicone transformer fluid (this material has a flash point of 300° C. and a fire point of 343° C., the single-component fluid is 100% PDMS, contains no additives, is naturally degradable in soils and sediments, and does not cause oxygen depletion in water).

XVI. Applications to Devices

The dual curable component materials of the present invention can be used in various medical applications including, but not limited to, medical device or medical implants. According to an embodiment, material including one or more blended photo curing and/or one or more thermal curing components can be used to fabricate medical devices, device components, portions of devices, surgical devices, tools, implantable components, and the like. The blended material refers to the mixing of photocurable and/or thermally curable constituents within the polymer that is to form the device. The use of such a system allows for the formation of discrete objects by activating the first curing system and then, in some embodiments, adhering such discrete objects to other objects, surfaces, or materials by activating the second curing system. In some embodiments, the dual cure materials can be used to make a medical device or implant outside the body through a first cure of the material, then the second cure can be utilized to adhered the device to tissue after implantation into the body. In other embodiments, the dual cure materials can be used to make medical devices or implants in stages and then the components can be cured together to form an implant. The medical devices or implants made with the dual cure materials of the present invention can be, but are not limited to, orthopedic devices, cardiovascular devices, intraluminal devices, dermatological devices, oral devices, optical devices, auditory devices, tissue devices, organ devices, neurological devices, vascular devices, reproductive devices, combinations thereof, and the like. Other devices and components that can be coated with the materials and methods disclosed herein include: tubes, piping; vials, glassware, storage containers, transfer containers, valves, pipettes; nozzles; labware, goggles, glasses, gloves, sinks, tanks (such as fuel tanks), cylinders, ceramic devices, metal devices, polymer devices, glass, combinations thereof, and the like. The materials can be used as coating or linings for such devices to prevent fouling, prevent contamination, prevent reactions between the container and a substance in the container, ease of cleaning, combinations thereof, and the like. In some embodiments, the materials of the present invention adhere to these devices and materials through hydroxy groups on the surface of the devices and form strong interactions which maintain the coating and linings in position.

A. Forming Devices or Implants and Attaching Same to Another Device or Implant

According to some embodiments, an object, such as a component of a medical device or an implant, or the entire device can be fabricated by forming a liquid precursor in a mold, activating a curing mechanism, such as photo curing or thermal curing to solidify or partially solidify the precursor, and removing the solid object from the mold. The object can then be placed in contact with another component of a medical device or implant, a surface, a coating, or the like and a second curing mechanism is activated, such as thermal curing or photo curing, to adhere the two objects together. For example, the object can be, but is not limited to, an artificial joint component, an artificial bone component, an artificial tooth or tooth component, an artificial articular surface, an artificial lens, and the like.

Figure 13:
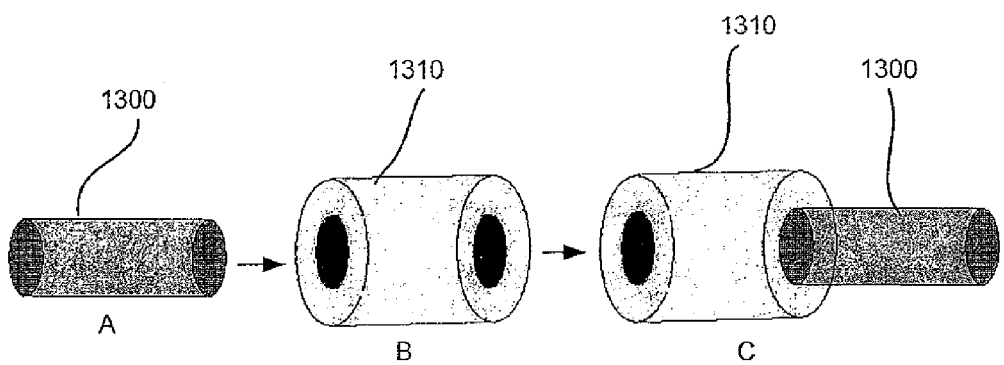
FIG. 13 shows fabrication of a device from materials and methods of an embodiment of the present invention.

An example of this procedure is shown in FIG. 13, steps A-C, for example. According to FIG. 13, liquid fluoropolymer (e.g., PFPE) material can be introduced into a mold and upon activating a first curing mechanism (e.g., thermal curing) the PFPE material is solidified to form a tube 1300. Tube 1300 can then be inserted into a second tube 1310, formed from the same or a different material, such as for example a different polymer or a natural material or structure such as tissue or a blood vessel. Next, a second curing mechanism (e.g., photo curing) is activated to adhere the PFPE tube 1300 to the second tube 1310.

According to some embodiments directed to orthopedic applications, the dual curable materials of the present invention facilitate rebuilding and/or building new devices and structures for placement within a living body. Further embodiments include rebuilding and repairing existing biologic or artificial devices, tissues, and structures in situ. For example, dual curable materials may be utilized in building new joints and in repairing existing joints in vitro or in situ.

According to some embodiments, a damaged biologic component can be a damaged tissue such as skeletal tissue (e.g., spinal components such as discs and vertebral bodies, and other skeletal bones). In some embodiments, the dual cure materials of the present invention can be used in situ to augment the damaged biologic components. According to such embodiments, the method includes surgically inserting a mold structure into the damaged site or preparing the surgical site to act as a receiving mold for liquid dual cure material. The mold structure is configured to receive liquid dual curable material and is geometrically configured similar to the damaged biologic component to be replaced or configured to yield a desired result. Next, liquid dual cure material is introduced into the mold and first cured. The first cure can be, for example, treatment with light or heat. In some embodiments, the first cure can be an incomplete cure such that the replacement structure is left compliant. The compliant nature of the replacement structure can facilitate removal of the mold structure from the site of damage or positioning of the replacement component in the desired surgical/implant site. After removal of the mold structure, the first cured replacement structure can be treated with a second cure to further cure the replacement structure to satisfy desired mechanical properties for the particular application.

In other embodiments, the replacement component can be built up, either in vitro or in situ. According to these embodiments, an opening to a surgical site may be made smaller than an implant required by the site because the implant can be built up a portion at a time (e.g., replacing a hip joint through an arthroscopic type procedure). In such embodiments, dual cure liquid material, as described herein, can be introduced into a mold or a surgical site and treated with a first cure. The first cure activates the liquid material to form a first portion of the replacement component such that the component can retain a desired shape. The first portion can be configured to harden upon the first curing or remain compliant. Next, in some embodiments, a second quantity of liquid material can be introduced to form a second portion of the replacement component. The material of the second portion is treated with a first cure treatment. The first cure treatment used to treat the second portion of the component can be the same technique used on the first portion such that each component retains a viable second cure component. Therefore, because each portion of the device retains a viable second cure component, after the first cured portions of the device are compiled to form the completed device, the portions can be treated with a second curing. Upon second curing, the second cure component of the layered portions of the device will be activated and the layered portion will bind together forming one integral device. Multiple portions of the replacement component can be formed, as described herein, as needed to make a replacement device. According to some embodiments, each portion can have different functional and/or mechanical properties to impart a desired mechanical and/or chemical result on the completed replacement component.

According to other embodiments, a portion such as an articular surface of a joint can be formed with the dual cure material of the present invention and attached to a natural joint in situ. According to such embodiments, an artificial articular surface can be fabricated from a first cure (e.g., thermal cure) of the dual cure material of the present invention. The artificial articular surface can then be implanted onto a preexisting joint surface and treated with a second cure (e.g., photo cure) such that the artificial articular surface binds to the preexisting joint surface.

B. Forming Devices or Implants and Attaching Same to Tissue

According to other embodiments, dual cure materials of the present invention can be used to replace or augment natural biologic tissue or structures and can be adhered directly to the tissue.

Figure 14:
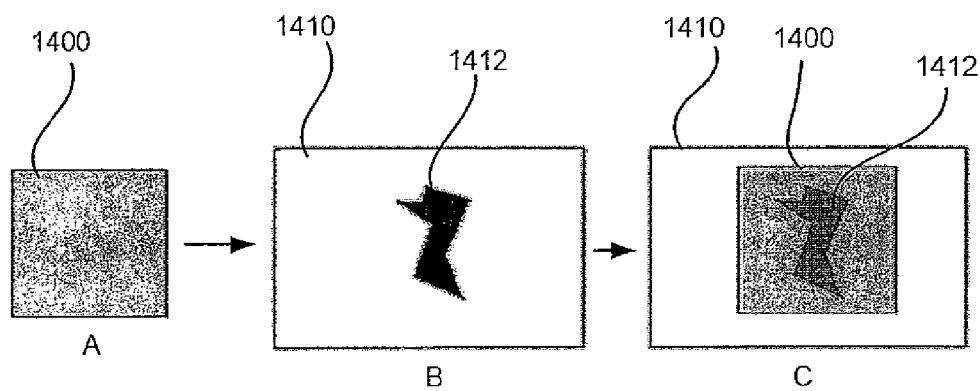
FIG. 14 shows a system for patching a disrupted component using materials and methods of an embodiment of the present invention.

According to some embodiments, dual cure materials described herein may be incorporated into various types of repairs or patches, as shown in FIG. 14. In one embodiment, such a patch can be utilized in lung surgical procedures.

Patches include, for example, but are not limited to sheets of dual cure material configured to be attached and secured directly to living tissue through activation of the second curing mechanism of the dual cure materials.

According to some embodiments, a disrupted or damaged material, device, or surface can be repaired (e.g., patched) with material of the present invention. As shown in FIG. 14, steps A-C, a patch can be made by molding dual cure material into a desired shape and activating a first cure (e.g., thermal cure) to form patch 1400. Next, patch 1400 is placed over a device or tissue 1410 that is affected with a disruption or damage (e.g., a crack, hole, surgically altered tissue) 1412. After placement of patch 1400 over disruption 1412, a second curing mechanism is activated (e.g., photo curing) to adhere the patch to the surface of device 1410. The strength of the patch is dependent upon multiple variables, such as, for example, the size of binding area between patch 1400 and tissue 1410, the extent of curing administered to the patch/tissue combination, the chemicals, quantities, concentrations, and the like used in the second curing process, the composition of patch 1400, the composition of tissue or device 1410, combinations thereof, and the like. According to alternative embodiments, patch 1400 can undergo a second cure (e.g., thermal or photo curing) to attach patch 1400 to a compound, material, or substance that is known to bind to tissue. For example, patch 1400 can be treated with or adhered to a fribrin sealant component or glue, which is well known and used extensively in various clinical settings for adhering tissues together. In other embodiment, the patch can be second cure attached to a biocompatible material and the biocompatible material is then stitched to the tissue, thereby implanting the patch.

In yet other embodiments, the materials of the present invention can be used to fabricate a mold and replicate another object. In some embodiments the object to be molded and replicated can be a medical device or a tissue, such as a joint component, organ, organ scaffold, joint, skeletal component, dental component, ocular component, vascular component, and the like.

Figure 15:
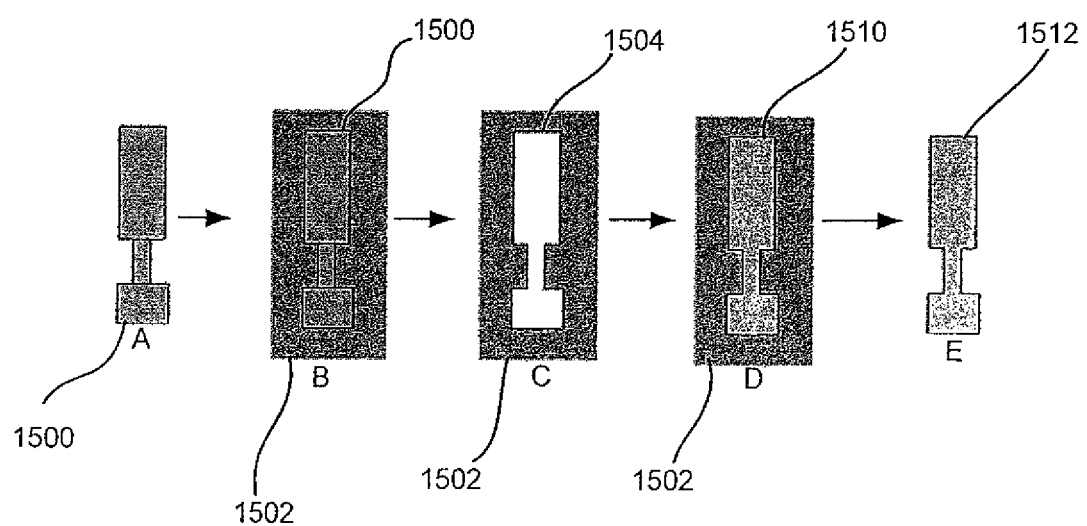
FIG. 15 shows molding and reconstruction of a molded object according to an embodiment of the present invention.

According to such embodiments, as shown in FIG. 15, steps A-E, a mold is fabricated by taking an object such as a bone 1500 and encapsulating the object in a curable matrix 1502 such as liquid PDMS precursors. Next, the curable matrix 1502 is cured. The bone 1500 is then removed, leaving a mold 1504 in a shape that corresponds to the molded object 1500. In some embodiments, the cured mold can be reversibly swelled to assist in removal of the object. Next, mold 1502 can be filled with dual cure materials of the present invention, such as for example, dual cure liquid PFPE precursors 1510. The dual cure material 1510 is then subjected to a first cure (e.g., thermal curing) to form a replicate object 1512 in the shape of bone 1500. Next, the replicate object 1512 can be implanted into the body as a replacement component. During implantation replicate object 1512 can be adhered to natural tissues, such as articular cartilage, portions of remaining natural bone, ligaments, tendons, other artificial joint components, and the like, by positioning the tissues with respect to replicate object 1512 and subjecting the combination to a second cure (e.g., photo curing).

According to other embodiments, dual cure materials of the present invention can be used in various cardiovascular applications and in other intraluminal applications. In some of these embodiments, the materials can be used to fabricate and/or augment body lumens, and to form artificial lumens (e.g., artificial blood vessels). The dual cure materials of the present invention can be molded, as shown in FIG. 15, to form replacement blood vessels for replacing damaged and/or occluded vessels within a body. Not only can the materials disclosed herein serve as conduits for blood flow, but they also can allow for diffusion of oxygen and nutrients through the vessel wall into surrounding tissues thus functioning much like a normal healthy blood vessel.

According to embodiments of the present invention, a method of replacing, in situ, a portion of a blood vessel includes injecting an oxygen permeable, bacterial impermeable dual cure liquid PFPE material into a lumen of a portion of a blood vessel such that the dual cure liquid PFPE coats the luminal surface of the blood vessel. The dual cure liquid PFPE is then subjected to a first cure technique to form an artificial blood vessel within the natural blood vessel. The biologic blood vessel can then be removed from the first cured PFPE material and the material can be subjected to a second cure or can be treated with another layer of dual curable liquid PFPE and the combination can be subjected to a second cure. Also, the second cure can be applied when the artificial blood vessel is positioned within the subject and activated to bind the material to the natural blood vessel. A working replacement for the blood vessel portion is thereby produced.

Embodiments of the present invention are particularly advantageous regarding repair and/or replacement of blood vessels. Given their high oxygen carrying ability and permeability, artificial vessels formed from PFPE materials have highly functional properties with synthetic vasavasorum characteristics. PFPE materials allow diffusion of oxygen through the walls and into surrounding dependent tissues, allow diffusion of sustaining nutrients, and diffusion of metabolites. PFPE materials substantially mimic vessels mechanically as they are flexible and compliant. Moreover, embodiments of the present invention are particularly suitable for use in heart by-pass surgery and as artificial arterio-venous shunts. PFPE materials can also be used to repair natural or synthetic arterio-venous shunts by coating the inside surface of the damaged or worn vessel and curing as described herein. According to other embodiments, intraluminal prostheses can be employed in sites of a body such as, but not limited to, biliary tree, esophagus, bowel, tracheo-bronchial tree, urinary tract, and the like.

In another embodiment, the dual cure materials of the present invention can be used to fabricate stents for repairing vascular tissue. In some embodiments the dual cure liquid material can be locally implanted and cured during a balloon angioplasty procedure, or the like, and subjected to a curing or a second curing after being locally positioned. In such embodiments, the dual cure liquid material can be first cured to form a manipulable sheet or tube of material. The manipulability of the sheet facilitates implantation of the stent precursor material. The stent precursor material can then be positioned, for example, by an angioplasty procedure. Upon positioning the stent precursor the implantation device can subject the stent precursor material to a second curing, thereby, creating a mechanically viable stent.

The dual cure PFPE materials, according to embodiments of the present invention, may be used with all of the cardiovascular and intraluminal devices described herein. PFPE materials may be utilized in the material(s) of these devices and/or may be provided as a coating on these devices.

Figure 16A:
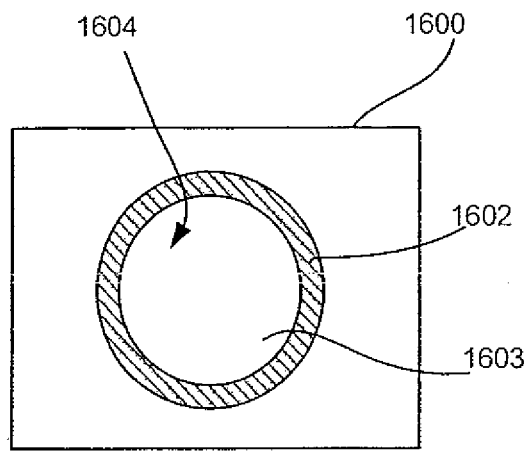
FIGS. 16A-16C show a device with a lumen according to an embodiment of the present invention.
Figure 16B:
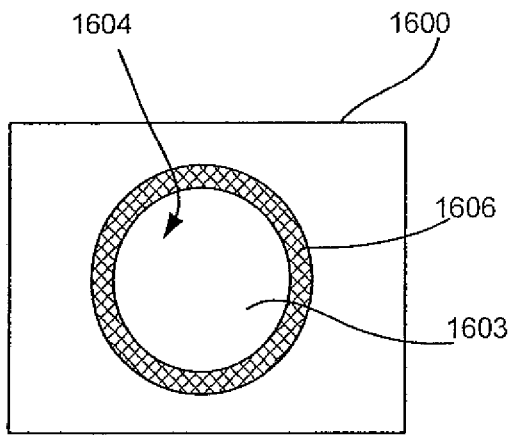
Figure 16C:
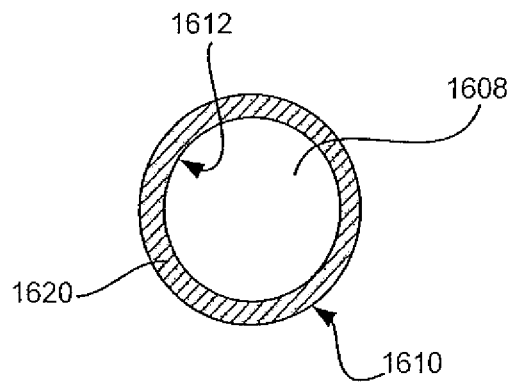

According to other embodiments and as shown in FIGS. 16A-16C, a biologic structure having a lumen (e.g., for example, a blood vessel) can be replaced with a medical device molded from the dual cure materials disclosed herein. FIG. 16 shows a top view or end view of a biologic structure 1602 having a lumen 1604. First, in molding the replacement vessel, lumen 1604 is filled with a temporary filler 1603. Temporary filler 1603 can be PDMS, foam, or another suitable material that can be inserted into vessel 1602. Filler 1603 can be administered into lumen 1604 such that a desired pressure is applied to the walls of vessel 1602. The pressure applied to the walls of vessel 1602 can be a pressure to mimic a biologic condition, a pressure below a normal biologic condition, a pressure above a normal biologic condition, a desired pressure, or the like. Vessel 1602 is then encapsulated into curable outer matrix 1600, such as for example liquid PDMS. Next, outer matrix 1600 is cured such that vessel 1602 is sandwiched between outer matrix 1600 and filler 1603.

Referring now to FIG. 16B, vessel 1602 is removed from between outer matrix 1600 and filler 1603, creating a receiving space 1606. Next, replacement material (e.g., liquid PFPE or the like) having dual cure capabilities, as described herein, is delivered into receiving space 1606. Replacement material can be injected, poured, sprayed, or the like into receiving space 1606. Next, replacement material is subjected to a first cure (e.g., photo or thermal curing) such that it solidifies, at least partially, and forms replacement device 1620. Following the first cure, outer matrix 1600 and filler 1603 are removed, thereby, leaving replacement device 1620 (FIG. 16C). Replacement device 1620 has an outer surface 1610, an inner surface 1612, and includes the characteristics of the natural biologic structure from which it was molded. Furthermore, replacement device 1620 includes a lumen 1608 that mimics the lumen of the biologic structure that replacement device 1620 was molded from.

Next, replacement device 1620 is positioned into the subject in the position where the natural component was removed or any other suitable implant location. Replacement device 1620 is aligned with biologic structures that it is configured to adhere to and function with and replacement device 1620 is treated with a second cure (e.g., thermal or photo curing). The second cure activates components of the replacement device (described herein) which in turn bind with the surrounding biologic tissue, thereby implanting and affixing replacement device 1620 with the subject. In other embodiments, replacement device 1620 can be bound to a bio-active polymer that is known to adhere to tissue, in the second curing step, such that the replacement device 1620 can bind to the biologic tissue through the bioactive polymer.

According to another embodiment, the dual cure material can be used to form a rigid structure that augments structural support to a skeletal portion of the subject. For example, damage to be augmented can be a crack or other defect in a bone. In some embodiments, the dual cure liquid material can be first molded or formed in vitro and first cured to form a structure of desired configuration. Next, the first cured structure can be implanted and positioned with respect to the damaged biologic structure to be augmented. Once in position, the first cured material can be treated with a second cure to further solidify and/or bond to the biologic structure. The dual cure mechanism of the present invention facilitates implantation of the structure because upon first curing the structure can retain a specific shape but be very compliant. The compliant nature of the structure after the first cure can reduce trauma inflicted on a patient while implanting the structure. Upon the second curing, the structure binds with the adjacent tissue or biologic component, seals the crack, and provides structural support to the damaged biological component. The composition and degree of curing of the implanted material can be altered to render a structure that resembles a desired functionality, such as strength, flexibility, rigidity, elasticity, combinations thereof and the like. Accordingly, the dual cured, flexible material may replace portions of ligaments, tendons, cartilage, muscles, and the like as well as tissue (e.g., flexible tissues) within the body of a subject.

In still further embodiments, the dual cure materials of the present invention can be utilized to form other medical devices, medical implants, biological replacement devices, medical procedure tools, surface treatments, combinations thereof, and the like. Other useful applications to which the dual cure material can be applied are disclosed in published U.S. patent application no. 2005/0142315, including the publications cited therein, all of which are incorporated herein by reference in their entirety.

In still further embodiments, the dual cure materials disclosed and described herein can be used to form a patterned surface characteristic on the surface of medical devices. The patterned surface characteristic can provide useful properties to medical devices and as medical device coatings. The surface patterning of medical devices and medical implants can provide superhydrophobic coatings that can be extremely non-wetting to fluids. The patterned surfaces can also be highly resistant to biological fouling. Dual cure materials can be patterned by pouring a liquid precursor of the dual cure material onto a patterned template (e.g., silicon wafer) or by photolithography, and treating the precursor to a first curing, whereby the material solidifies or partially solidifies and takes the shape of the pattern on the patterned wafer. In some embodiments, the pattern can have structures that are between about 1 nm and about 500 nm. In other embodiments, the pattern can have structures that are between about 1 μm and 10 μm. In one embodiment the pattern is a repeated diamond shape pattern.

Next, the first cured material is released from the wafer to yield a patterned layer. Such a layer can then be used directly as a medical device or can be adhered, through a second curing, to other objects by the orthogonal curing methods previously described, thereby coating the surface of medical devices and implants and resulting in decreased wetability and decreased likelihood of bio-fouling of the medical device or implant.

In other embodiments, the dual cure materials are useful in dermatological applications including, for example, bandages, dressings, wound healing applications, burn care, reconstructive surgery, surgical glue, sutures, and the like. Because PFPE materials are oxygen permeable and bacterial impermeable, tissue underlying a PFPE bandage can receive oxygen while being protected against the ingress of dirt, microbial organisms, pathogens, and other forms of contamination and toxicity. In addition, the oxygen permeability and carrying capacity of PFPE materials can also help with preventing necrosis of healthy tissue under bandages and dressings, or under an area being treated.

According to an embodiment of the present invention, a method of applying "instant skin" to the body of a subject includes applying an oxygen permeable, bacterial impermeable liquid dual cure PFPE material onto a portion of the body of a subject. The dual cure PFPE material can be treated with a first cure to form layers of an approximate predetermined size and/or shape. After the first cure, the layered PFPE dual cure material is placed on the damaged zone of the patient. The dual cure PFPE is then subjected to a second cure such that the dual cure PFPE adheres to the patient and provides a oxygen permeable, microbial impermeable, waterproof, flexible, elastic, biocompatible artificial skin layer.

According to further embodiments, ocular implants and contact lenses can be formed from the dual cure materials of the present invention. These devices are advantageous over conventional ocular implants and contact lenses because the PFPE material is permeable to oxygen and resistant to bio-fouling. In addition, because of the lower surface energy, there is more comfort to the wearer as a result of the low friction generated the PFPE. In addition, the refractive index of PFPE materials can be adjusted for optimum performance for ocular implants and contact lenses. Further embodiments include cochlear implants utilizing the dual cure PFPE material. Using dual cure PFPE materials, tissue in-growth can be minimized, thus making removal of the device safer and less traumatic.

XVII. Materials Having Nanoscopic Voids and Methods for Forming the Same

According to other embodiments of the present invention, materials of the present disclosure are formed with nano-scale voids. The nano-scale voids can provide a porous material and/or increase the permeability of the material. According to such embodiments, a fluorinated or non-fluorinated fluid is introduced to the precursors, described herein, in low concentrations. The materials are then cured as described herein, including but not limited to UV curing, thermal curing, evaporation, combinations thereof, and the like. Next, the fluid is evaporated or removed from the cured material. Following removal of the fluid from the cured material, nanoscopic voids are left behind. These nano-scale voids can give porosity to the material, increase permeability of the material, can be interconnected or independent, combinations thereof, and the like. According to one embodiment, the concentration of the fluid is less than about 15%. According to another embodiment, the concentration of the fluid is less than about 10%. In yet another embodiment, the concentration of the fluid is less than about 5%. According to such embodiments, the fluid acts as a porogen, leaving nano-scopic voids in the cured elastomer, thereby increase the gas permeability of the material, generating nano-scale porosity in the material, increasing liquid permeability, combinations thereof, and the like. Other methods for fabricating nanoscopic voids in the materials of the present invention are disclosed in U.S. Pat. No. 6,160,030 to Chaouk et al., which is incorporated herein by reference in its entirety including all references cited therein.

XVIII. Other Applications

According to other embodiments of the present invention, traditional applications for silicone can be improved with the materials and methods of the present invention and according to further embodiments the applications can be replaced with the materials and methods disclosed herein. Silicone applications to which the materials and methods of the present invention are applicable include mold release agents, release layers, respiratory masks, anti-graffiti paint systems; aqueous coatings, sealants, mechanically assembled monolayers, micro plates and covers, tubing, water repellant, and organic solvent repellant.

Microextraction is a further application to which the materials and methods of the present invention can be applied. For example, the materials and methods of the present invention can be applied to substitute for or enhance the current techniques and chemicals used in microextraction. An example of microextraction is detailed in an article in Analytical Chemistry [69(6), 1197-1210, 1997] in which the authors placed 80 microliter chips of OV-1 extraction medium [poly(dimethylsiloxane)] in 50 ml flasks with 49 ml of aqueous sample, shook the flasks for 45 to 100 minutes, removed the chips, and placed them in the cell of a Shimadzu UV-260 spectrophotometer (Shimadzu Corp., Kyoto, Japan) to obtain a UV spectrum. Further described is a preconcentration by SPME that enables UV absorption spectroscopy to identify benzene at detection limits of 97 ppb, naphthalene at 0.40 ppb, 1-methylnaphthalene at 0.41 ppb, and 8 other aromatics at 5.5-12 ppb. In tests of samples spiked with unleaded gasoline, JP4 jet fuel, and no. 1 diesel fuel, preconcentration permits direct quantitation of dilute levels of aromatic species in aqueous samples without interference from humic substances in solution.

According to other embodiments, an application of the present invention can include substituting the materials and methods of the present invention for traditional chromatographic separation materials. According to yet another embodiment of the present invention the materials and methods of the present invention can be combined with typical chromatographic separation materials. Chromatographic separations useful with the present invention are described in the following studies, incorporated herein by reference, and which describe that natural enantiomeric distribution of terpene alcohols on various natural matrices determined that, although distinctive for each matrix, the distribution is widely differentiated. While there is data available on the free bound linalool content in muscat wines, no data is available on the enantiomeric distribution of the same terpene alcohols in these wines. Researchers at DIFCA (Sezione di Chimica Analitica Argoali-mentare ed. Ambientale, Universita degli Studi di Milano, Via Celoria 2, 20133 Milan, Italy; Tel: 39 2 26607227, Fax: 39 2 2663057) have characterized muscat wines using gas chromatography (GC) chiral analysis. To determine the aromatic fraction of muscat wines, the enantiomeric excess of linalool and α-terpineol must be measured. F. Tateo and M. Bononi used two different fibers for the solid phase microextraction (SPME), one apolar (100 micron non-bonded polydimethylsiloxane) and one polar (partially crosslinked 65 micron carbowax/divinylbenzene). There was greater adsorption of the linalool using the polar fiber. The enantiomeric distribution of the linalool and of the α-terpineol were within fairly narrow limits and were considered characteristic indices. In order to assess the selectivity of SPME adsorption of the polar fiber with respect to a number of molecules, comparison was made using data obtained by direct injection. Greater sensitivity for the molecules was obtained using this technique.

In other applications, the materials and methods of the present invention can be substituted for PDMS materials used in outdoor capacities, such as for example, PDMS shed materials used to cover high voltage outdoor insulators. According to further embodiments, the presently disclosed materials and methods can be combined with PDMS materials used in outdoor capacities, such as for example, the high voltage outdoor insulator sheds described above. It is important that the surface of the shed of the insulator remains hydrophobic throughout its services life. It is known, however, that electrical discharges lead to an oxidation of the traditional surface and a temporary loss of hydrophobicity. According to a study of traditional materials, crosslinked polydimethylsiloxane (PDMS) containing Irganox 1076, Tinuvin 770 or Irganox 565 (Ciba Specialty Chemicals Corp., Tarrytown, N.Y., United States of America), prepared by swelling PDMS in a solution of one of these stabilizers in n-hexane, was exposed to a corona discharge and the corona exposure time (t-crit) to form a brittle, silica-like layer was determined by optical microscopy. The critical corona exposure time showed a linear increase with increasing stabilizer concentration; Tinuvin 770 showed the highest efficiency and Irganox 1076 the lowest. The increase in t-crit on corona exposure of the stabilized samples with reference to the value for unstabilized PDMS was similar to that reported earlier for air plasma exposed samples. The efficiency of the stabilizers towards corona-induced surface oxidation of PDMS also was confirmed by X-ray photoelectron spectroscopy. As will be appreciated by one of ordinary skill in the art, however, traditional materials utilizing PDMS can be significantly improved by the addition or augmentation with the materials and methods of the present invention.

Microvalves actuated by paraffin, such as, for example, microvalves containing silicone-rubber seals actuated by heating and cooling of paraffin have been proposed for development as integral components of microfluidic systems. According to an embodiment of the present invention, the materials and methods of the present invention can be substituted for, or combined with the silicone-rubber seals of such devices as the disclosed microvalve materials, thereby, increasing the physical and chemical properties of such microvalves.

Scratch-free surfaces are yet a further application to which the materials and methods of the present invention can be applied. The materials and methods of the present invention can be substituted for or used to augment the traditional scratch-free surface materials to improve their physical and chemical properties. As an example, research from Dow Corning of Freeland, Mich., has shown that adding masterbatches to thermoplastic olefins (TPOs) improves scratch resistance of TPO components. The company's MB50-series of masterbatches are in carrier-resin formats containing 50% ultra-high molecular weight polydimethylsiloxane, a scratch-resisting and lubricating additive. The additive lowers the coefficient of friction at the surface of the molded part. Surface-modifying masterbatches are now utilized and developed for various applications, such as in the automotive sector where it is being used in consoles, airbags, door skins and exterior components. Substituting the materials and methods of the present invention, or combining the materials and methods of the present invention to such scratch-free surface materials can improve the scratch-resistance of the materials.

The materials and methods of the present invention also can be applied to materials and methods used in the fabrication of sensors. An example of applying the materials and methods of the present invention to the materials that are used to make sensors, such as for example, polymeric membrane paste compositions will be appreciated by one of ordinary skill in the art from the following. Advantageous polymeric membrane paste compositions include a polyurethane/hydroxylated poly(vinyl chloride) compound and a silicone-based compound in appropriate solvent systems to provide screen-printable pastes of the appropriate viscosity and thixotropy. For an ion sensor to be commercially acceptable, it must have qualities beyond just electrochemical performance. For a sensor to be cost effective, it must be reproducible using mass production systems. There must be common electrochemical response characteristics within the members of a batch fabricated group. If the sensors are not all substantially identical, they will each be characterized by different lifetimes and response characteristics, creating difficulties in the field, not the least of which is the added cost associated with recalibration of equipment whenever the sensor is changed. Polymeric membranes are in common use as transducers in solid-state chemical sensors, particularly because such membranes have high selectivity to the ion of interest and can be made selective to a wide range of ions using one or many readily available ionophores. One known technique for forming the membranes is solvent casting; a technique which originated with ion-selective electrode technology. In addition to being a rather tedious operation, particularly in view of the small size of the sensors, this production method yields very high losses. The thickness and shape of the membrane cannot be controlled, resulting in an unacceptable lack of sensor reproducibility. An objective of the research at the University of Michigan was to provide a simple and economical system for batch fabrication of solid-state ion-selective sensors. Their method consists of installing a mask on a semiconductor substrate, the mask having at least one aperture having a predetermined configuration which corresponds with a desired membrane configuration. A polymeric membrane paste is applied to the mask, and a squeegee is drawn across the mask to force the paste into the aperture and in communication with the semiconductor substrate. In one form, the mask is of a metallic material, which can be a stainless steel mesh coated with a photoreactive emulsion. In another form, the mask is a metal foil stencil. The membrane which ultimately is produced has a thickness which corresponds to that of the mask, between 25 and 250 microns. The membrane paste can be formed of a polyurethane with an effective portion of an hydroxylated poly(vinyl chloride) copolymer; a polyimide-based compound; a silicone-based compound, such as silanol-terminated polydimethylsiloxane with the resistance-reducing additive, CN-derivatized silicone rubber; or any other suitable polymeric material. Thus, it will be appreciated that the materials and methods of the present invention can be applied to the materials and processes for forming sensors, such as the polymeric membrane compositions, polyimide-based compounds, polydimethylsiloxane, and silicone rubber, for example.

In another further embodiment, the materials and methods of the present invention can be substituted for or can be used to augment the materials and methods used in sol-gel capillary microextraction. Typically, sol-gel technology involves the encapsulation of active ingredients in micro- and nano-sized matrices, often silica based matrices, as well as nanospheres. Sol-gel capillary microextraction (sol-gel CME), for example, is a viable solventless extraction technique for the preconcentration of trace analytes. Sol-gel-coated capillaries are often employed for the extraction and preconcentration of a wide variety of polar and nonpolar analytes. Two different types of sol-gel coatings are used for extraction: sol-gel poly(dimethylsiloxane) (PDMS) and sol-gel poly(ethylene glycol) (PEG). A gravity-fed sample dispensing unit can be used to perform the extraction. The analysis of the extracted analytes can be performed by gas chromatography (GC). The extracted analytes are transferred to the GC column via thermal desorption. For this, the capillary with the extracted analytes can be connected to the inlet end of the GC column using a two-way press-fit fused-silica connector housed inside the GC injection port. Desorption of the analytes from the extraction capillary can be performed by rapid temperature programming (at 100 degrees C./min) of the GC injection port. The desorbed analytes are transported down the system by the helium flow and further focused at the inlet end of the GC column maintained at 30 degrees C. Sol-gel PDMS capillaries are commonly used for the extraction of nonpolar and moderately polar compounds (such as, but not limited to, polycyclic aromatic hydrocarbons, aldehydes, ketones), while sol-gel PEG capillaries are used for the extraction of polar compounds (such as, but not limited to, alcohols, phenols, amines). For both polar and nonpolar analytes, the run-to-run and capillary-to-capillary relative standard deviation (RSD) values for GC peak areas often remain under 6% and 4%, respectively. Parts per quadrillion level detection limits are achieved by coupling sol-gel CME with gas chromatography/flame ionization detection (GC-FID). The use of thicker sol-gel coatings and longer capillary segments of larger diameter (or capillaries with sol-gel monolithic beds) often lead to further enhancement of the extraction sensitivity. As will be appreciated by one of ordinary skill in the art, replacing or combining the matrices and nanospheres commonly used in sol-gel applications with the materials and methods of the present invention can improve the efficiency and effectiveness of sol-gel processes.

In alternative embodiments the materials and methods of the present invention can be applied to processes, such as process aid for plastics and membrane separating processes. An example of membrane separating processes applicable with the present invention is described in Membrane & Separation Technology News, v. 15:no. 6, Feb. 1, 1997 (ISSN-0737-8483)).

Other silicone related arts that the methods and materials of the present invention are capable of augmenting or replacing include, but are not limited to, the disclosures in U.S. Pat. Nos. 6,887,911; 6,846,479; 6,808,814; 6,806,311; 6,804,062; 6,803,103; 6,797,740; the disclosures in U.S. Patent Application Nos. 2005/0147768; 2005/0112385; 2005/0111776; 2005/0091836; 2005/0052754; and the disclosure in EP1533339A1, each of which are incorporated by reference herein in their entirety.

XIX. Sacrificial Layer Device Fabrication

According to some embodiments of the present invention, the materials described herein are used to form devices, such as microfluidic devices, fabricated according to sacrificial layer methods. Specific photolithographic patterning of curable materials disclosed herein, through controlled light exposure, such as for example, rastering a focused source, flood exposure through a mask, a highly organized precision light source, combinations thereof, or the like provides fabrication of polymeric micro-devices. Furthermore, according to embodiments of the present invention, living radical photo-polymerization of materials disclosed herein provides parallel fabrication of multilayer devices. Living radical photo-polymerization, uses specific initiator chemistries that continuously reactivate during exposure to UV light for synthesizing linear polymers. According to some embodiments, the polymer chain ends are not permanently terminated or deactivated and in conjunction with cross-linking monomers, living radical photo-polymerization enables initiation and covalent adhesion of new polymer chains or films to surfaces of previously photo-polymerized structures.

According to some embodiments, methods for photo patterned polymerization of polymers, such as polymers discloses herein, can be used to generate micro-devices, such as microfluidic devices, with highly complex three-dimensional designs, extremely versatile surface, and a plurality of physical and chemical properties. In alternative methods, the materials disclosed herein can be combined with materials, such as filters, different polymerizable monomer formulations, such as for example, photo-curable agents, thermal curable agents, combinations thereof, or the like to form cured components that can be combined as layers of an overall structure or device. Following initial curing of the materials, adjacent layers or devices can be covalently adhered together, through a second curing process or procedure, such as described herein, to form complex multilayered devices. According to some embodiments, material properties can be initially selected by altering the composition of the base material and/or monomer formulation in the base material, according to materials and methods described herein, such that the resulting layers of a device or the device itself will function for a predetermined use.

Figure 18:
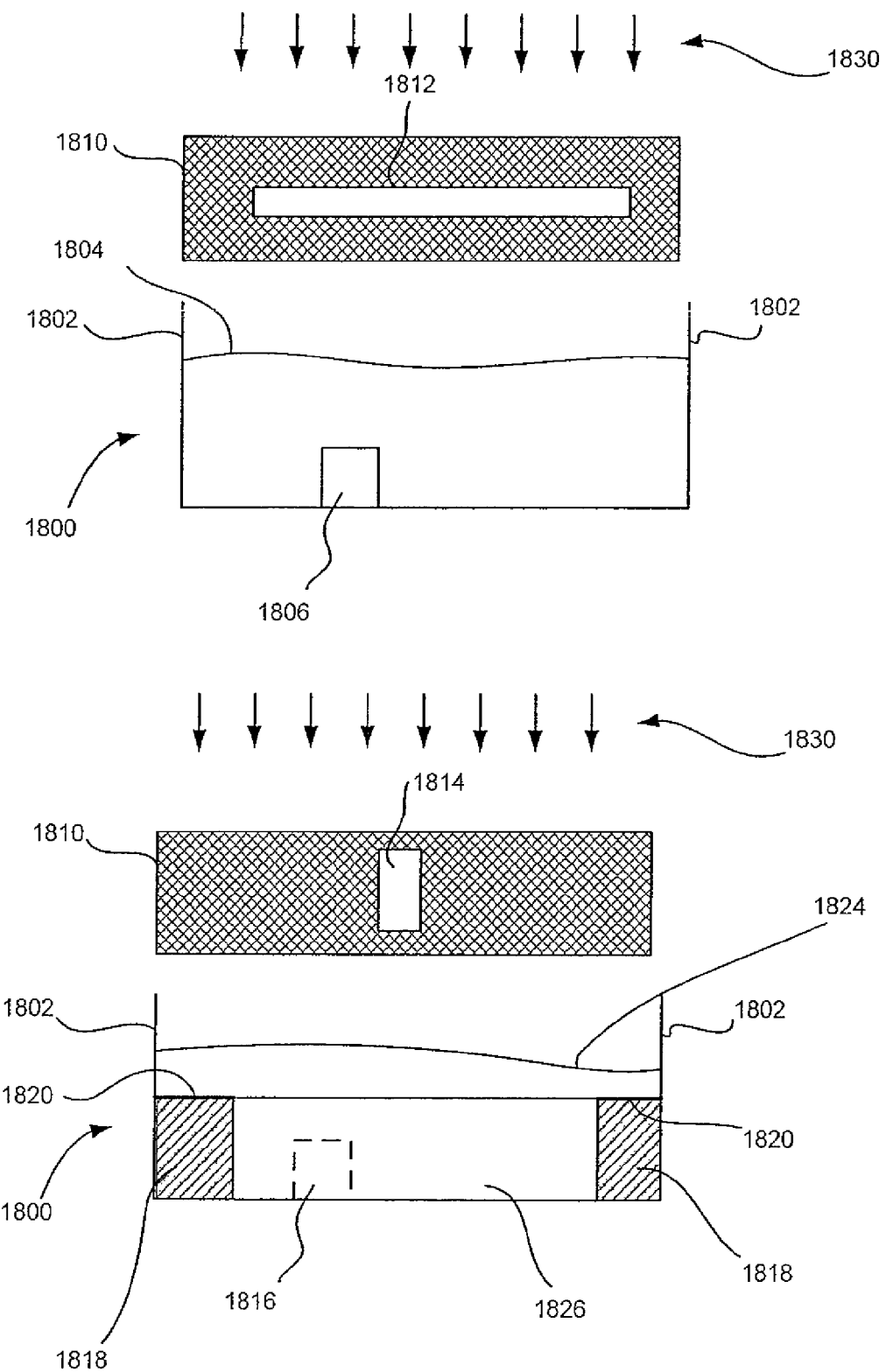
FIG. 18 shows a sacrificial layer fabrication method and device according to an embodiment of the present invention.
Figure 19:
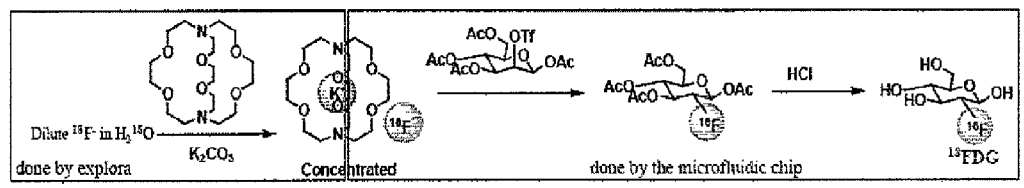
FIG. 19 depicts a reaction for the synthesis of 2-deoxy-2-[$^{18}$F]fluoro-D-glucose (FDG), an imaging agent used in positron emission topography (PET).

According to FIG. 18, a reaction chamber 1800 is provided. Reaction chamber 1800 is typically shaped similar to a cup, with sides 1802 such that it can house a liquid 1804 without the liquid spilling from chamber 1800. Chamber 1800 can have a flat, curved, or the like bottom chamber or can have a shape or recesses 1806 contained therein. Chamber 1800 preferable has sides 1802 with a height equal to or greater than a height of a desired device. In some embodiments, sides 1802 are between about 1 nm and about 100 mm. According to other embodiments, sides 1802 are between about 1 micron and about 500 micron. According to yet other embodiments, sides 1802 are between about 50 nm and about 50 mm. Liquid material 1804, such as materials disclosed herein, for example, PFPE or a derivative of PFPE as disclosed herein, is presented into chamber 1800 and filled to a desired depth. The desired dept can be determined by a desired thickness of the resulting device or layer to be fabricated in a first fabrication step.

According to some embodiments, a mask 1810, such as for example, an optical mask alignment system having a desired mask design or pattern 1812 is placed above or in contact with liquid polymer material 1810. In some embodiments, masks 1810 are made from commercially available emulsion films with a high resolution plotter. According to such embodiments, masks 1810 are made from rapid prototyping and device optimization. Using a method of mask fabricating such as these typically generates a resolution of about 10 micron. According to other embodiments, higher resolution, i.e., less than about 1 micron and/or more durable masks can be fabricated by deposition of chrome on etched quartz glass or alternative printing methods. Masks 1810 can be aligned using registration marks or an optical alignment system. In some embodiments, mask 1810 and liquid material 1804 exposed by the pattern 1812 of mask 1810, is treated with a light or UV cure 1830, such as described herein. In some embodiments cure 1830 activates photo-curable monomer components in liquid material 1804 such that liquid material 1804 is cured in a pattern according to pattern 1812 of mask 1810. According to other embodiments, after liquid material 1804 is presented into chamber 1800, liquid material 1804 is treated with a highly organized light source such that primarily predetermined areas of liquid material 1804 is cured to a solid form or a substantially solid form. If mask 1810 is utilized, it is then removed and any uncured liquid material 1804 is removed by treating the uncured liquid material 1804 with a solvent.

According to some embodiments, it can be desirable to form and adhere a second layer or a second device to the initially cured liquid material 1804. According to such embodiments, voids 1818 left behind after removing uncured liquid material 1804 are filled with a sacrificial layer 1820. In some embodiments, sacrificial layer 1820 can be a wax, such as paraffin wax, or the like. Sacrificial layer 1820 is preferably a liquid or molten solid such that it fills voids 1818 to preserve open spaces in the material, such as for example, channels, valve ports or openings, recesses, and the like in the cured material. According to some embodiments, voids 1818 are filled such that sacrificial layer is flush or even with a surface of initially cured liquid material 1826. In some embodiments, excess sacrificial layer is removed such that the surface of initially cured liquid material 1826 is exposed.

Next, a second liquid material 1824 is introduced onto the surface of initially cured liquid material 1826 and sacrificial layer 1820. As described above, a mask 1810 having pattern 1812, a second pattern 1814, a precision light source, or the like is then delivered to the second liquid material 1824 such that a predetermined portion of second liquid material 1824 becomes photo-activated and cured. Space between the photo-mask and the previous layer dictates the height of the second layer. During the photo-activating and curing process, second liquid material 1824 can also chemically bind to initially cured liquid material 1804, thereby adhering the two layers together and forming a single device.

The above described process can be repeated to form a multiple layered predetermined three-dimensional structure. Following fabrication of the desired structure, any sacrificial layer 1820 is removed from the structure, such as by heating or treating the structure with a solvent. The sacrificial layer 1820 removal process, can in some embodiments, be analogous to negative photoresist chemistry; unexposed regions are removed and exposed regions remain after solvent rinsing. In some embodiments, the subsequent layers can have the same or different physical configuration and/or the same or different material composition and/or properties, according to desired uses of the device.

In some embodiments, a shape or recess 1806 can be included in chamber 1800. Accordingly, when first liquid material 1804 is cured around shape 1806, shape will leave a void 1816 in cured first liquid material 1826 after the cured first liquid material 1826 is removed from chamber 1800. In some embodiments, shape 1806 can be a chamber, path, system of chambers, valve ports, or the like commonly associated with microfluidic devices.

According to yet other embodiments, the base materials of the device can include, as disclosed herein, thermally curable components. According to such embodiments, following fabrication of the device by build-up of multiple layers, as described above, the device can be treated with a thermal cure. Thermal cure activates the thermally curable components of the base material and further adheres the multiple layers together or can adhere the device to a second device.

According to some embodiments, the material 1804 of the device can include moieties such as moieties disclosed herein, for example as described above with respect to the fourth precursor. According to such embodiments the moiety precursor remains available at the surfaces of the cured device such that a sample passed over the surface can react with the moieties. Many functions performed in microfluidic devices rely upon interactions between fluids and transported chemical or biological compounds, therefore, fabricating microfluidic devices with functional moiety precursors that remain available after fabrication of the device can facilitate microfluidic reactions. According to some embodiments, the moieties included in the material 1804 can be selected and altered for a desired function of the fabricated device. Often, spatially controlled surface properties that differ from the bulk material properties are desirable in microfluidic devices. Incorporation of a living radical initiator, in some embodiments for example, in the monomer formulations can enable spatially resolved grafting or modification via photolithographic methods and surface-mediated living radical photo-polymerization.

All references cited herein are incorporated herein by reference in their entirety, including all references cited therein.

EXAMPLES

The following Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and alterations can be employed without departing from the scope of the presently disclosed subject matter.

General Considerations

A PFPE microfluidic device has been previously reported by Rolland, J. et al. *JACS* 2004, 126, 2322-2323, which is incorporated herein by reference in its entirety. The specific PFPE material disclosed in Rolland, J., et al., was not chain extended and therefore did not possess the multiple hydrogen bonds that are present when PFPEs are chain extended with a diisocyanate linker. Nor did the material posses the higher molecular weights between crosslinks that are needed to improve mechanical properties such as modulus and tear strength which are critical to a variety of microfluidics applications. Furthermore, this material was not functionalized to incorporate various moieties, such as a charged species, a biopolymer, or a catalyst.

Herein is described a variety of methods to address these issues. Included in these improvements are methods which describe chain extension, improved adhesion to multiple PFPE layers and to other substrates such as glass, silicon, quartz, and other polymers as well as the ability to incorporate functional monomers capable of changing wetting properties or of attaching catalysts, biomolecules or other species. Also described are improved methods of curing PFPE elastomers which involve thermal free radical cures, two-component curing chemistries, and photocuring using photoacid generators.

Example 1

A liquid PFPE precursor having the structure shown below (where n=2) is blended with 1 wt % of a free radical photoinitiator and poured over a microfluidics master containing 100-μm features in the shape of channels. A PDMS mold is used to contain the liquid in the desired area to a thickness of about 3 mm. The wafer is then placed in a UV chamber and exposed to UV light (λ=365) for 10 minutes under a nitrogen purge. Separately, a second master containing 100-μm features in the shape of channels is spin coated with a small drop of the liquid PFPE precursor over top of it at 3700 rpm for 1 minute to a thickness of about 20 μm. The wafer is then placed in a UV chamber and exposed to UV light (λ=365) for 10 minutes under a nitrogen purge. Thirdly, a smooth, flat PFPE layer is generated by drawing a doctor's blade across a small drop of the liquid PFPE precursor across a glass slide. The Slide is then placed in a UV chamber and exposed to UV light (λ=365) for 10 minutes under a nitrogen purge. The thicker layer is then removed, trimmed, and inlet holes are punched through it using a luer stub. The layer is then placed on top of the 20-μm thick layer and aligned in the desired area to form a seal. The layers are then placed in an oven and allowed to heat at 120° C. for 2 hours. The thin layer is then trimmed and the adhered layers are lifted from the master. Fluid inlet holes and outlet holes are punched using a luer stub. The bonded layers are then placed on the fully cured PFPE smooth layer on the glass slide and allowed to heat at 120° C. for 15 hours. Small needles can then be placed in the inlets to introduce fluids and to actuate membrane valves as reported by Unger, M. et al. *Science.* 2000, 288, 113-6.

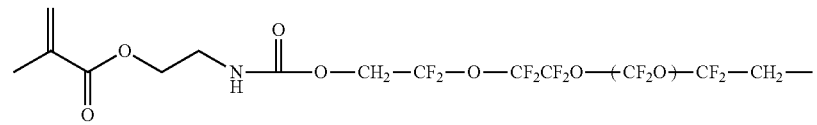

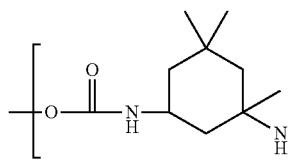
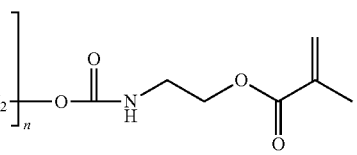

Example 2

Thermal Free Radical

Glass

A liquid PFPE precursor encapped with methacrylate groups is blended with 1 wt % of 2,2-Azobisisobutyronitrile and poured over a microfluidics master containing 100-μm features in the shape of channels. A PDMS mold is used to contain the liquid in the desired area to a thickness of about 3 mm. The wafer is then placed in an oven at 65° C. for 20 hours under nitrogen purge. The cured layer is then removed, trimmed, and inlet holes are punched through it using a luer stub. The layer is then placed on top of a clean glass slide and fluids can be introduced through the inlet holes.

Example 3

Thermal Free Radical

Partial Cure

Layer to Layer Adhesion

A liquid PFPE precursor encapped with methacrylate groups is blended with 1 wt % of 2,2-Azobisisobutyronitrile and poured over a microfluidics master containing 100-μm features in the shape of channels. A PDMS mold is used to contain the liquid in the desired area to a thickness of about 3 mm. The wafer is then placed in an oven at 65° C. for 2-3 hours under nitrogen purge. Separately, a second master containing 100-μm features in the shape of channels is spin coated with a small drop of the liquid PFPE precursor over top of it at 3700 rpm for 1 minute to a thickness of about 20 μm. The wafer is then placed in an oven at 65° C. for 2-3 hours under nitrogen purge. Thirdly, a smooth, flat PFPE layer is generated by drawing a doctor's blade across a small drop of the liquid PFPE precursor across a glass slide. The wafer is then placed in an oven at 65° C. for 2-3 hours under nitrogen purge. The thicker layer is then removed, trimmed, and inlet holes are punched through it using a luer stub. The layer is then placed on top of the 20-μm thick layer and aligned in the desired area to form a seal. The layers are then placed in an oven and allowed to heat at 65° C. for 10 hours. The thin layer is then trimmed and the adhered layers are lifted from the master. Fluid inlet holes and outlet holes are punched using a luer stub. The bonded layers are then placed on the partially cured PFPE smooth layer on the glass slide and allowed to heat at 65° C. for 10 hours. Small needles can then be placed in the inlets to introduce fluids and to actuate membrane valves as reported by Unger, M. et al. *Science*. 2000, 288, 113-6.

Example 4

Thermal Free Radical

Partial Cure

Adhesion to Polyurethane

A photocurable liquid polyurethane precursor containing methacrylate groups is blended with 1 wt % of 2,2-Azobisisobutyronitrile and poured over a microfluidics master containing 100-μm features in the shape of channels. A PDMS mold is used to contain the liquid in the desired area to a thickness of approximately 3 mm. The wafer is then placed in an oven at 65° C. for 2-3 hours under nitrogen purge. Separately, a second master containing 100-μm features in the shape of channels is spin coated with a small drop of the liquid PFPE precursor over top of it at 3700 rpm for 1 minute to a thickness of approximately 20 μm. The wafer is then placed in an oven at 65° C. for 2-3 hours under nitrogen purge. Thirdly, a smooth, flat PFPE layer is generated by drawing a doctor's blade across a small drop of the liquid PFPE precursor across a glass slide. The wafer is then placed in an oven at 65° C. for 2-3 hours under nitrogen purge. The thicker layer is then removed, trimmed, and inlet holes are punched through it using a luer stub. The layer is then placed on top of the 20-μm thick layer and aligned in the desired area to form a seal. The layers are then placed in an oven and allowed to heat at 65° C. for 10 hours. The thin layer is then trimmed and the adhered layers are lifted from the master. Fluid inlet holes and outlet holes are punched using a luer stub. The bonded layers are then placed on the partially cured PFPE smooth layer on the glass slide and allowed to heat at 65° C. for 10 hours. Small needles can then be placed in the inlets to introduce fluids and to actuate membrane valves as reported by Unger, M. et al. *Science*. 2000, 288, 113-6.

Example 5

Thermal Free Radical

Partial Cure

Adhesion to Silicone-Containing Polyurethane

A photocurable liquid polyurethane precursor containing PDMS blocks and methacrylate groups is blended with 1 wt % of 2,2-Azobisisobutyronitrile and poured over a microfluidics master containing 100-μm features in the shape of channels. A PDMS mold is used to contain the liquid in the desired area to a thickness of approximately 3 mm. The wafer is then placed in an oven at 65° C. for 2-3 hours under nitrogen purge. Separately, a second master containing 100-μm features in the shape of channels is spin coated with a small drop of the liquid PFPE precursor over top of it at 3700 rpm for 1 minute to a thickness of approximately 20 μm. The wafer is then placed in an oven at 65° C. for 2-3 hours under nitrogen purge. Thirdly, a smooth, flat PFPE layer is generated by drawing a doctor's blade across a small drop of the liquid PFPE precursor across a glass slide. The wafer is then placed in an oven at 65° C. for 2-3 hours under nitrogen purge. The thicker layer is then removed, trimmed, and inlet holes are punched through it using a luer stub. The layer is then placed on top of the 20-μm thick layer and aligned in the desired area to form a seal. The layers are then placed in an oven and allowed to heat at 65° C. for 10 hours. The thin layer is then trimmed and the adhered layers are lifted from the master. Fluid inlet holes and outlet holes are punched using a luer stub. The bonded layers are then placed on the partially cured PFPE smooth layer on the glass slide and allowed to heat at 65° C. for 10 hours. Small needles can then be placed in the inlets to introduce fluids and to actuate membrane valves as reported by Unger, M. et al. *Science.* 2000, 288, 113-6.

Example 6

Thermal Free Radical

Partial Cure

Adhesion to PFPE-PDMS Block Copolymer

A liquid precursor containing both PFPE and PDMS blocks encapped with methacrylate groups is blended with 1 wt % of 2,2-Azobisisobutyronitrile and poured over a microfluidics master containing 100-μm features in the shape of channels. A PDMS mold is used to contain the liquid in the desired area to a thickness of approximately 3 mm. The wafer is then placed in an oven at 65° C. for 2-3 hours under nitrogen purge. Separately, a second master containing 100-μm features in the shape of channels is spin coated with a small drop of the liquid PFPE precursor over top of it at 3700 rpm for 1 minute to a thickness of approximately 20 μm. The wafer is then placed in an oven at 65° C. for 2-3 hours under nitrogen purge. Thirdly, a smooth, flat PFPE layer is generated by drawing a doctor's blade across a small drop of the liquid PFPE precursor across a glass slide. The wafer is then placed in an oven at 65° C. for 2-3 hours under nitrogen purge. The thicker layer is then removed, trimmed, and inlet holes are punched through it using a luer stub. The layer is then placed on top of the 20-μm thick layer and aligned in the desired area to form a seal. The layers are then placed in an oven and allowed to heat at 65° C. for 10 hours. The thin layer is then trimmed and the adhered layers are lifted from the master. Fluid inlet holes and outlet holes are punched using a luer stub. The bonded layers are then placed on the partially cured PFPE smooth layer on the glass slide and allowed to heat at 65° C. for 10 hours. Small needles can then be placed in the inlets to introduce fluids and to actuate membrane valves as reported by Unger, M. et al. *Science.* 2000, 288, 113-6.

Example 7

Thermal Free Radical

Partial Cure

Glass Adhesion

A liquid PFPE precursor encapped with methacrylate groups is blended with 1 wt % of 2,2-Azobisisobutyronitrile and poured over a microfluidics master containing 100-μm features in the shape of channels. A PDMS mold is used to contain the liquid in the desired area to a thickness of about 3 mm. The wafer is then placed in an oven at 65° C. for 2-3 hours under nitrogen purge. The partially cured layer is removed from the wafer and inlet holes are punched using a luer stub. The layer is then placed on top of a glass slide treated with a silane coupling agent, trimethoxysilyl propyl methacrylate. The layer is then placed in an oven and allowed to heat at 65° C. for 20 hours, permanently bonding the PFPE layer to the glass slide. Small needles can then be placed in the inlets to introduce fluids.

Example 8

Thermal Free Radical

Partial Cure

PDMS Adhesion

A liquid poly(dimethylsiloxane) precursor poured over a microfluidics master containing 100-μm features in the shape of channels. The wafer is then placed in an oven at 80° C. for 3 hours. Separately, a second master containing 100-μm features in the shape of channels is spin coated with a small drop of liquid PFPE precursor encapped with methacrylate units at 3700 rpm for 1 minute to a thickness of about 20 μm. The wafer is then placed in an oven at 65° C. for 2-3 hours under nitrogen purge. The PDMS layer is then removed, trimmed, and inlet holes are punched through it using a luer stub. The layer is then treated with an oxygen plasma for 20 minutes followed by treatment with a silane coupling agent, trimethoxysilyl propyl methacrylate. The treated PDMS layer is then placed on top of the partially cured PFPE thin layer and heated at 65° C. for 10 hours. The thin layer is then trimmed and the adhered layers are lifted from the master. Fluid inlet holes and outlet holes are punched using a luer stub. The bonded layers are then placed on the partially cured PFPE smooth layer on the glass slide and allowed to heat at 65° C. for 10 hours. Small needles can then be placed in the inlets to introduce fluids and to actuate membrane valves as reported by Unger, M. et al. *Science.* 2000, 288, 113-6.

Example 9

Thermal Free Radical

PDMS Adhesion Using SYLGARD 184® and Functional PDMS

A liquid poly(dimethylsiloxane) precursor is designed such that it can be part of the base or curing component of SYLGARD 184®. The precursor contains latent functionalities such as epoxy, methacrylate, or amines and is mixed with the standard curing agents and poured over a microfluidics master containing 100-μm features in the shape of channels. The wafer is then placed in an oven at 80° C. for 3 hours. Separately, a second master containing 100-μm features in the shape of channels is spin coated with a small drop of liquid PFPE precursor encapped with methacrylate units at 3700 rpm for 1 minute to a thickness of approximately 20 μm. The wafer is then placed in an oven at 65° C. for 2-3 hours under nitrogen purge. The PDMS layer is then removed, trimmed, and inlet holes are punched through it using a luer stub. The PDMS layer is then placed on top of the partially cured PFPE thin layer and heated at 65° C. for 10 hours. The thin layer is then trimmed and the adhered layers are lifted from the master. Fluid inlet holes and outlet holes are punched using a luer stub. The bonded layers are then placed on the partially cured PFPE smooth layer on the glass slide and allowed to heat at 65° C. for 10 hours. Small needles can then be placed in the inlets to introduce fluids and to actuate membrane valves as reported by Unger, M. et al. *Science*. 2000, 288, 113-6.

Example 10

Epoxy/Amine

A two-component liquid PFPE precursor system such as shown below containing a PFPE diepoxy and a PFPE diamine are blended together in a stoichiometric ratio and poured over a microfluidics master containing 100-μm features in the shape of channels. A PDMS mold is used to contain the liquid in the desired area to a thickness of about 3 mm. The wafer is then placed in an oven at 65° C. for 5 hours. The cured layer is then removed, trimmed, and inlet holes are punched through it using a luer stub. The layer is then placed on top of a clean glass slide and fluids can be introduced through the inlet holes.

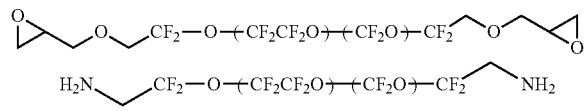

Example 11

Epoxy/Amine

Excess

Adhesion to Glass

A two-component liquid PFPE precursor system such as shown below containing a PFPE diepoxy and a PFPE diamine are blended together in a 4:1 epoxy:amine ratio such that there is an excess of epoxy and poured over a micro fluidics master containing 100-μm features in the shape of channels. A PDMS mold is used to contain the liquid in the desired area to a thickness of about 3 mm. The wafer is then placed in an oven at 65° C. for 5 hours. The cured layer is then removed, trimmed, and inlet holes are punched through it using a luer stub. The layer is then placed on top of a clean glass slide that has been treated with a silane coupling agent, aminopropyltriethoxy silane. The slide is then heated at 65° C. for 5 hours to permanently bond the device to the glass slide. Fluids can then be introduced through the inlet holes.

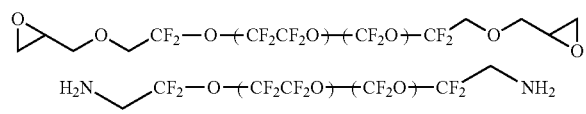

Example 12

Epoxy/Amine

Excess

Adhesion to PFPE Layers

A two-component liquid PFPE precursor system such as shown below containing a PFPE diepoxy and a PFPE diamine are blended together in a 1:4 epoxy:amine ratio such that there is an excess of amine and poured over a microfluidics master containing 100-μm features in the shape of channels. A PDMS mold is used to contain the liquid in the desired area to a thickness of about 3 mm. Separately, a second master containing 100-μm features in the shape of channels is coated with a small drop of liquid PFPE precursors blended in a 4:1 epoxy:amine ratio such that there is an excess of epoxy units and spin coated at 3700 rpm for 1 minute to a thickness of about 20 μm. The wafer is then placed in an oven at 65° C. for 5 hours. The thick layer is then removed, trimmed, and inlet holes are punched through it using a luer stub. The thick layer is then placed on top of the cured PFPE thin layer and heated at 65° C. for 5 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane and heated in an oven at 65° C. for 5 hours to adhere the device to the glass slide. Small needles can then be placed in the inlets to introduce fluids and to actuate membrane valves as reported by Unger, M. et al. *Science*. 2000, 288, 113-6.

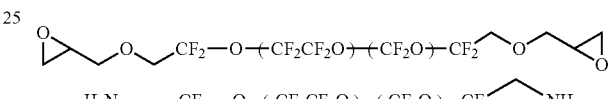

Example 13

Epoxy/Amine

Excess

Adhesion to PDMS Layers

A liquid poly(dimethylsiloxane) precursor is poured over a microfluidics master containing 100-μm features in the shape of channels. The wafer is then placed in an oven at 80° C. for 3 hours. Separately, a second master containing 100-μm features in the shape of channels is coated with a small drop of liquid PFPE precursors blended in a 4:1 epoxy:amine ratio such that there is an excess of epoxy units and spin coated at 3700 rpm for 1 minute to a thickness of about 20 μm. The wafer is then placed in an oven at 65° C. for 5 hours. The PDMS layer is then removed, trimmed, and inlet holes are punched through it using a luer stub. The layer is then treated with an oxygen plasma for 20 minutes followed by treatment with a silane coupling agent, aminopropyltriethoxy silane. The treated PDMS layer is then placed on top of the PFPE thin layer and heated at 65° C. for 10 hours to adhere the two layers. The thin layer is then trimmed and the adhered layers are lifted from the master. Fluid inlet holes and outlet holes are punched using a luer stub. The bonded layers are then placed on a glass slide treated with aminopropyltriethoxy silane and allowed to heat at 65° C. for 10 hours. Small needles can then be placed in the inlets to introduce fluids and to actuate membrane valves as reported by Unger, M. et al. *Science*. 2000, 288, 113-6.

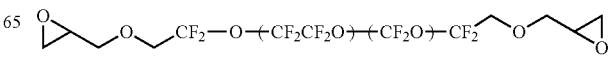

-continued

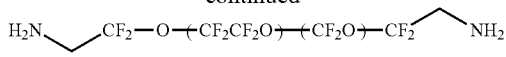

Example 14

Epoxy/Amine

Excess

Adhesion to PFPE Layers

Attachment of a Biomolecule

A two-component liquid PFPE precursor system such as shown below containing a PFPE diepoxy and a PFPE diamine are blended together in a 1:4 epoxy:amine ratio such that there is an excess of amine and poured over a microfluidics master containing 100-μm features in the shape of channels. A PDMS mold is used to contain the liquid in the desired area to a thickness of about 3 mm. Separately, a second master containing 100-μm features in the shape of channels is coated with a small drop of liquid PFPE precursors blended in a 4:1 epoxy:amine ratio such that there is an excess of epoxy units and spin coated at 3700 rpm for 1 minute to a thickness of about 20 μm. The wafer is then placed in an oven at 65° C. for 5 hours. The thick layer is then removed, trimmed, and inlet holes are punched through it using a luer stub. The thick layer is then placed on top of the cured PFPE thin layer and heated at 65° C. for 5 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane and heated in an oven at 65° C. for 5 hours to adhere the device to the glass slide. Small needles can then be placed in the inlets to introduce fluids and to actuate membrane valves as reported by Unger, M. et al. *Science.* 2000, 288, 113-6. An aqueous solution containing a protein functionalized with a free amine is then flowed through the channel which is lined with unreacted epoxy moieties, in such a way that the channel is then functionalized with the protein.

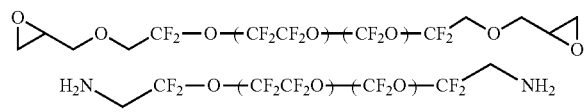

Example 15

Epoxy/Amine

Excess

Adhesion to PFPE Layers

Attachment of a Charged Species

A two-component liquid PFPE precursor system such as shown below containing a PFPE diepoxy and a PFPE diamine are blended together in a 1:4 epoxy:amine ratio such that there is an excess of amine and poured over a microfluidics master containing 100-μm features in the shape of channels. A PDMS mold is used to contain the liquid in the desired area to a thickness of about 3 mm. Separately, a second master containing 100-μm features in the shape of channels is coated with a small drop of liquid PFPE precursors blended in a 4:1 epoxy:amine ratio such that there is an excess of epoxy units and spin coated at 3700 rpm for 1 minute to a thickness of about 20 μm. The wafer is then placed in an oven at 65° C. for 5 hours. The thick layer is then removed, trimmed, and inlet holes are punched through it using a luer stub. The thick layer is then placed on top of the cured PFPE thin layer and heated at 65° C. for 5 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane and heated in an oven at 65° C. for 5 hours to adhere the device to the glass slide. Small needles can then be placed in the inlets to introduce fluids and to actuate membrane valves as reported by Unger, M. et al. *Science.* 2000, 288, 113-6. An aqueous solution containing a charged molecule functionalized with a free amine is then flowed through the channel which is lined with unreacted epoxy moieties, in such a way that the channel is then functionalized with the charged molecule.

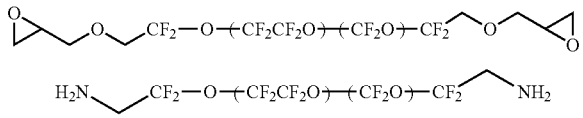

Example 16

Epoxy/Amine

Partial Cure

Adhesion to Glass

A two-component liquid PFPE precursor system such as shown below containing a PFPE diepoxy and a PFPE diamine are blended together in a stoichiometric ratio and poured over a microfluidics master containing 100-μm features in the shape of channels. A PDMS mold is used to contain the liquid in the desired area to a thickness of about 3 mm. The wafer is then placed in an oven at 65° C. for 0.5 hours such that it is partially cured. The partially cured layer is then removed, trimmed, and inlet holes are punched through it using a luer stub. The layer is then placed on a glass slide treated with a silane coupling agent, aminopropyltriethoxy silane, and allowed to heat at 65° C. for 5 hours such that it is adhered to the glass slide. Small needles can then be placed in the inlets to introduce fluids.

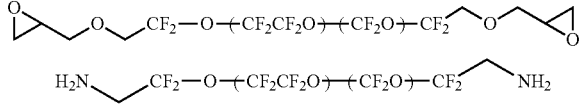

Example 17

Epoxy/Amine

Partial Cure

Layer to Layer Adhesion

A two-component liquid PFPE precursor system such as shown below containing a PFPE diepoxy and a PFPE diamine are blended together in a stoichiometric ratio and poured over a microfluidics master containing 100-µm features in the shape of channels. A PDMS mold is used to contain the liquid in the desired area to a thickness of about 3 mm. The wafer is then placed in an oven at 65° C. for 0.5 hours such that it is partially cured. The partially cured layer is then removed, trimmed, and inlet holes are punched through it using a luer stub. Separately, a second master containing 100-µm features in the shape of channels is spin coated with a small drop of the liquid PFPE precursors over top of it at 3700 rpm for 1 minute to a thickness of about 20 µm. The wafer is then placed in an oven at 65° C. for 0.5 hours such that it is partially cured. The thick layer is then placed on top of the 20-µm thick layer and aligned in the desired area to form a seal. The layers are then placed in an oven and allowed to heat at 65° C. for 1 hour to adhere the two layers. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane, and allowed to heat at 65° C. for 10 hours. Small needles can then be placed in the inlets to introduce fluids and to actuate membrane valves as reported by Unger, M. et al. *Science*. 2000, 288, 113-6.

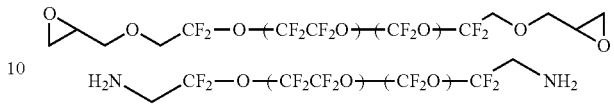

Example 18

Epoxy/Amine

Partial Cure

PDMS Adhesion

A liquid poly(dimethylsiloxane) precursor is poured over a microfluidics master containing 100-µm features in the shape of channels. The wafer is then placed in an oven at 80° C. for 3 hours. The cured PDMS layer is then removed, trimmed, and inlet holes are punched through it using a luer stub. The layer is then treated with an oxygen plasma for 20 minutes followed by treatment with a silane coupling agent, aminopropyltriethoxy silane. Separately, a second master containing 100-µm features in the shape of channels is spin coated with a small drop of liquid PFPE precursors mixed in a stoichiometric ratio at 3700 rpm for 1 minute to a thickness of about 20 µm. The wafer is then placed in an oven at 65° C. for 0.5 hours. The treated PDMS layer is then placed on top of the partially cured PFPE thin layer and heated at 65° C. for 1 hour. The thin layer is then trimmed and the adhered layers are lifted from the master. Fluid inlet holes and outlet holes are punched using a luer stub. The bonded layers are then placed on a glass slide treated with aminopropyltriethoxy silane and allowed to heat at 65° C. for 10 hours. Small needles can then be placed in the inlets to introduce fluids and to actuate membrane valves as reported by Unger, M. et al. *Science*. 2000, 288, 113-6.

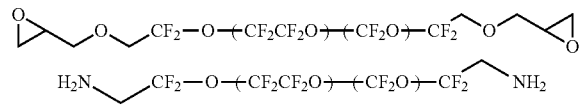

Example 19

Photocuring with Latent Functional Groups Available Post Cure

Adhesion to Glass

A liquid PFPE precursor having the structure shown below (where R is an epoxy group, the curvy lines are PFPE chains, and the circle is a linking molecule) is blended with 1 wt % of a free radical photoinitiator and poured over a microfluidics master containing 100-µm features in the shape of channels. A PDMS mold is used to contain the liquid in the desired area to a thickness of about 3 mm. The wafer is then placed in a UV chamber and exposed to UV light ($\lambda$=365) for 10 minutes under a nitrogen purge. The fully cured layer is then removed from the master and inlet holes are punched using a luer stub. The device is placed on a glass slide treated with a silane coupling agent, aminopropyltriethoxy silane, and allowed to heat at 65° C. for 15 hours permanently bonding the device to the glass slide. Small needles can then be placed in the inlets to introduce fluids.

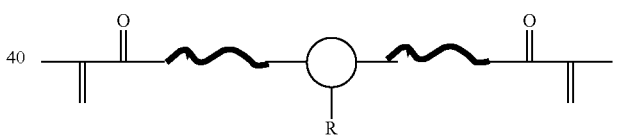

Example 20

Photocuring with Latent Functional Groups Available Post Cure

Adhesion to PFPE

A liquid PFPE precursor having the structure shown below (where R is an epoxy group), the curvy lines are PFPE chains, and the circle is a linking molecule) is blended with 1 wt % of a free radical photoinitiator and poured over a microfluidics master containing 100-µm features in the shape of channels. A PDMS mold is used to contain the liquid in the desired area to a thickness of about 3 mm. The wafer is then placed in a UV chamber and exposed to UV light ($\lambda$=365) for 10 minutes under a nitrogen purge. The fully cured layer is then removed from the master and inlet holes are punched using a luer stub. Separately a second master containing 100-µm features in the shape of channels is spin coated with a small drop of the liquid PFPE precursor (where R is an amine group) over top of it at 3700 rpm for 1 minute to a thickness of about 20 µm. The wafer is then placed in a UV chamber and exposed to UV light ($\lambda$=365) for 10 minutes under a nitrogen purge. The thicker layer is then placed on top of the 20-µm thick layer and aligned in the desired area to form a seal. The layers are then placed in an oven and allowed to heat at 65° C. for 2 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane, and allowed to heat at 65° C. for 15 hours permanently bonding the device to the glass slide. Small needles can then be placed in the inlets to introduce fluids and to actuate membrane valves as reported by Unger, M. et al. *Science.* 2000, 288, 113-6.

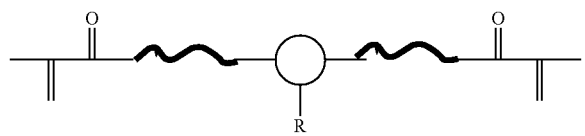

Example 21

Photocuring w/Latent Functional Groups Available Post Cure

Adhesion to PDMS

A liquid poly(dimethylsiloxane) precursor is poured over a microfluidics master containing 100-µm features in the shape of channels. The wafer is then placed in an oven at 80° C. for 3 hours. The cured PDMS layer is then removed, trimmed, and inlet holes are punched through it using a luer stub. The layer is then treated with an oxygen plasma

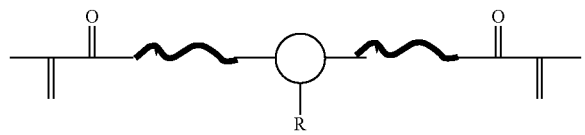

for 20 minutes followed by treatment with a silane coupling agent, aminopropyltriethoxy silane. Separately a second master containing 100-µm features in the shape of channels is spin coated with a small drop of the liquid PFPE precursor (where R is an epoxy) over top of it at 3700 rpm for 1 minute to a thickness of about 20 µm. The wafer is then placed in a UV chamber and exposed to UV light ($\lambda$=365) for 10 minutes under a nitrogen purge. The thicker PDMS layer is then placed on top of the 20-µm thick layer and aligned in the desired area to form a seal. The layers are then placed in an oven and allowed to heat at 65° C. for 2 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane, and allowed to heat at 65° C. for 15 hours permanently bonding the device to the glass slide. Small needles can then be placed in the inlets to introduce fluids and to actuate membrane valves as reported by Unger, M. et al. *Science.* 2000, 288, 113-6.

Example 22

Latent Functional Groups Available Post Cure

Attach Biomolecule

A liquid PFPE precursor having the structure shown below (where R is an amine group), the curvy lines are PFPE chains, and the circle is a linking molecule) is blended with 1 wt % of a free radical photoinitiator and poured over a microfluidics master containing 100-µm features in the shape of channels. A PDMS mold is used to contain the liquid in the desired area to a thickness of about 3 mm. The wafer is then placed in a UV chamber and exposed to UV light ($\lambda$=365) for 10 minutes under a nitrogen purge. The fully cured layer is then removed from the master and inlet holes are punched using a luer stub. Separately a second master containing 100-µm features in the shape of channels is spin coated with a small drop of the liquid PFPE precursor (where R is an epoxy group) over top of it at 3700 rpm for 1 minute to a thickness of about 20 µm. The wafer is then placed in a UV chamber and exposed to UV light ($\lambda$=365) for 10 minutes under a nitrogen purge. The thicker layer is then placed on top of the 20-µm thick layer and aligned in the desired area to form a seal. The layers are then placed in an oven and allowed to heat at 65° C. for 2 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane, and allowed to heat at 65° C. for 15 hours permanently bonding the device to the glass slide. Small needles can then be placed in the inlets to introduce fluids and to actuate membrane valves as reported by Unger, M. et al. *Science.* 2000, 288, 113-6. An aqueous solution containing a protein functionalized with a free amine is then flowed through the channel which is lined with unreacted epoxy moieties, in such a way that the channel is then functionalized with the protein.

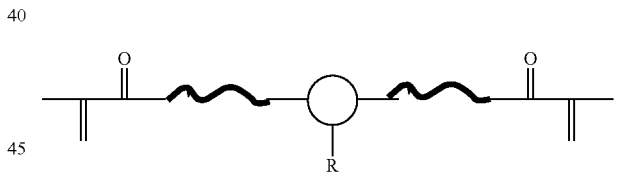

Example 23

Latent Functional Groups Available Post Cure

Attach Charged Species

A liquid PFPE precursor having the structure shown below (where R is an amine group), the curvy lines are PFPE chains, and the circle is a linking molecule) is blended with 1 wt % of a free radical photoinitiator and poured over a microfluidics master containing 100-µm features in the shape of channels. A PDMS mold is used to contain the liquid in the desired area to a thickness of about 3 mm. The wafer is then placed in a UV chamber and exposed to UV light ($\lambda$=365) for 10 minutes under a nitrogen purge. The fully cured layer is then removed from the master and inlet holes are punched using a luer stub. Separately a second master containing 100-µm features in the shape of channels is spin coated with a small drop of the liquid PFPE precursor (where R is an epoxy group) over top of it at 3700 rpm for 1 minute to a thickness of about 20 μm. The wafer is then placed in a UV chamber and exposed to UV light (λ=365) for 10 minutes under a nitrogen purge. The thicker layer is then placed on top of the 20-μm thick layer and aligned in the desired area to form a seal. The layers are then placed in an oven and allowed to heat at 65° C. for 2 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane, and allowed to heat at 65° C. for 15 hours permanently bonding the device to the glass slide. Small needles can then be placed in the inlets to introduce fluids and to actuate membrane valves as reported by Unger, M. et al. *Science.* 2000, 288, 113-6. An aqueous solution containing a charged molecule functionalized with a free amine is then flowed through the channel which is lined with unreacted epoxy moieties, in such a way that the channel is then functionalized with the charged molecule.

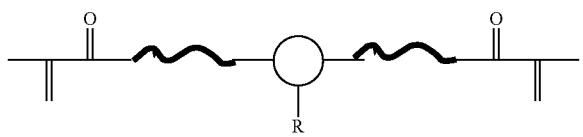

Example 24

Photocuring with Functional Monomers Available Post Cure

Adhesion to Glass

A liquid PFPE dimethacrylate precursor or a monomethacrylate PFPE macromonomer is blended with a monomer having the structure shown below (where R is an epoxy group) and blended with 1 wt % of a free radical photoinitiator and poured over a microfluidics master containing 100-μm features in the shape of channels. A PDMS mold is used to contain the liquid in the desired area to a thickness of about 3 mm. The wafer is then placed in a UV chamber and exposed to UV light (λ=365) for 10 minutes under a nitrogen purge. The fully cured layer is then removed from the master and inlet holes are punched using a luer stub. The device is placed on a glass slide treated with a silane coupling agent, aminopropyltriethoxy silane, and allowed to heat at 65° C. for 15 hours permanently bonding the device to the glass slide. Small needles can then be placed in the inlets to introduce fluids.

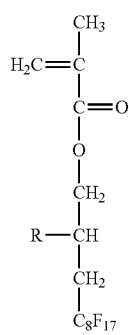

Example 25

Photocuring with Functional Monomers Available Post Cure

Adhesion to PFPE

A liquid PFPE dimethacrylate precursor is blended with a monomer having the structure shown below (where R is an epoxy group) and blended with 1 wt % of a free radical photoinitiator and poured over a microfluidics master containing 100-μm features in the shape of channels. A PDMS mold is used to contain the liquid in the desired area to a thickness of about 3 mm. The wafer is then placed in a UV chamber and exposed to UV light (λ=365) for 10 minutes under a nitrogen purge. The fully cured layer is then removed from the master and inlet holes are punched using a luer stub. Separately a second master containing 100-μm features in the shape of channels is spin coated with a small drop of the liquid PFPE precursor plus functional (where R is an amine group) over top of it at 3700 rpm for 1 minute to a thickness of about 20 μm. The wafer is then placed in a UV chamber and exposed to UV light (λ=365) for 10 minutes under a nitrogen purge. The thicker layer is then placed on top of the 20-μm thick layer and aligned in the desired area to form a seal. The layers are then placed in an oven and allowed to heat at 65° C. for 2 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane, and allowed to heat at 65° C. for 15 hours permanently bonding the device to the glass slide. Small needles can then be placed in the inlets to introduce fluids and to actuate membrane valves as reported by Unger, M. et al. *Science.* 2000, 288, 113-6.

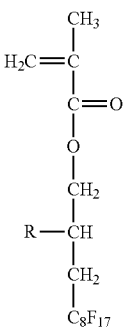

Example 26

Photocuring with Functional Monomers Available Post Cure

Adhesion to PDMS

A liquid poly(dimethylsiloxane) precursor is poured over a microfluidics master containing 100-μm features in the shape of channels. The wafer is then placed in an oven at 80° C. for 3 hours. The cured PDMS layer is then removed, trimmed, and inlet holes are punched through it using a luer stub. The layer is then treated with an oxygen plasma for 20 minutes followed by treatment with a silane coupling agent, aminopropyltriethoxy silane. Separately a second master containing 100-μm features in the shape of channels is spin coated with a small drop of a liquid PFPE dimethacrylate precursor plus functional monomer (where R is an epoxy) plus a photoinitiator over top of it at 3700 rpm for 1 minute to a thickness of about 20 μm. The wafer is then placed in a UV chamber and exposed to UV light (λ=365) for 10 minutes under a nitrogen purge. The thicker PDMS layer is then placed on top of the 20-μm thick layer and aligned in the desired area to form a seal. The layers are then placed in an oven and allowed to heat at 65° C. for 2 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane, and allowed to heat at 65° C. for 15 hours permanently bonding the device to the glass slide. Small needles can then be placed in the inlets to introduce fluids and to actuate membrane valves as reported by Unger, M. et al. *Science.* 2000, 288, 113-6.

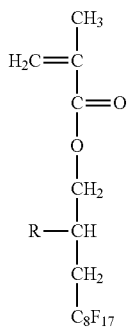

Example 27

Photocuring with Functional Monomers Available Post Cure

Attachment of a Biomolecule

A liquid PFPE dimethacrylate precursor is blended with a monomer having the structure shown below (where R is an amine group) and blended with 1 wt % of a free radical photoinitiator and poured over a microfluidics master containing 100-μm features in the shape of channels. A PDMS mold is used to contain the liquid in the desired area to a thickness of about 3 mm. The wafer is then placed in a UV chamber and exposed to UV light (λ=365) for 10 minutes under a nitrogen purge. The fully cured layer is then removed from the master and inlet holes are punched using a luer stub. Separately a second master containing 100-μm features in the shape of channels is spin coated with a small drop of the liquid PFPE precursor plus functional (where R is an epoxy group) over top of it at 3700 rpm for 1 minute to a thickness of about 20 μm. The wafer is then placed in a UV chamber and exposed to UV light (λ=365) for 10 minutes under a nitrogen purge. The thicker layer is then placed on top of the 20-μm thick layer and aligned in the desired area to form a seal. The layers are then placed in an oven and allowed to heat at 65° C. for 2 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane, and allowed to heat at 65° C. for 15 hours permanently bonding the device to the glass slide. Small needles can then be placed in the inlets to introduce fluids and to actuate membrane valves as reported by Unger, M. et al. *Science.* 2000, 288, 113-6. An aqueous solution containing a protein functionalized with a free amine is then flowed through the channel which is lined with unreacted epoxy moieties, in such a way that the channel is then functionalized with the protein.

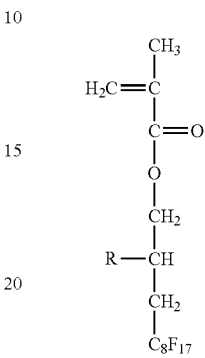

Example 28

Photocuring with Latent Functional Groups Available Post Cure

Attachment of Charged Species

A liquid PFPE dimethacrylate precursor is blended with a monomer having the structure shown below (where R is an amine group) and blended with 1 wt % of a free radical photoinitiator and poured over a microfluidics master containing 100-μm features in the shape of channels. A PDMS mold is used to contain the liquid in the desired area to a thickness of about 3 mm. The wafer is then placed in a UV chamber and exposed to UV light (λ=365) for 10 minutes under a nitrogen purge. The fully cured layer is then removed from the master and inlet holes are punched using a luer stub. Separately a second master containing 100-μm features in the shape of channels is spin coated with a small drop of the liquid PFPE precursor plus functional (where R is an epoxy group) over top of it at 3700 rpm for 1 minute to a thickness of about 20 μm. The wafer is then placed in a UV chamber and exposed to UV light (λ=365) for 10 minutes under a nitrogen purge. The thicker layer is then placed on top of the 20-μm thick layer and aligned in the desired area to form a seal. The layers are then placed in an oven and allowed to heat at 65° C. for 2 hours. The thin layer is then trimmed and the adhered layers are lifted from the master. Fluid inlet holes and outlet holes are punched using a luer stub. The bonded layers are then placed on a glass slide treated with a silane coupling agent, aminopropyltriethoxy silane, and allowed to heat at 65° C. for 15 hours permanently bonding the device to the glass slide. Small needles can then be placed in the inlets to introduce fluids and to actuate membrane valves as reported by Unger, M. et al. *Science.* 2000, 288, 113-6. An aqueous solution containing a charged molecule functionalized with a free amine is then flowed through the channel which is lined with unreacted epoxy moieties, in such a way that the channel is then functionalized with the charged molecule.

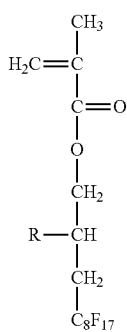

Example 29

Fabrication of a PFPE Microfluidic Device Using Sacrificial Channels

A smooth, flat PFPE layer is generated by drawing a doctor's blade across a small drop of the liquid PFPE dimethacrylate precursor across a glass slide. The Slide is then placed in a UV chamber and exposed to UV light ($\lambda$=365) for 10 minutes under a nitrogen purge. A scaffold composed of poly(lactic acid) in the shape of channels is laid on top of the flat, smooth layer of PFPE. A liquid PFPE dimethacrylate precursor is with 1 wt % of a free radical photoinitiator and poured over the scaffold. A PDMS mold is used to contain the liquid in the desired area to a thickness of about 3 mm. The apparatus is then placed in a UV chamber and exposed to UV light ($\lambda$=365) for 10 minutes under a nitrogen purge. The device can then be heated at 150° C. for 24 hours to degrade the poly(lactic acid) thus revealing voids left in the shape of channels.

Example 30

Adhesion of a PFPE Device to Glass Using 185-nm Light

A liquid PFPE dimethacrylate precursor is blended with 1 wt % of a free radical photoinitiator and poured over a micro fluidics master containing 100-µm features in the shape of channels. A PDMS mold is used to contain the liquid in the desired area to a thickness of about 3 mm. The wafer is then placed in a UV chamber and exposed to UV light ($\lambda$=365) for 10 minutes under a nitrogen purge. Separately a second master containing 100-µm features in the shape of channels is spin coated with a small drop of the liquid PFPE precursor over top of it at 3700 rpm for 1 minute to a thickness of about 20 µm. The wafer is then placed in a UV chamber and exposed to UV light ($\lambda$=365) for 10 minutes under a nitrogen purge. The thicker layer is then removed, trimmed, and inlet holes are punched through it using a luer stub. The layer is then placed on top of the 20-µm thick layer and aligned in the desired area to form a seal. The layers are then placed in an oven and allowed to heat at 120° C. for 2 hours. The thin layer is then trimmed and the adhered layers are lifted from the master. Fluid inlet holes and outlet holes are punched using a luer stub. The bonded layers are then placed on a clean, glass slide in such a way that it forms as seal. The apparatus is exposed to 185 nm UV light for 20 minutes, forming a permanent bond between the device and the glass. Small needles can then be placed in the inlets to introduce fluids and to actuate membrane valves as reported by Unger, M. et al. *Science*. 2000, 288, 113-6.

Example 31

"Epoxy Casing" Method to Encapsulate Devices

A liquid PFPE dimethacrylate precursor is blended with 1 wt % of a free radical photoinitiator and poured over a micro fluidics master containing 100-µm features in the shape of channels. A PDMS mold is used to contain the liquid in the desired area to a thickness of about 3 mm. The wafer is then placed in a UV chamber and exposed to UV light ($\lambda$=365) for 10 minutes under a nitrogen purge. Separately a second master containing 100-µm features in the shape of channels is spin coated with a small drop of the liquid PFPE precursor over top of it at 3700 rpm for 1 minute to a thickness of about 20 µm. The wafer is then placed in a UV chamber and exposed to UV light ($\lambda$=365) for 10 minutes under a nitrogen purge. The thicker layer is then removed, trimmed, and inlet holes are punched through it using a luer stub. The layer is then placed on top of the 20-µm thick layer and aligned in the desired area to form a seal. The layers are then placed in an oven and allowed to heat at 120° C. for 2 hours. The thin layer is then trimmed and the adhered layers are lifted from the master. Fluid inlet holes and outlet holes are punched using a luer stub. The bonded layers are then placed on a clean, glass slide in such a way that it forms as seal. Small needles can then be placed in the inlets to introduce fluids and to actuate membrane valves as reported by Unger, M. et al. *Science*. 2000, 288, 113-6. The entire apparatus can then be encased in a liquid epoxy precursor which is poured over the device allowed to cure. The casing serves to mechanically bind the device the substrate.

Example 32

Fabrication of a PFPE Device from a Three-Armed PFPE Precursor

A liquid PFPE precursor having the structure shown below (where the circle represents a linking molecule) is blended with 1 wt % of a free radical photoinitiator and poured over a microfluidics master containing 100-µm features in the shape of channels. A PDMS mold is used to contain the liquid in the desired area to a thickness of about 3 mm. The wafer is then placed in a UV chamber and exposed to UV light ($\lambda$=365) for 10 minutes under a nitrogen purge. Separately a second master containing 100-µm features in the shape of channels is spin coated with a small drop of the liquid PFPE precursor over top of it at 3700 rpm for 1 minute to a thickness of about 20 µm. The wafer is then placed in a UV chamber and exposed to UV light ($\lambda$=365) for 10 minutes under a nitrogen purge. Thirdly a smooth, flat PFPE layer is generated by drawing a doctor's blade across a small drop of the liquid PFPE precursor across a glass slide. The Slide is then placed in a UV chamber and exposed to UV light ($\lambda$=365) for 10 minutes under a nitrogen purge. The thicker layer is then removed, trimmed, and inlet holes are punched through it using a luer stub. The layer is then placed on top of the 20-gm thick layer and aligned in the desired area to form a seal. The layers are then placed in an oven and allowed to heat at 120° C. for 2 hours. The thin layer is then trimmed and the adhered layers are lifted from the master. Fluid inlet holes and outlet holes are punched using a luer stub. The bonded layers are then placed on the fully cured PFPE smooth layer on the glass slide and allowed to heat at 120° C. for 15 hours. Small needles can then be placed in the inlets to introduce fluids and to actuate membrane valves as reported by Unger, M. et al. *Science.* 2000, 288, 113-6.

trimmed and inlet/outlet holes punched. Next the layers are stacked and aligned in registered positions such that they form a conformal seal. The stacked layers are then heated, at

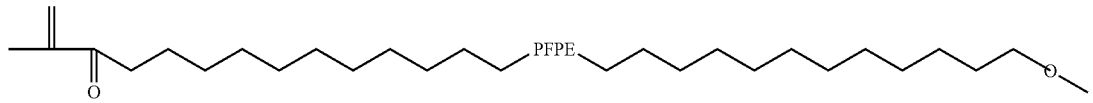

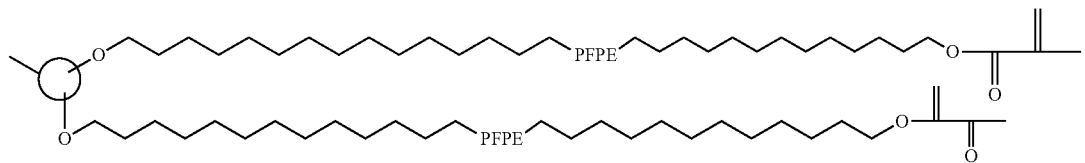

Example 33

Photocured PFPE/PDMS Hybrid

A master containing 100-μm features in the shape of channels is spin coated with a small drop of the liquid PFPE dimethacrylate precursor containing photoinitiator over top of it at 3700 rpm for 1 minute to a thickness of about 20 μm. A PDMS dimethacrylate containing photoinitiator is then poured over top of the thin PFPE layer to a thickness of 3 mm. The wafer is then placed in a UV chamber and exposed to UV light (λ=365) for 10 minutes under a nitrogen purge. The layer is then removed, trimmed, and inlet holes are punched through it using a luer stub. The hybrid device is then placed on a glass slide and a seal is formed. Small needles can then be placed in the inlets to introduce fluids.

Example 34

Microfluidic Device Formed from Blended Thermally and PhotoCurable Materials Firstly, a predetermined amount, e.g., 5 grams, of a chain-extended PFPE dimethacrylate containing a small amount of photoinitiator, such as hydroxycyclohexylphenyl ketone, is measured. Next, a 1:1 ratio by weight, e.g., 5 grams, of a chain-extended PFPE diisocyanate is added. Next, an amount, e.g., 0.3 mL, of a PFPE tetrol (Mn~2000 g/mol) is then added such that there is a stoichiometric amount of —N(C=O)— and —OH moieties. The three components are then mixed thoroughly and degassed under vacuum.

Master templates are generated using photolithography and are coated with a thin layer of metal, e.g., Gold/Palladium, using an argon plasma. Thin layers for devices are spin coated at 1500 rpm from the PFPE blend onto patterned substrates. A thin, flat (non patterned), layer also is spin coated. Separately, thicker layers are cast onto the metal-coated master templates, typically by pooling the material inside, for example, a PDMS gasket. All layers are then placed in a UV chamber, purged with nitrogen for 10 minutes, and photocured for ten minutes into solid rubbery pieces under a thorough nitrogen purge. The layers can then be trimmed and inlet/outlet holes punched. Next the layers are stacked and aligned in registered positions such that they form a conformal seal. The stacked layers are then heated, at 105° C. for 10 minutes. The heating step initiates the thermal cure of the thermally curable material which is physically entangled in the photocured matrix. Because the layers are in conformal contact, strong adhesion is obtained. The two adhered layers can then be peeled from the patterned master or lifted off with a solvent, such as dimethyl formamide, and placed in contact with a third flat, photocured substrate which has not yet been exposed to heat. The three-layer device is then baked for 15 hours at 110° C. to fully adhere all three layers.

According to another embodiment, the thermal cure is activated at a temperature of between about 20 degrees Celsius (C) and about 200 degrees C. According to yet another embodiment, the thermal cure is activated at a temperature of between about 50 degrees Celsius (C) and about 150 degrees C. Further still, the thermal cure selected such that it is activated at a temperature of between about 75 degrees Celsius (C) and about 200 degrees C.

According to yet another embodiment, the amount of photocure substance added to the material is substantially equal to the amount of thermal cure substance. In a further embodiment, the amount of thermal cure substance added to the material is about 10 percent of the amount of photocure substance. According to another embodiment, the amount of thermal cure substance is about 50 percent of the amount of the photocure substance.

Example 35

Multicomponent Material for Fabricating Microfluidic Devices

The chemical structure of each component will be described below. In the following example, the first component (Component 1) is a chain extended, photocurable PFPE liquid precursor. The synthesis consists of the chain extension of a commercially available PFPE diol (ZDOL) with a common diisocyanate, isophorone diisocyanate (IPDI), using classic urethane chemistry with an organo-tin catalyst. Following chain extension, the chain is end-capped with a methacrylate-containing diisocyanate monomer (EIM).

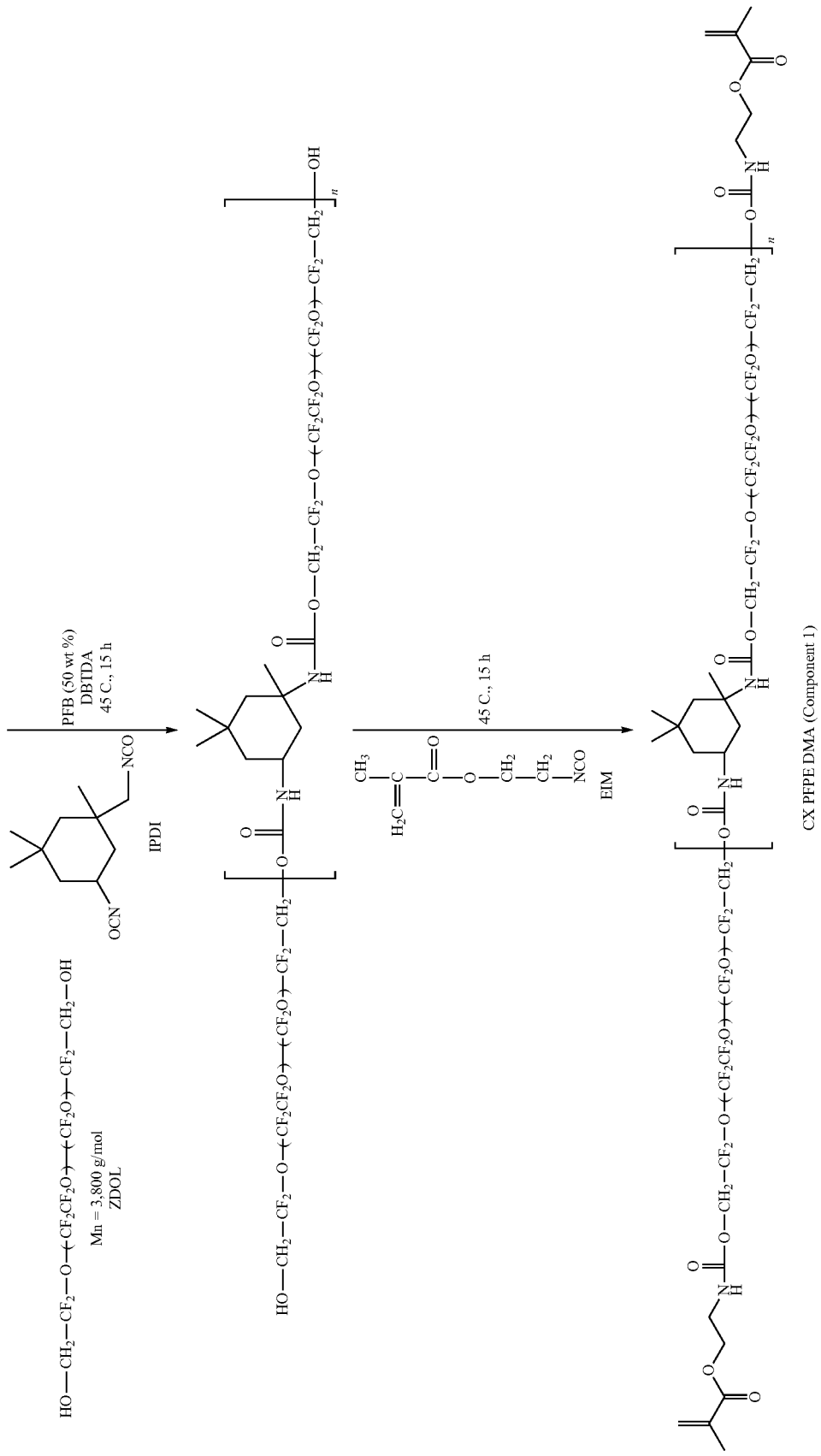

The second component is a chain-extended PFPE diisocyanate. It is made by the reaction of ZDOL with IPDI in a molar ratio such that the resulting polymer chain is capped with isocyanate groups (Component 2a). The reaction again makes use of classic urethane chemistry with an organo-tin catalyst.

added. Next, an amount, e.g., 3.0 g of a PFPE triol (Mn~5000 g/mol) is then added such that there is a stoichiometric amount of —N(C=O)— and —OH moieties. The three components are then mixed thoroughly and degassed under vacuum.

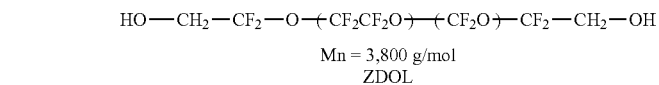

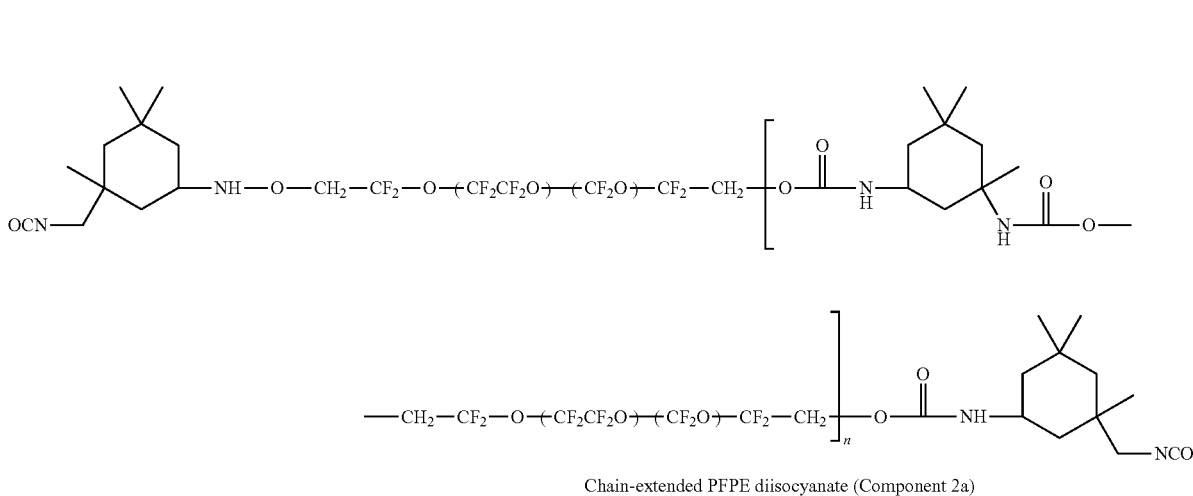

Chain-extended PFPE diisocyanate (Component 2a)

The second part of the thermally curable component is a commercially available perfluoropolyether tetraol with a molecular weight of 2,000 g/mol (Component 2b).

Master templates are generated using photolithography and are coated with a thin layer of metal, e.g., Gold/Palladium, using an Argon plasma. Alternatively the masters are

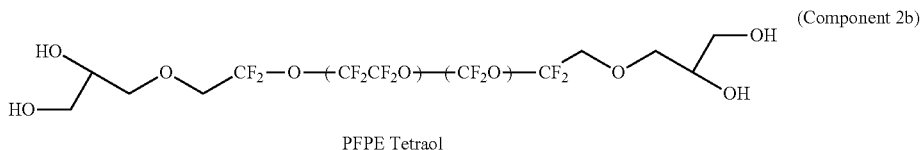

PFPE Tetraol

It will be understood that various details of the presently disclosed subject matter can be changed without departing from the scope of the presently disclosed subject matter. Furthermore, the foregoing description is for the purpose of illustration only, and not for the purpose of limitation.

Example 36

Microfluidic Device Formed from Blended Thermally and PhotoCurable Materials

UV Diurethane Methacrylate w/PFPE Triol+PFPE Diisocyanate System

Firstly, a predetermined amount, for example, 10 grams, of a chain-extended PFPE dimethacrylate containing a small amount of photoinitiator, such as diethoxyphenyl ketone, is measured. Next, about 7 grams, of a PFPE diisocyanate is treated with a silane or other release layer. Thin layers for devices are spin coated at 1500 rpm from the PFPE blend onto patterned substrates. A thin, flat (non patterned), layer also is spin coated. Separately, thicker layers are cast onto the metal-coated master templates, typically by pooling the material inside, for example, a PDMS gasket. All layers are then placed in a UV chamber, purged with nitrogen for 10 minutes, and photocured for ten minutes into solid rubbery pieces under a thorough nitrogen purge. The layers can then be trimmed and inlet/outlet holes punched. Next the layers are stacked and aligned in registered positions such that they form a conformal seal. The stacked layers are then heated, at 115° C. for 10 minutes. The heating step initiates the thermal cure of the thermally curable material which is physically entangled in the photocured matrix. Because the layers are in conformal contact, strong adhesion is obtained. The two adhered layers can then be peeled from the patterned master or lifted off with a solvent, such as dimethyl formamide, and placed in contact with a third flat, photocured substrate which has not yet been exposed to heat. The three-layer device is then baked for 2 hours at 150° C. to fully adhere all three layers.

Example 37

Microfluidic Device Formed from Blended Thermally and PhotoCurable Materials

UV Diurethane Methacrylate w/PFPE diepoxy+PFPE Diamine

Firstly, a predetermined amount, e.g., 20 grams, of a chain-extended PFPE dimethacrylate containing a small amount of photoinitiator, such as diethoxyphenyl ketone, is measured. Next, about 10 grams, of a PFPE diepoxy is added. Next, an amount, e.g., 3.6 g of a PFPE diamine is then added such that there is a stoichiometric amount of epoxy and amine moieties. The three components are then mixed thoroughly and degassed under vacuum.

Master templates are generated using photolithography and are coated with a thin layer of metal, e.g., Gold/Palladium, using an Argon plasma. Alternatively, the masters are treated with a silane or other release layer. A thin, flat (non patterned), layer is spin coated at 1500 rpm. Separately, thicker layers are cast onto the patterned master templates, typically by pooling the material inside, for example, a PDMS gasket. All layers are then placed in a UV chamber, purged with nitrogen for 10 minutes, and photocured for ten minutes into solid rubbery pieces under a thorough nitrogen purge. The layers can then be trimmed and inlet/outlet holes punched. Next the layers are stacked and aligned in registered positions such that they form a conformal seal. The stacked layers are then heated, at 120° C. for 20 minutes. The heating step initiates the thermal cure of the thermally curable material which is physically entangled in the photocured matrix. Because the layers are in conformal contact, strong adhesion is obtained.

Example 38

Microfluidic Device Formed from Two Blended PhotoCurable Materials

UV Diurethane Methacrylate w/UV Epoxy

Firstly, a predetermined amount, e.g., 10 grams, of a chain-extended PFPE dimethacrylate containing a small amount of photoinitiator, such as diethoxyphenyl ketone, is measured. Next, 10 grams, of a PFPE diepoxy formulation which contains 5 grams of ZDOL TX and 0.2 g a photoacid generator, such as Rhodorsil 2079, is added. The two components are then mixed thoroughly and degassed under vacuum.

Master templates are generated using photolithography and are coated with a thin layer of metal, e.g., Gold/Palladium, using an Argon plasma. Alternatively, the masters are treated with a silane or other release layer. A thin, flat (non patterned), layer is spin coated at 1500 rpm. Separately, thicker layers are cast onto the patterned master templates, typically by pooling the material inside, for example, a PDMS gasket. All layers are then placed in a UV chamber, purged with nitrogen for 5 minutes, and photocured for 5 minutes into solid rubbery pieces under a thorough nitrogen purge. The layers can then be trimmed and inlet/outlet holes punched. Next the layers are stacked and aligned in registered positions such that they form a conformal seal. The stacked layers are then exposed to UV light for a second time for 10 minutes. The second UV step further propagates the cure of the PFPE diepoxy material which is physically entangled in the PFPE diurethane methacrylate. Because the layers are in conformal contact, strong adhesion is obtained.

Example 39

Microfluidic Device Formed from Blended Thermally and PhotoCurable Materials

UV Diurethane Methacrylate w/PFPE Diisocyanate System

Firstly, about 10 grams, of a chain-extended PFPE dimethacrylate containing a small amount of photoinitiator, such as diethoxyphenyl ketone, can be measured. Next, about 7 grams of a PFPE diisocyanate shall be added. The three components shall then be mixed thoroughly and degassed under vacuum.

Master templates will then be generated using photolithography and coated with a thin layer of metal, e.g., Gold/Palladium, using an Argon plasma. Alternatively the masters can be treated with a silane or other release layer. Thin layers for devices will then be spin coated at 1500 rpm from the PFPE blend onto patterned substrates. A thin, flat (non patterned), layer also will be spin coated. Separately, thicker layers can be cast onto the metal-coated master templates, typically by pooling the material inside, for example, a PDMS gasket. All layers will then be placed in a UV chamber, purged with nitrogen for 10 minutes, and photocured for ten minutes into solid rubbery pieces under a thorough nitrogen purge. The layers can then be trimmed and inlet/outlet holes punched, as needed. Next the layers will be stacked and aligned in registered positions such that a conformal seal is formed. The stacked layers will then be heated, at 130° C. for 30 minutes. The heating step initiates thermal cure components of the thermally curable material which are physically entangled in the photocured matrix. Because the layers are in conformal contact, strong adhesion will be obtained. The two adhered layers can then be peeled from the patterned master or lifted off with a solvent, such as dimethyl formamide, and placed in contact with a third flat, photocured substrate which has not yet been exposed to heat. The three-layer device can then be baked for 4 hours at 130° C. to fully adhere all three layers.

Example 40

Multicomponent Material for Fabricating Microfluidic Devices

Microfluidic Device Formed from Blended Thermally and PhotoCurable Materials

UV Diurethane Methacrylate w/PFPE Diisocyanate System

Firstly, about 10 grams, of a chain-extended PFPE dimethacrylate containing a small amount of photoinitiator, such as diethoxyphenyl ketone, shall be measured. Next, 7 grams of a PFPE diisocyanate shall be added. The three components will then be mixed thoroughly and degassed under vacuum.

Master templates will be generated using photolithography and coated with a thin layer of metal, e.g., Gold/Palladium, using an argon plasma. Alternatively the masters can be treated with a silane or other release layer. Thin layers for devices will then be spin coated at 1500 rpm from the PFPE blend onto patterned substrates. A thin, flat (non patterned), layer will also be spin coated. Separately, thicker layers are cast onto the metal-coated master templates, typically by pooling the material inside, for example, a PDMS gasket. All layers shall then be placed in a UV chamber, purged with nitrogen for 10 minutes, and photocured for ten minutes into solid rubbery pieces under a thorough nitrogen purge. The layers can then be trimmed and inlet/outlet holes punched, as necessary. Next the layers shall be stacked and aligned in registered positions such that they form a conformal seal. The stacked layers will then be heated, at 90° C. in a humidity chamber with greater than 50% relative humidity for 30 minutes (moisture cure). The heating step initiates the thermal cure of the thermally curable material which is physically entangled in the photocured matrix. Because the layers are in conformal contact, strong adhesion will be obtained. The two adhered layers can then be peeled from the patterned master or lifted off with a solvent, such as dimethyl formamide, and placed in contact with a third flat, photocured substrate which has not yet been exposed to heat. The three-layer device can then be baked at 90° C. in a humidity chamber with greater than 50% relative humidity for 4 hours.

That which is claimed:

1. A method for pattern transfer of micro-scale and nano-scale cavities, comprising:
    contacting a fluoropolymer with a master template, wherein the master template includes a dimensional pattern;
    curing the fluoropolymer such that the fluoropolymer retains a substantial replicate of the dimensional pattern;
    removing the cured fluoropolymer from the master template;
    contacting a poly(dimethylsiloxane) with the dimensional pattern of the cured fluoropolymer;
    curing the poly(dimethylsiloxane); and
    removing the cured poly(dimethylsiloxane) from the cured fluoropolymer wherein the dimensional pattern of the cured poly(dimethylsiloxane) is a substantial replicate of the dimensional pattern of the master template.

2. The method of claim 1, wherein said fluoropolymer is perfluoropolyether.

3. The method of claim 1, wherein said fluoropolymer is a liquid before curing.

4. The method of claim 1, wherein said fluoropolymer is a perfluoropolyether precursor.

5. The method of claim 4, wherein said perfluoropolyether precursor has a viscosity less than about 110 cst.

6. The method of claim 1, wherein said poly(dimethylsiloxane) is a liquid before curing.

7. The method of claim 1, wherein said dimensional pattern of said master template comprises at least one cavity and said dimensional pattern of said cured fluoropolymer comprises at least one protrusion corresponding to said cavity.

8. The method of claim 7, wherein said dimensional pattern of said cured poly(dimethylsiloxane) comprises a cavity corresponding to said protrusion of said cured fluoropolymer, wherein said cavity substantially replicates a cavity on said master template.

9. The method of claim 1, further comprising:
    after said removing, using said cured poly(dimethylsiloxane) as a mold.

10. The method of claim 9, wherein said using the cured poly(dimethylsiloxane) as a mold comprises preparing a molded fluoropolymer material from said mold, wherein said molded fluoropolymer material has at least one dimension corresponding to the dimensional pattern on said mold.

11. The method of claim 10, wherein said dimensional pattern of said mold comprises a plurality of cavities.

12. The method claim 11, wherein each cavity has a broadest dimension less than about 1000 micrometers.

13. The method claim 11, wherein each cavity has a broadest dimension less than about 100 micrometers.

14. The method claim 11, wherein each cavity has a broadest dimension less than about 1 micrometer.

15. The method claim 11, wherein each cavity has a broadest dimension of about 0.01 micrometer.

16. The method of claim 1, wherein said dimensional pattern of said master template comprises a plurality of cavities, wherein each cavity has a broadest dimension of less than 1000 micrometers.

17. The method of claim 1, wherein said dimensional pattern of said master template comprises a plurality of cavities, wherein each cavity has a broadest dimension of less than 100 micrometers.

18. The method of claim 1, wherein said dimensional pattern of said master template comprises a plurality of cavities, wherein each cavity has a broadest dimension of less than 10 micrometers.

19. The method of claim 1, wherein said dimensional pattern of said master template comprises a plurality of cavities, wherein each cavity has a broadest dimension of less than 1 micrometer.

20. The method of claim 1, wherein said curing in each instance is independently selected from the group consisting of thermal curing and photo curing.

\* \* \* \* \*